United States Patent
Kang et al.

(10) Patent No.: US 11,299,648 B2
(45) Date of Patent: Apr. 12, 2022

(54) POLYMER, COATING COMPOSITION COMPRISING SAME, AND ORGANIC LIGHT EMITTING DIODE USING SAME

(71) Applicant: LG Chem, Ltd., Seoul (KR)

(72) Inventors: Esder Kang, Daejeon (KR); Jaesoon Bae, Daejeon (KR); Jaechol Lee, Daejeon (KR); Sungkyoung Kang, Daejeon (KR); Hyeonah Shin, Daejeon (KR); Keunsoo Lee, Daejeon (KR); Hyungil Park, Daejeon (KR)

(73) Assignee: LG Chem, Ltd.

( * ) Notice: Subject to any disclaimer, the term of this patent is extended or adjusted under 35 U.S.C. 154(b) by 227 days.

(21) Appl. No.: 16/649,837

(22) PCT Filed: Feb. 26, 2019

(86) PCT No.: PCT/KR2019/002321
§ 371 (c)(1),
(2) Date: Mar. 23, 2020

(87) PCT Pub. No.: WO2019/168322
PCT Pub. Date: Sep. 6, 2019

(65) Prior Publication Data
US 2020/0280001 A1    Sep. 3, 2020

(30) Foreign Application Priority Data

Feb. 28, 2018  (KR) .................. 10-2018-0024571

(51) Int. Cl.
*C09D 125/18* (2006.01)
*C08F 212/32* (2006.01)
(Continued)

(52) U.S. Cl.
CPC .......... *C09D 125/18* (2013.01); *C08F 212/22* (2020.02); *C08F 212/26* (2020.02);
(Continued)

(58) Field of Classification Search
CPC ... C09D 125/18; C08F 212/32; H01L 51/004; H01L 51/0043
See application file for complete search history.

(56) References Cited

U.S. PATENT DOCUMENTS 10,040,887 B2   8/2018   Korai et al.
2004/0067387 A1   4/2004   Kim et al.
(Continued)

FOREIGN PATENT DOCUMENTS

JP  2004303490 A   10/2004
JP  2012111719 A    6/2012
(Continued)

OTHER PUBLICATIONS

Ho et al., "Review of recent progress in multilayer solution-processed organic light-emitting diodes", Journal of Photonics for Energy, Jun. 2015, vol. 5, No. 1, p. 057611-1-057611-17 (inner pp. 1-12).

(Continued)

*Primary Examiner* — Anthony Ho
(74) *Attorney, Agent, or Firm* — Lerner, David, Littenberg, Krumholz & Mentlik, LLP

(57) ABSTRACT

The present specification relates to a polymer comprising: a first unit represented by Formula 1; and a second unit represented by Formula 2, a coating composition comprising the same, and an organic light emitting device formed by using the same.

18 Claims, 1 Drawing Sheet

(51) Int. Cl.
  *H01L 51/00* (2006.01)
  *C08F 212/14* (2006.01)
  *H01L 51/50* (2006.01)
  *H01L 51/56* (2006.01)

(52) U.S. Cl.
  CPC .......... *C08F 212/32* (2013.01); *H01L 51/004* (2013.01); *H01L 51/0043* (2013.01); *H01L 51/0004* (2013.01); *H01L 51/0026* (2013.01); *H01L 51/5012* (2013.01); *H01L 51/5056* (2013.01); *H01L 51/5088* (2013.01); *H01L 51/56* (2013.01)

(56) References Cited

U.S. PATENT DOCUMENTS

| | | | |
|---|---|---|---|
| 2012/0074360 | A1 | 3/2012 | Funyuu et al. |
| 2015/0094437 | A1 | 4/2015 | Caille et al. |
| 2016/0025998 | A1 | 1/2016 | Ruhland et al. |
| 2017/0062724 | A1 | 3/2017 | Shibata et al. |
| 2017/0186969 | A1 | 6/2017 | Kim et al. |
| 2017/0342181 | A1 | 11/2017 | Morooka |

FOREIGN PATENT DOCUMENTS

| | | |
|---|---|---|
| JP | 2015035629 A | 2/2015 |
| JP | 2017048290 A | 3/2017 |
| KR | 20040028954 A | 4/2004 |
| KR | 20140107594 A | 9/2014 |
| WO | 2005049548 A1 | 6/2005 |
| WO | 2005052027 A1 | 6/2005 |
| WO | 2016096851 A1 | 6/2016 |
| WO | 2017031622 A1 | 3/2017 |
| WO | 2017107117 A1 | 6/2017 |

OTHER PUBLICATIONS

Huang et al., "Cross-Linkable Hole-Transport Materials Improve the Device Performance of Perovskite Light-Emitting Diodes", ACS Applied Materials Interfaces, Sep. 2016, vol. 8, No. 40, pp. 27006?27011.
International Search Report from Application No. PCT/KR2019/002321 dated May 28, 2019, 3 pages.
Ma et al., "Nevv Thermally Cross-Linkable Polymer and Its Application as a Hole-Transporting Layer for Solution Processed Multilayer Organic Light Emitting Diodes", Chemistry of Materials, Jul. 2007, vol. 19, No. 19, pp. 4827-4832.

| 701 |
|---|
| 601 |
| 501 |
| 401 |
| 301 |
| 201 |
| 101 |

POLYMER, COATING COMPOSITION COMPRISING SAME, AND ORGANIC LIGHT EMITTING DIODE USING SAME

CROSS-REFERENCE TO RELATED APPLICATIONS

This application is a national phase entry under 35 U.S.C. § 371 of International Application No. PCT/KR2019/002321 filed Feb. 26, 2019, which claims priority from Korean Patent Application No. 10-2018-0024571 filed Feb. 28, 2018, all of which are incorporated herein by reference.

TECHNICAL FIELD

The present specification relates to a polymer, a coating composition comprising the same, and an organic light emitting device formed by using the same.

BACKGROUND ART

An organic light emission phenomenon is one of the examples of converting an electric current into visible rays through an internal process of a specific organic molecule. The principle of the organic light emission phenomenon is as follows. When an organic material layer is disposed between an anode and a cathode, if an electric current is applied between the two electrodes, electrons and holes are injected into the organic material layer from the cathode and the anode, respectively. The electrons and the holes which are injected into the organic material layer are recombined to form an exciton, and the exciton falls down again to the ground state to emit light. An organic electroluminescent device using the principle may be generally composed of a cathode, an anode, and an organic material layer disposed therebetween, for example, an organic material layer comprising a hole injection layer, a hole transport layer, a light emitting layer, an electron transport layer, and an electron injection layer.

A material used in the organic light emitting device is mostly a pure organic material or a complex compound where an organic material and metal form a complex, and may be classified into a hole injection material, a hole transport material, a light emitting material, an electron transport material, an electron injection material, and the like according to the use thereof. Herein, an organic material having a p-type property, that is, an organic material, which is easily oxidized and has an electrochemically stable state during oxidation, is usually used as the hole injection material or the hole transport material. Meanwhile, an organic material having an n-type property, that is, an organic material, which is easily reduced and has an electrochemically stable state during reduction, is usually used as the electron injection material or the electron transport material. As the light emitting material, a material having both p-type and n-type properties, that is, a material having a stable form in both oxidation and reduction states is preferred, and a material having high light emitting efficiency for converting an exciton into light when the exciton is formed is preferred.

In addition to those mentioned above, it is preferred that the material used in the organic light emitting device additionally has the following properties.

First, it is preferred that the material used in the organic light emitting device has excellent thermal stability. This is because joule heating occurs due to the movement of electric charges in the organic light emitting device. Since N,N"-di(1-naphthyl)-N,N"-diphenyl-(1,1"-biphenyl)-4,4"-diamine (NPB) currently and mainly used as a hole transport layer material has a glass transition temperature value of 100° C. or less, there is a problem in that it is difficult to use the material in an organic light emitting device requiring a high electric current.

Second, in order to obtain a high-efficiency organic light emitting device which is capable of being driven at low voltage, it is necessary for holes or electrons injected into the organic light emitting device to be smoothly transferred to a light emitting layer, and simultaneously, it is necessary for the injected holes and electrons not to go out of the light emitting layer. For this purpose, a material used in the organic light emitting device needs to have an appropriate band gap and an appropriate highest occupied molecular orbital (HOMO) or lowest unoccupied molecular orbital (LUMO) energy level. Since poly(3,4-ethylenediocythiophene) doped: poly(styrenesulfonic acid) (PEDOT:PSS) currently used as a hole transport material in an organic light emitting device to be manufactured by a solution application method has a lower LUMO energy level than the LUMO energy level of an organic material used as a light emitting layer material, it is difficult to manufacture an organic light emitting device having high efficiency and a long service life.

In addition, the material used in the organic light emitting device needs to have excellent chemical stability, excellent charge mobility, excellent interface characteristics with electrodes or adjacent layers, and the like. That is, the material used in the organic light emitting device needs to be minimally deformed by moisture or oxygen. Further, by having appropriate hole or electron mobility to make a balance between densities of holes and electrons in a light emitting layer of the organic light emitting device, the material used in the organic light emitting device needs to enable excitons to be maximally formed. Moreover, the material used in the organic light emitting device needs to enable the interface with an electrode including a metal or a metal oxide to be improved for the stability of the device.

In addition to those mentioned above, a material used in an organic light emitting device for a solution process needs to additionally have the following properties.

First, the material used in the organic light emitting device needs to form a storable homogenous solution. Since a commercialized material for a deposition process has good crystallinity so that the material is not dissolved well in a solution or the crystals thereof are easily formed even though the material forms a solution, it is highly likely that according to the storage period, the concentration gradient of the solution varies or a defective device is formed.

Second, layers where the solution process is performed need to have solvent and material resistance to other layers. For this purpose, a material capable of forming a polymer self-crosslinked on a substrate through a heat treatment or ultraviolet (UV) irradiation after a curing group is introduced and a solution is applied, like N4,N4"-di(naphthalen-1-yl)-N4,N4"-bis(4-vinylphenyl)biphenyl-4,4"-diamine (VNPB), or capable of forming a polymer having sufficient resistance in the next process is preferred, and a material capable of having solvent resistance itself, like hexaazatriphenylenehexacarbonitrile (HATCN), is also preferred. Since an arylamine-based single molecule generally used in an organic light emitting device (OLED) itself does not have resistance to a solvent in the next process in any cases, a curing group needs to be introduced into the arylamine-based single molecule compound which can be used in the OLED for a solution process.

Therefore, there is a need for developing an organic material having the aforementioned requirements in the art.

DETAILED DESCRIPTION OF INVENTION

Technical Problem

The present specification has been made in an effort to provide a polymer, a coating composition comprising the same, and an organic light emitting device formed by using the same.

Technical Solution

The present specification provides a polymer comprising: a first unit represented by the following Formula 1; and a second unit represented by the following Formula 2.

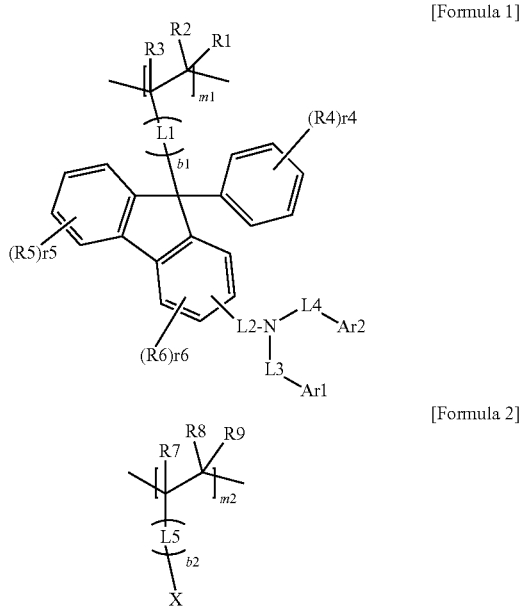

[Formula 1]

[Formula 2]

In Formulae 1 and 2,

X is a curing group,

L1 to L5 are the same as or different from each other, and are each independently a direct bond; —O—; a substituted or unsubstituted alkylene group; a substituted or unsubstituted arylene group; a substituted or unsubstituted divalent amine group; or a substituted or unsubstituted heteroarylene group, b1 and b2 are each an integer from 1 to 10, when b1 and b2 are each 2 or more, two or more L1s and L5s are each the same as or different from each other, Ar1 and Ar2 are the same as or different from each other, and are each independently a substituted or unsubstituted aryl group, R1 to R9 are the same as or different from each other, and are each independently hydrogen; deuterium; a halogen group; a hydroxyl group; a nitrile group; a substituted or unsubstituted alkyl group; a substituted or unsubstituted cycloalkyl group; a substituted or unsubstituted aryl group; or a substituted or unsubstituted heterocyclic group, r4 is an integer from 1 to 5,
r5 is an integer from 1 to 4,
r6 is an integer from 1 to 3, when r4 to r6 are each 2 or more, two or more R4s to R6s are each the same as or different from each other, m1 is a mole fraction and 0<m1<1,
m2 is a mole fraction and 0<m2<1, and
m1+m2≤1.

Further, the present specification provides a coating composition comprising the polymer.

In addition, the present specification provides an organic light emitting device comprising: a first electrode; a second electrode provided to face the first electrode; and an organic material layer having one or more layers provided between the first electrode and the second electrode, in which one or more layers of the organic material layer comprise a cured product of the coating composition.

Advantageous Effects

An organic material layer formed by using the polymer according to an exemplary embodiment of the present specification has excellent thermal and optical stability after curing through heat and light and does not have solubility to other solvents, so that a stacking film-formation process may be performed on the formed film through another solvent process.

Further, the polymer according to an exemplary embodiment of the present specification is used as a material for an organic material layer of an organic light emitting device, so that it is possible to lower a driving voltage of the organic light emitting device.

In addition, the polymer according to an exemplary embodiment of the present specification is used as a material for an organic material layer of an organic light emitting device, so that it is possible to improve the light efficiency.

Furthermore, the polymer according to an exemplary embodiment of the present specification is used as a material for an organic material layer of an organic light emitting device, so that it is possible to improve service life characteristics of the device.

BRIEF DESCRIPTION OF DRAWINGS

The FIGURE illustrates an example of an organic light emitting device according to an exemplary embodiment of the present specification.

101: Substrate
201: Anode
301: Hole injection layer
401: Hole transport layer
501: Light emitting layer
601: Layer which simultaneously injects and transports electrons
701: Cathode

BEST MODE

Hereinafter, the present specification will be described in more detail.

The present specification provides a polymer comprising: the first unit represented by Formula 1; and the second unit represented by Formula 2.

In an exemplary embodiment of the present specification, a polymer comprising the first unit represented by Formula 1 is a random polymer or a block polymer.

In an exemplary embodiment of the present specification, a polymer comprising the second unit represented by Formula 2 is a random polymer or a block polymer.

In one exemplary embodiment of the present specification, the first unit represented by Formula 1 and the second unit represented by Formula 2 may constitute a random polymer.

In the present specification, the "unit" means a structure in which a monomer is included and repeated in a polymer, and a structure in which the monomer is bonded into the polymer by polymerization.

In the present specification, "comprising a unit" means that the unit is included in a main chain in a polymer.

In the present specification, the "monomer" means a monomer or a unit body which is a unit constituting the polymer.

In an exemplary embodiment of the present specification, the first unit represented by Formula 1 has excellent solubility to an organic solvent. Accordingly, when the polymer comprising the first unit represented by Formula 1 is used in a hole transport layer or a hole injection layer in an organic light emitting device, a solution process is easily applied and uniformity, surface characteristics, and the like of a hole transport layer or hole injection layer manufactured are also excellent, so that it is possible to improve performance and service life characteristics of the device.

In an exemplary embodiment of the present specification, the second unit represented by Formula 2 is derived from a compound having a curing group and a vinyl group. A polymer which does not comprise an additional curing group has a disadvantage in that the polymer cannot exhibit sufficient solvent resistance. However, the second unit represented by Formula 2 according to the present specification may form a cross-linking bond through a heat treatment due to an additional curing group, and has an effect of exhibiting sufficient solvent resistance.

In the present specification, the "curing group" may mean a reactive substituent which cross-links compounds by being exposed to heat and/or light. The cross-linkage may be produced while radicals produced by decomposing carbon-carbon multiple bond and cyclic structures by means of a heat treatment or light irradiation are linked to each other.

In the present specification, the mole fraction refers to a value obtained by dividing the number of moles of the corresponding unit body by the sum of the number of moles (repeating number) of the unit body comprised in a polymer.

When one member is disposed "on" another member in the present specification, this includes not only a case where the one member is brought into contact with another member, but also a case where still another member is present between the two members.

When one part "comprises" one constituent element in the present specification, unless otherwise specifically described, this does not mean that another constituent element is excluded, but means that another constituent element may be further included.

Examples of the substituents in the present specification will be described below, but are not limited thereto.

In the present specification,

means a moiety to be linked.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a nitrile group; an alkyl group; a cycloalkyl group; an amine group; a silyl group; a phosphine oxide group; an aryl group; and a heteroaryl group including one or more of N, O, S, Se, and Si atoms, being substituted with a substituent to which two or more substituents among the substituents exemplified above are linked, or having no substituent.

In the present specification, examples of a halogen group include fluorine, chlorine, bromine or iodine.

In the present specification, for an ether group, the oxygen of the ether group may be substituted with a straight-chained, branched, or cyclic alkyl group having 1 to 30 carbon atoms, or an aryl group having 6 to 30 carbon atoms. Specifically, the ether group may be a compound having the following structural formulae, but is not limited thereto.

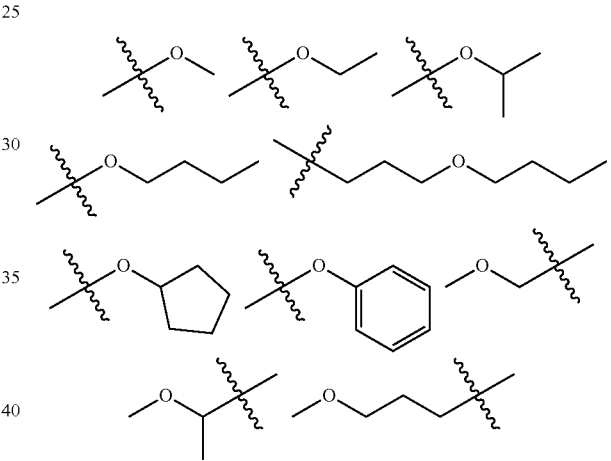

In the present specification, an alkoxy group may be straight-chained, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, examples of an aryloxy group include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthracenyloxy group, a 2-anthracenyloxy group, a 9-anthracenyloxy group, a 1-phenanthryloxy group, a 3-phenanthryloxy group, a 9-phenanthryloxy group, and the like, but are not limited thereto.

In the present specification, an alkyl group may be straight-chained or branch-chained, and the number of carbon atoms thereof is not particularly limited, but is preferably 1 to 50, and more preferably 1 to 30. Specific examples thereof include methyl, ethyl, propyl, n-propyl, isopropyl, butyl, n-butyl, isobutyl, tert-butyl, sec-butyl, 1-methylbutyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 4-methylhexyl, 5-methylhexyl, and the like, but are not limited thereto.

In the present specification, a cycloalkyl group is not particularly limited, but has preferably 3 to 60 carbon atoms, and more preferably 3 to 30 carbon atoms. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, when an aryl group is a monocyclic aryl group, the number of carbon atoms thereof is not particularly limited, but is preferably 6 to 50, and more preferably 6 to 30. Specific examples of the monocyclic aryl group include a phenyl group, a biphenyl group, a terphenyl group, a quaterphenyl group, and the like, but are not limited thereto.

When the aryl group is a polycyclic aryl group, the number of carbon atoms thereof is not particularly limited, but is preferably 10 to 50, and more preferably 10 to 30. Specific examples of the polycyclic aryl group include a naphthyl group, an anthracenyl group, a phenanthryl group, a pyrenyl group, a perylenyl group, a triphenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the substituent may be

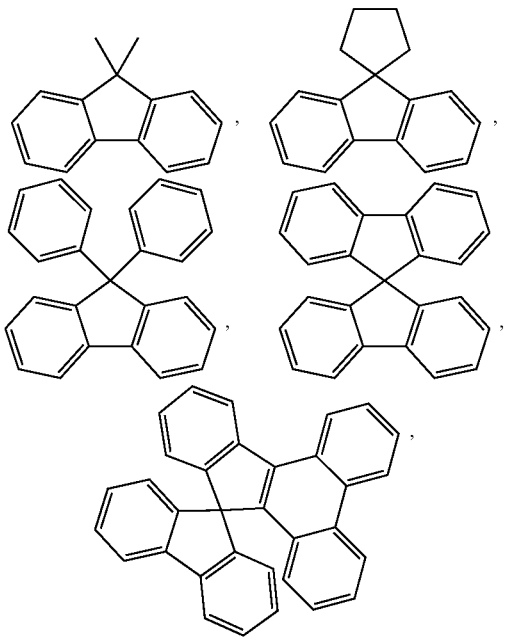

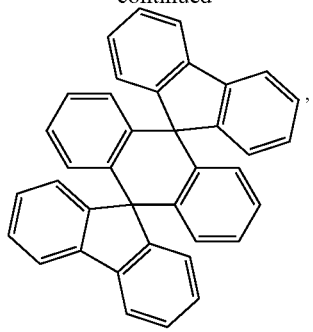

and the like, but is not limited thereto.

In the present specification, a heterocyclic group includes one or more of N, O, S, Si, and Se as a heteroatom, and the number of carbon atoms thereof is not particularly limited, but is preferably 2 to 60, and more preferably 2 to 30. Examples of the heterocyclic group include a thiophene group, a furan group, a pyrrole group, an imidazole group, a triazole group, an oxazole group, an oxadiazole group, a triazole group, a pyridine group, a bipyridine group, a pyrimidine group, a triazine group, an acridine group, a pyridazine group, a pyrazine group, a quinoline group, a quinazoline group, a quinoxaline group, a phthalazine group, a pteridine group, a pyrido pyrimidine group, a pyrido pyrazine group, a pyrazino pyrazine group, an isoquinoline group, an indole group, a pyrido indole group, indeno pyrimidine (5H-indeno pyrimidine), a carbazole group, a benzoxazole group, a benzimidazole group, a benzothiazole group, a benzocarbazole group, a benzothiophene group, a dibenzothiophene group, a benzofuran group, a dibenzofuran group, a phenanthroline group, a thiazolyl group, an isoxazolyl group, an oxadiazolyl group, a thiadiazolyl group, and the like, but are not limited thereto.

In the present specification, a heteroaryl group may be selected from the examples of the heterocyclic group except for an aromatic heteroaryl group, but is not limited thereto.

In the present specification, an alkylene group means a group having two bonding positions in an alkyl group, that is, a divalent group. The above-described description on the alkyl group may be applied to the alkylene group, except for a divalent alkylene group.

In the present specification, an arylene group means a group having two bonding positions in an aryl group, that is, a divalent group. The above-described description on the aryl group may be applied to the arylene group, except for a divalent arylene group.

In the present specification, a heteroarylene group means a group having two bonding positions in a heteroaryl group, that is, a divalent group. The above-described description on the heteroaryl group may be applied to the heteroarylene group, except for a divalent heteroarylene group.

In an exemplary embodiment of the present specification, L1 to L5 are the same as or different from each other, and are each independently a direct bond; —O—; a substituted or unsubstituted alkylene group; a substituted or unsubstituted arylene group; a substituted or unsubstituted divalent amine group; or a substituted or unsubstituted heteroarylene group.

In an exemplary embodiment of the present specification, L1 is a substituted or unsubstituted arylene group having 6 to 30 carbon atoms.

In an exemplary embodiment of the present specification, L1 is a substituted or unsubstituted phenylene group, a substituted or unsubstituted biphenylene group, a substituted or unsubstituted naphthylene group, or a substituted or unsubstituted fluorenylene group.

In an exemplary embodiment of the present specification, L1 is a phenylene group or a biphenylene group.

In an exemplary embodiment of the present specification, L1 is a phenylene group.

In an exemplary embodiment of the present specification, L1 is —O—.

In an exemplary embodiment of the present specification, L1 is a substituted or unsubstituted alkylene group having 1 to 30 carbon atoms.

In an exemplary embodiment of the present specification, L1 is a methylene group, an ethylene group, a propylene group, a butylene group, or a pentylene group.

In an exemplary embodiment of the present specification, L1 is a methylene group.

In an exemplary embodiment of the present specification, L2 is a direct bond.

In an exemplary embodiment of the present specification, L2 is a substituted or unsubstituted arylene group having 6 to 30 carbon atoms.

In an exemplary embodiment of the present specification, L2 is a substituted or unsubstituted phenylene group, a substituted or unsubstituted biphenylene group, a substituted or unsubstituted naphthylene group, or a substituted or unsubstituted fluorenylene group.

In an exemplary embodiment of the present specification, L2 is a phenylene group.

In an exemplary embodiment of the present specification, L3 and L4 are the same as or different from each other, and are each independently a substituted or unsubstituted arylene group having 6 to 30 carbon atoms.

In an exemplary embodiment of the present specification, L3 and L4 are the same as or different from each other, and are each independently a substituted or unsubstituted phenylene group, a substituted or unsubstituted biphenylene group, a substituted or unsubstituted naphthylene group, or a substituted or unsubstituted fluorenylene group.

In an exemplary embodiment of the present specification, L3 is a direct bond.

In an exemplary embodiment of the present specification, L3 is a phenylene group.

In an exemplary embodiment of the present specification, L3 is a biphenylene group.

In an exemplary embodiment of the present specification, L3 is a fluorenylene group which is unsubstituted or substituted with an alkyl group.

In an exemplary embodiment of the present specification, L3 is a fluorenylene group which is unsubstituted or substituted with a methyl group.

In an exemplary embodiment of the present specification, L4 is a direct bond.

In an exemplary embodiment of the present specification, L4 is a phenylene group.

In an exemplary embodiment of the present specification, L4 is a biphenylene group.

In an exemplary embodiment of the present specification, L4 is a fluorenylene group which is unsubstituted or substituted with an alkyl group.

In an exemplary embodiment of the present specification, L4 is a fluorenylene group which is unsubstituted or substituted with a methyl group.

In an exemplary embodiment of the present specification, L5 is a direct bond.

In an exemplary embodiment of the present specification, L5 is a phenylene group.

In an exemplary embodiment of the present specification, L5 is a biphenylene group.

In an exemplary embodiment of the present specification, L5 is a substituted or unsubstituted divalent amine group.

In an exemplary embodiment of the present specification, L5 is a divalent amine group which is unsubstituted or substituted with an aryl group.

In an exemplary embodiment of the present specification, L5 is a divalent amine group which is unsubstituted or substituted with a phenyl group.

In an exemplary embodiment of the present specification, L5 is —O—.

In an exemplary embodiment of the present specification, L5 is a substituted or unsubstituted alkylene group having 1 to 20 carbon atoms.

In an exemplary embodiment of the present specification, L5 is a methylene group, an ethylene group, a propylene group, a butylene group, a pentylene group, or a hexylene group.

In an exemplary embodiment of the present specification, b1 and b2 are each an integer from 1 to 10, and when b1 and b2 are each 2 or more, two or more L1s and L5s are each the same as or different from each other.

In an exemplary embodiment of the present specification, b1 is an integer from 1 to 5.

In an exemplary embodiment of the present specification, b1 is an integer from 1 to 4.

In an exemplary embodiment of the present specification, b1 is an integer from 1 to 3.

In an exemplary embodiment of the present specification, b1 is 1 or 2.

In an exemplary embodiment of the present specification, b2 is 1.

In an exemplary embodiment of the present specification, Ar1 and Ar2 are the same as or different from each other, and are each independently a substituted or unsubstituted aryl group.

In an exemplary embodiment of the present specification, Ar1 and Ar2 are the same as or different from each other, and are each independently a substituted or unsubstituted phenyl group; a substituted or unsubstituted biphenyl group; a substituted or unsubstituted naphthyl group; or a substituted or unsubstituted fluorenyl group.

In an exemplary embodiment of the present specification, Ar1 is a phenyl group.

In an exemplary embodiment of the present specification, Ar1 is a biphenyl group.

In an exemplary embodiment of the present specification, Ar1 is a fluorenyl group which is unsubstituted or substituted with an alkyl group or an aryl group.

In an exemplary embodiment of the present specification, Ar1 is a fluorenyl group which is unsubstituted or substituted with a methyl group or a phenyl group.

In an exemplary embodiment of the present specification, Ar2 is a phenyl group.

In an exemplary embodiment of the present specification, Ar2 is a biphenyl group.

In an exemplary embodiment of the present specification, Ar2 is a fluorenyl group which is unsubstituted or substituted with an alkyl group or an aryl group.

In an exemplary embodiment of the present specification, Ar2 is a fluorenyl group which is unsubstituted or substituted with a methyl group or a phenyl group.

In an exemplary embodiment of the present specification, R1 to R9 are the same as or different from each other, and are each independently hydrogen; deuterium; a halogen group; a hydroxyl group; a nitrile group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, R1 to R3 are hydrogen.

In an exemplary embodiment of the present specification, R4 is a substituted or unsubstituted alkyl group having 1 to 20 carbon atoms.

In an exemplary embodiment of the present specification, R4 is a methyl group, an ethyl group, a propyl group, a butyl group, a pentyl group, a hexyl group, an isopropyl group, or a tert-butyl group.

In an exemplary embodiment of the present specification, R4 is a substituted or unsubstituted aryl group having 6 to 20 carbon atoms.

In an exemplary embodiment of the present specification, R4 is a substituted or unsubstituted phenyl group, a substituted or unsubstituted biphenyl group, a substituted or unsubstituted naphthyl group, or a substituted or unsubstituted fluorenyl group.

In an exemplary embodiment of the present specification, R4 is hydrogen.

In an exemplary embodiment of the present specification, R5 to R9 are each hydrogen.

In an exemplary embodiment of the present specification, r4 is an integer from 1 to 5, r5 is an integer from 1 to 4, r6 is an integer from 1 to 3, and when r4 to r6 are each 2 or more, two or more R4s to R6s are each the same as or different from each other.

In an exemplary embodiment of the present specification, m1 is a mole fraction and 0<m1<1, m2 is a mole fraction and 0<m2<1, and m1+m2≤1.

In an exemplary embodiment of the present specification, m1 is 0.01<m1<0.99, and m2 is 0.01<m2<0.59.

In an exemplary embodiment of the present specification, m1 is 0.5<m1<0.99, and m2 is 0.01<m2<0.5.

In an exemplary embodiment of the present specification, m1>m2.

In an exemplary embodiment of the present specification, m1+m2 is 1.

In an exemplary embodiment of the present specification, X is a curing group.

In an exemplary embodiment of the present specification, X may be any one selected from the following structures.

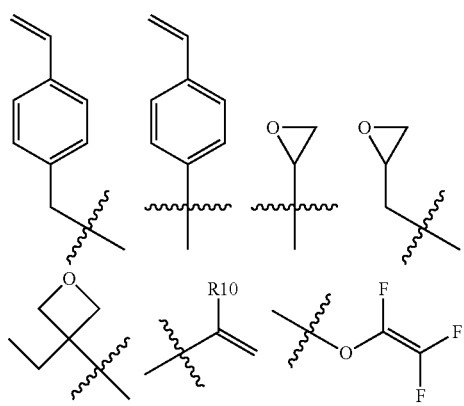

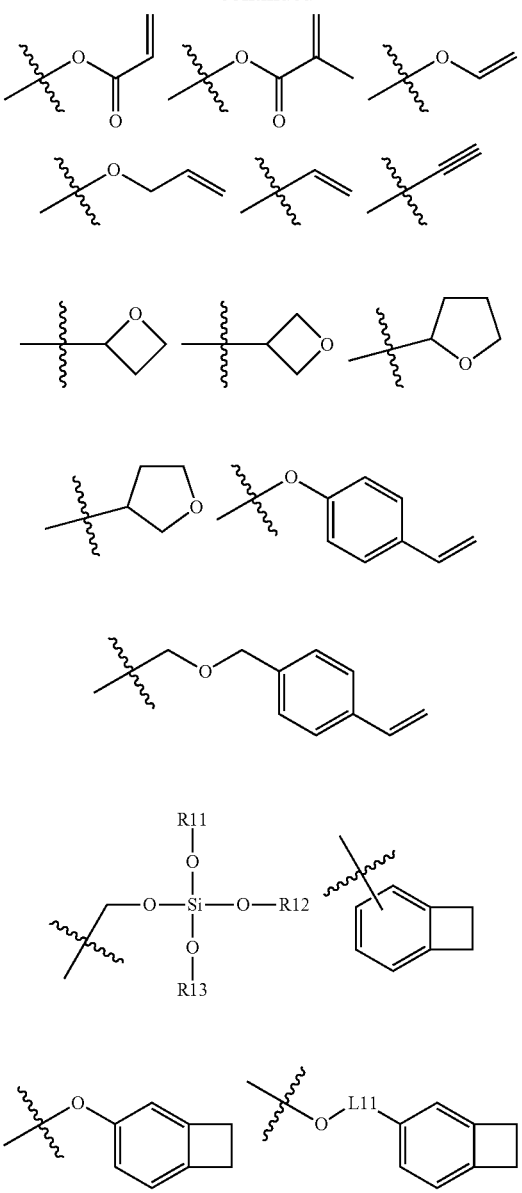

In the structures,

L11 is a substituted or unsubstituted alkylene group; or a substituted or unsubstituted arylene group, and R10 to R13 are the same as or different from each other, and are each independently hydrogen; or a substituted or unsubstituted alkyl group having 1 to 6 carbon atoms.

In an exemplary embodiment of the present specification, X is cyclobutabenzene or oxetane.

When X is cyclobutabenzene or oxetane, there are advantages in that the structure is not damaged during the process (AIBN: a radical initiation reaction using azobisisobutyronitrile) of vinyl polymerization, and when heat is subsequently applied, curing begins, and as a result, a cross-linked polymer may be formed, and the polymer exhibits high resistance, and thus is easy to be used for the solution process.

In an exemplary embodiment of the present specification, Formula 1 is represented by the following Formula 101.

[Formula 101]

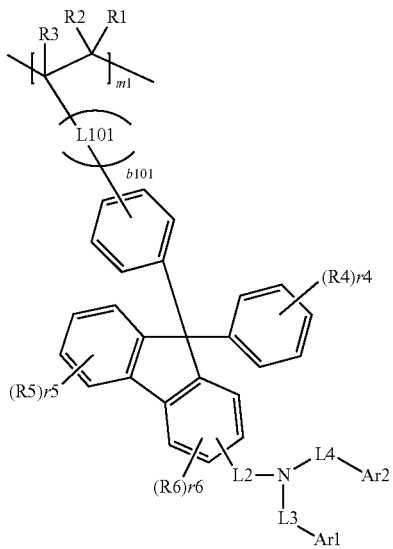

In Formula 101,
definitions of L2 to L4, Ar1, Ar2, R1 to R6, r4 to r6, and m1 are the same as those defined in Formula 1, L101 is a direct bond; —O—; a substituted or unsubstituted alkylene group; a substituted or unsubstituted arylene group; a substituted or unsubstituted divalent amine group; or a substituted or unsubstituted heteroarylene group, and b101 is an integer from 1 to 9.

In an exemplary embodiment of the present specification, L101 of Formula 101 is the same as the definition of L1 of Formula 1.

In an exemplary embodiment of the present specification, b101 of Formula 101 is an integer from 1 to 4.

In an exemplary embodiment of the present specification, b101 of Formula 101 is an integer from 1 to 3.

In an exemplary embodiment of the present specification, b101 of Formula 101 is 1 or 2.

In an exemplary embodiment of the present specification, Formula 1 is represented by the following Formula 102.

[Formula 102]

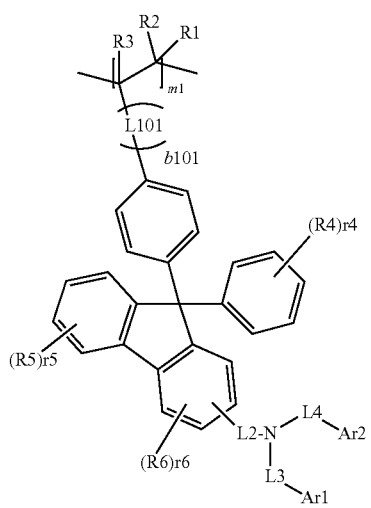

In Formula 102,
definitions of L2 to L4, Ar1, Ar2, R1 to R6, r4 to r6, and m1 are the same as those defined in Formula 1, L101 is a direct bond; —O—; a substituted or unsubstituted alkylene group; a substituted or unsubstituted arylene group; a substituted or unsubstituted divalent amine group; or a substituted or unsubstituted heteroarylene group, and b101 is an integer from 1 to 9.

In an exemplary embodiment of the present specification, L101 of Formula 102 is the same as the definition of L1 of Formula 1.

In an exemplary embodiment of the present specification, b101 of Formula 102 is an integer from 1 to 4.

In an exemplary embodiment of the present specification, b101 of Formula 102 is an integer from 1 to 3.

In an exemplary embodiment of the present specification, b101 of Formula 102 is 1 or 2.

In an exemplary embodiment of the present specification, the first unit represented by Formula 1 may be represented by any one of the following structures.

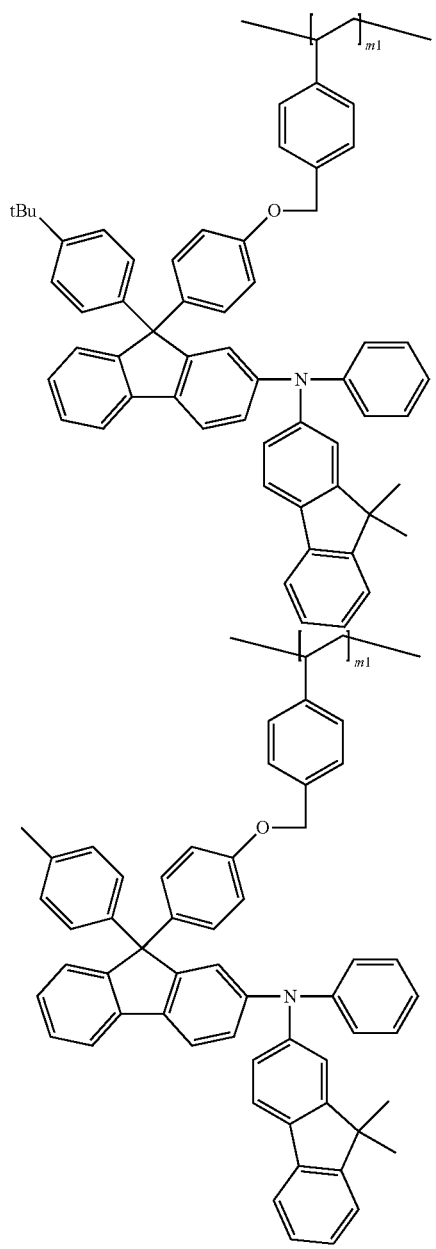

-continued
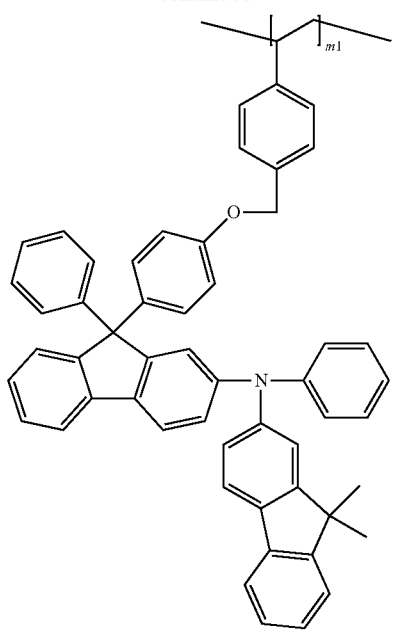
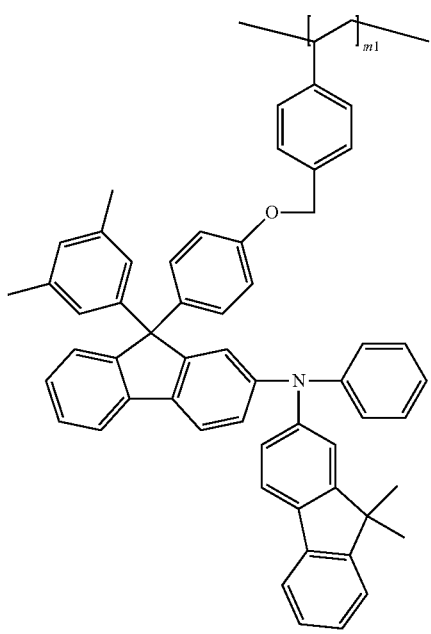
-continued
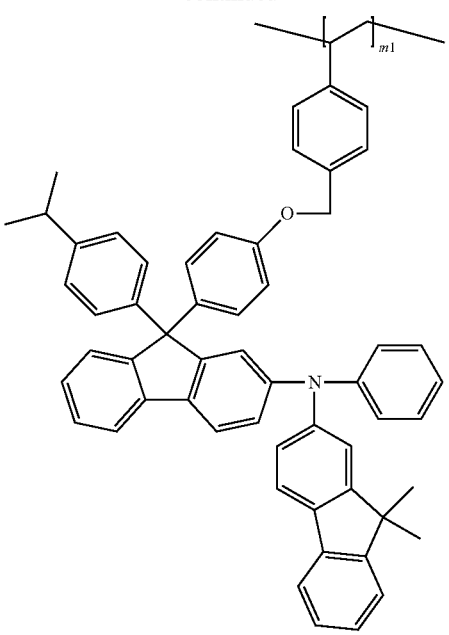
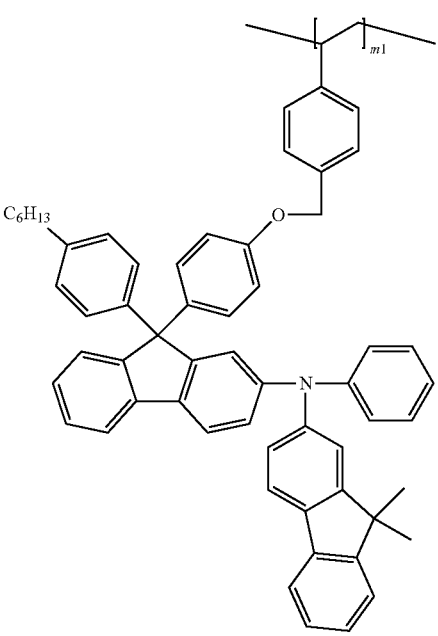

17
-continued
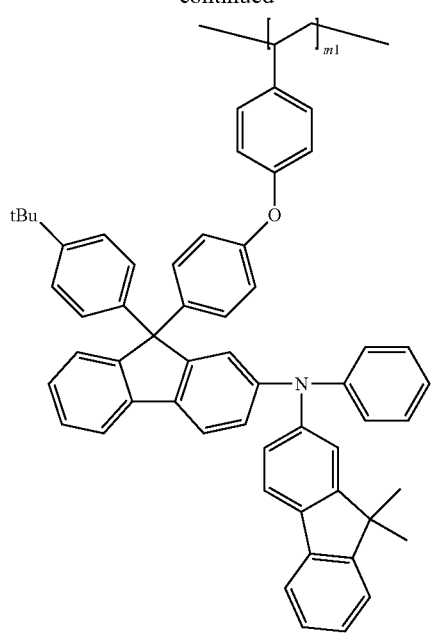
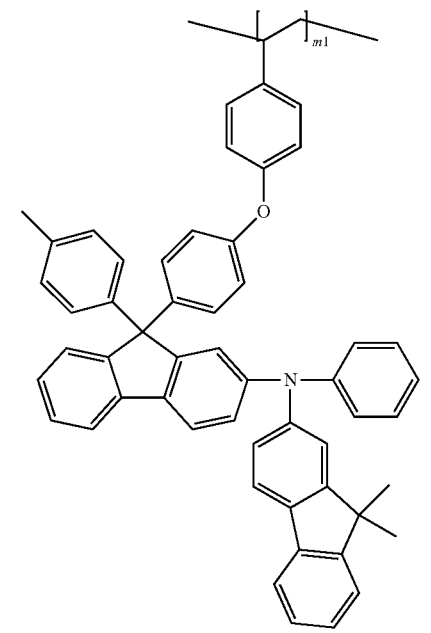
18
-continued
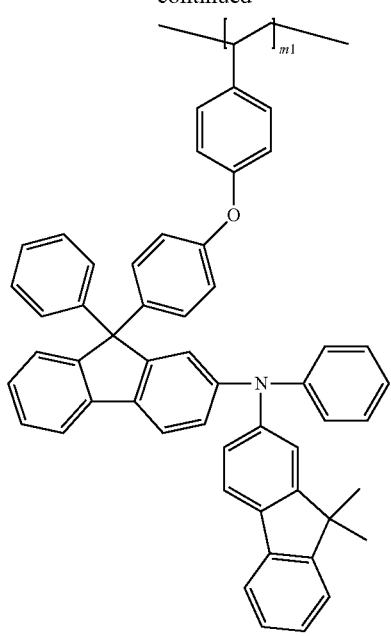
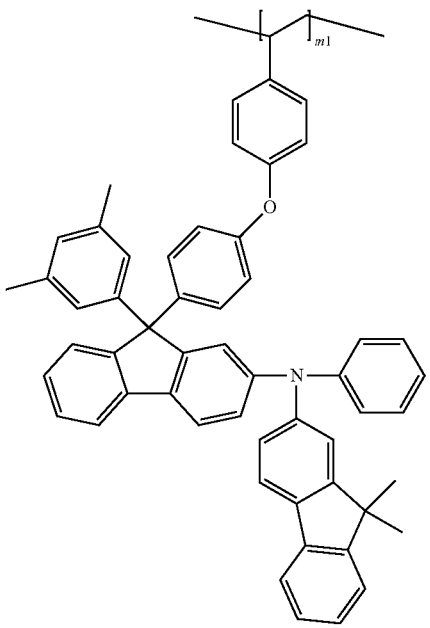

19
-continued
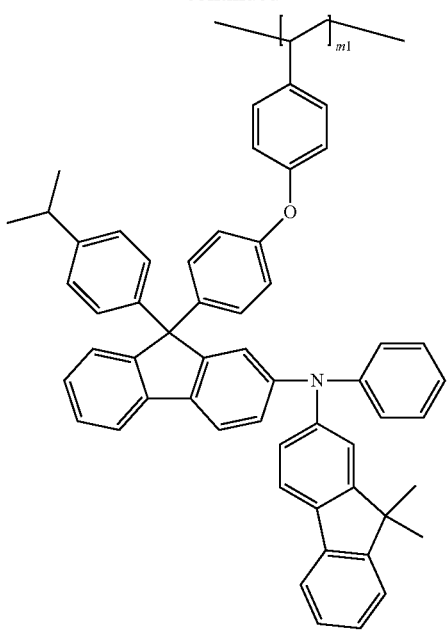
20
-continued
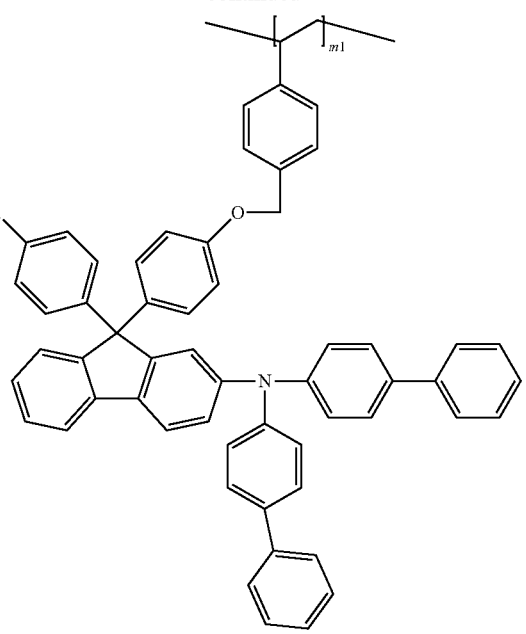

21
-continued
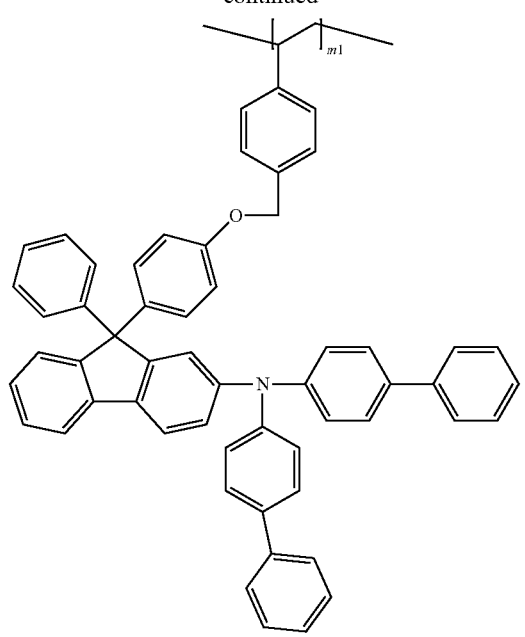
22
-continued
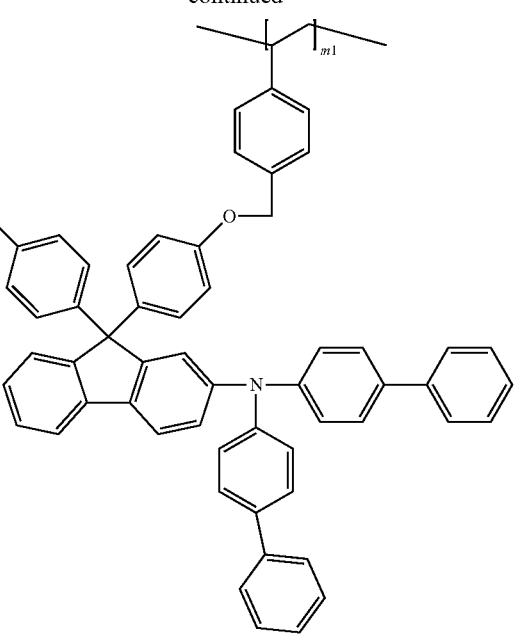
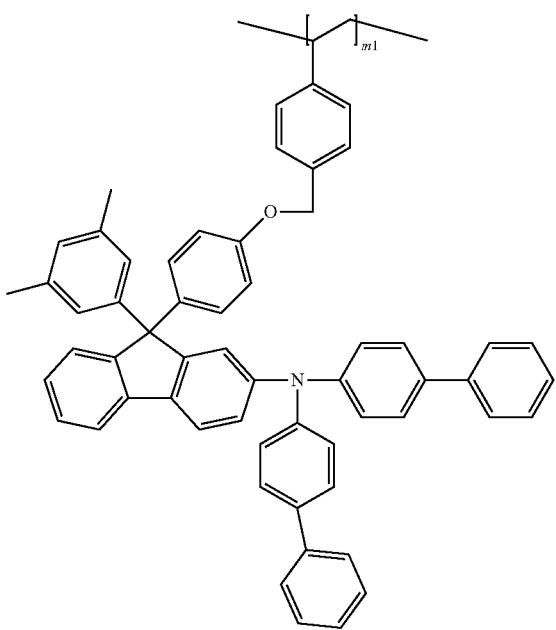
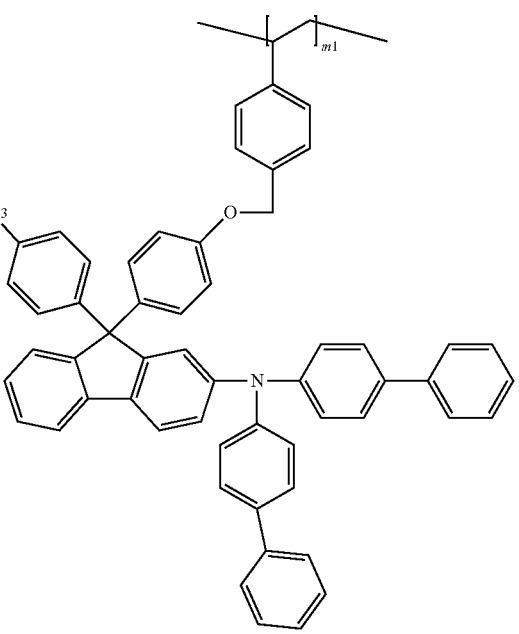

23
-continued
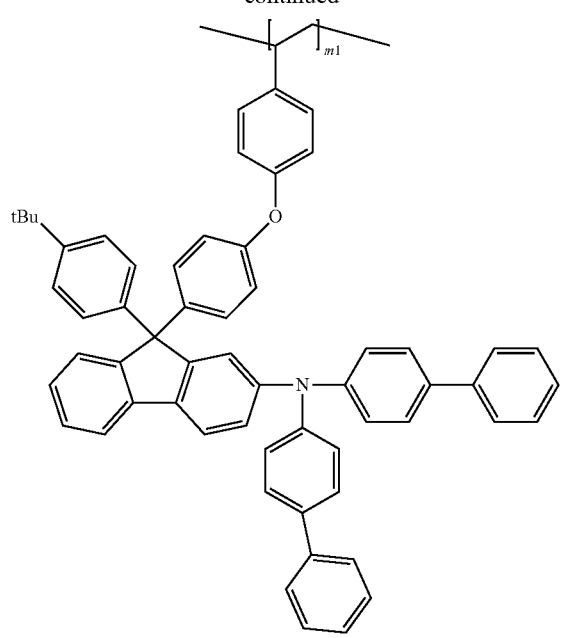
24
-continued
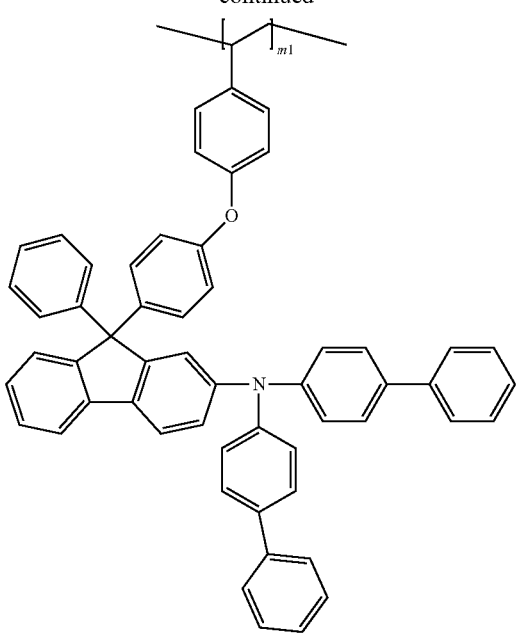
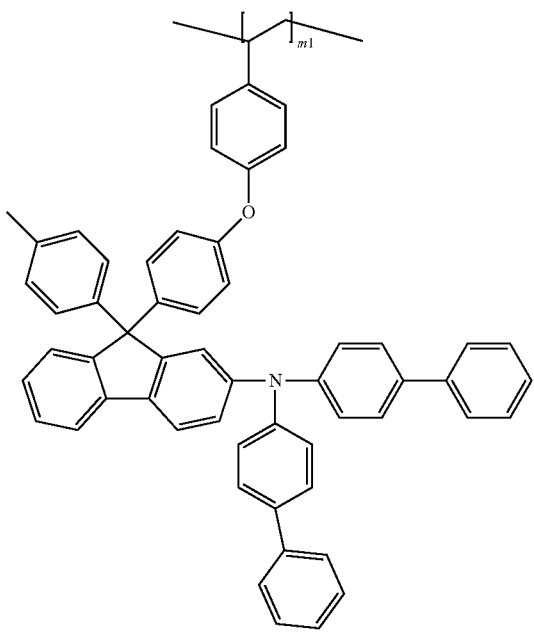

25
-continued
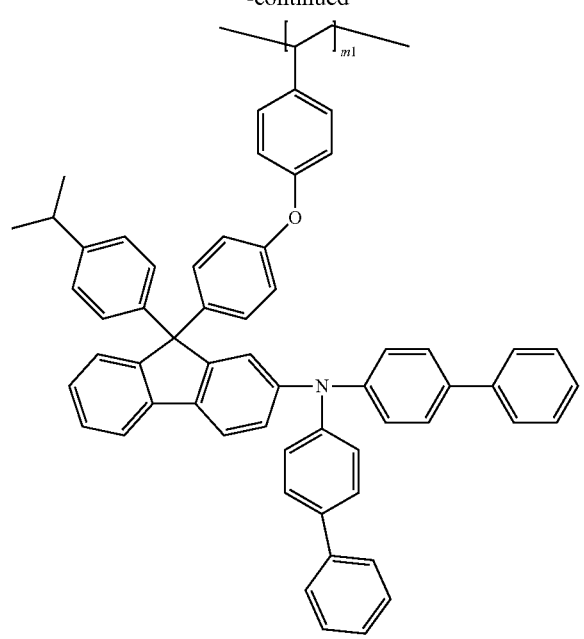
26
-continued
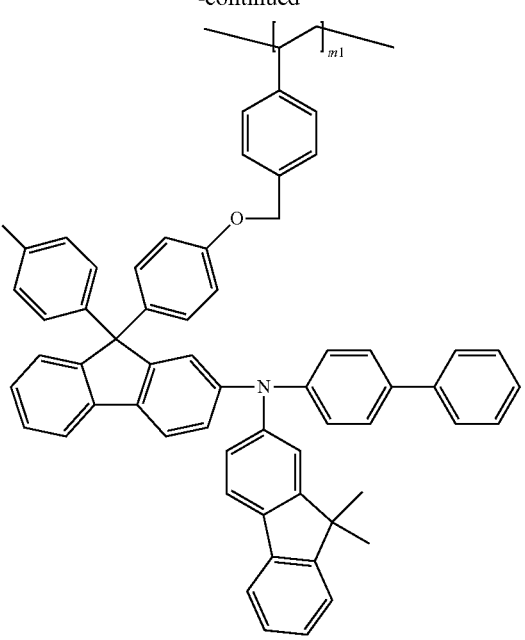
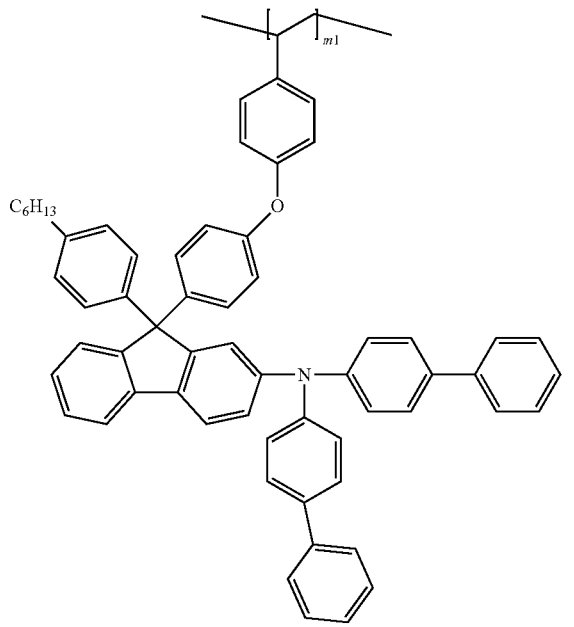
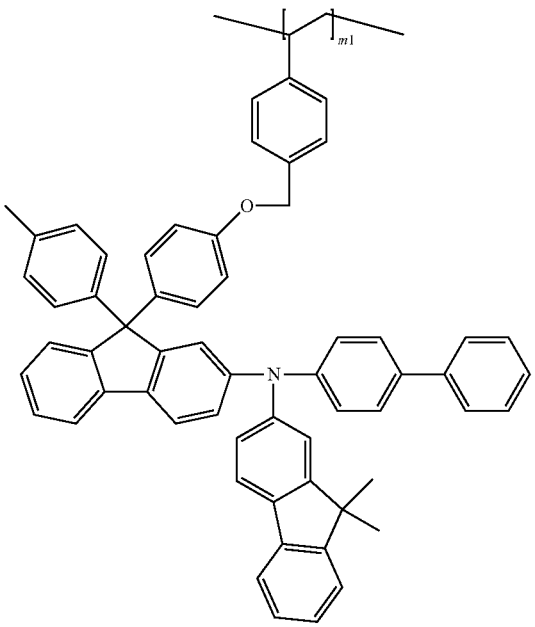

-continued
27
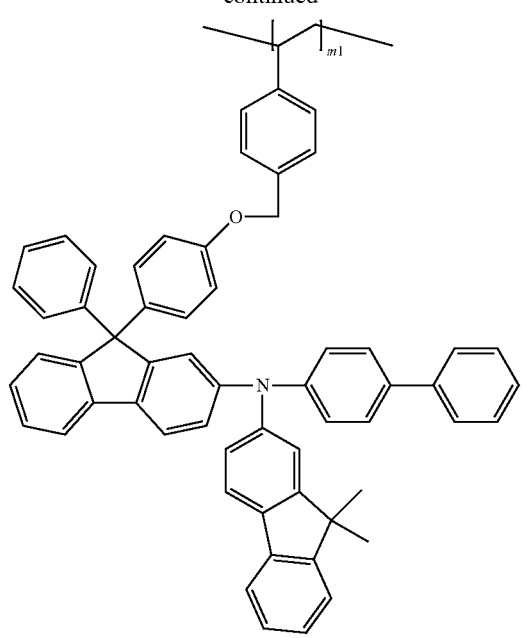
28
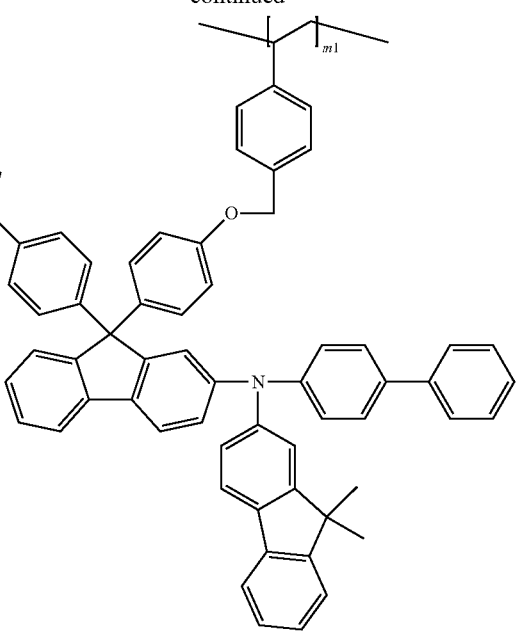
-continued
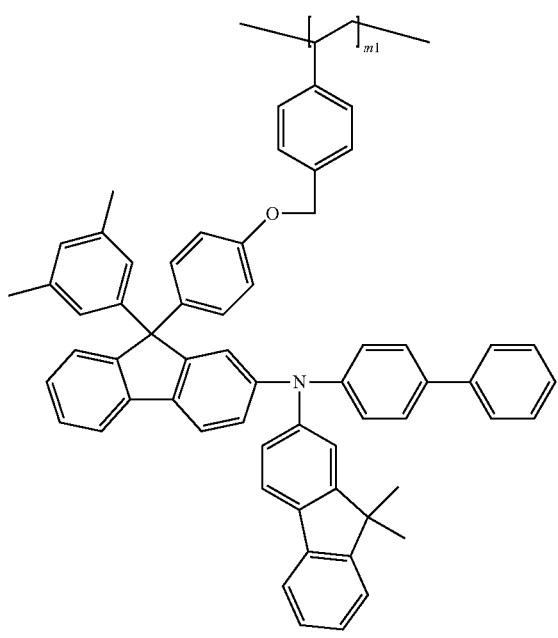
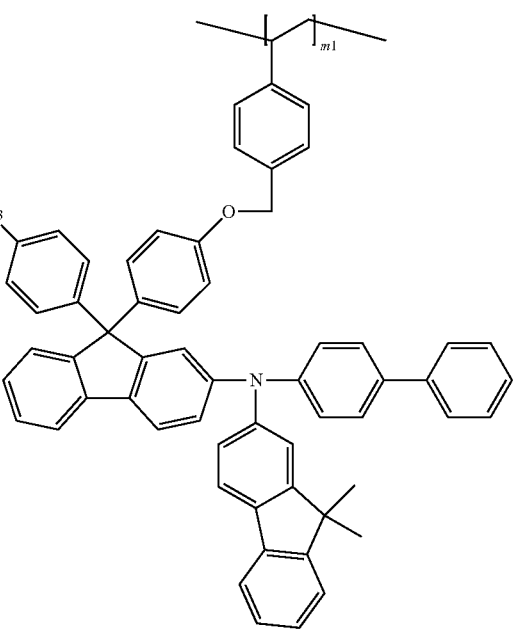

29
-continued
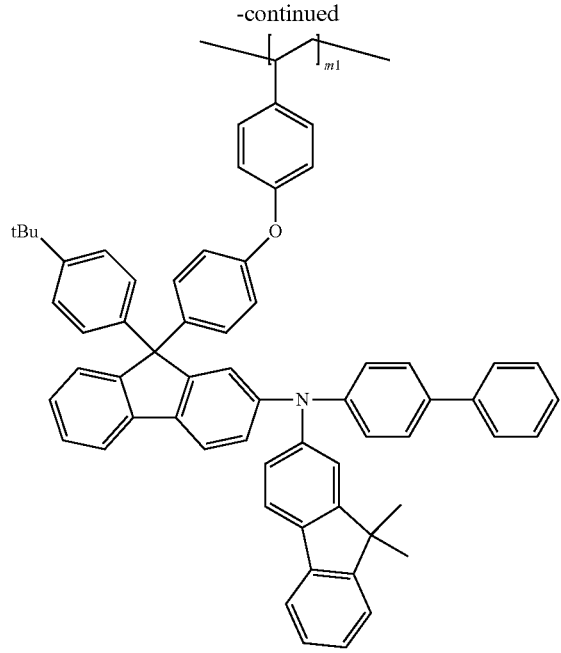
30
-continued
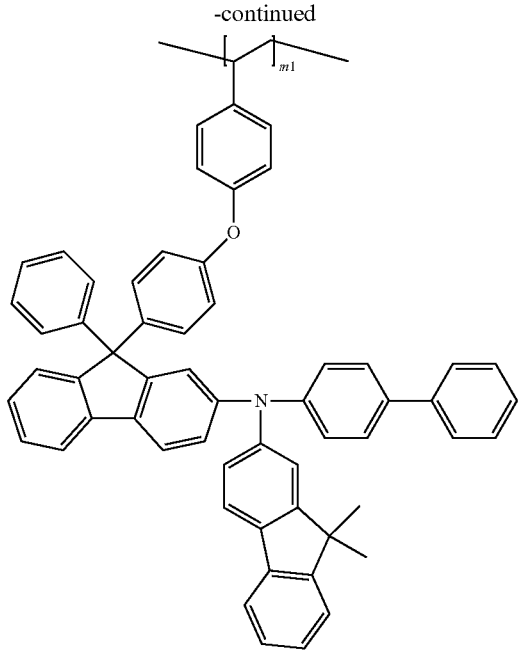
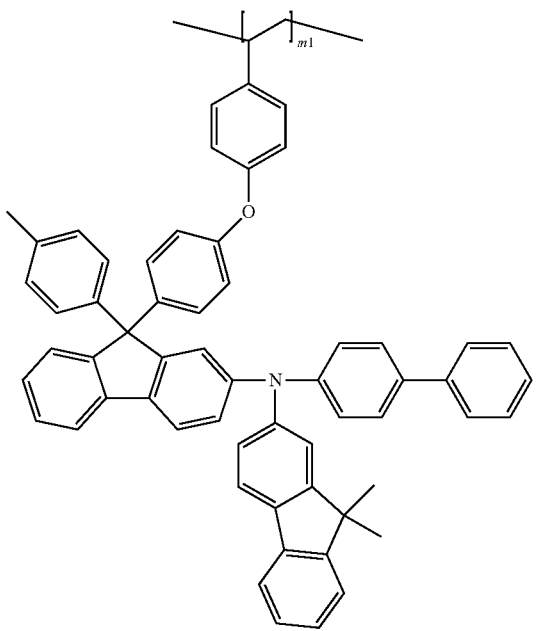
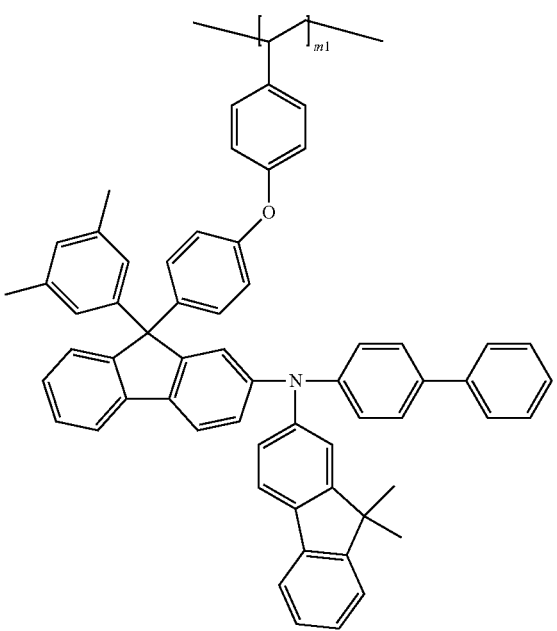

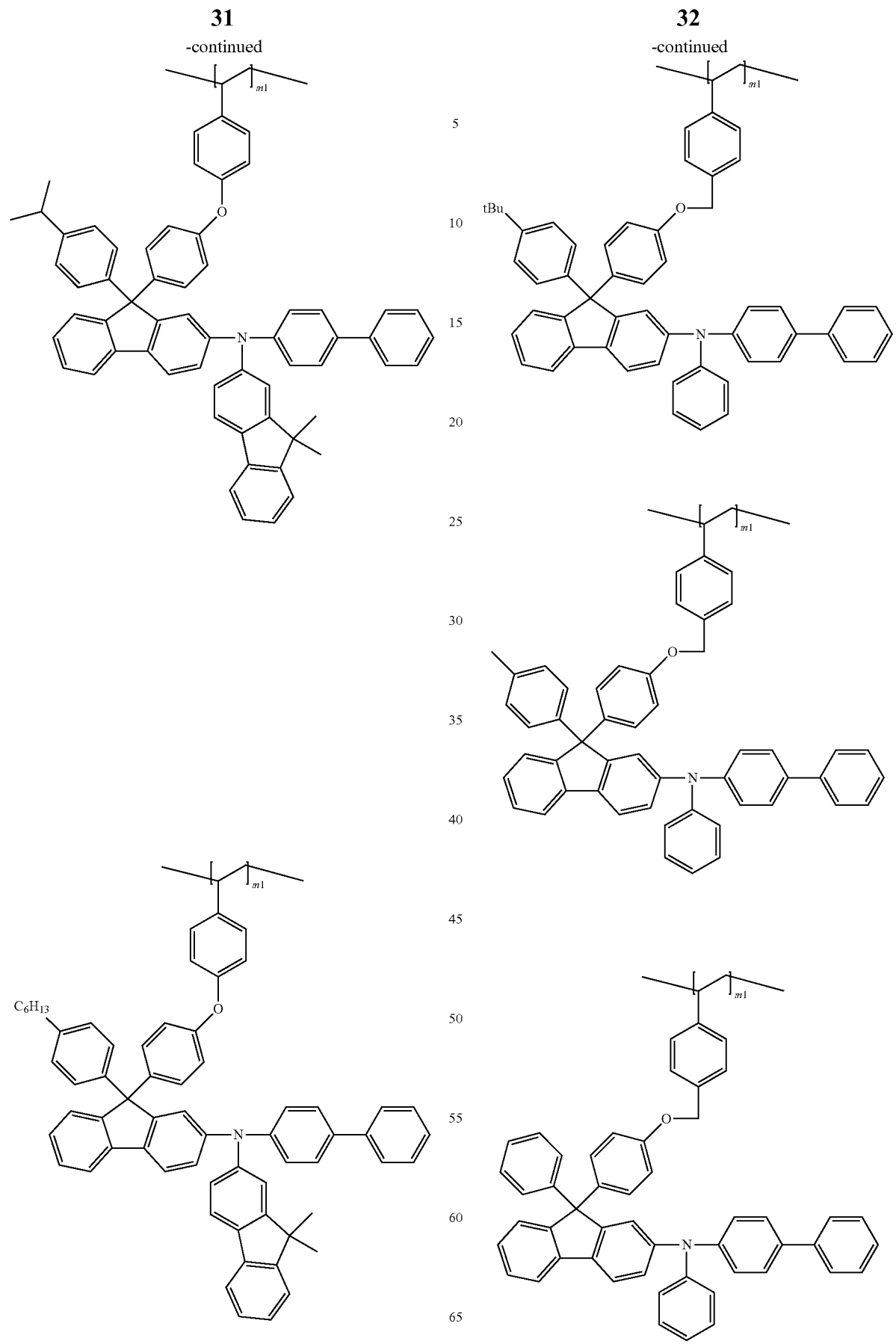

33
-continued
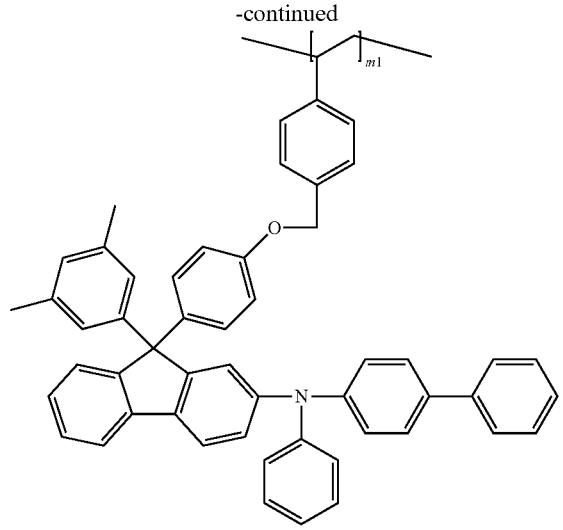
34
-continued
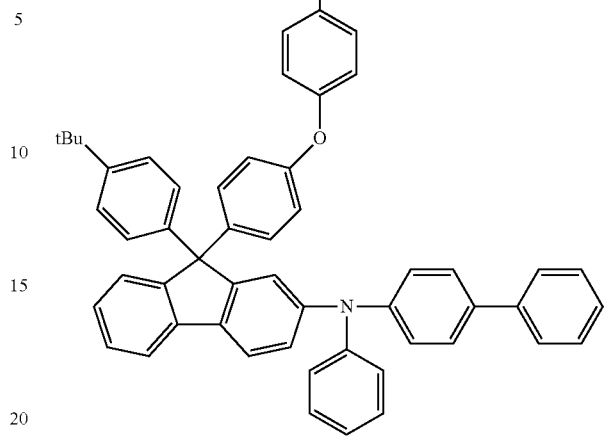
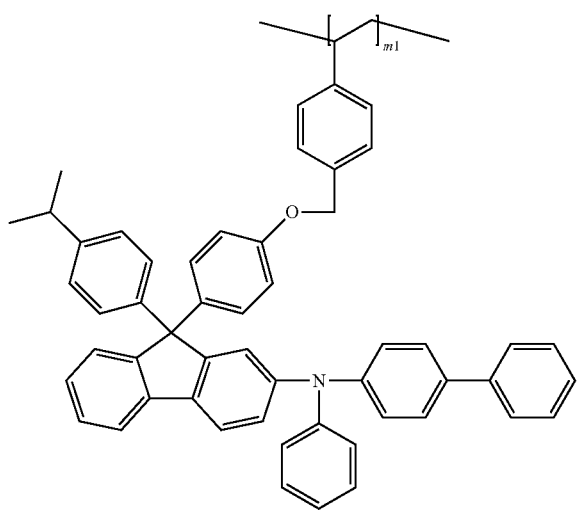
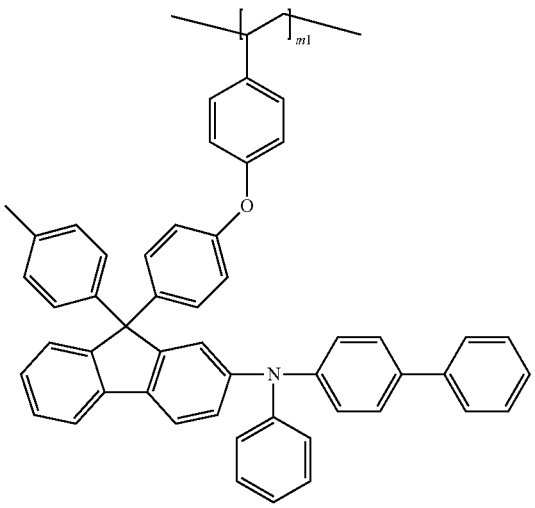
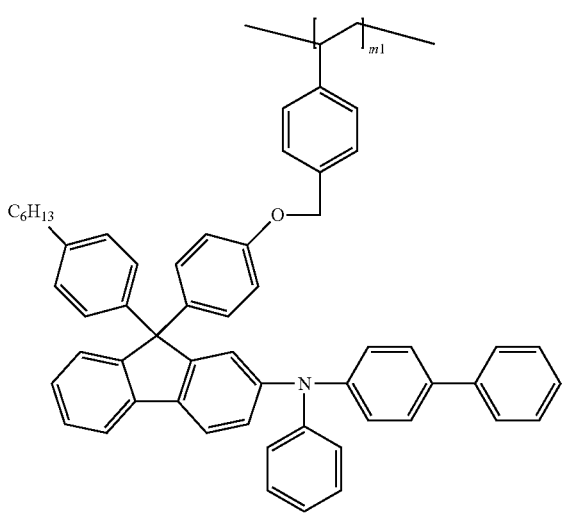
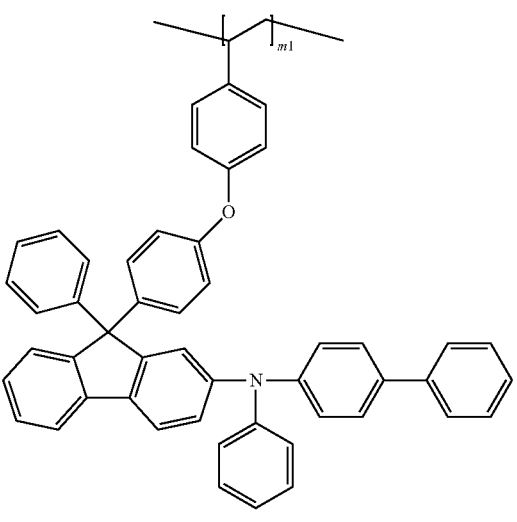

-continued
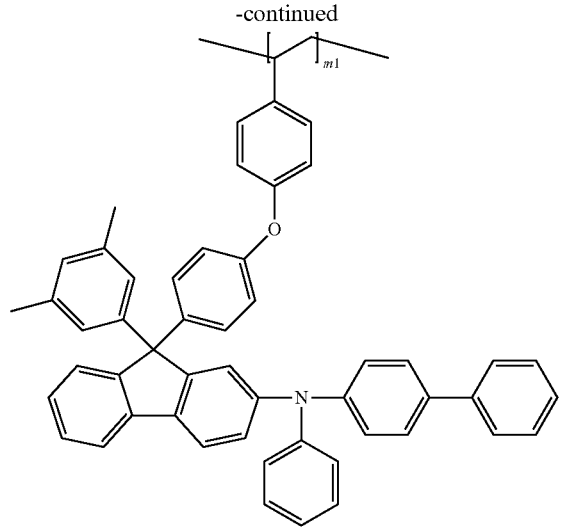
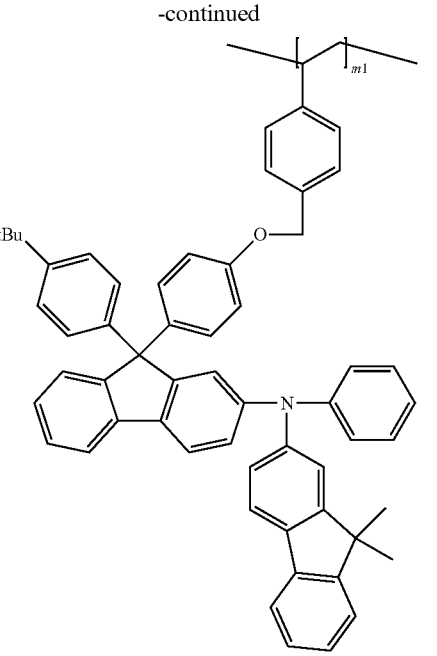
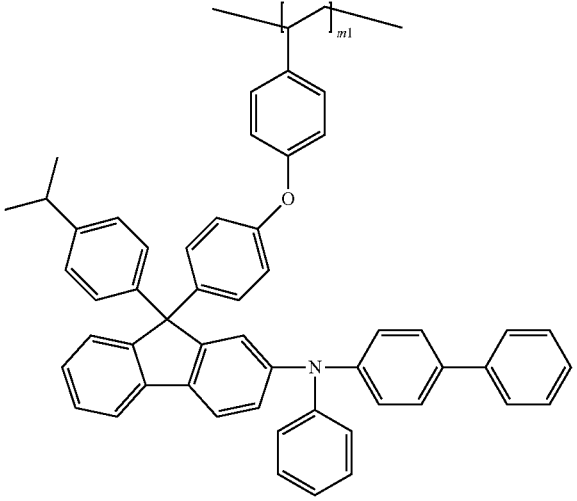
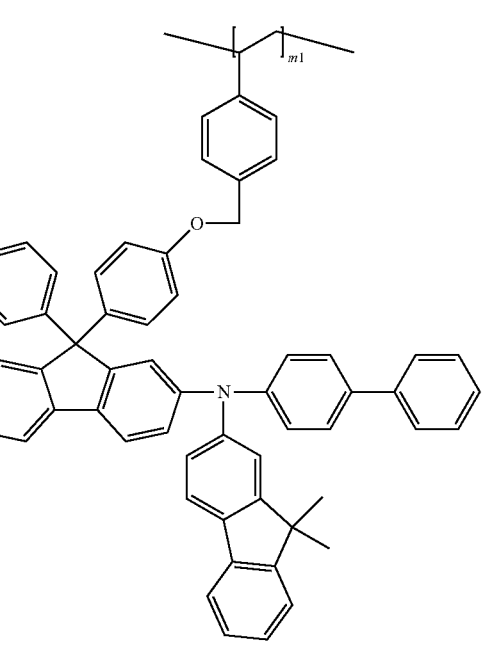

37
-continued
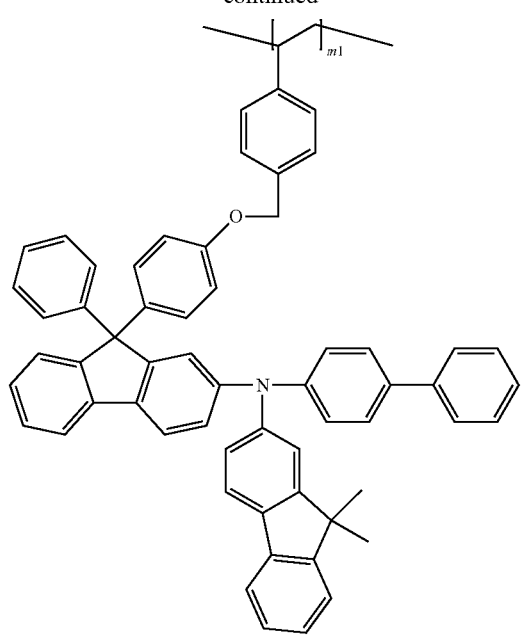
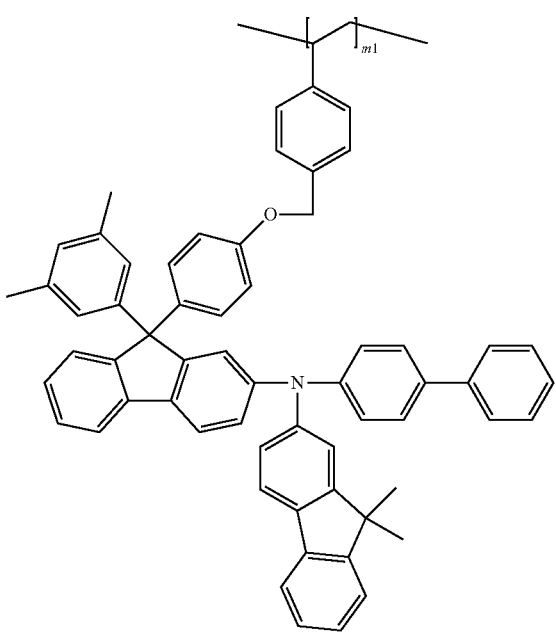
38
-continued
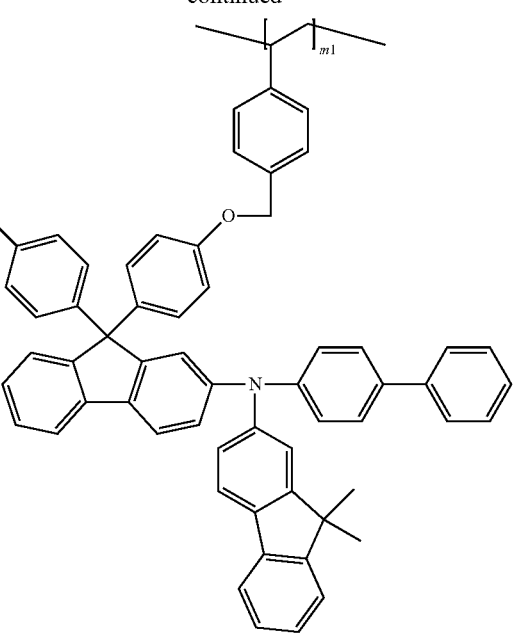
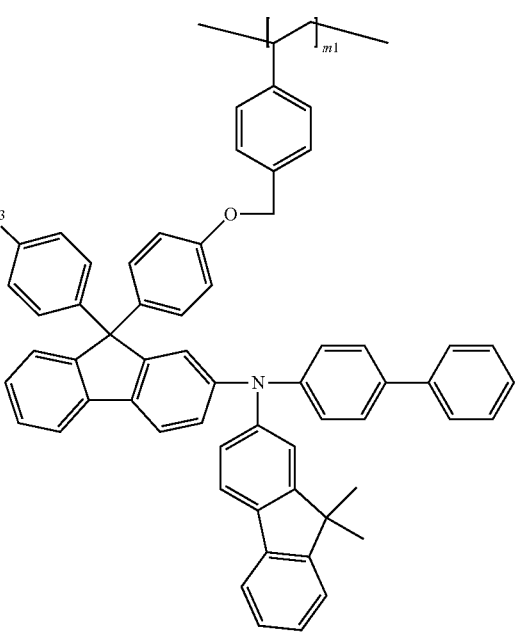

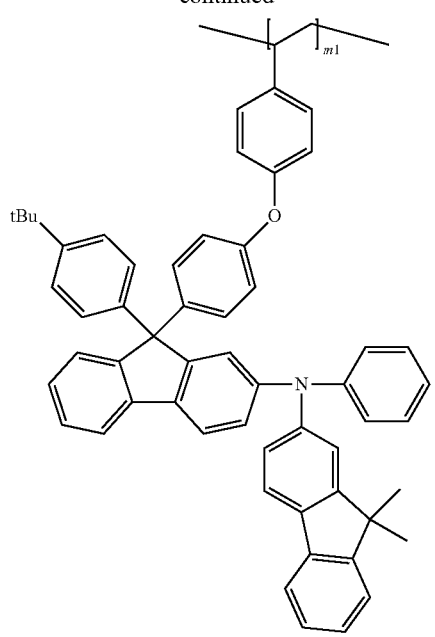
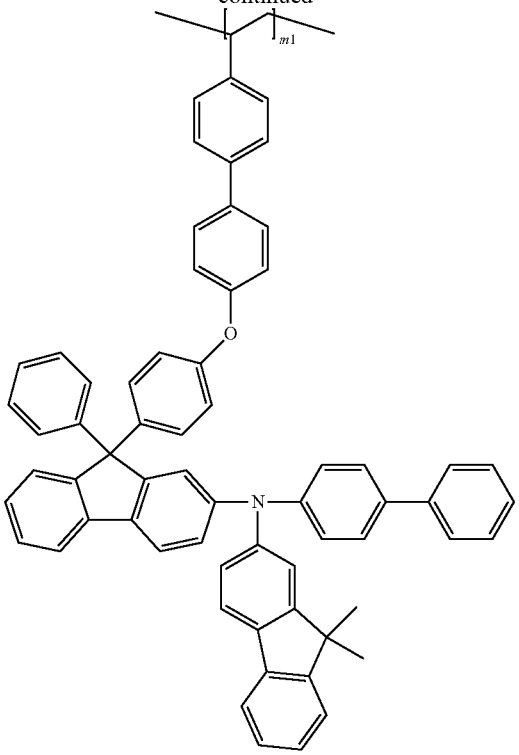
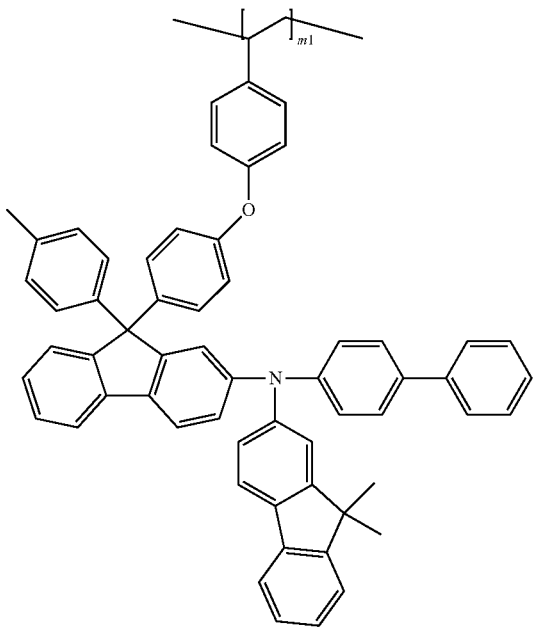
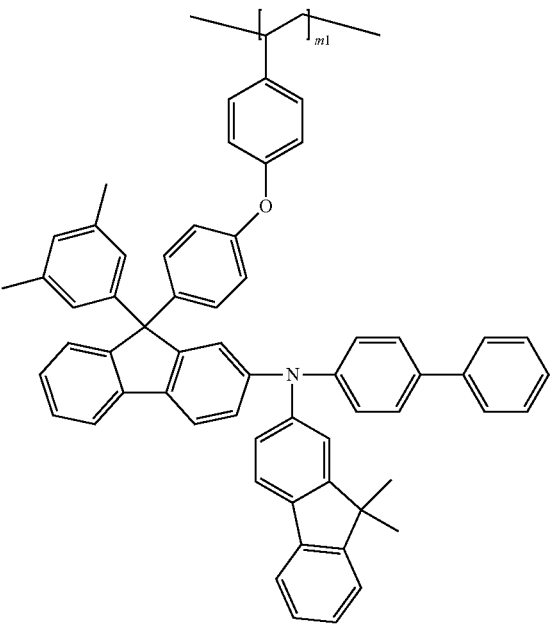

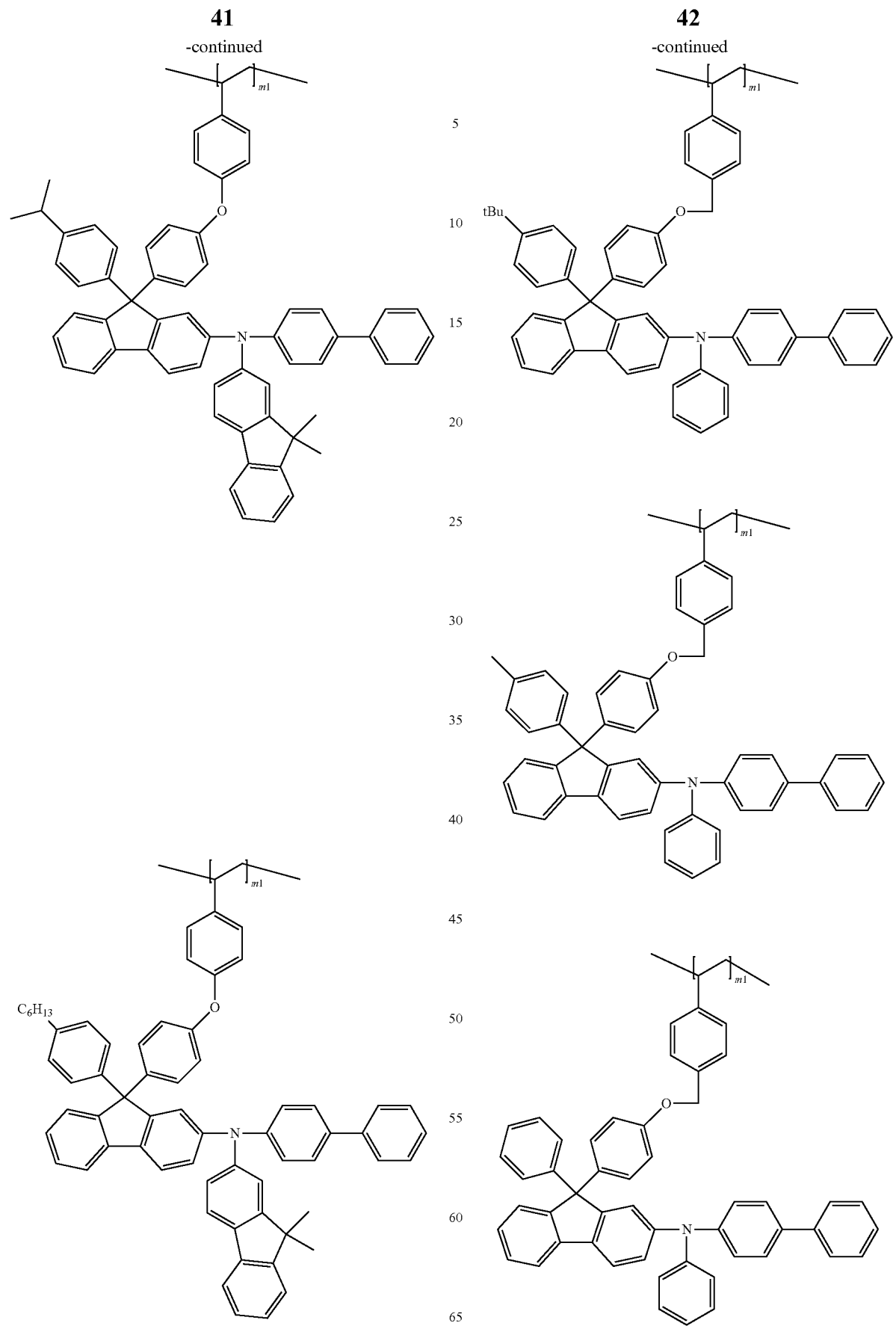

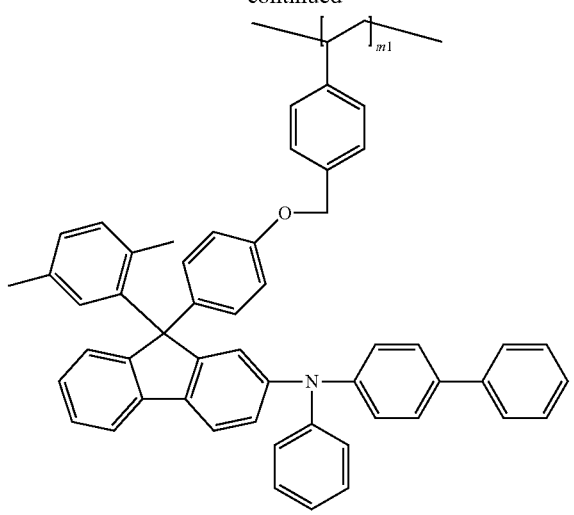
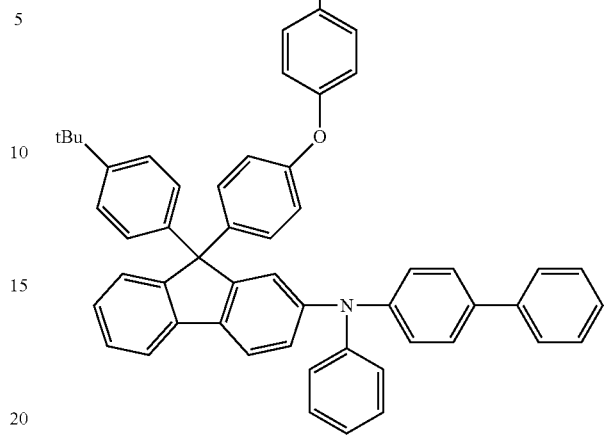
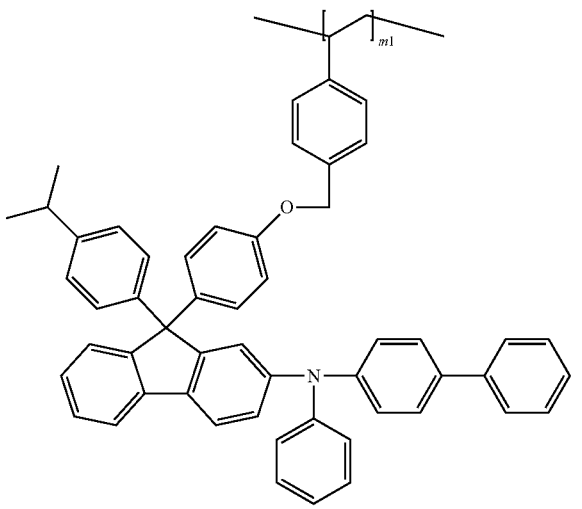
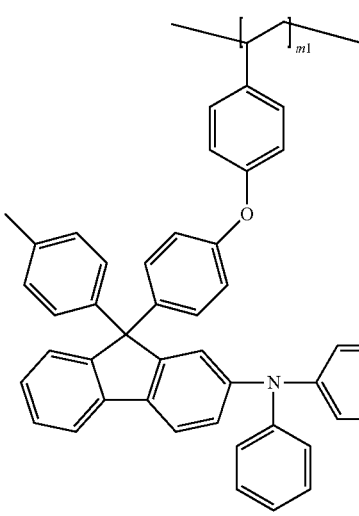
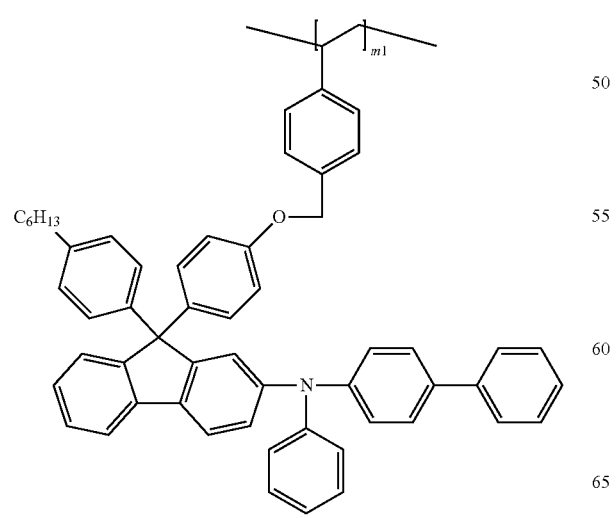
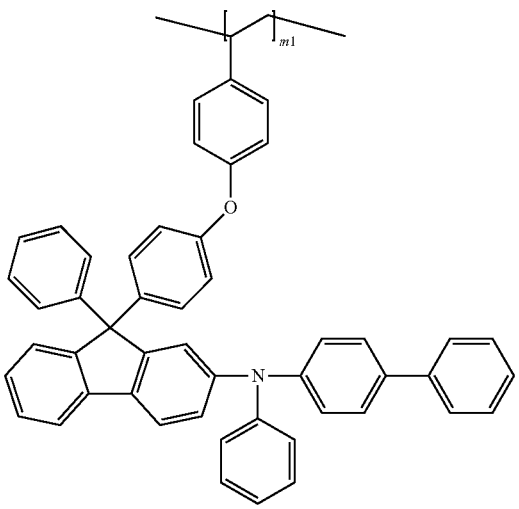

-continued
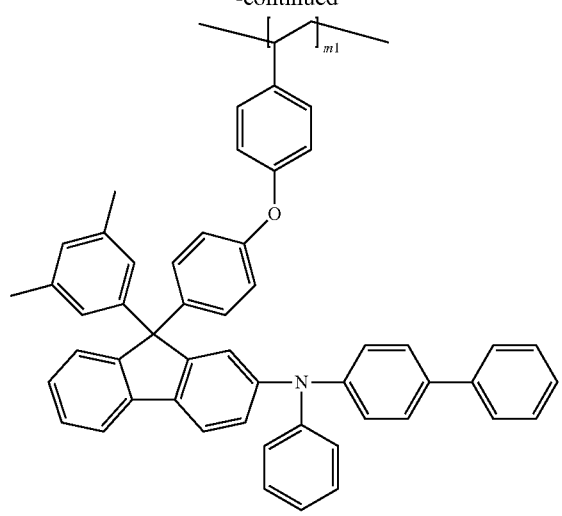
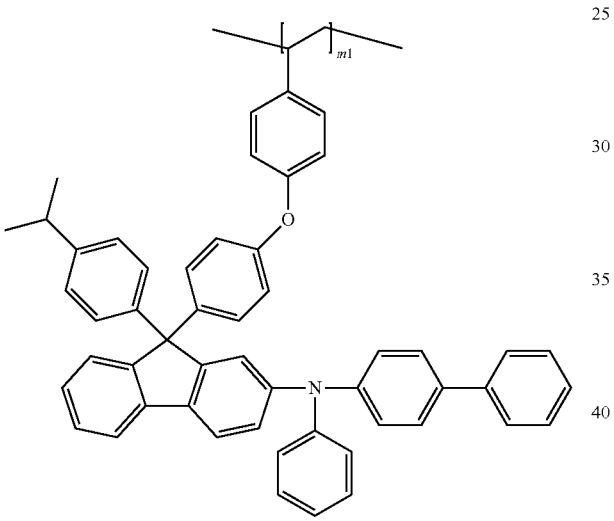
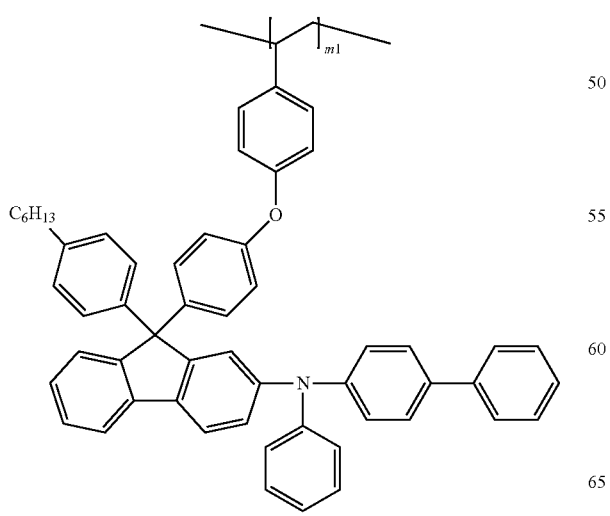
-continued
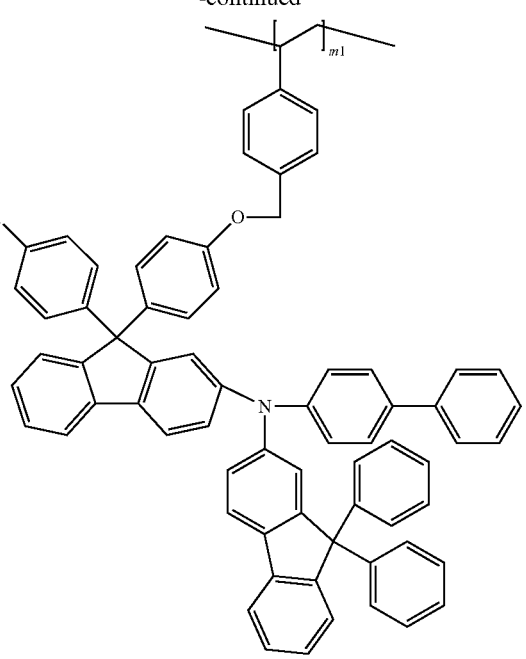
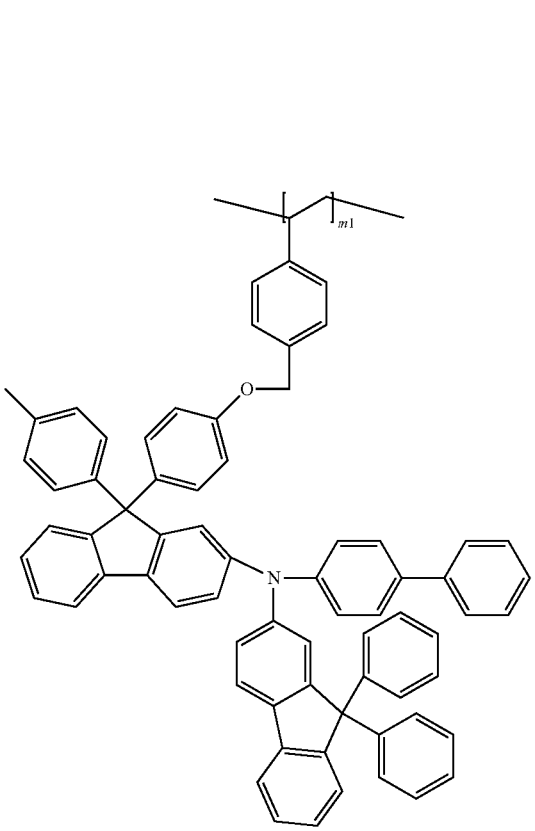

47
-continued
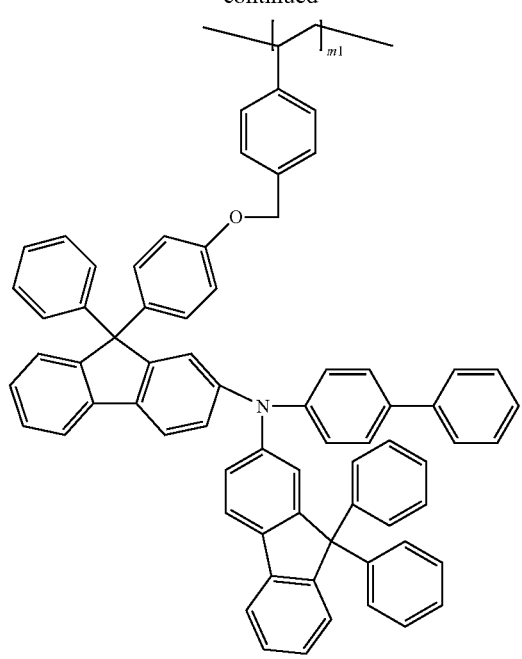
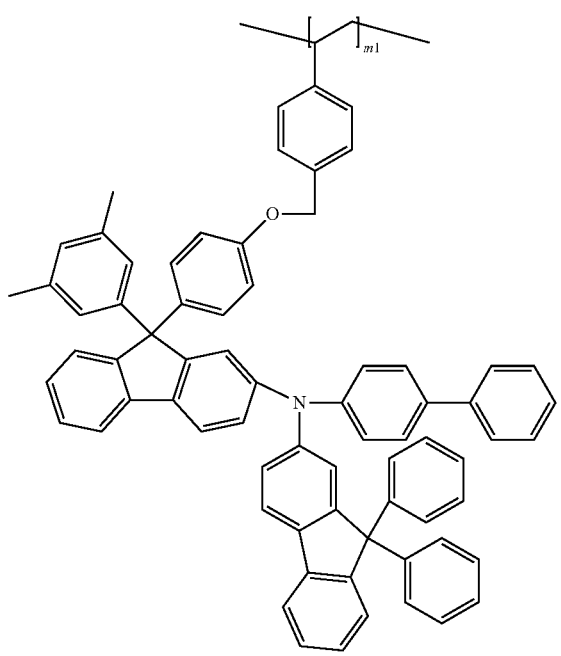
48
-continued
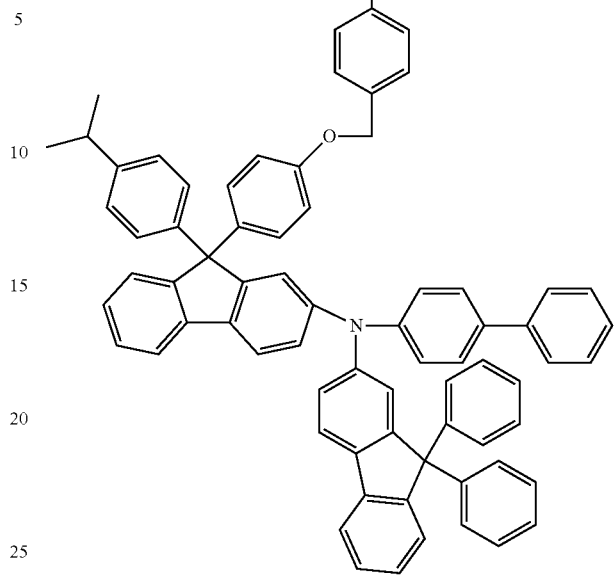
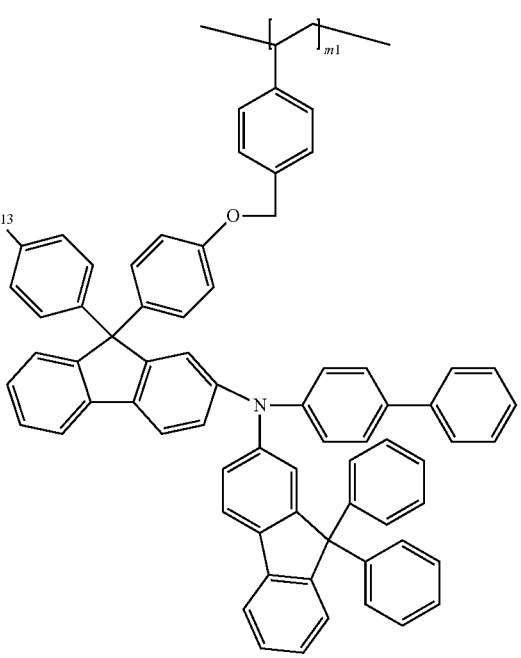

49
-continued
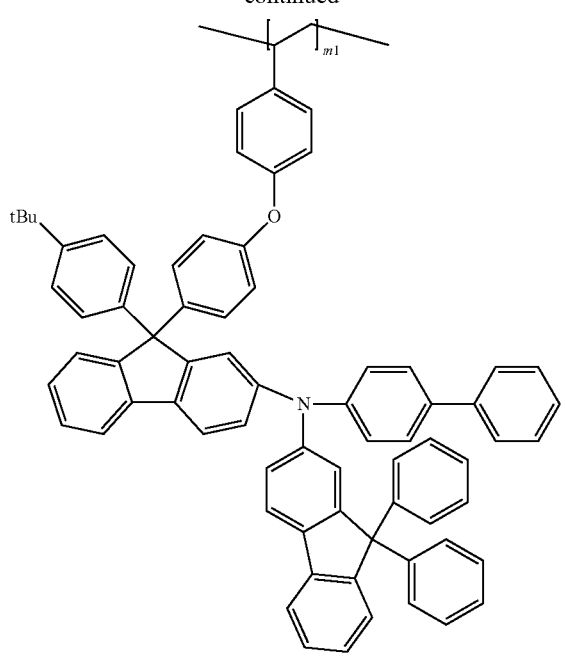
50
-continued
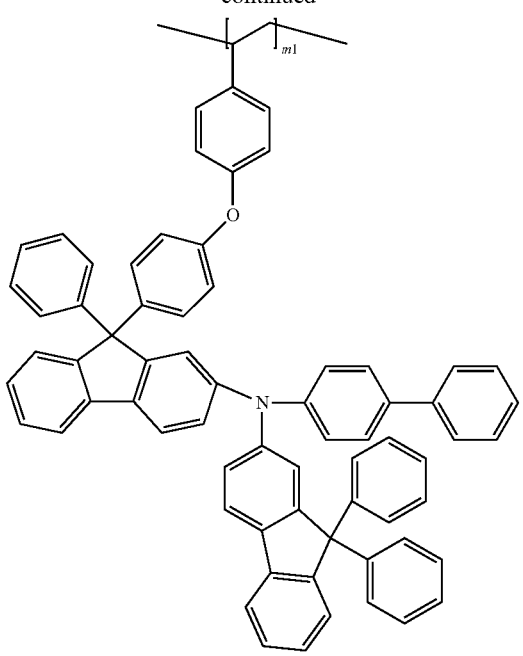
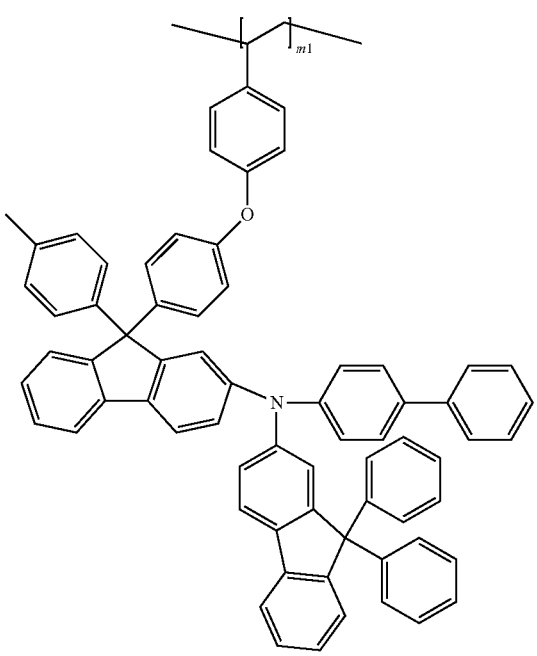
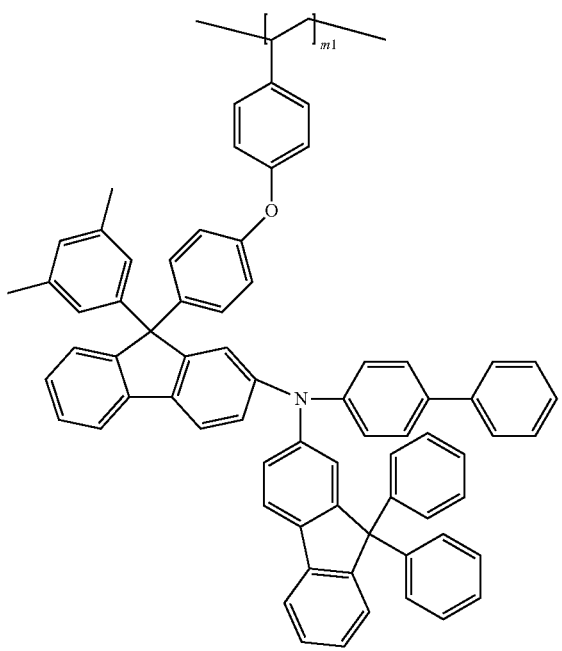

51
-continued
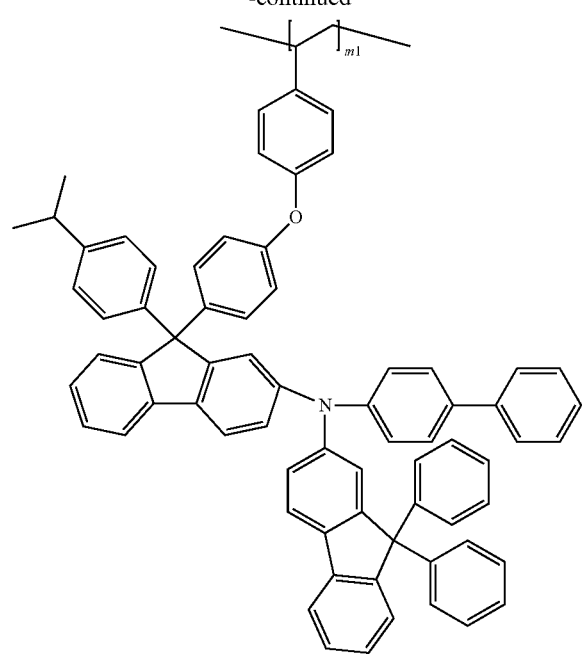
52
-continued
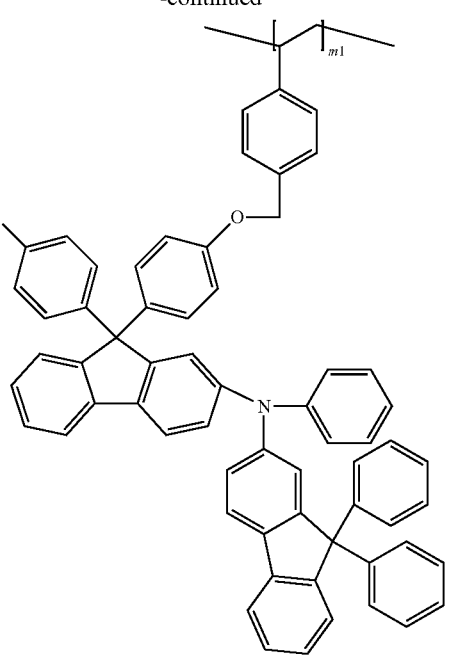
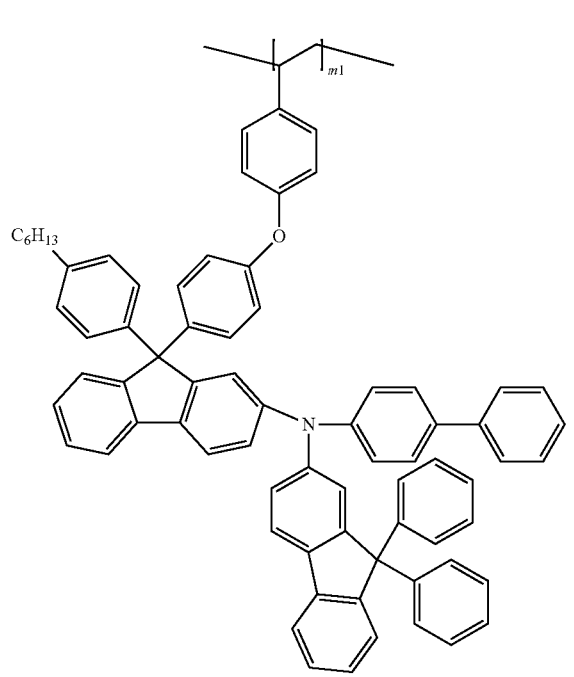
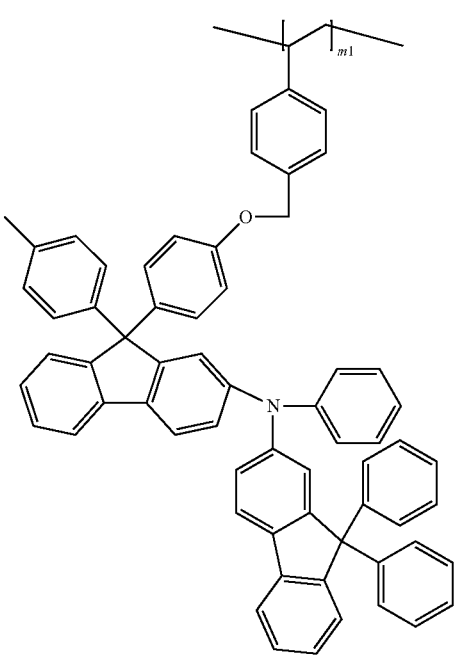

53
-continued
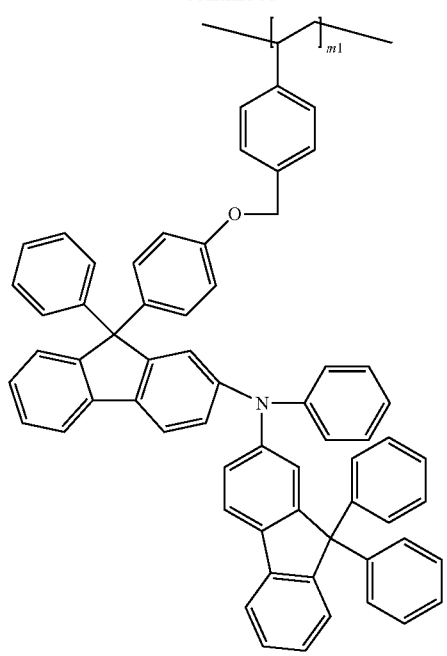
54
-continued
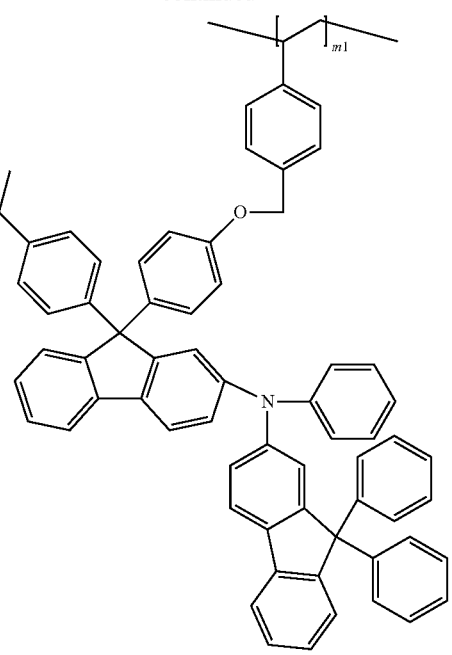
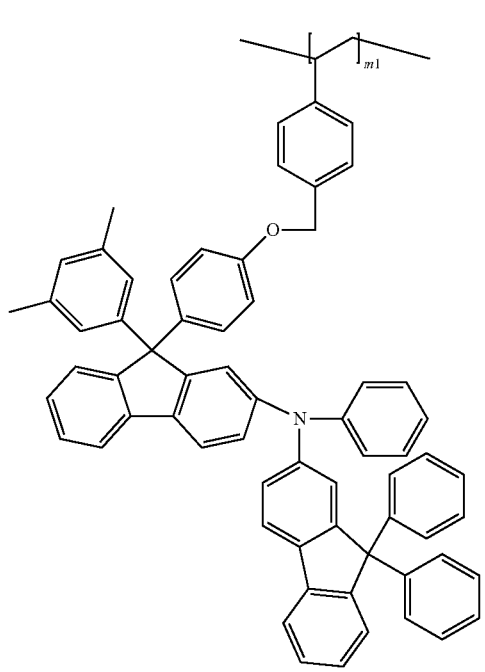
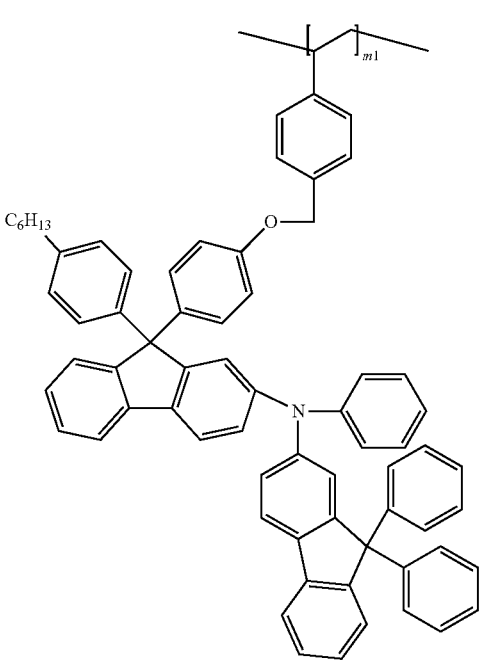

55
-continued
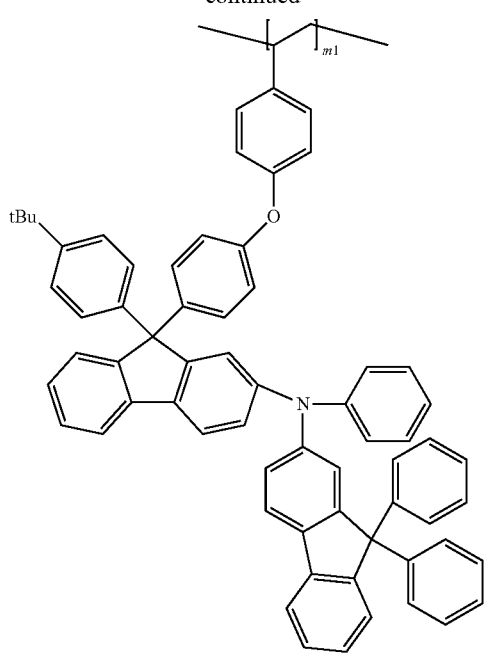
56
-continued
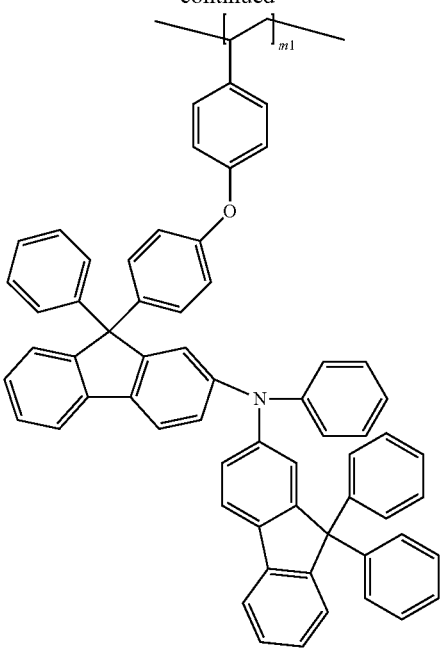
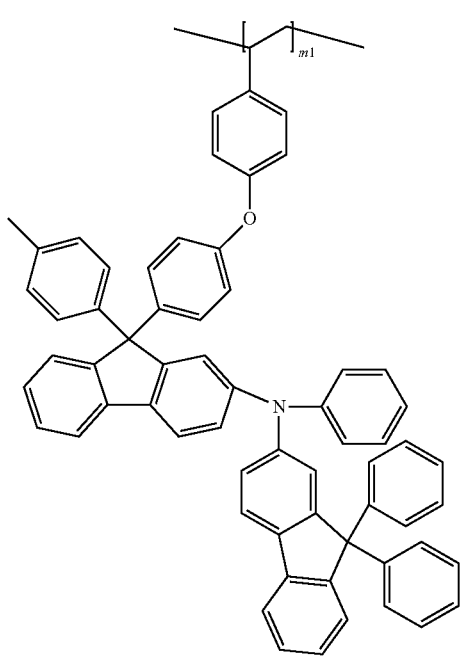
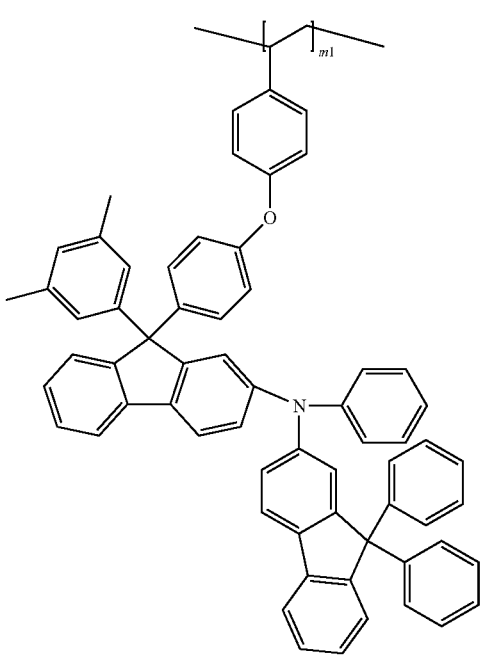

57
-continued
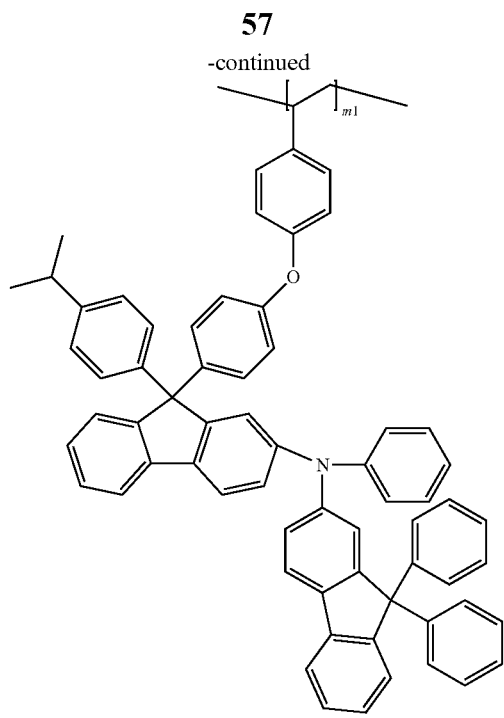
58
-continued
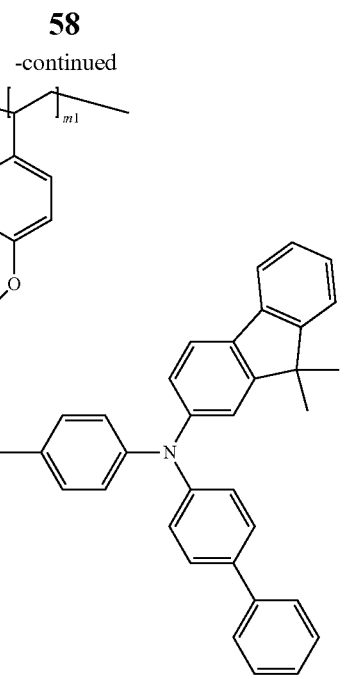
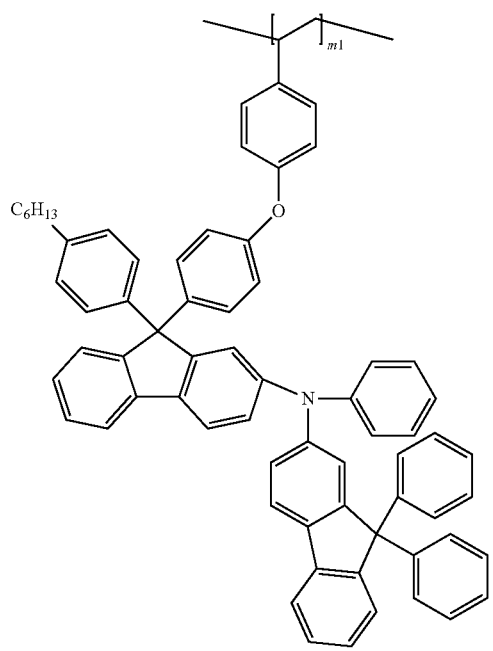

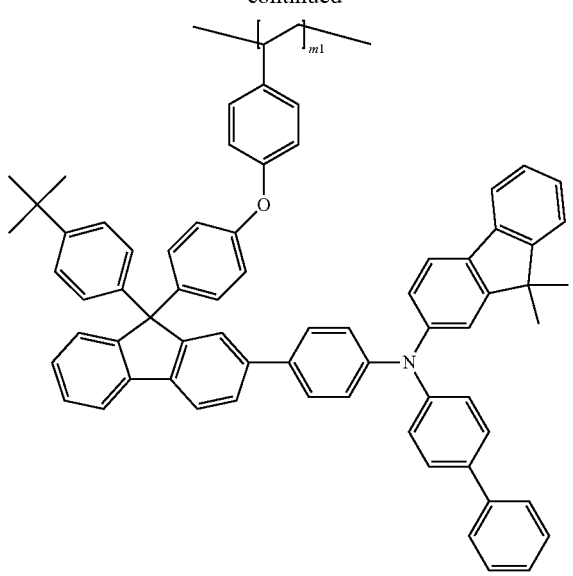
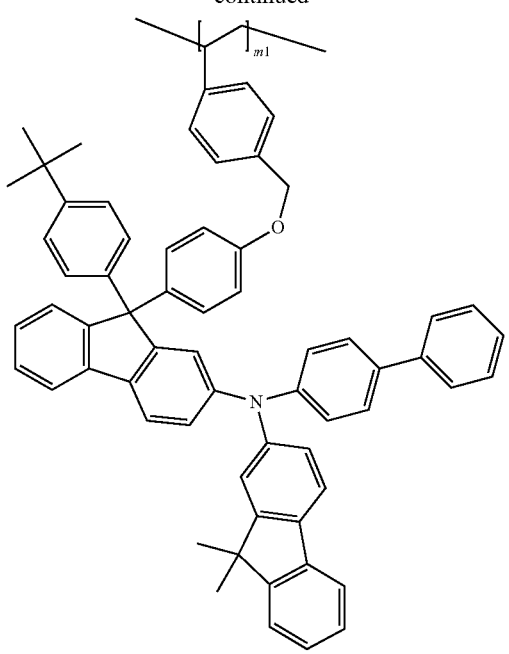
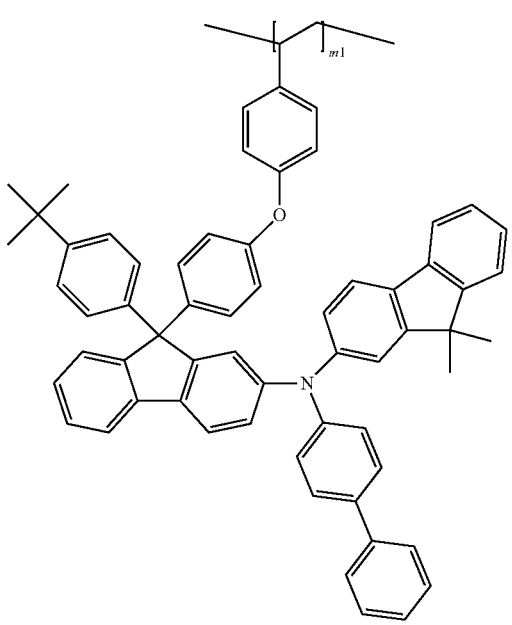
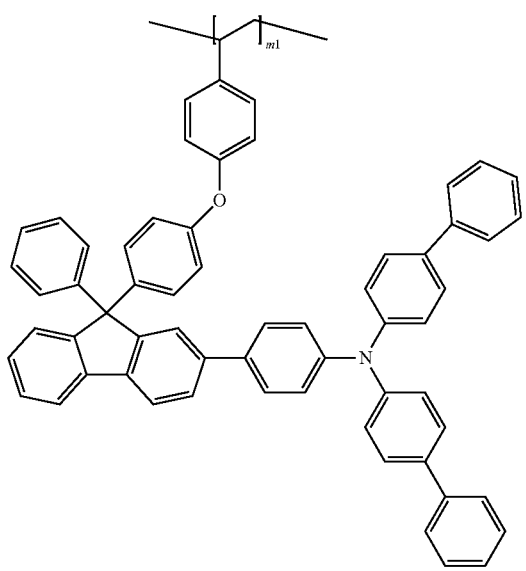

61
-continued
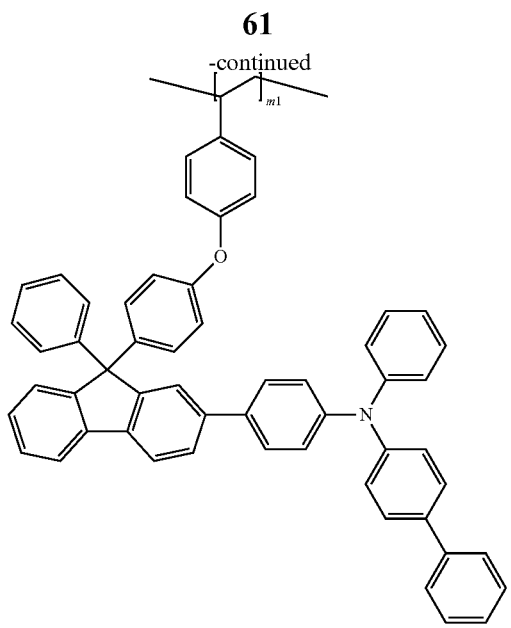
In the structures,
m1 is a mole fraction and 0<m1<1.
In an exemplary embodiment of the present specification, the second unit represented by Formula 2 may be represented by any one of the following structures.
Q1
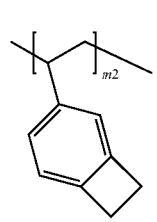
Q2
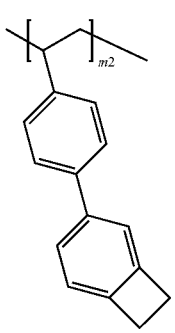
Q3
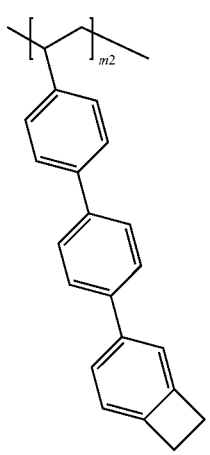
62
-continued
Q4
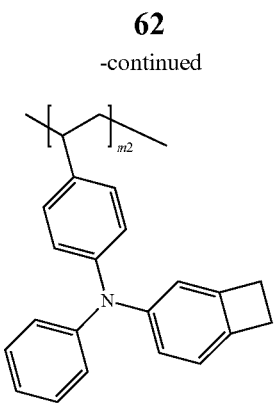
Q5
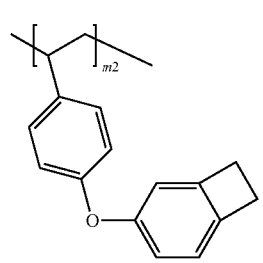
Q6
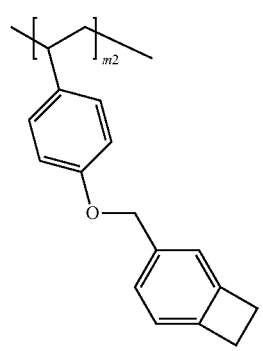
Q7
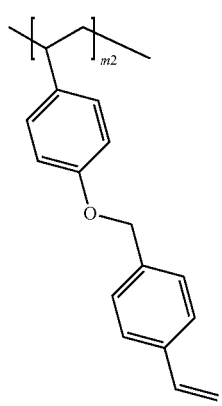

-continued

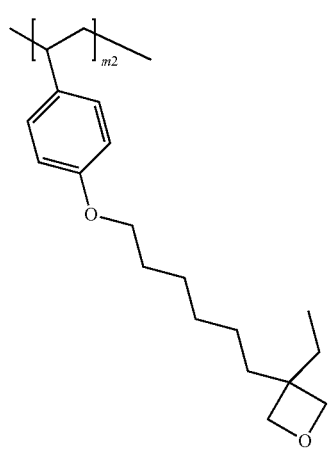

Q8

In the structures, m2 is a mole fraction and 0<m2<1.

In an exemplary embodiment of the present specification, a polymer comprising the first unit represented by Formula 1 and the second unit represented by Formula 2 may be represented by the following Formula 11 or 12.

[Formula 11]

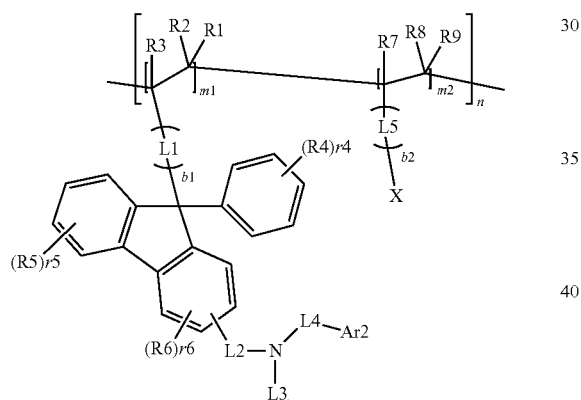

[Formula 12]

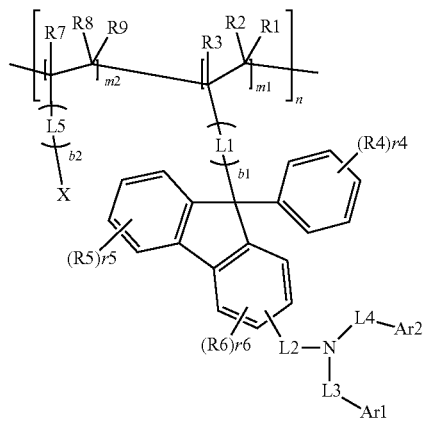

In Formulae 11 and 12, definitions of X, L1 to L5, b1, b2, Ar1, Ar2, R1 to R9, r4 to r6, m1, and m2 are the same as those defined in Formulae 1 and 2, and n is a repeating number of the unit, and an integer from 1 to 10,000.

In an exemplary embodiment of the present specification, the polymer comprising the first unit represented by Formula 1 and the second unit represented by Formula 2 may be any one selected from the following structures.

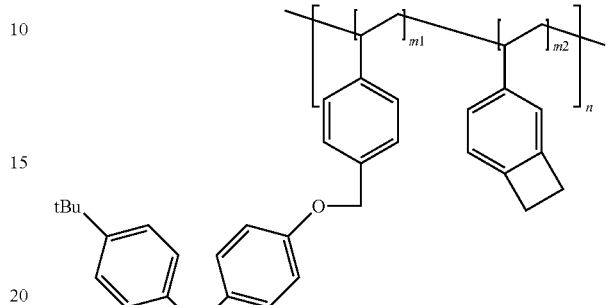

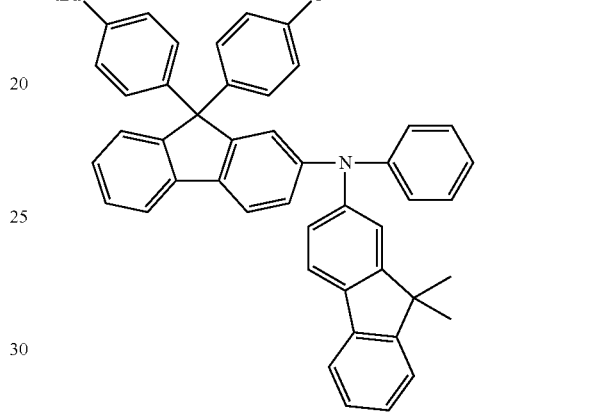

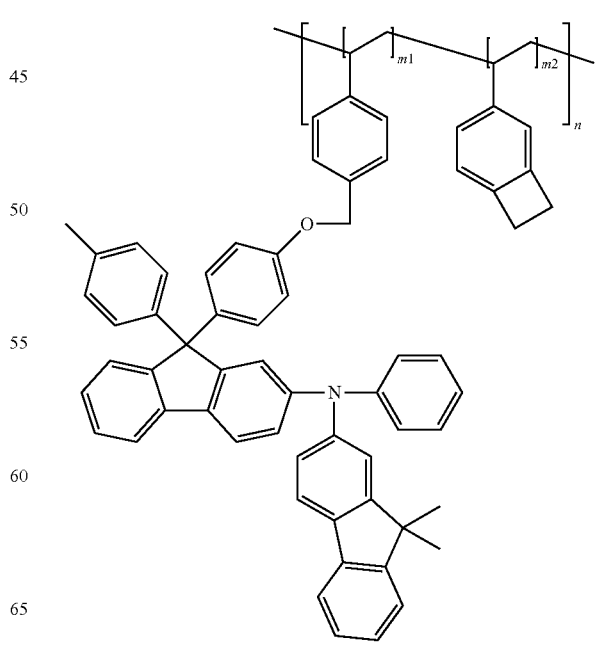

65
-continued
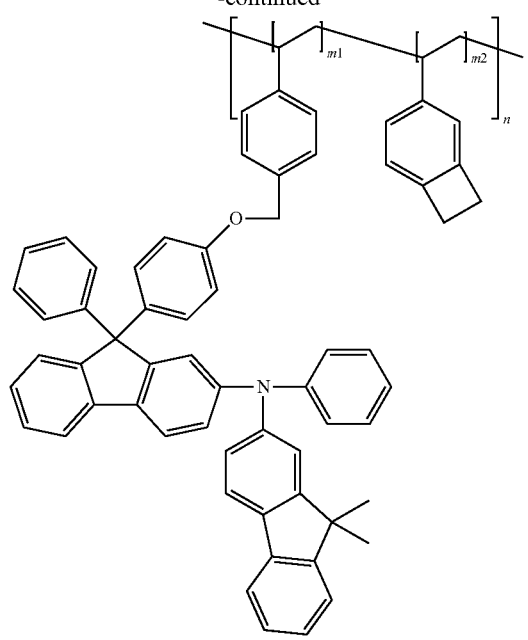
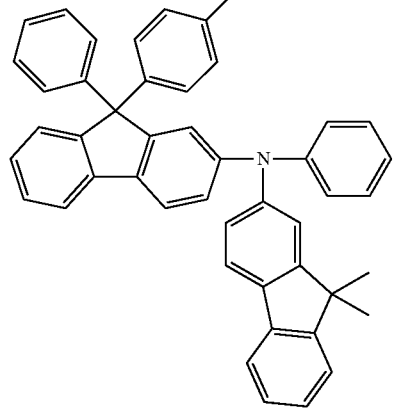
66
-continued
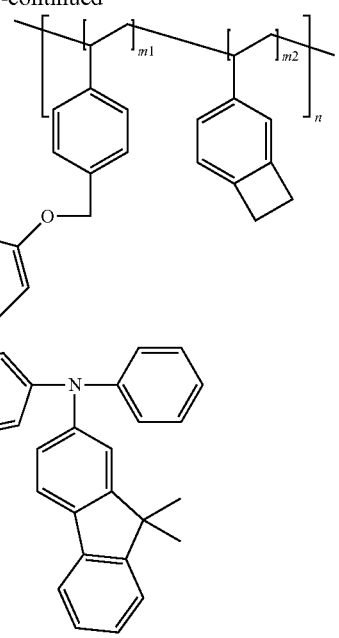
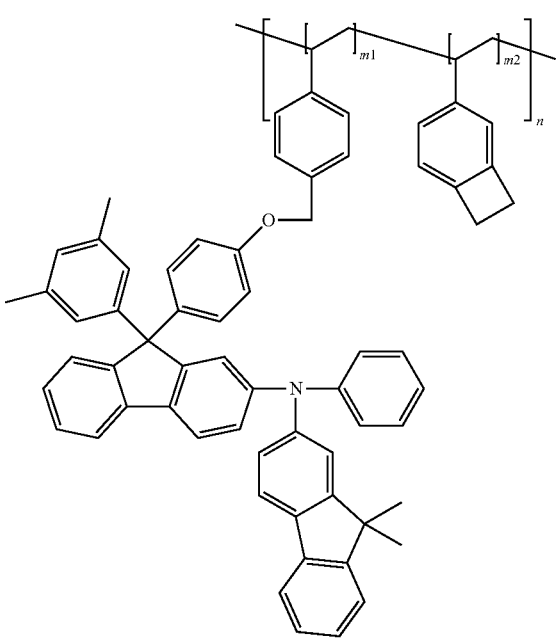
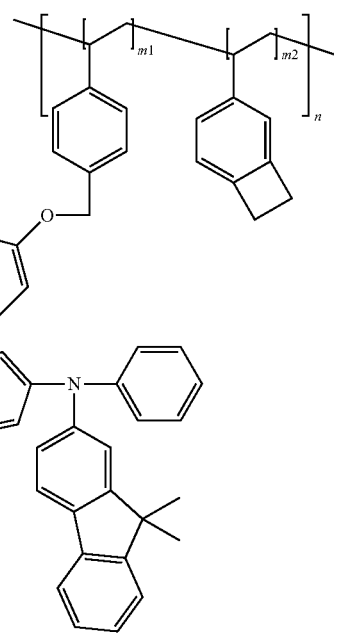

67
-continued
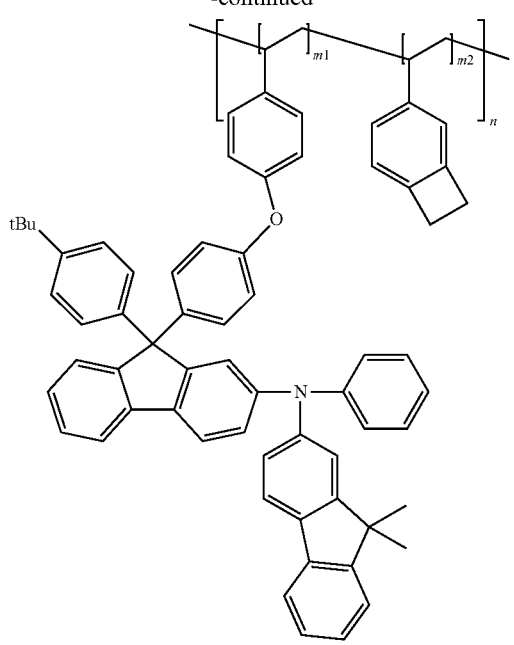
68
-continued
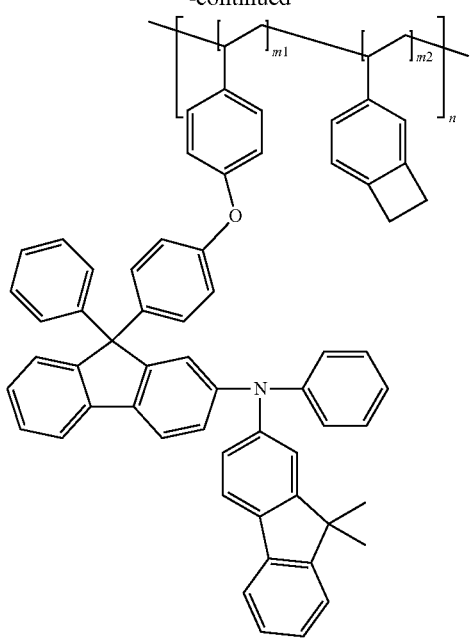
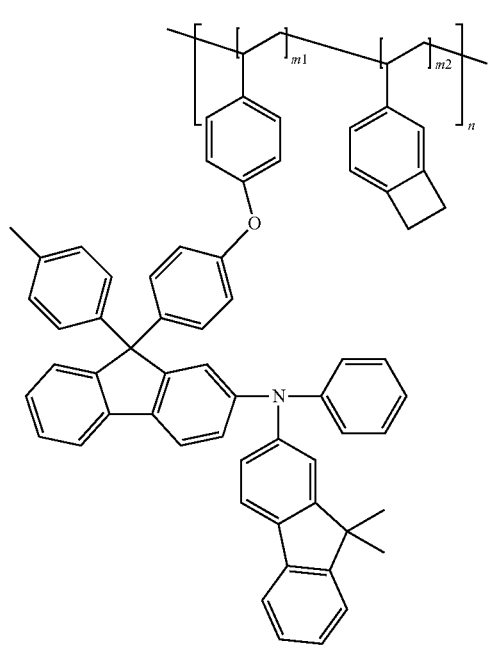
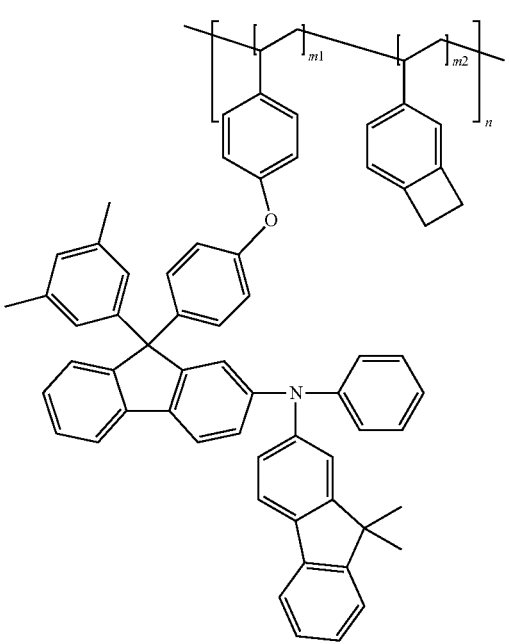

69
-continued
70
-continued
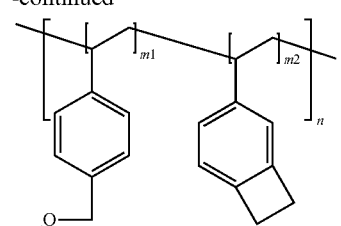
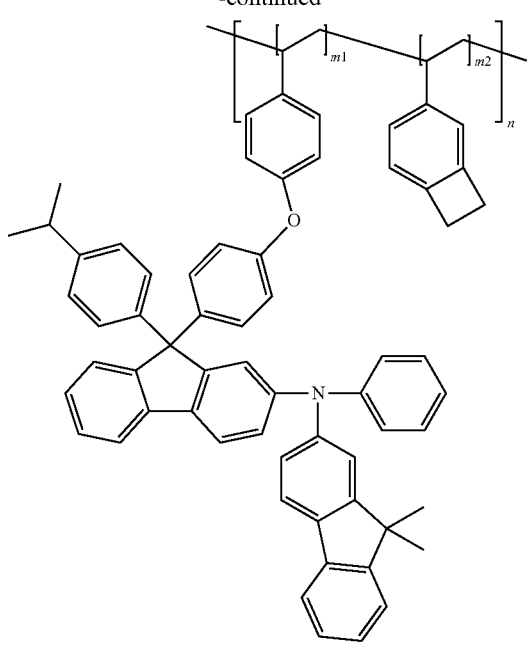
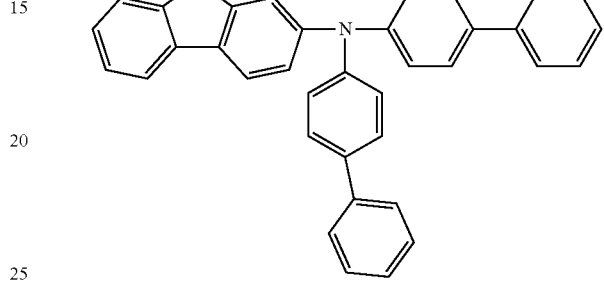
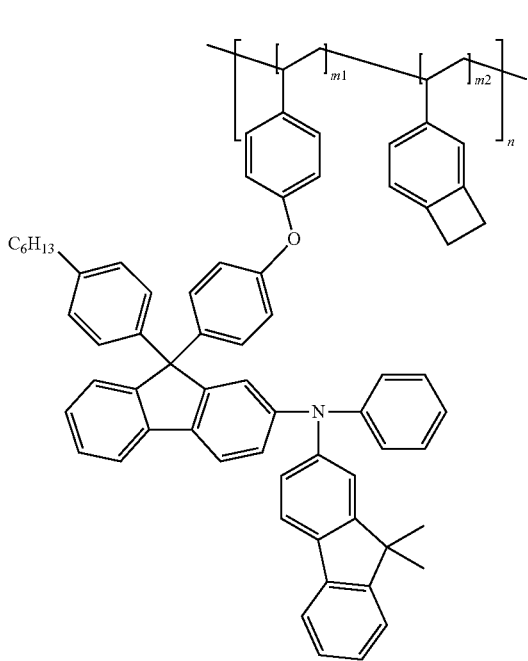
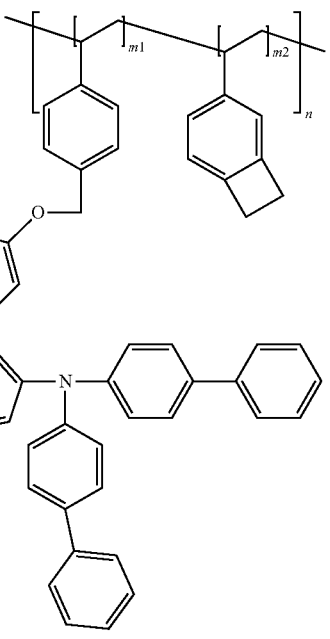

71
-continued
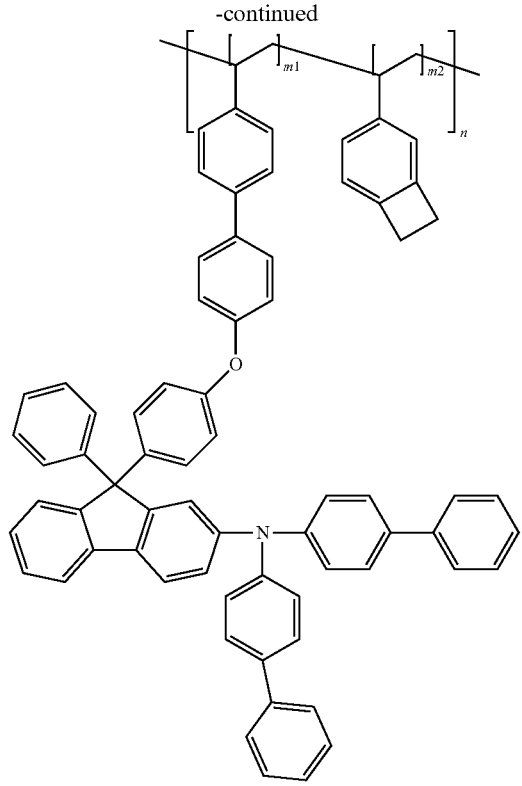
72
-continued
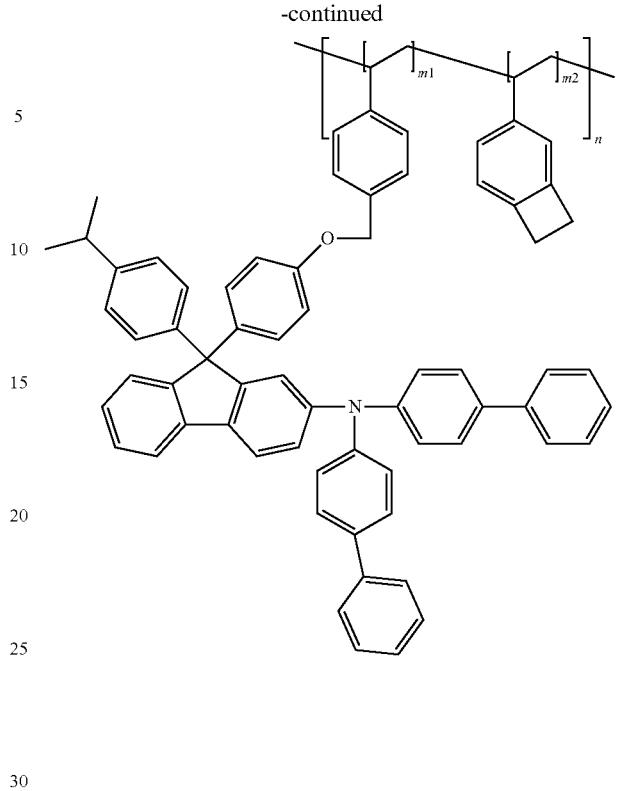
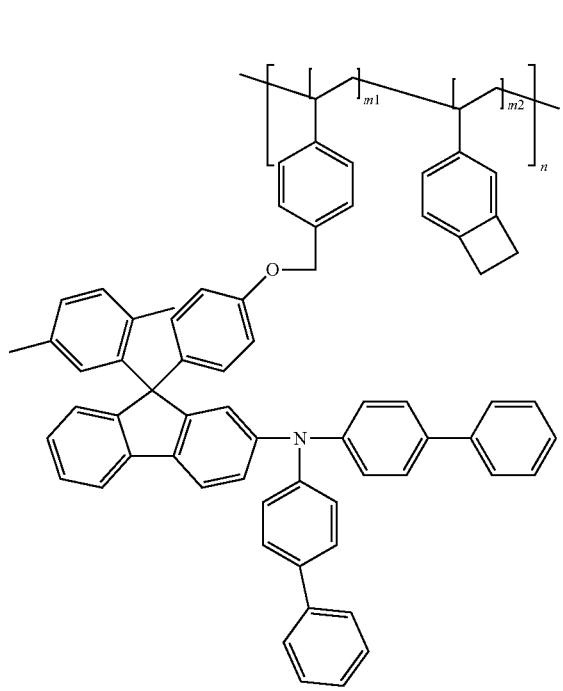
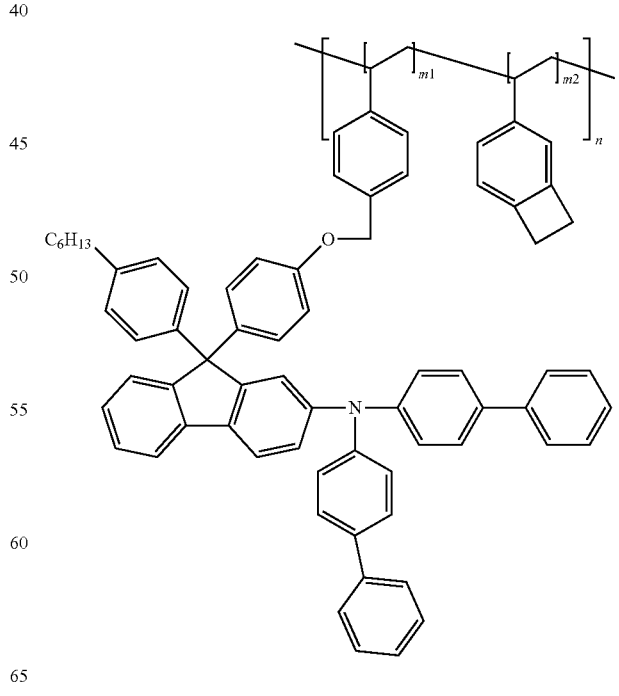

73
-continued
74
-continued
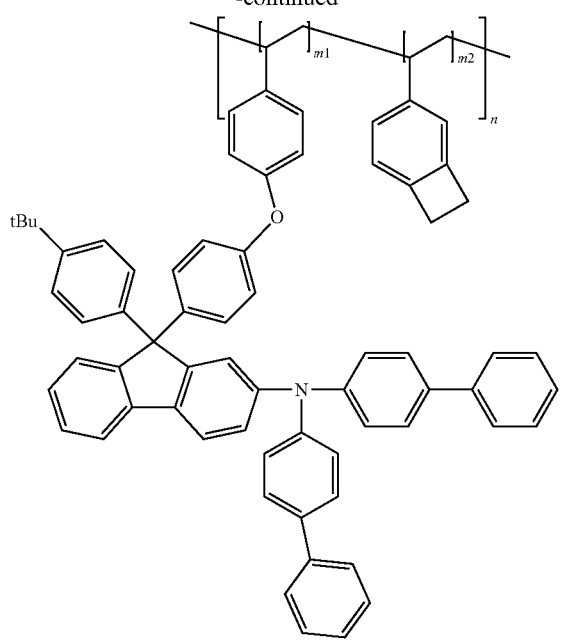
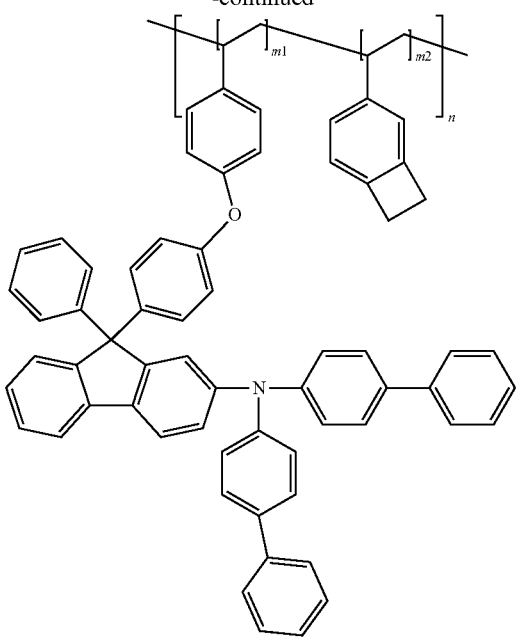

75
-continued
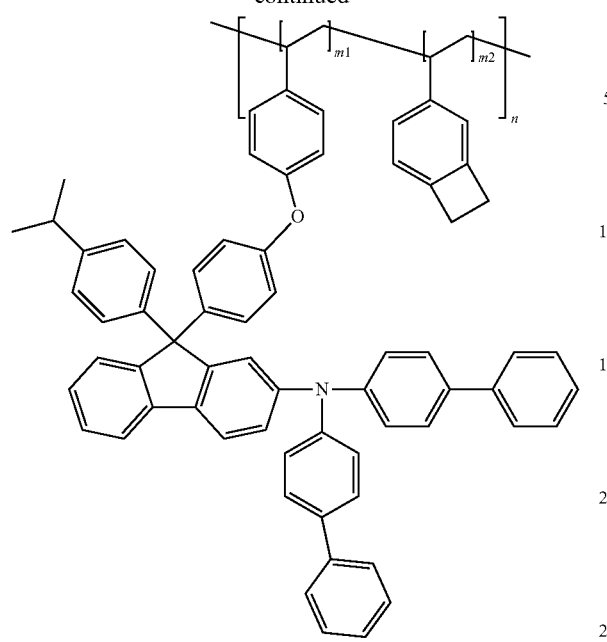
76
-continued
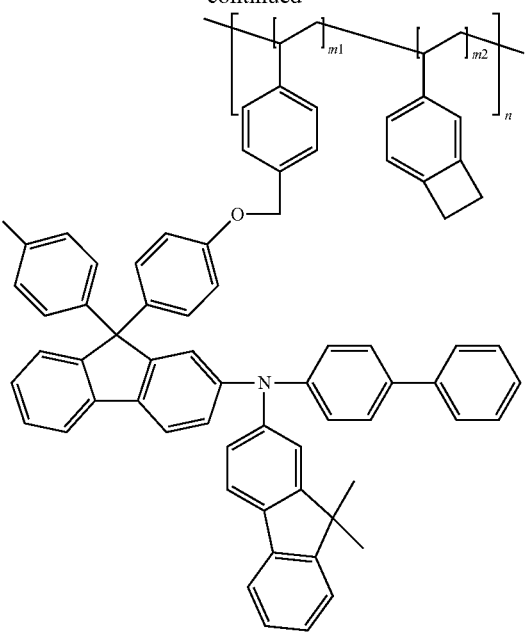
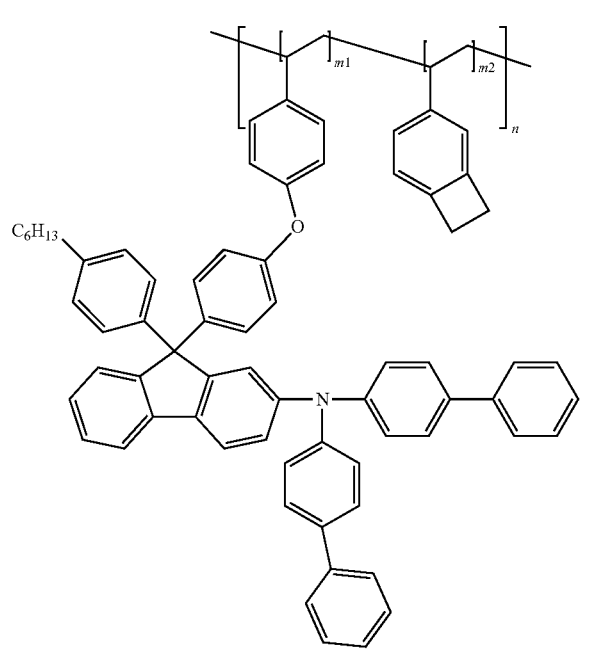
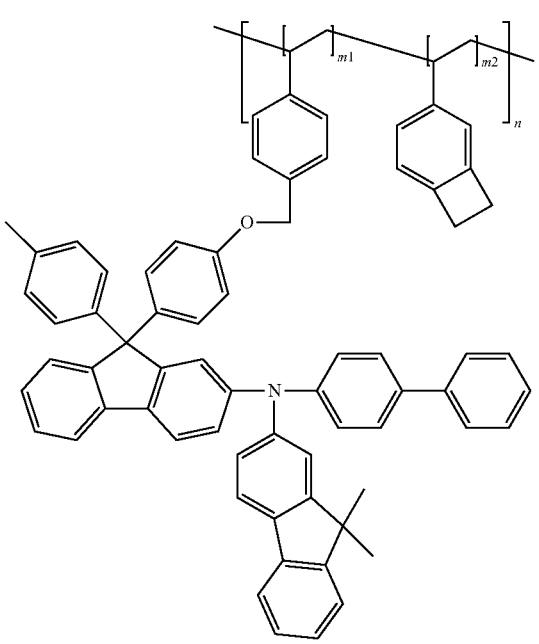

77
-continued
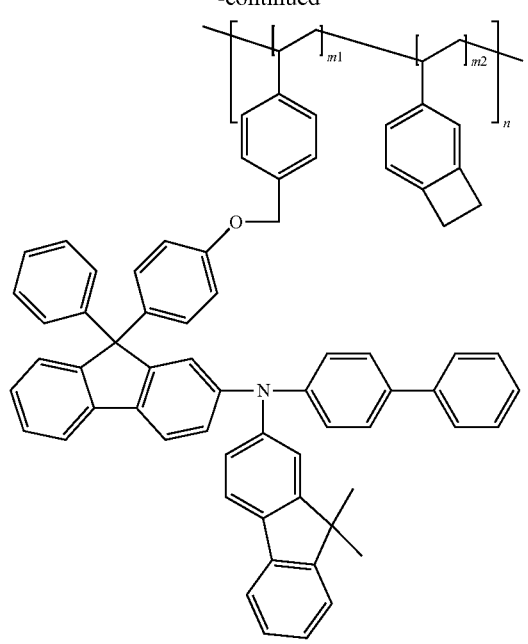
78
-continued
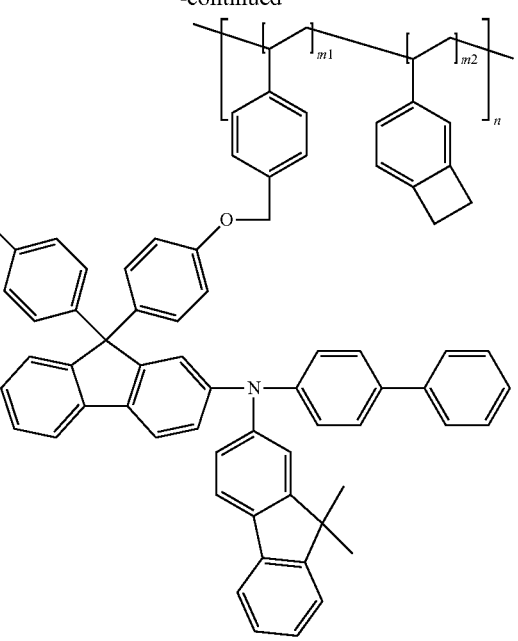
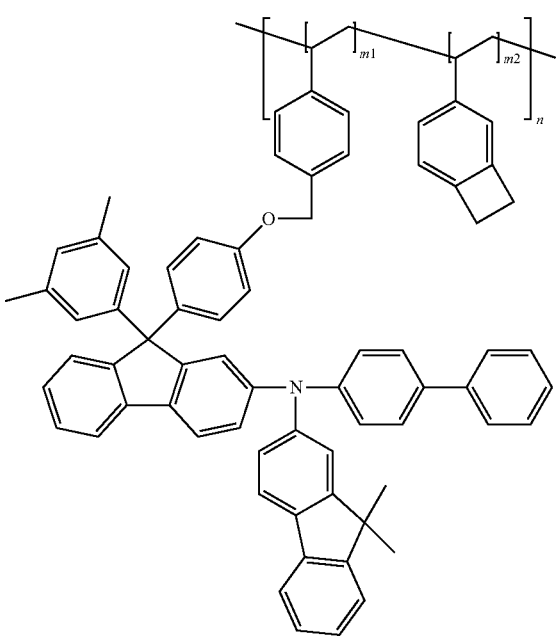
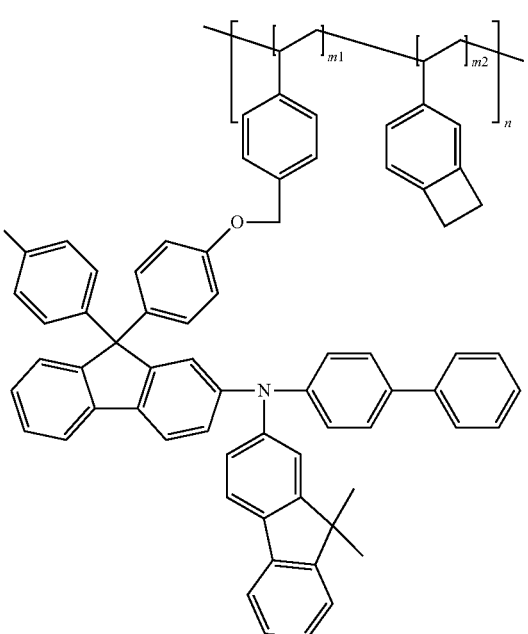

79
-continued
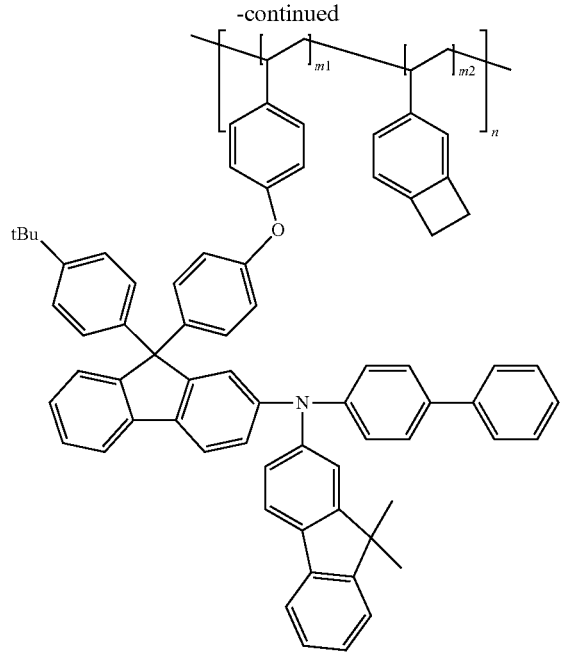
80
-continued
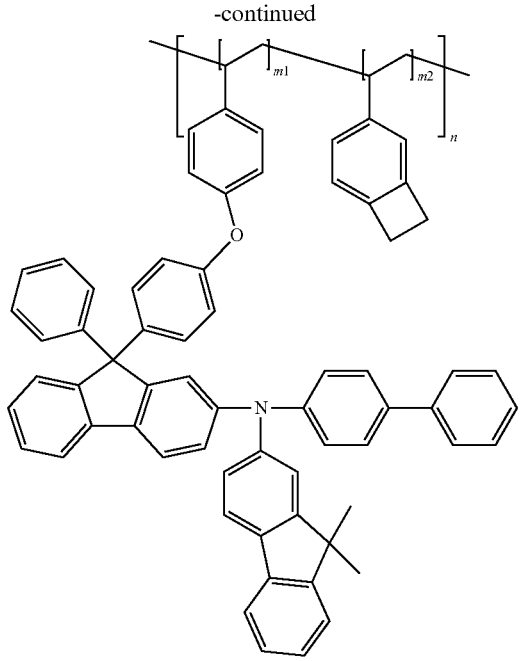
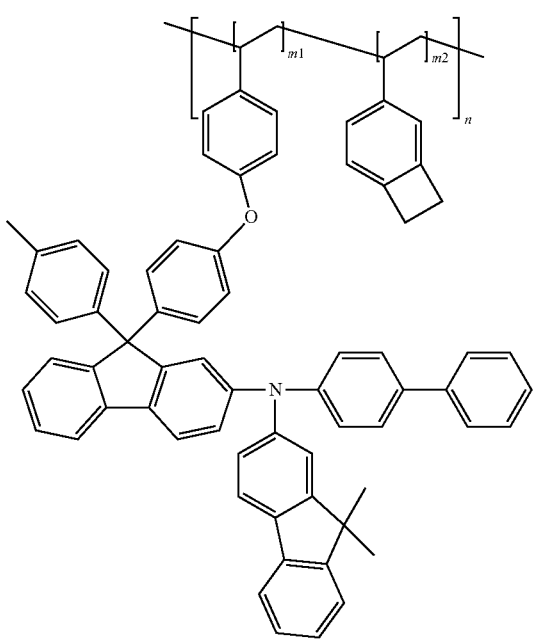
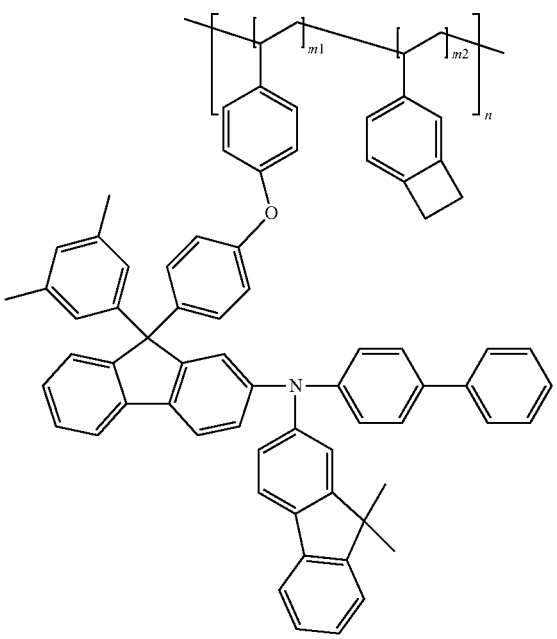

81
-continued
82
-continued
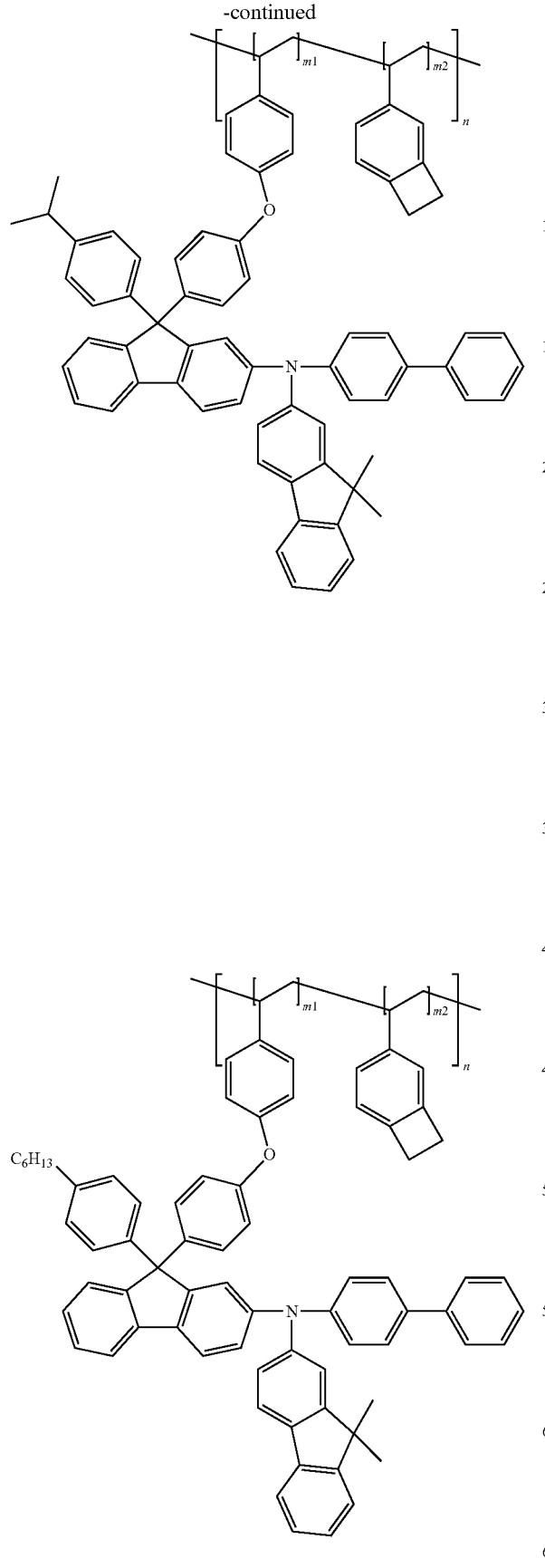
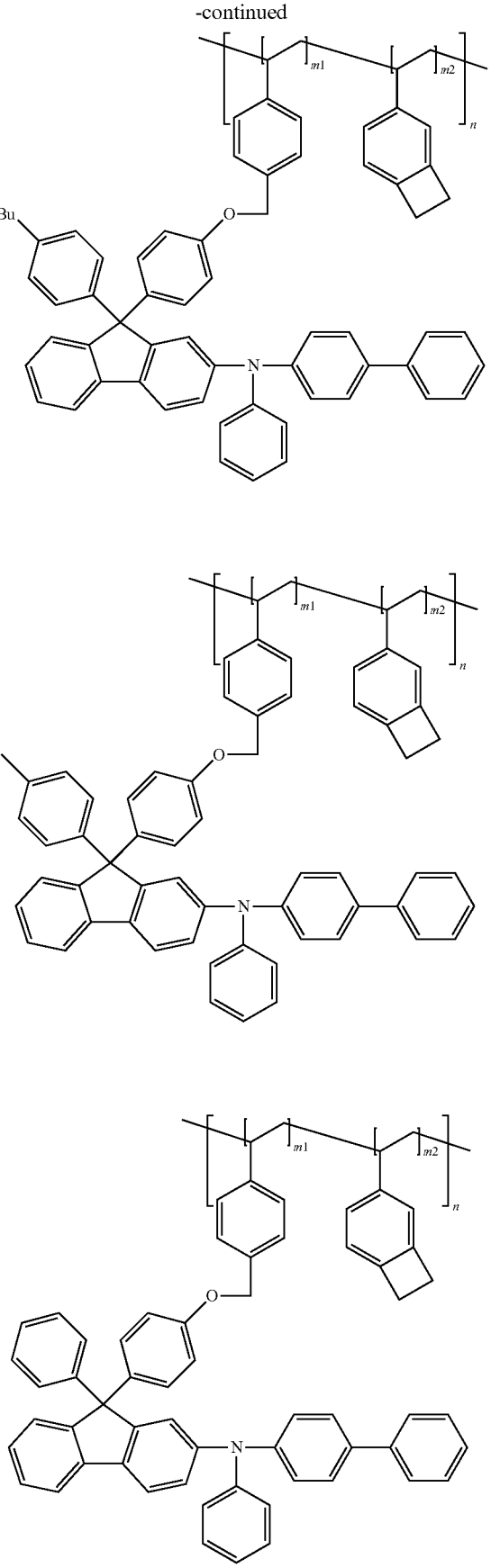

83
-continued
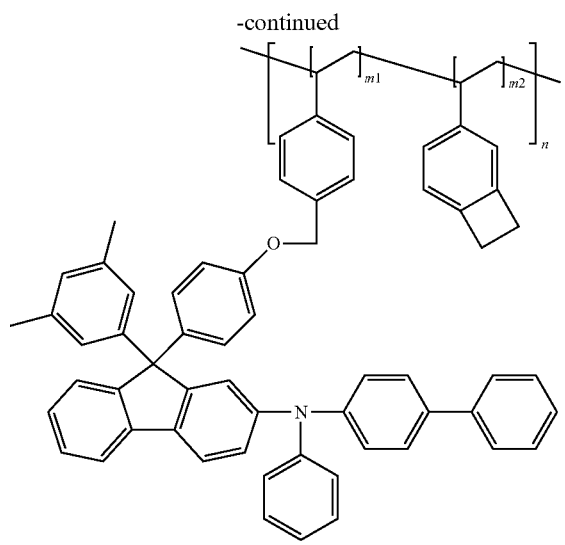
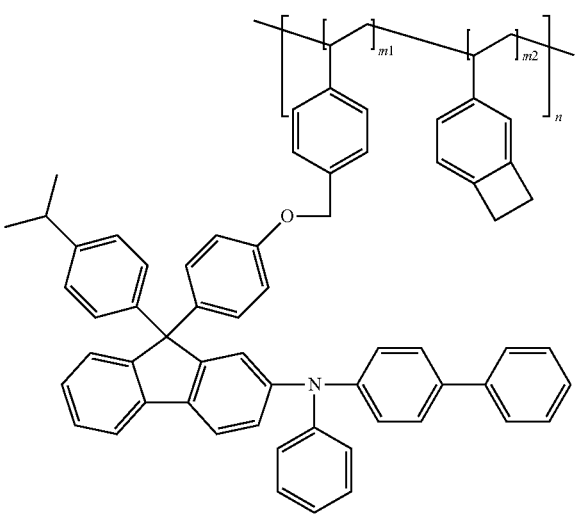
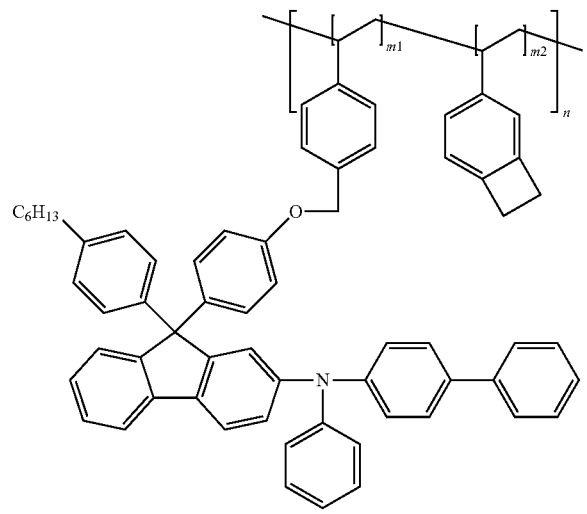
84
-continued
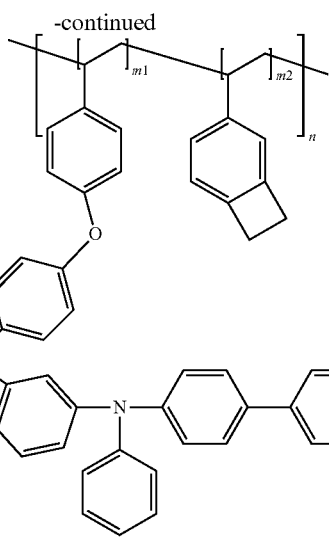
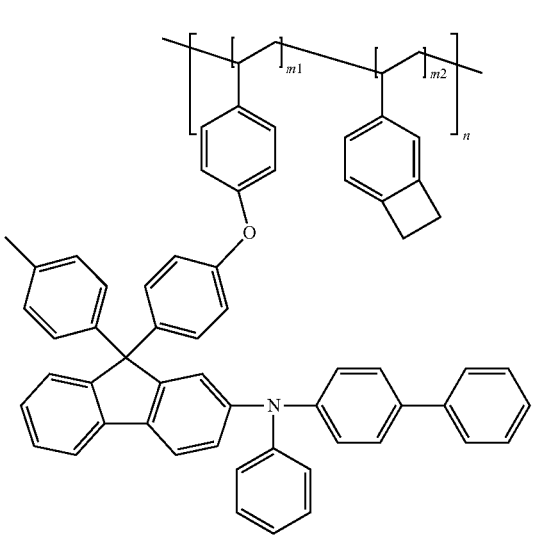
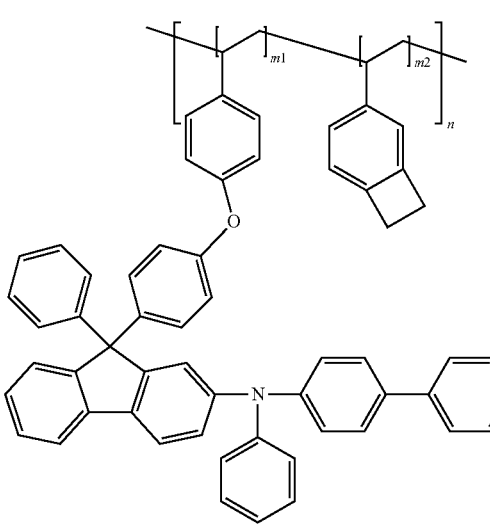

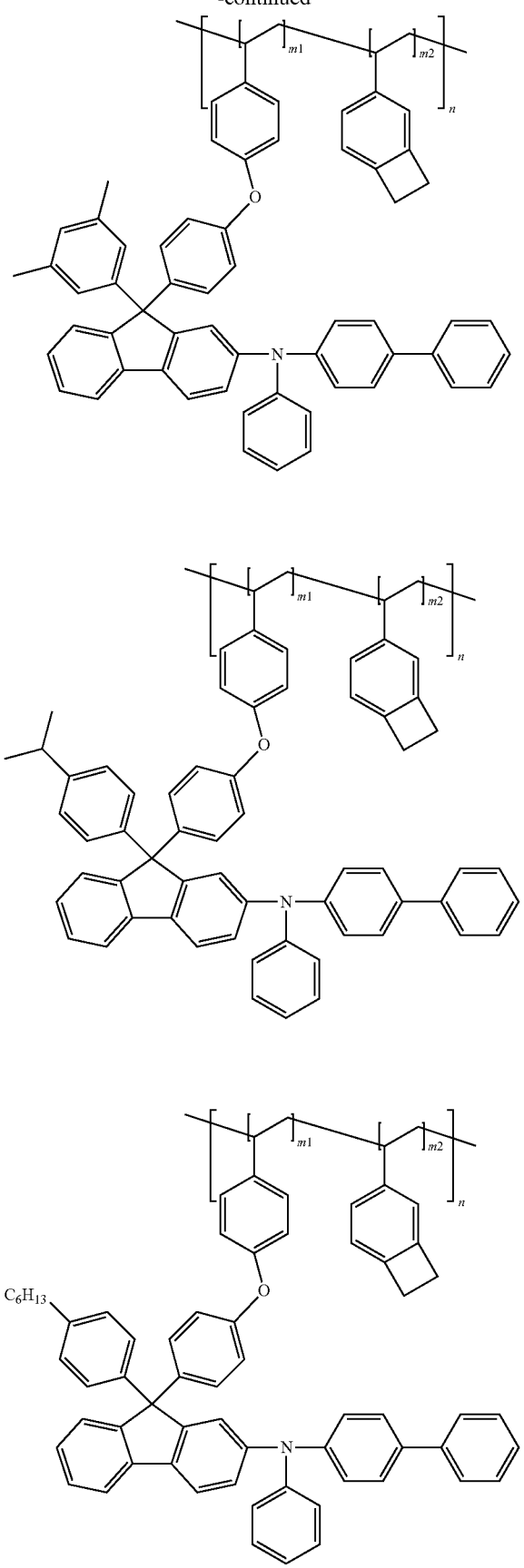
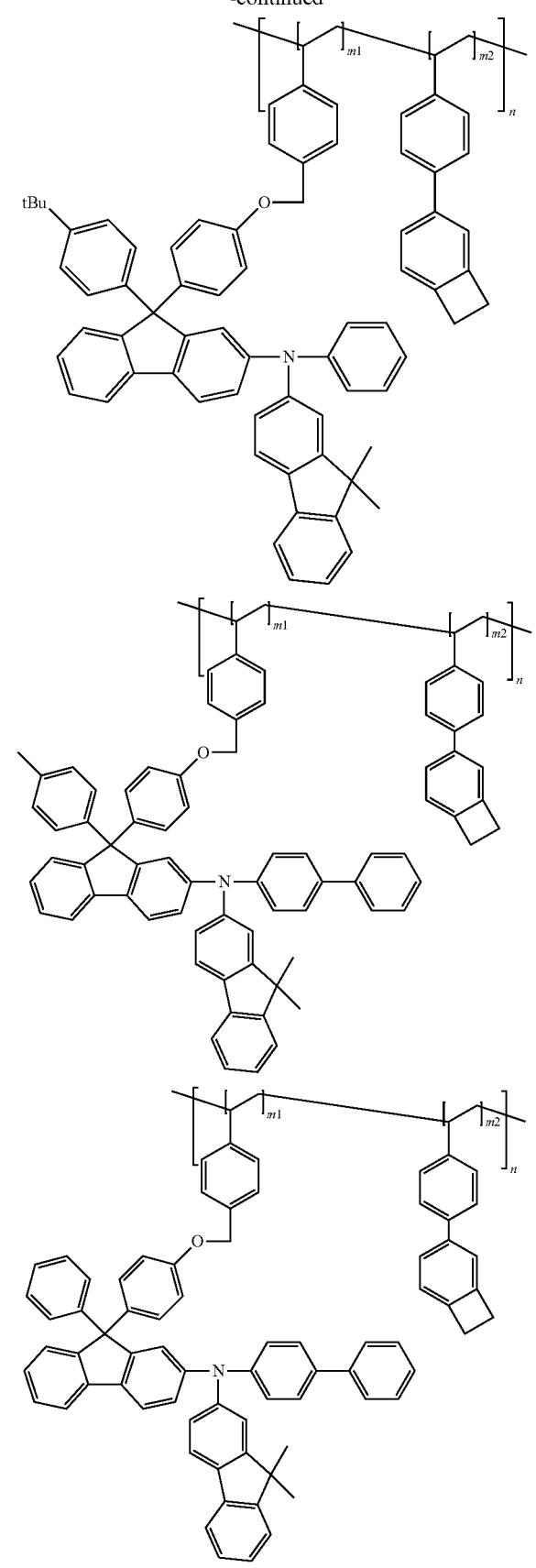

87
-continued
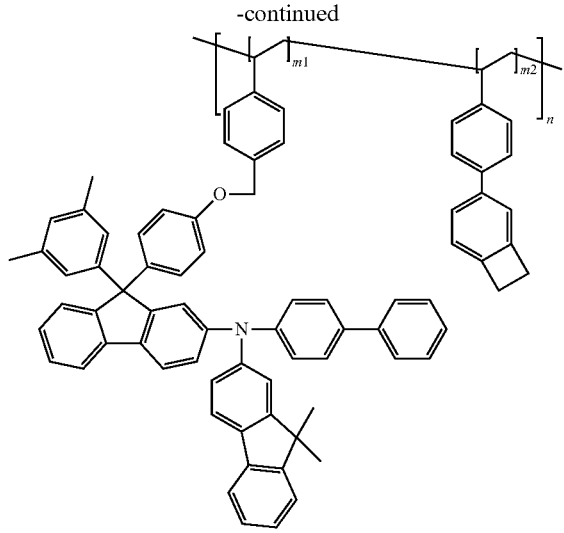
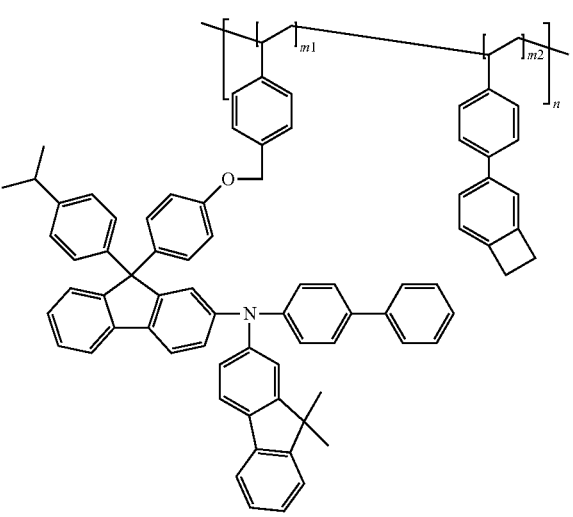
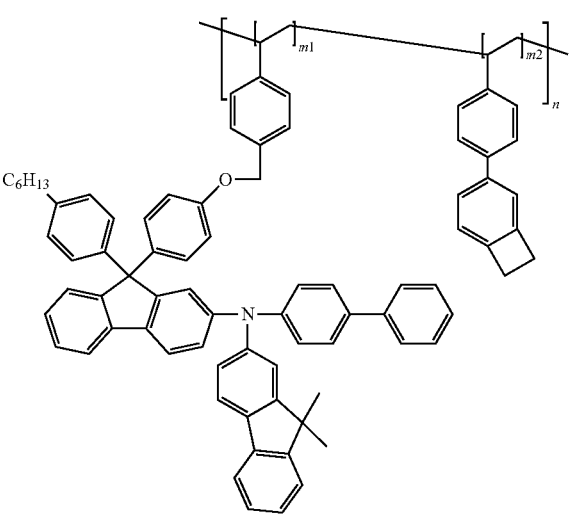
88
-continued
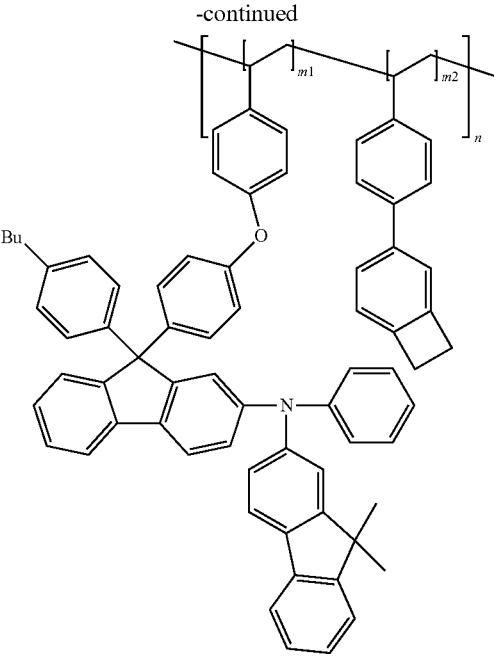
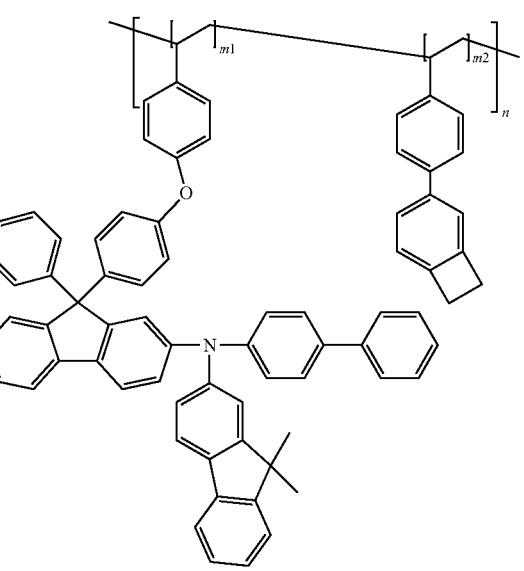

89
-continued
90
-continued
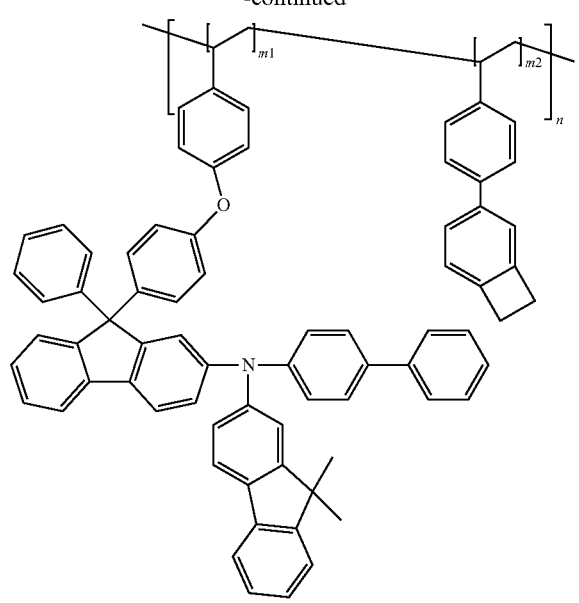
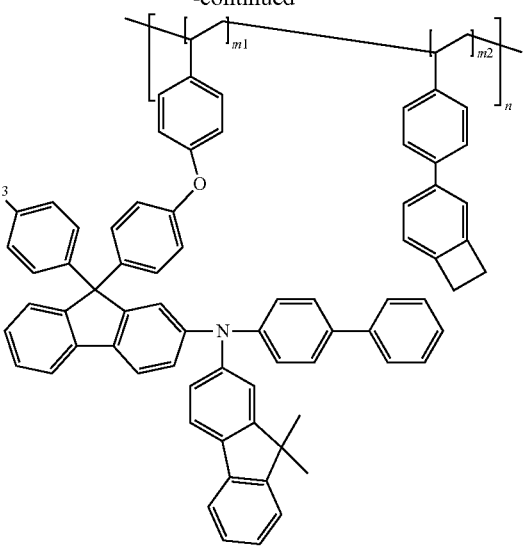
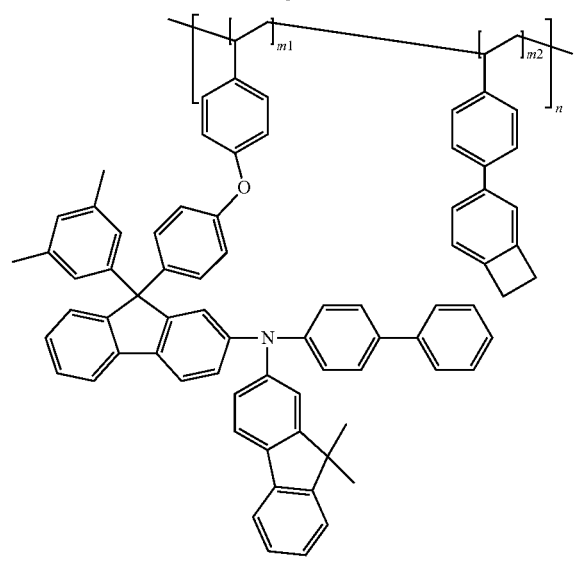
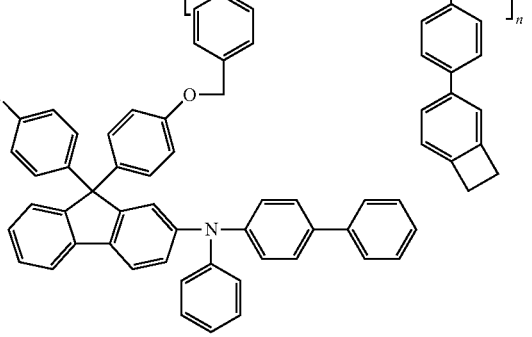
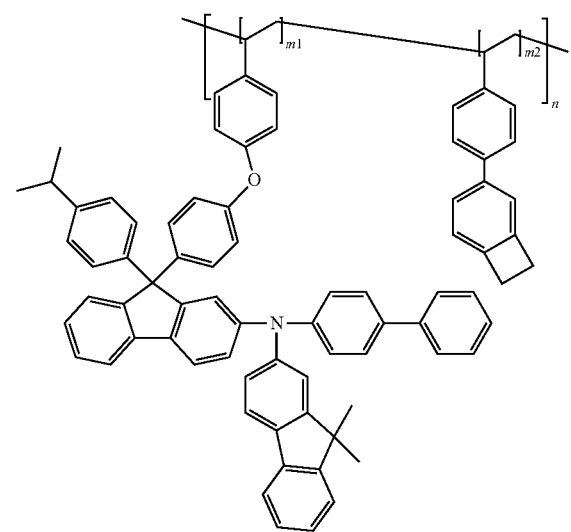
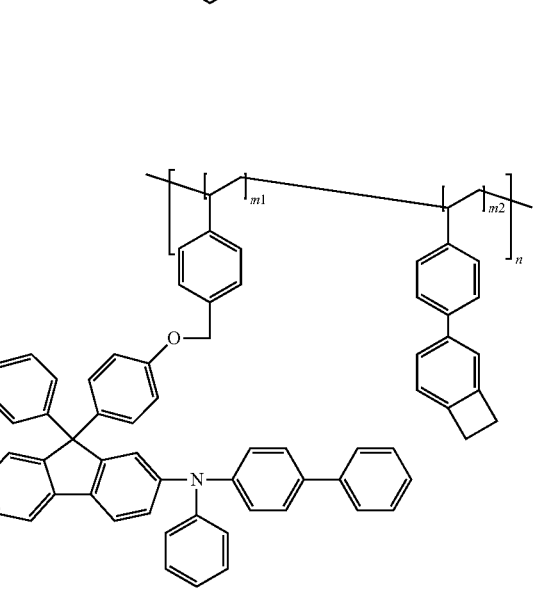

91
-continued
92
-continued
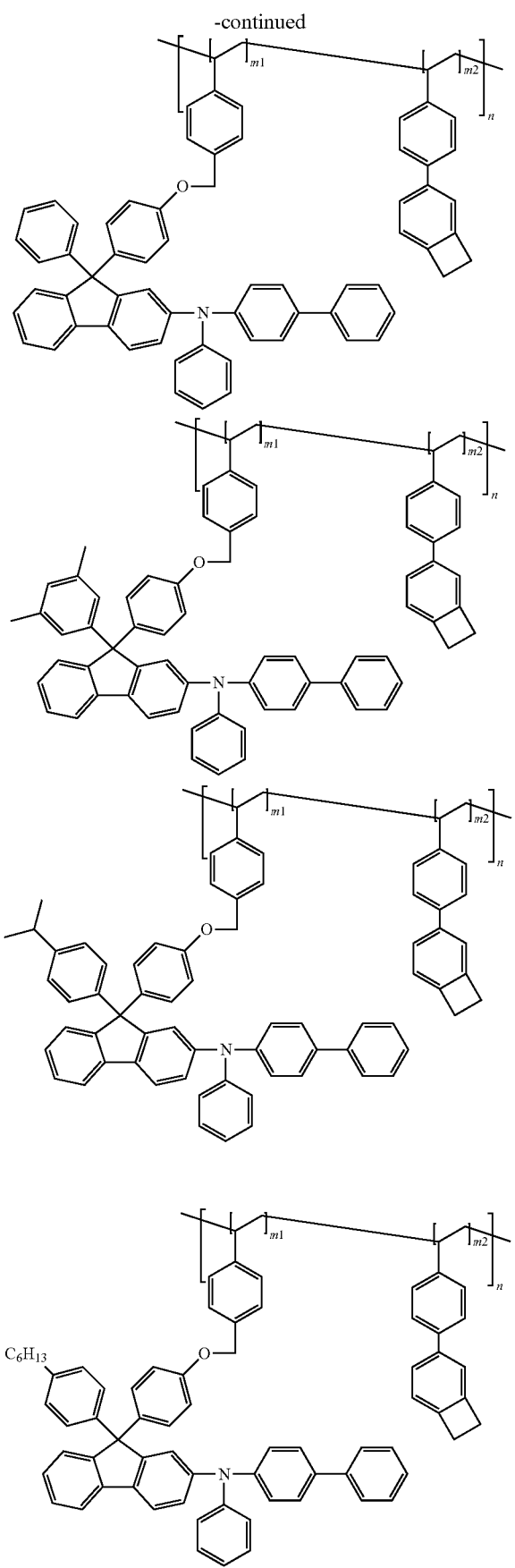
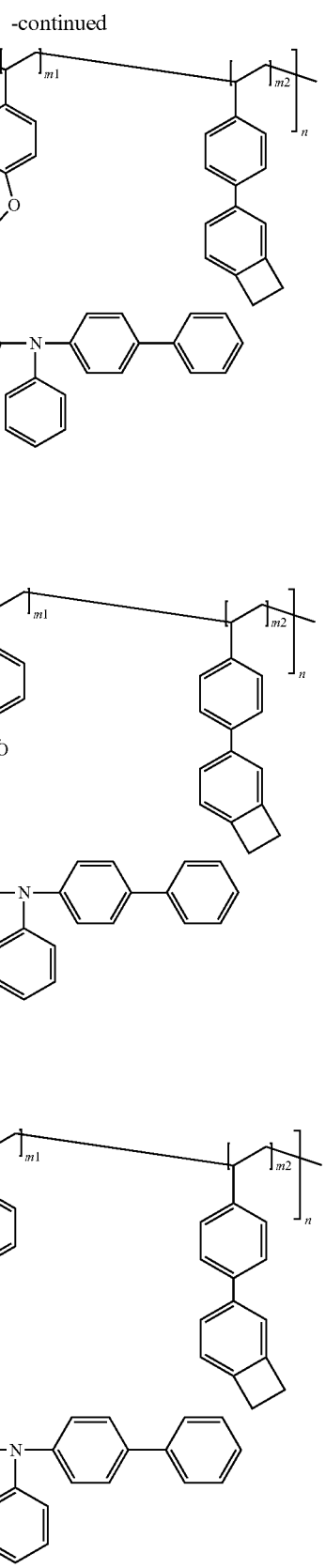

93
-continued
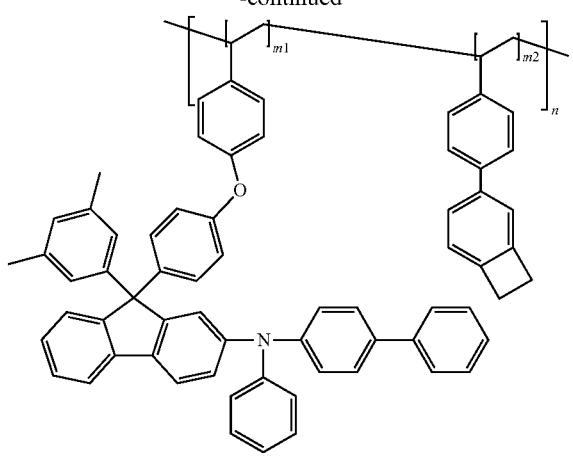
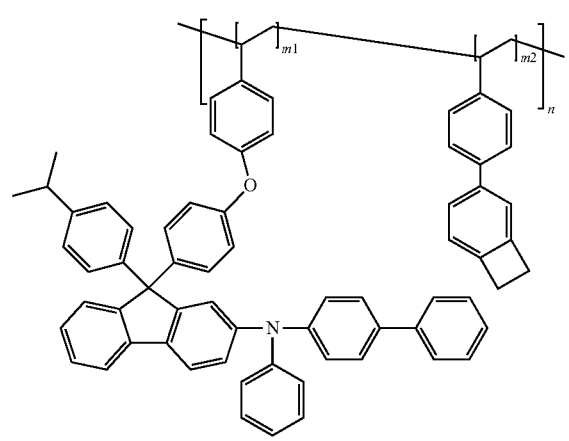
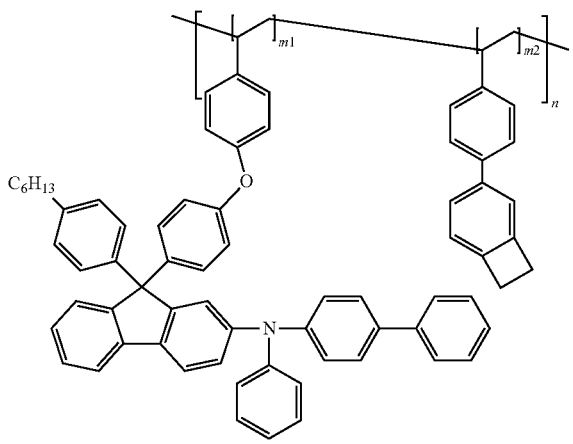
94
-continued
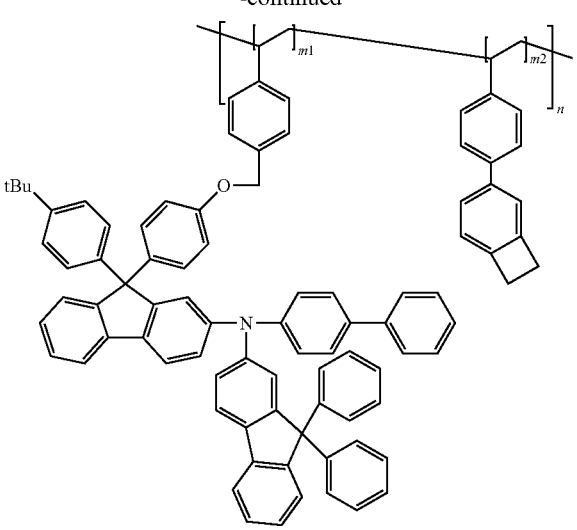
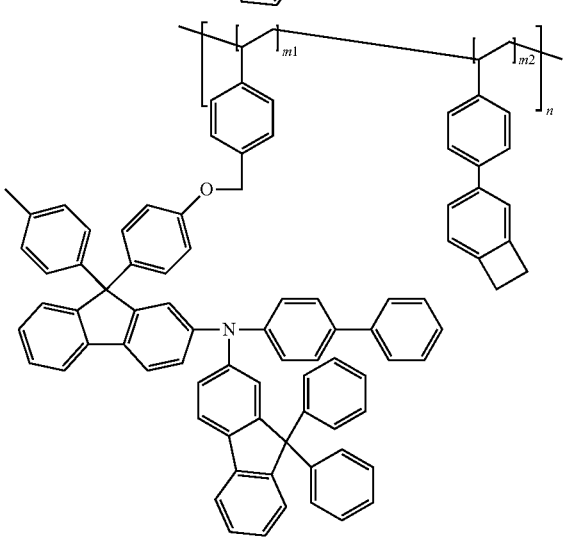
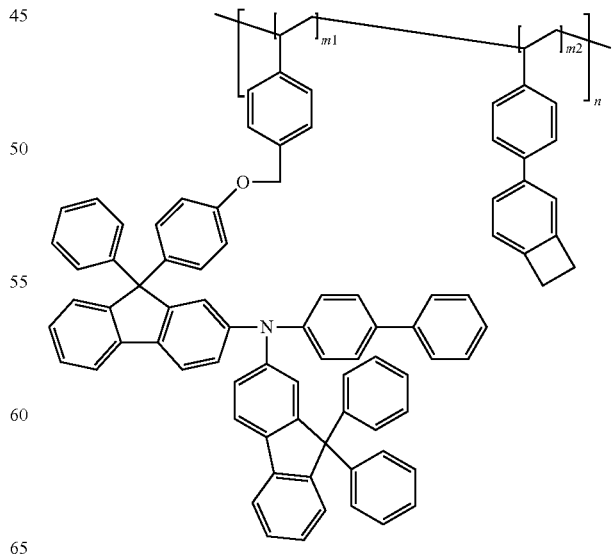

95
-continued
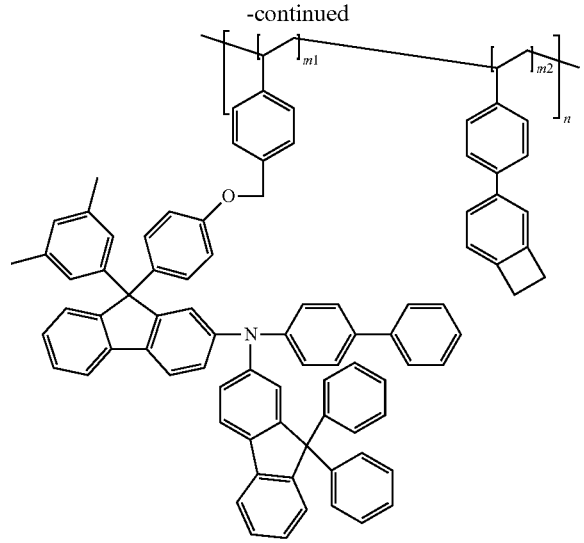
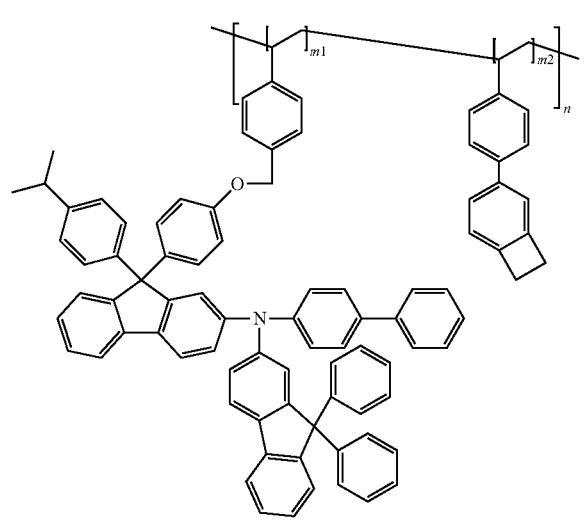
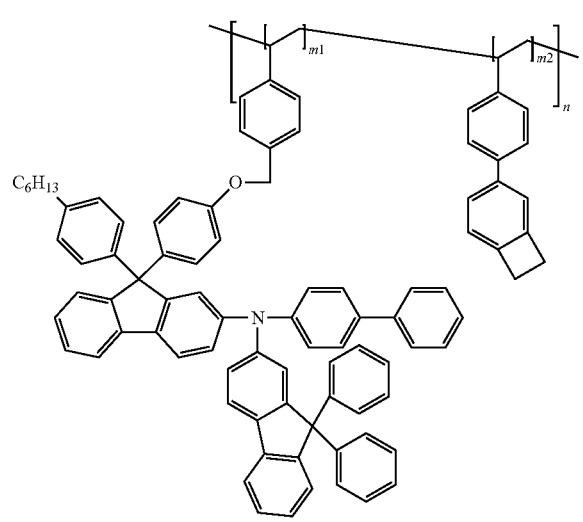
96
-continued
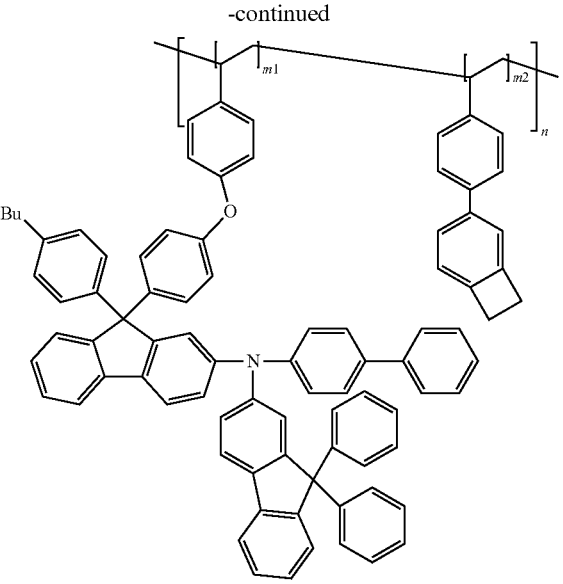
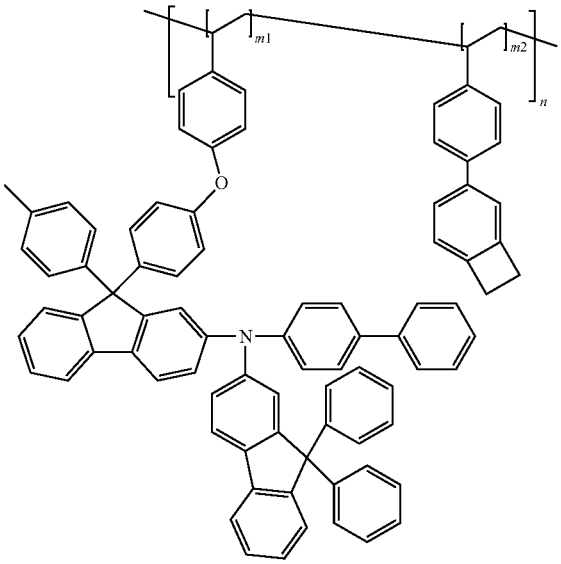
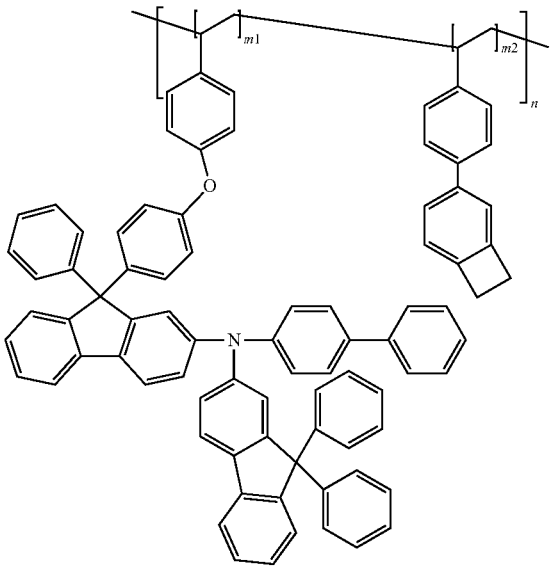

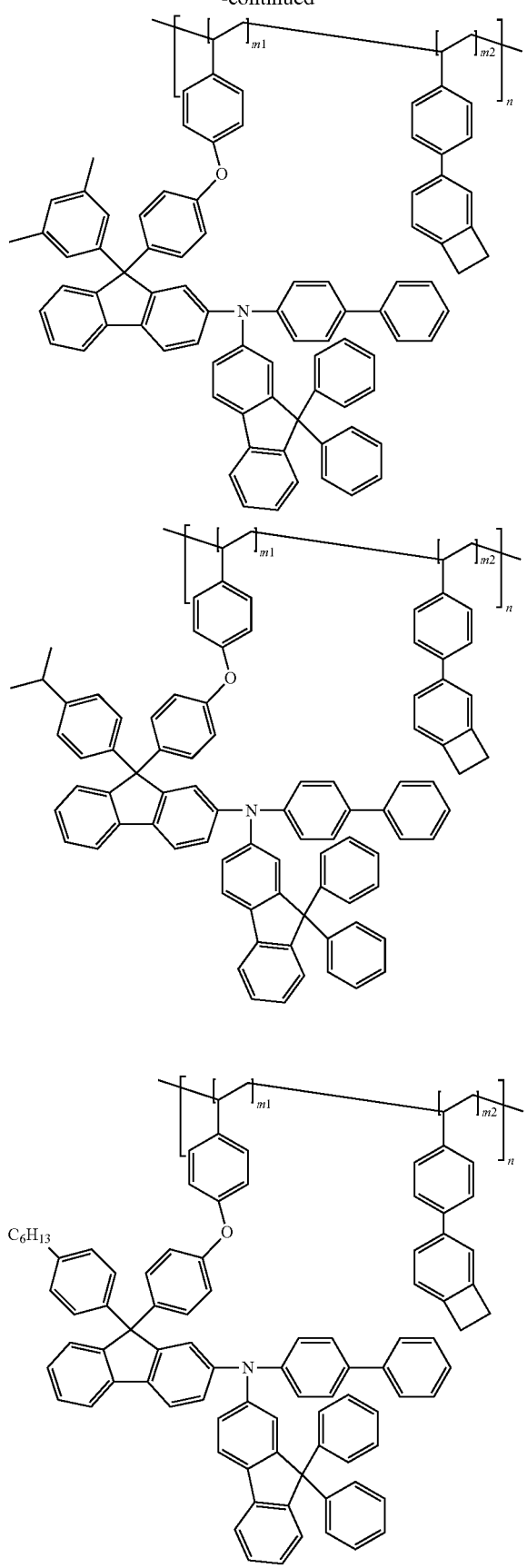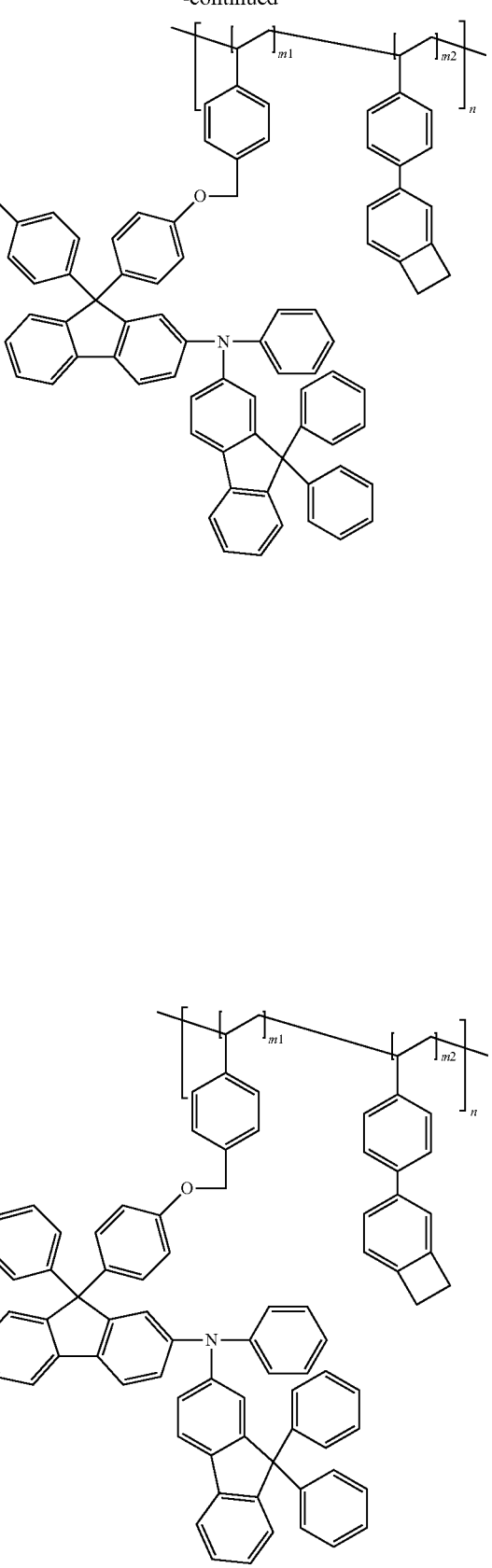

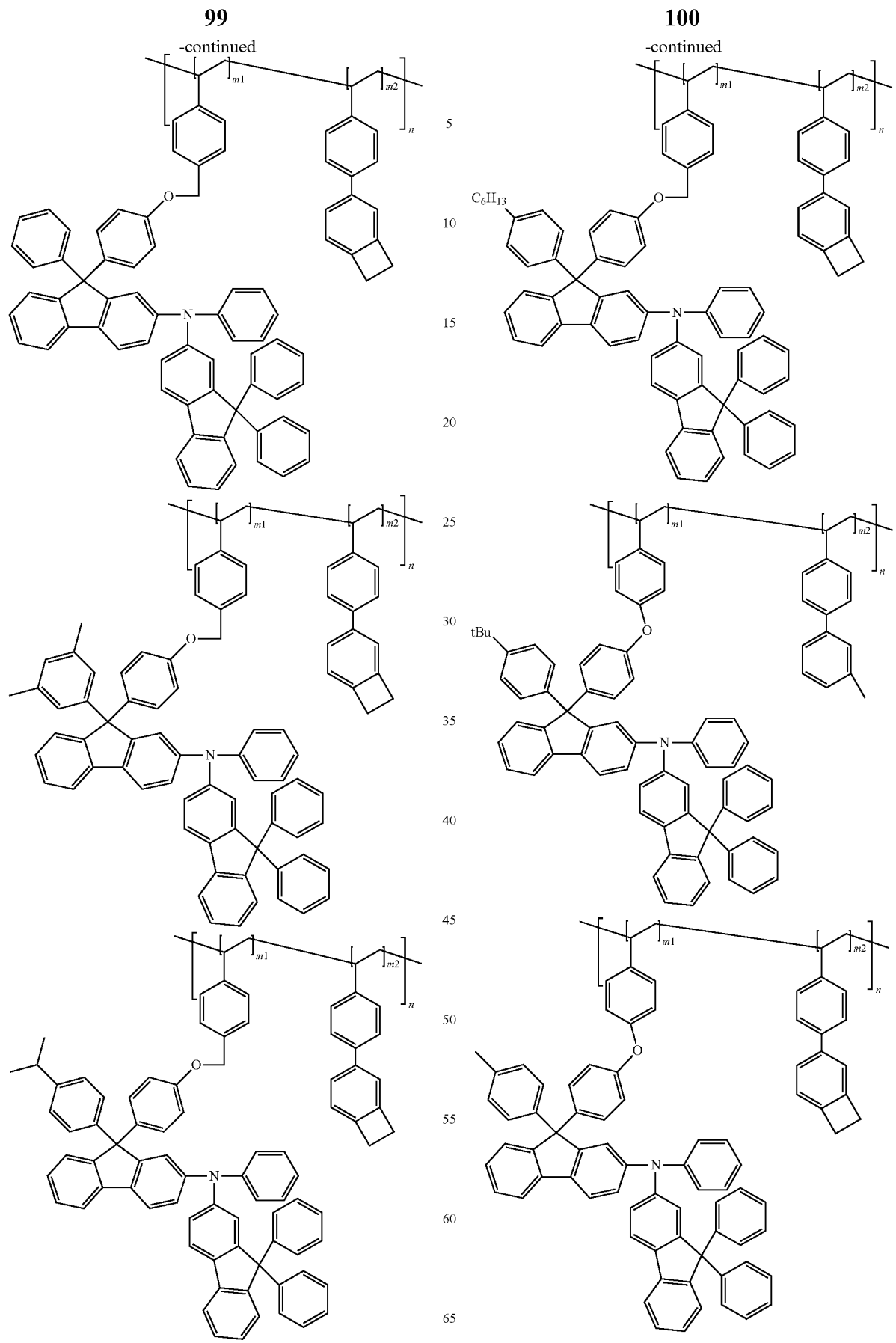

101
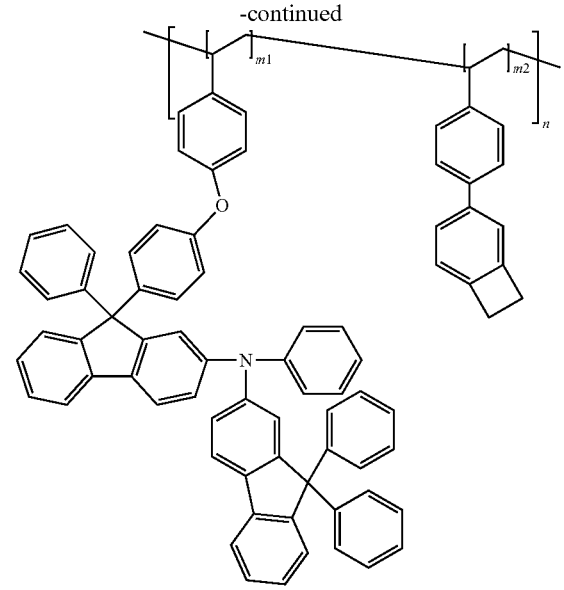
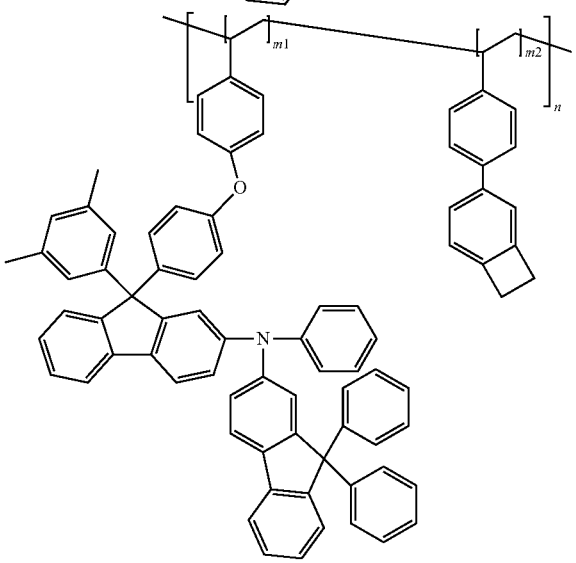
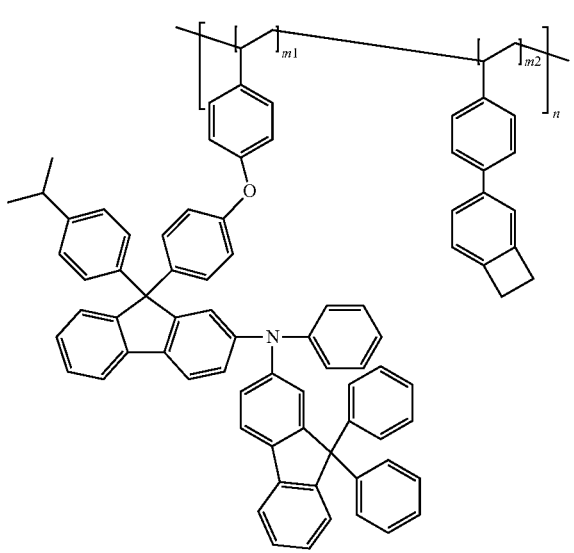
102
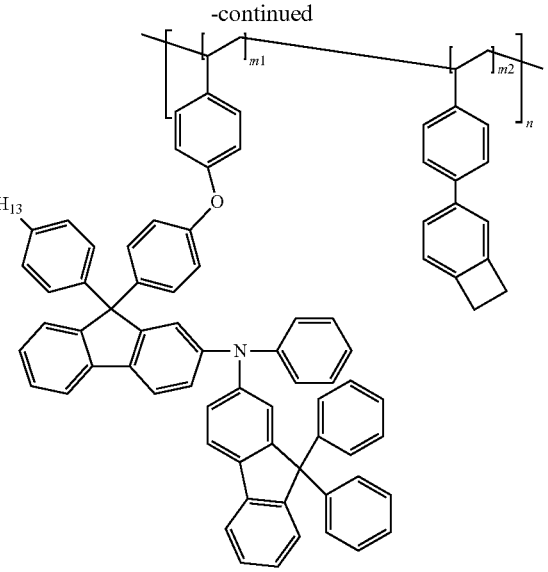
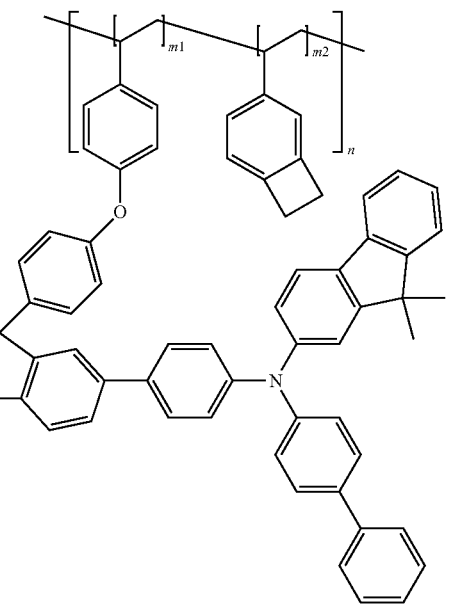

103
-continued

104
-continued

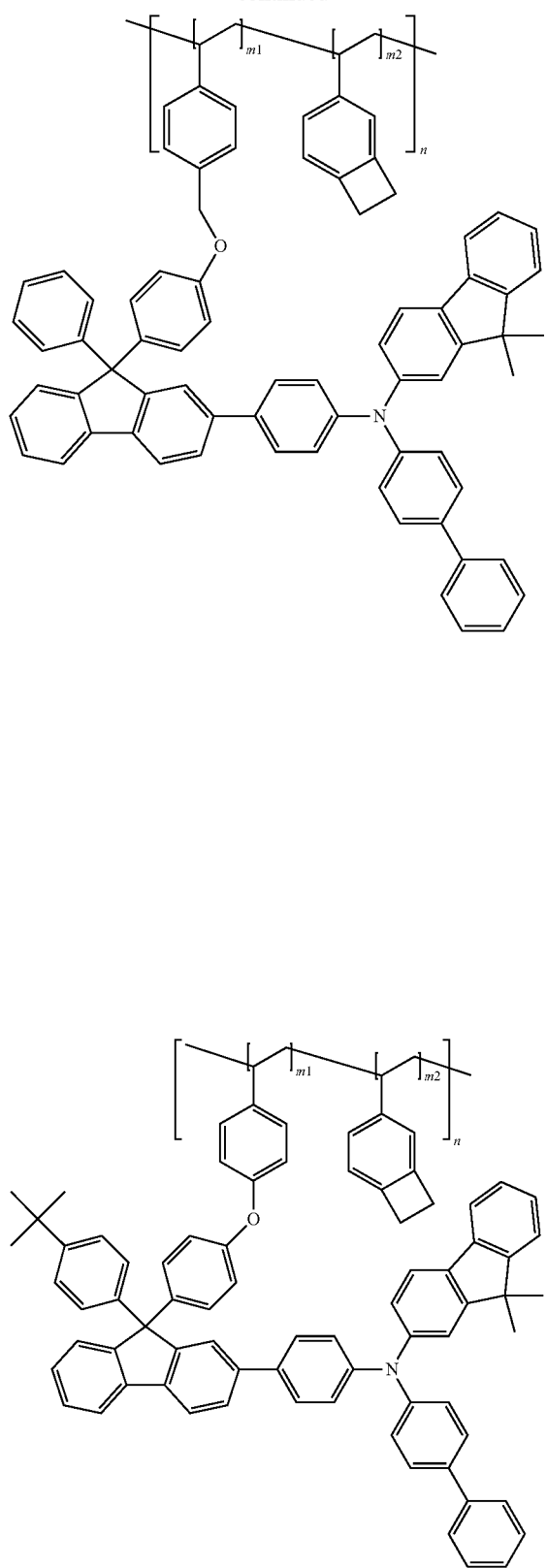

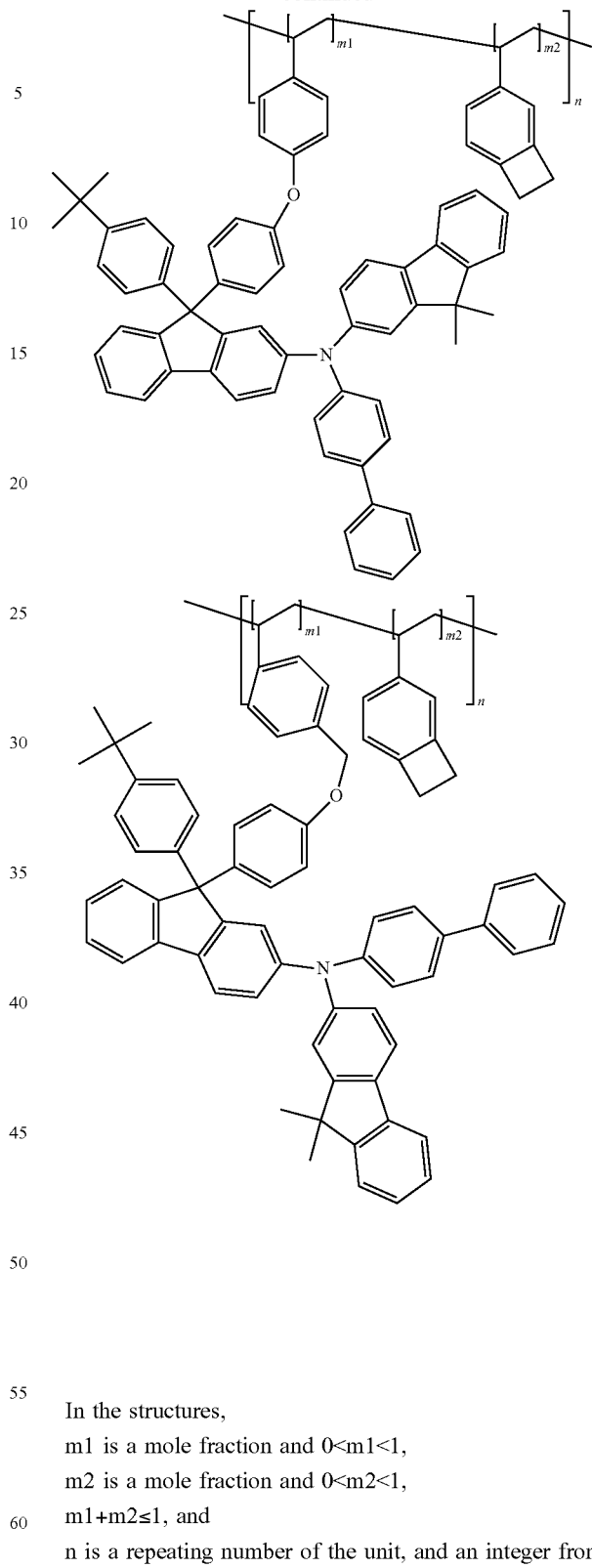

In the structures, m1 is a mole fraction and 0<m1<1, m2 is a mole fraction and 0<m2<1, m1+m2≤1, and n is a repeating number of the unit, and an integer from 1 to 10,000.

In an exemplary embodiment of the present specification, the polymer comprising the first unit represented by Formula 1 and the second unit represented by Formula 2 may be any one selected from the following structures.

105
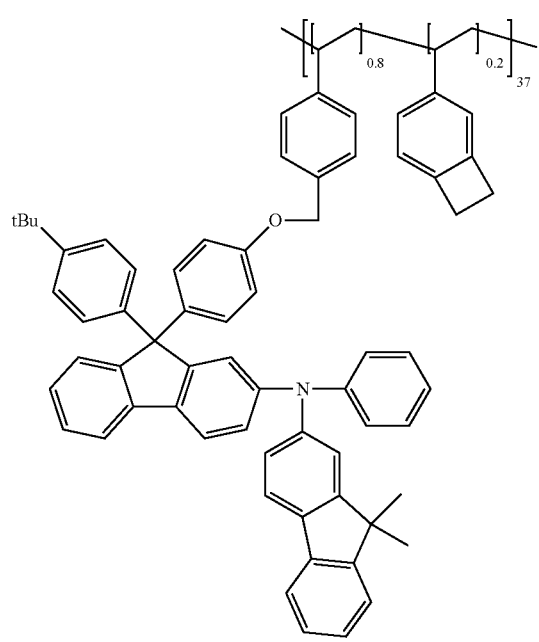
106
-continued
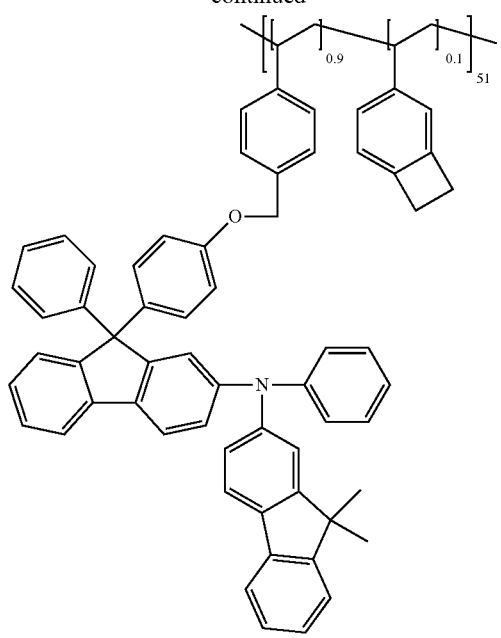
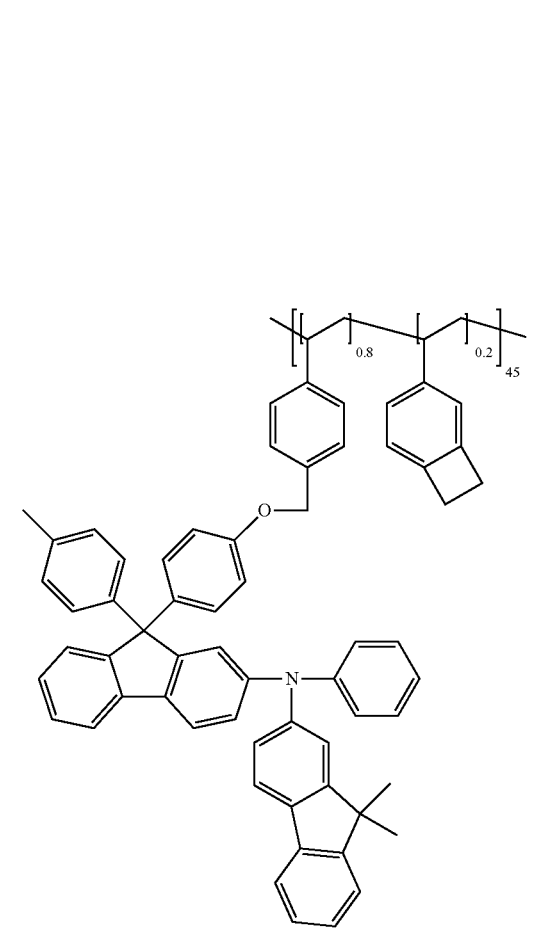
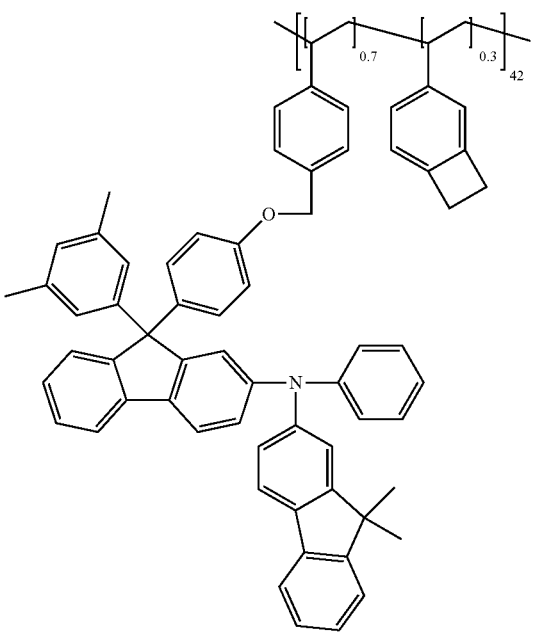

107
-continued
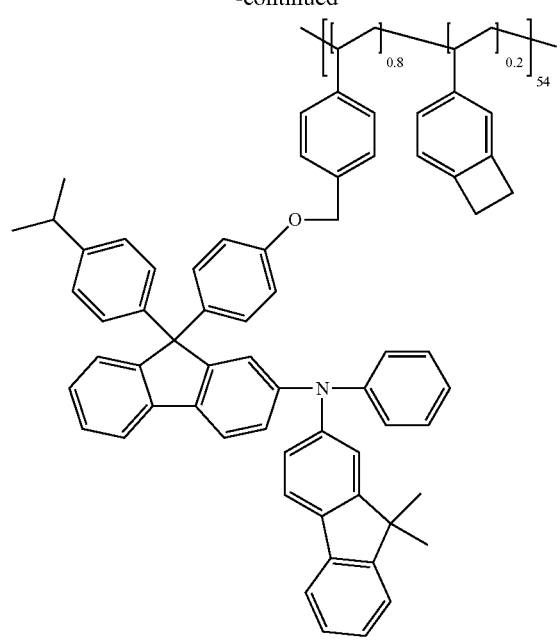
108
-continued
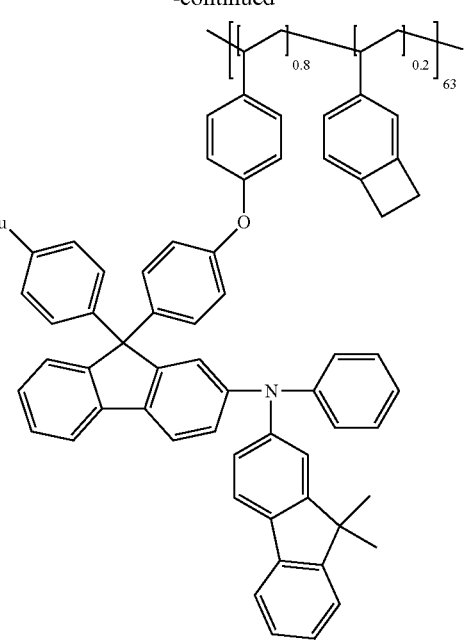
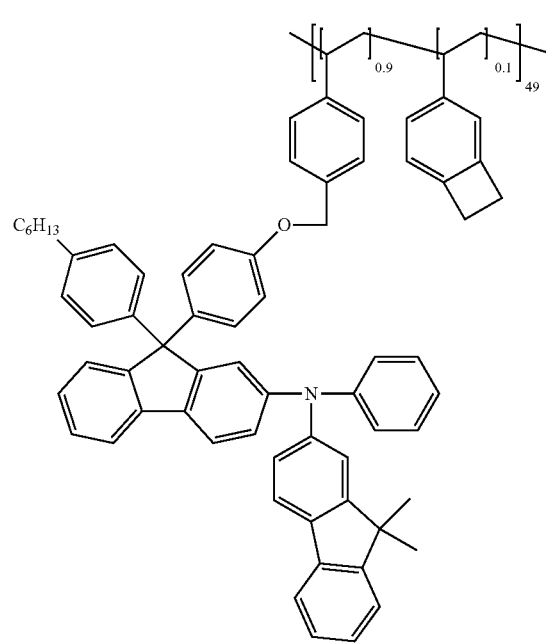
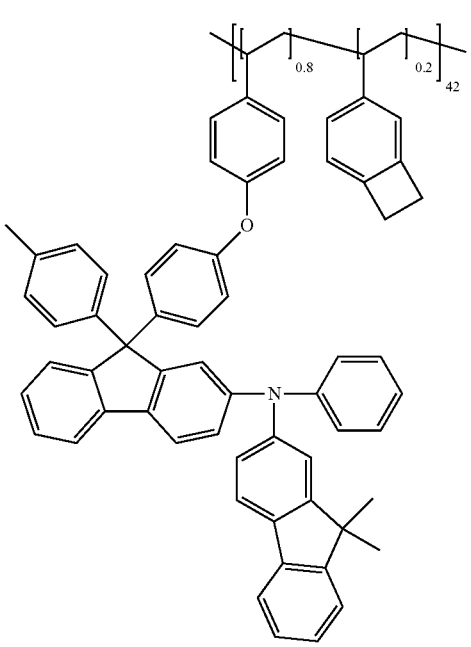

109
-continued
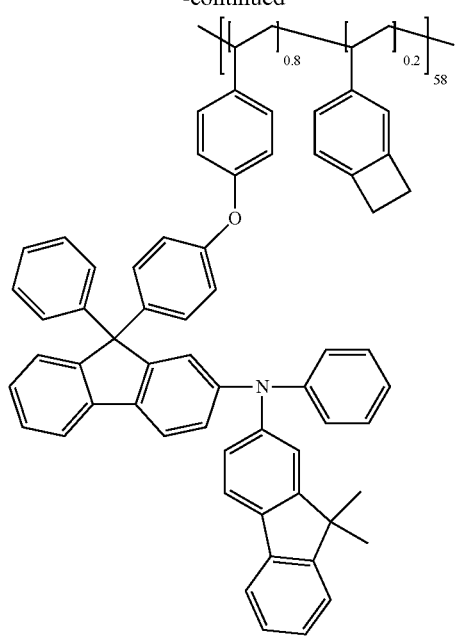
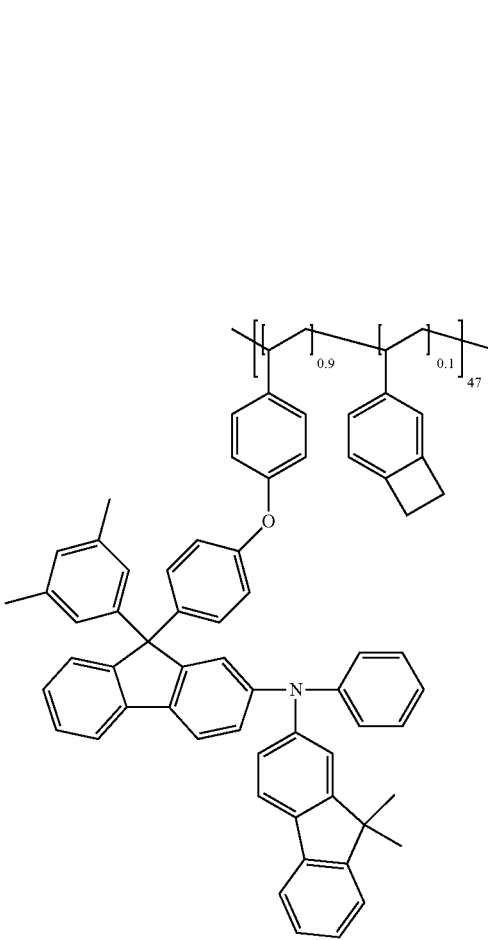
110
-continued
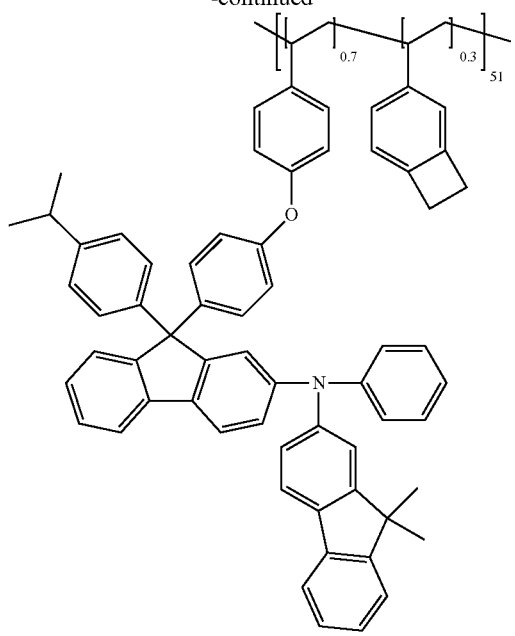
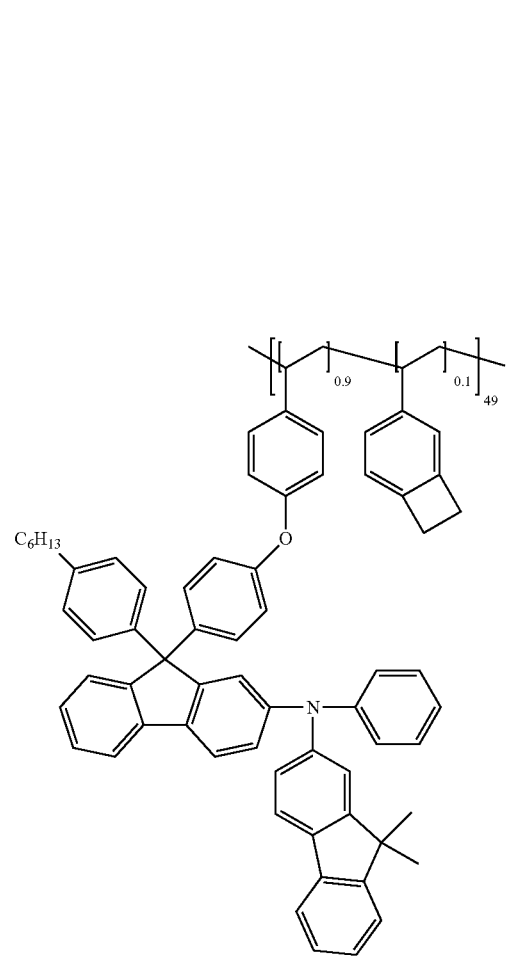

111
-continued
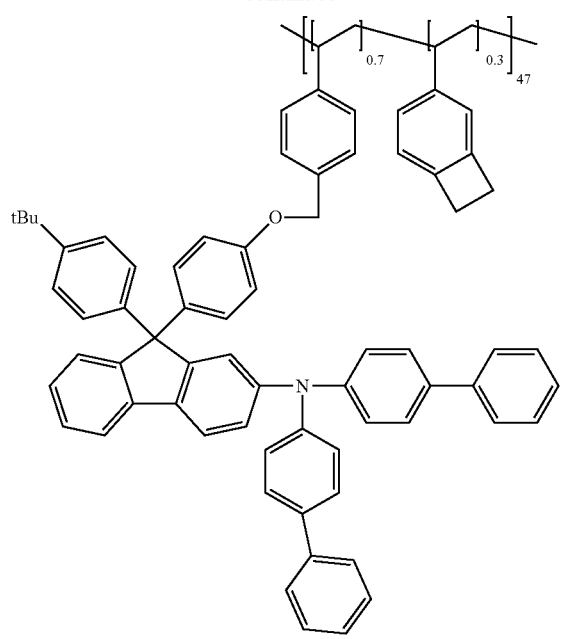
112
-continued
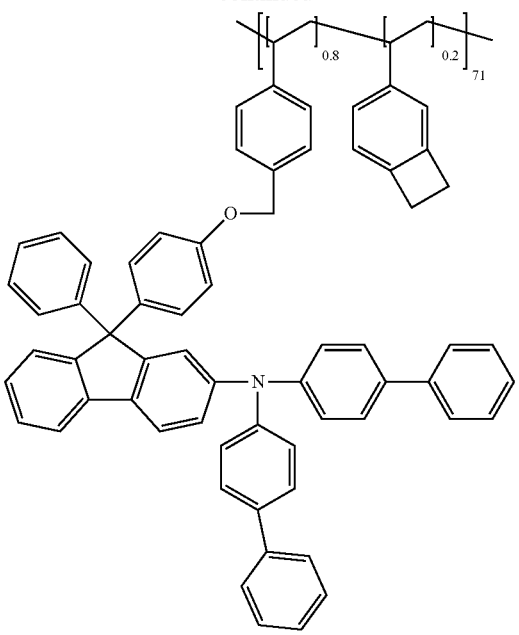
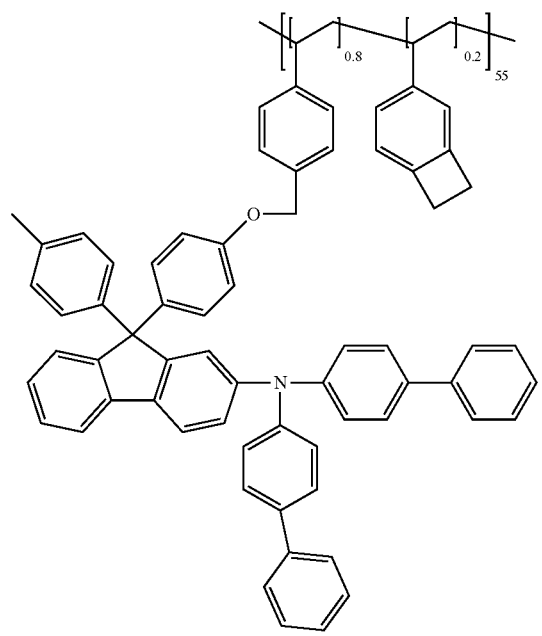
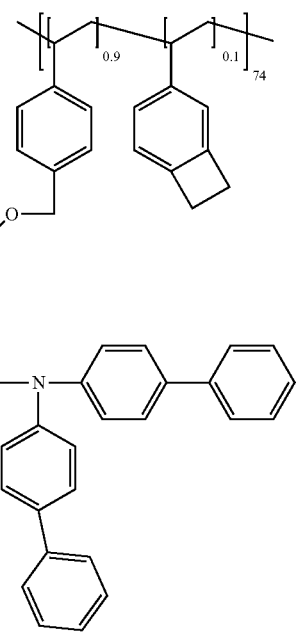

113
-continued
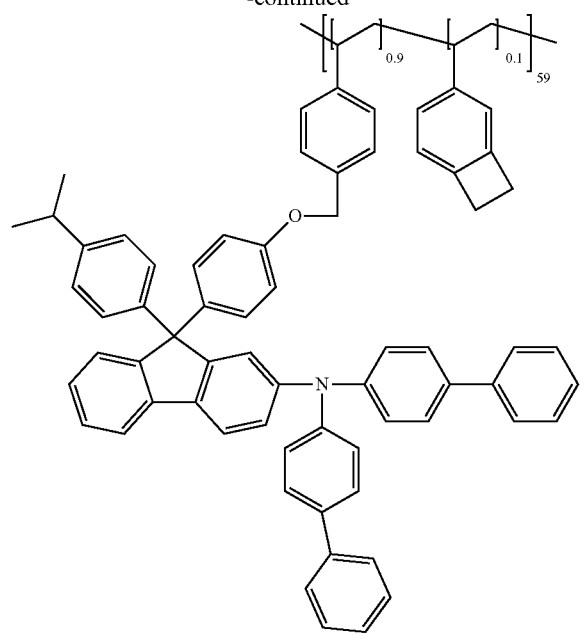
114
-continued
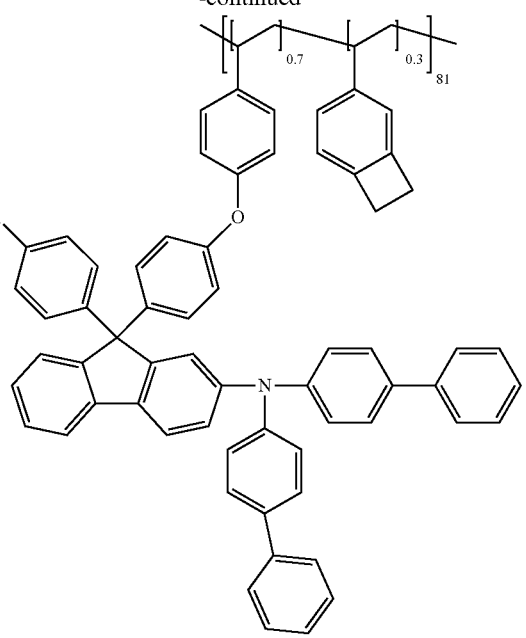
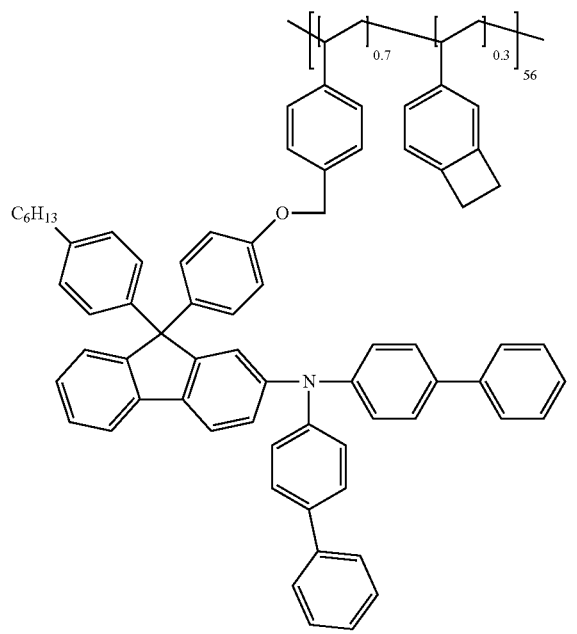
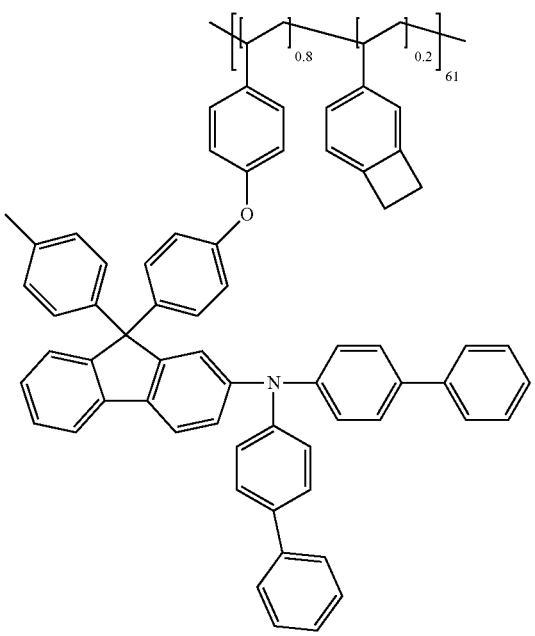

115
-continued
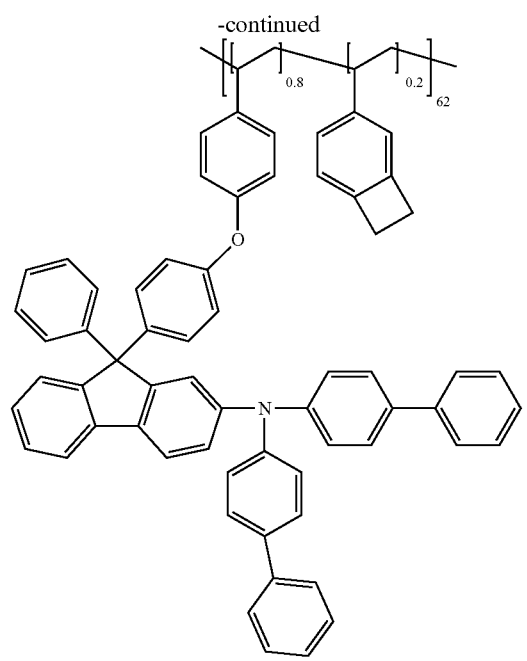
116
-continued
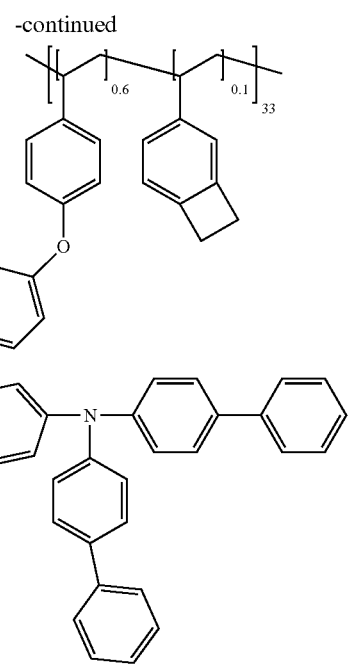
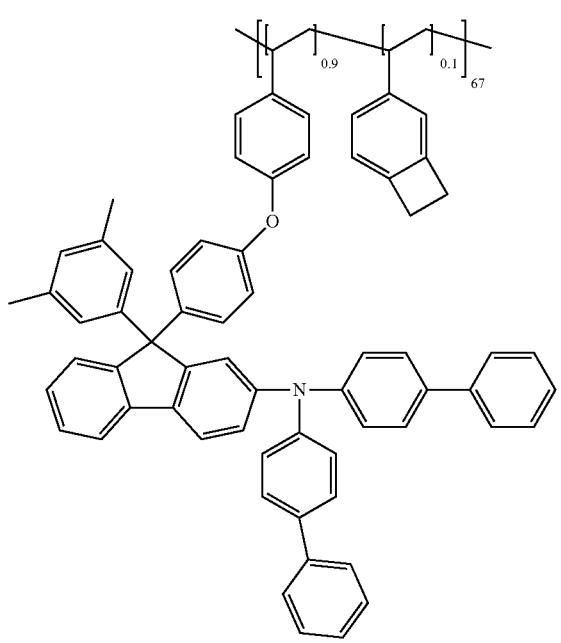
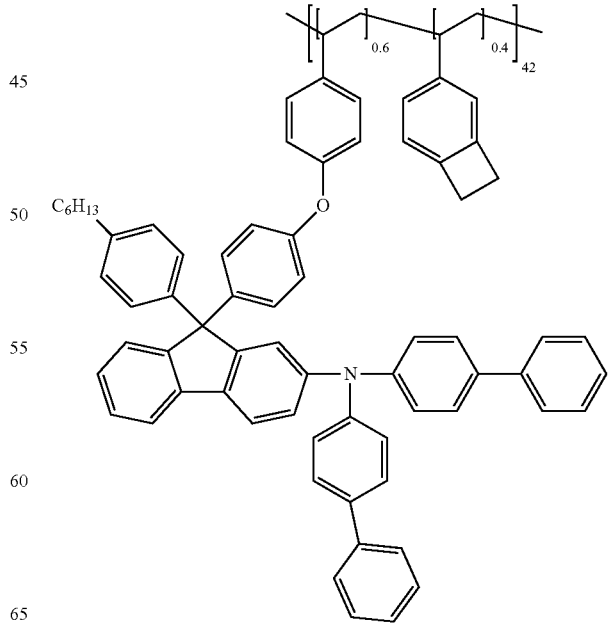

117
-continued
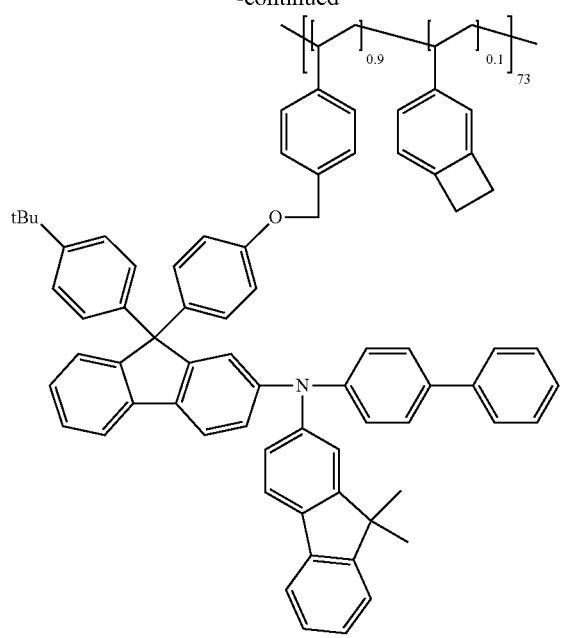
118
-continued
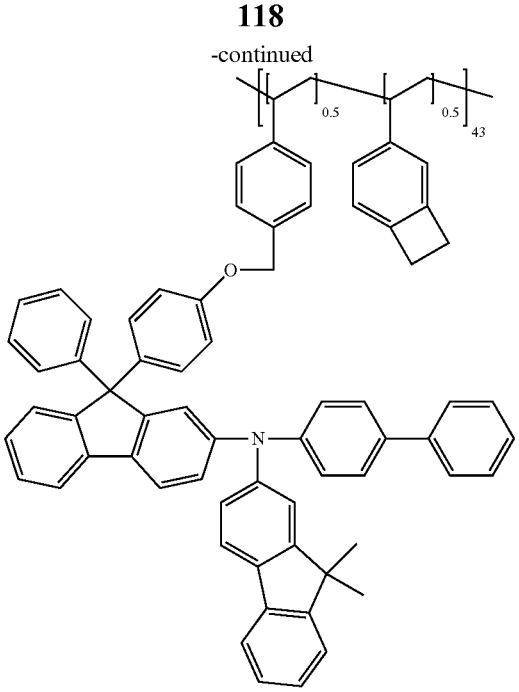
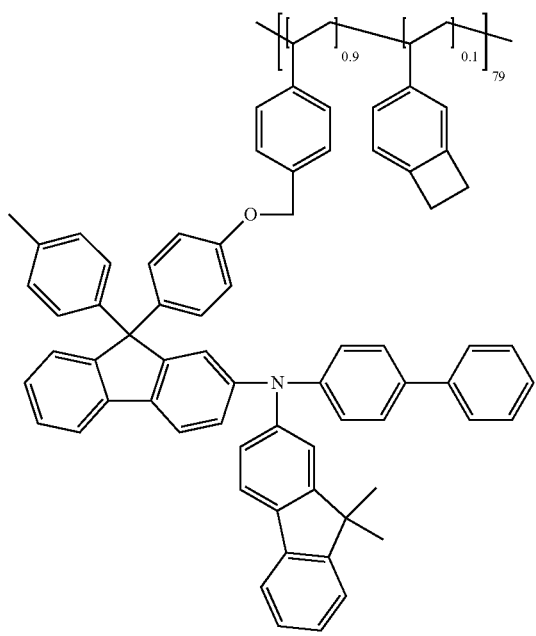

119
-continued
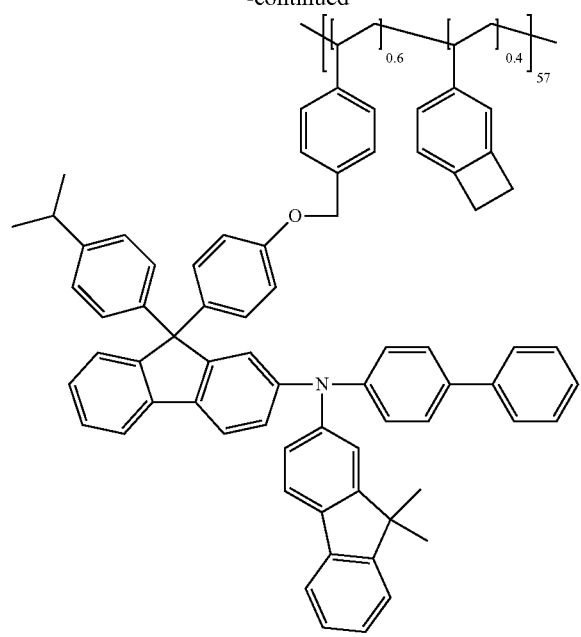
120
-continued
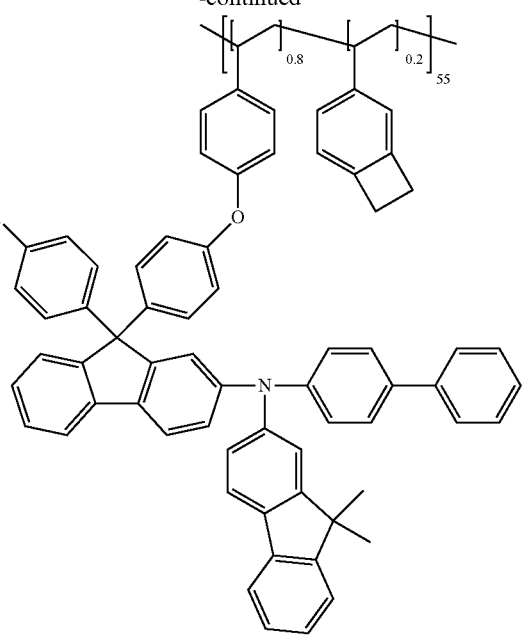
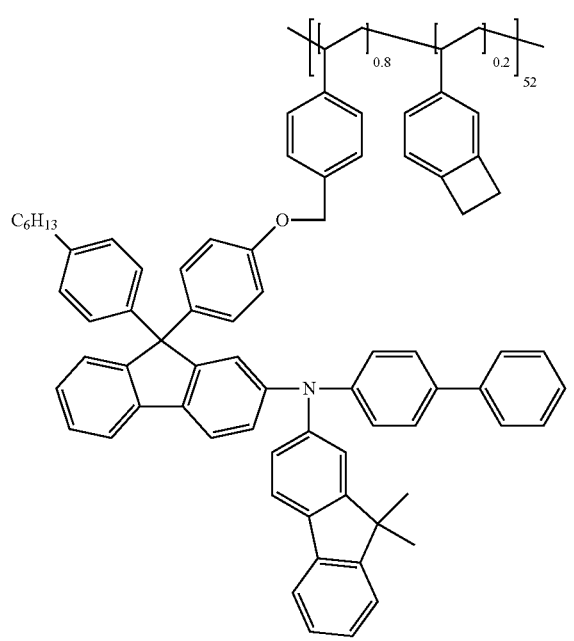
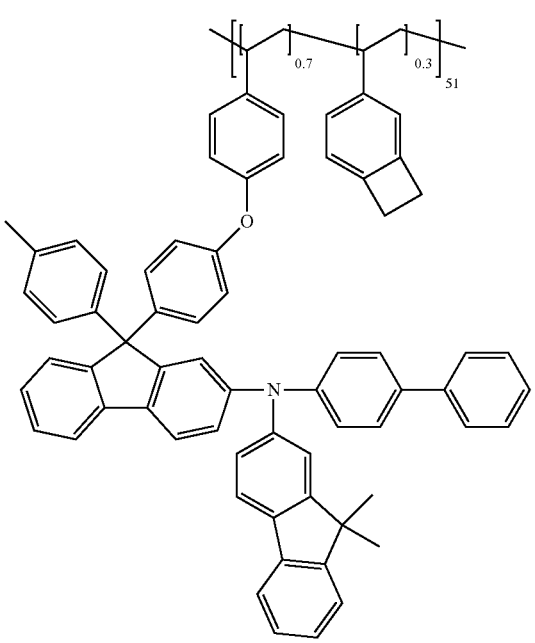

121
-continued
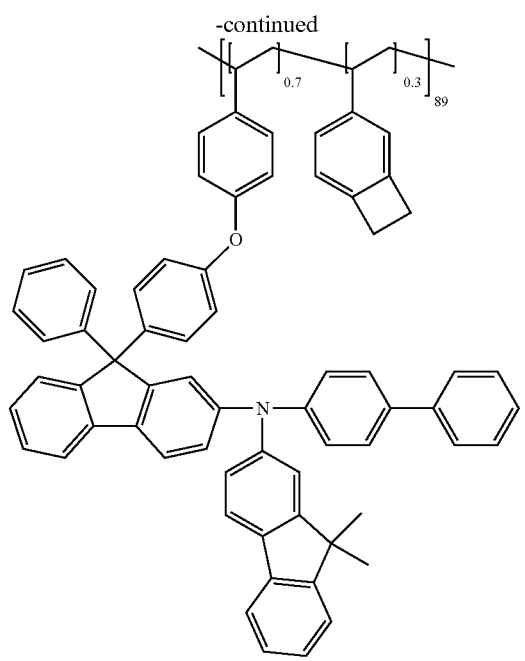
122
-continued
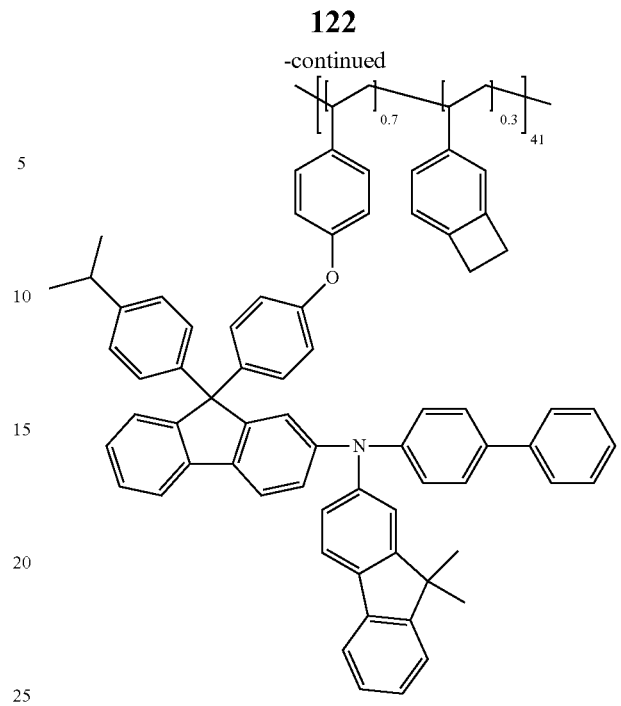
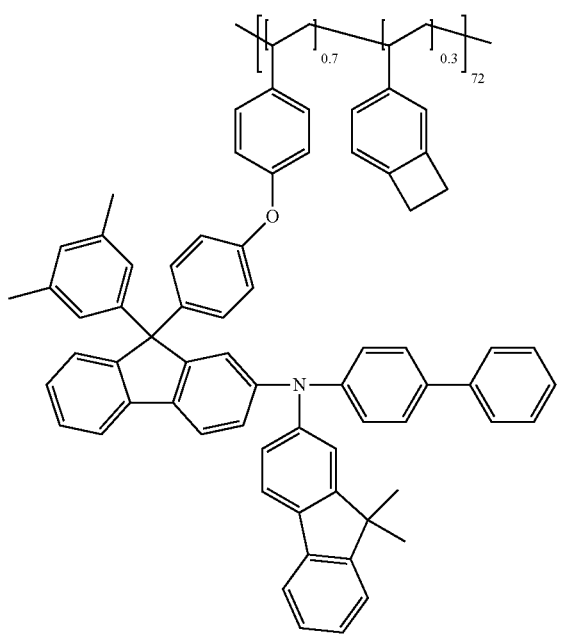
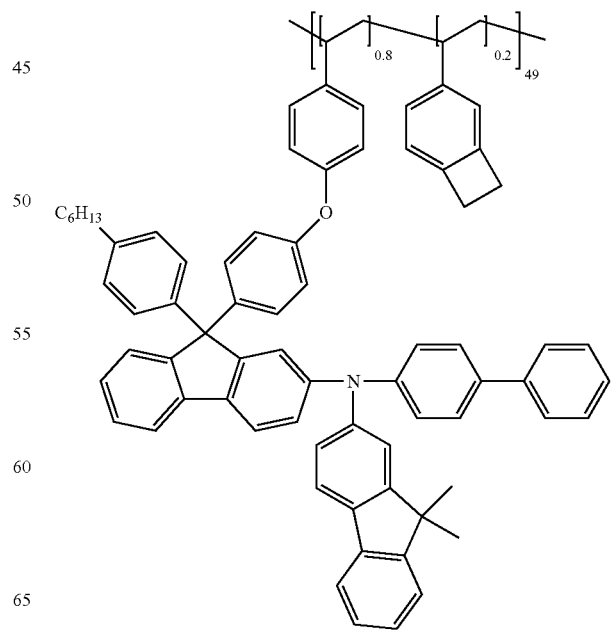

123
-continued
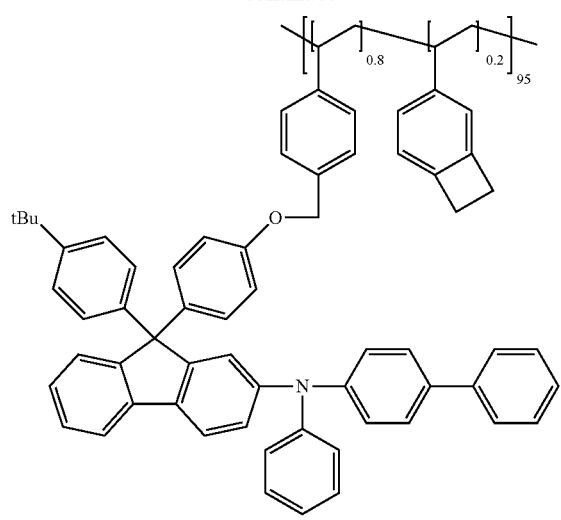
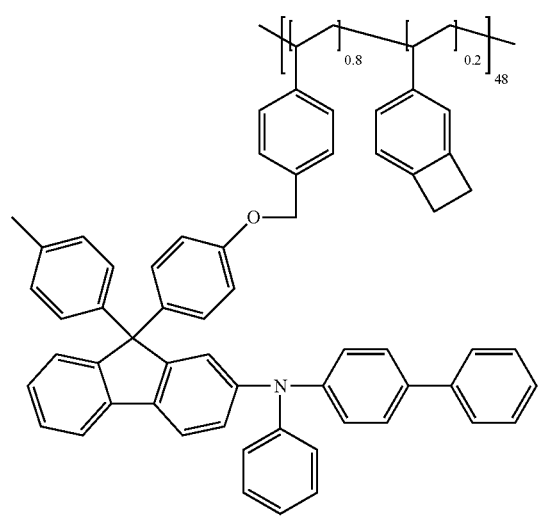
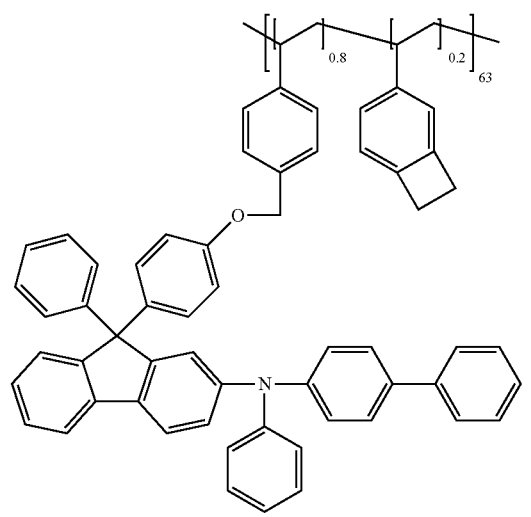
124
-continued
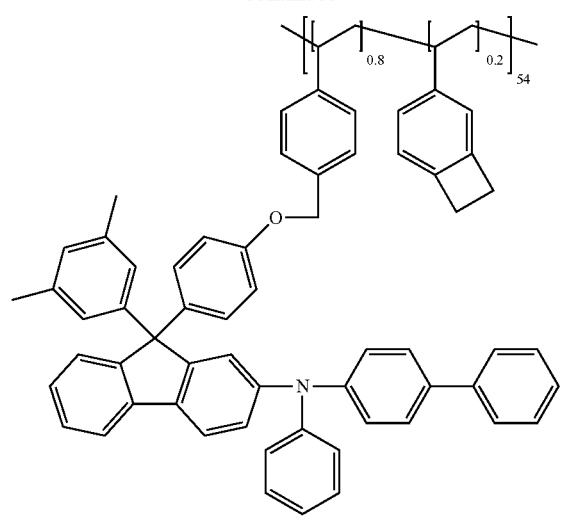
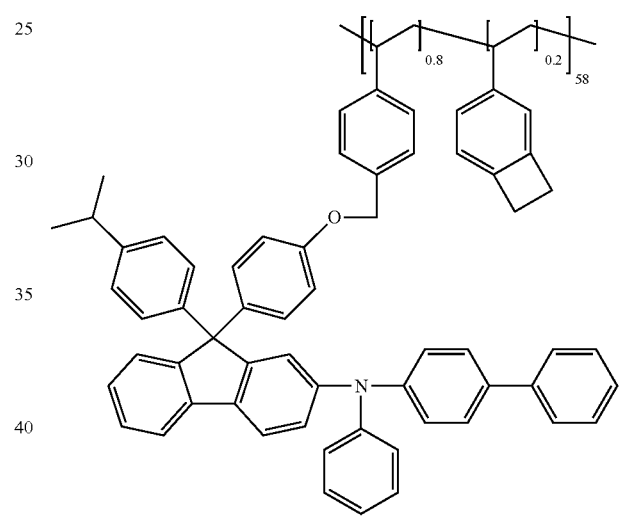
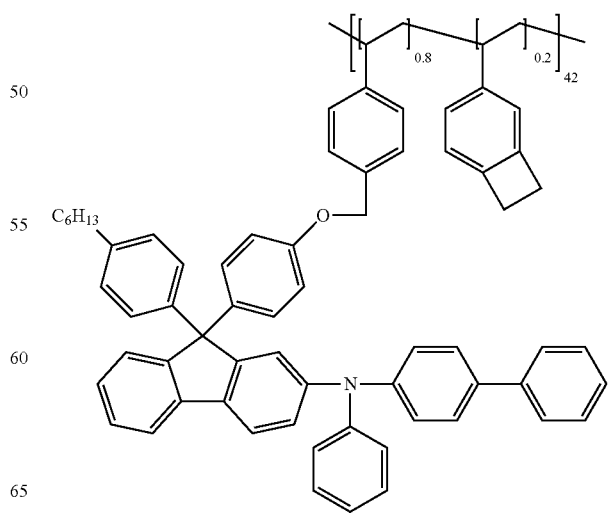

125
-continued
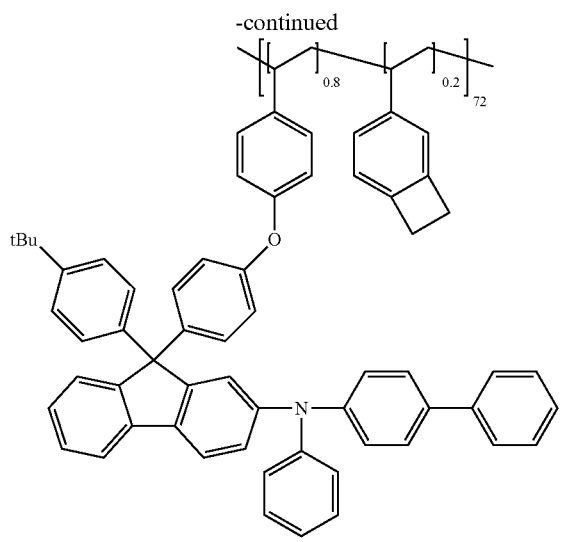
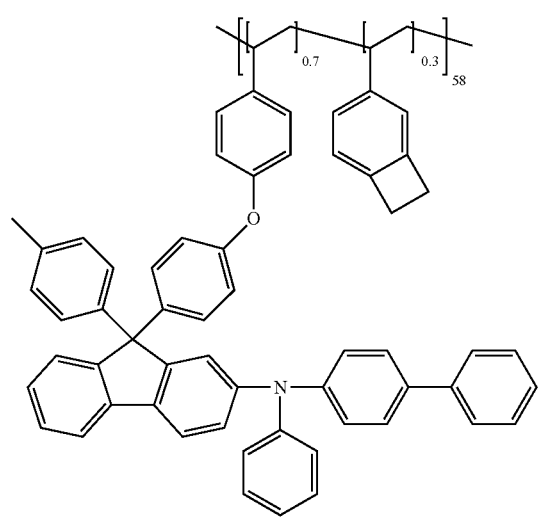
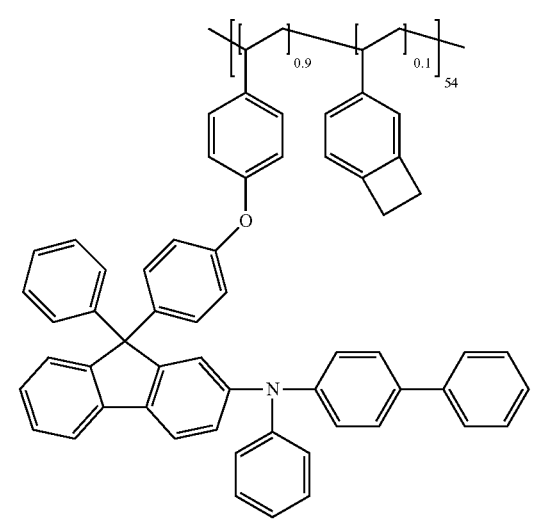
126
-continued
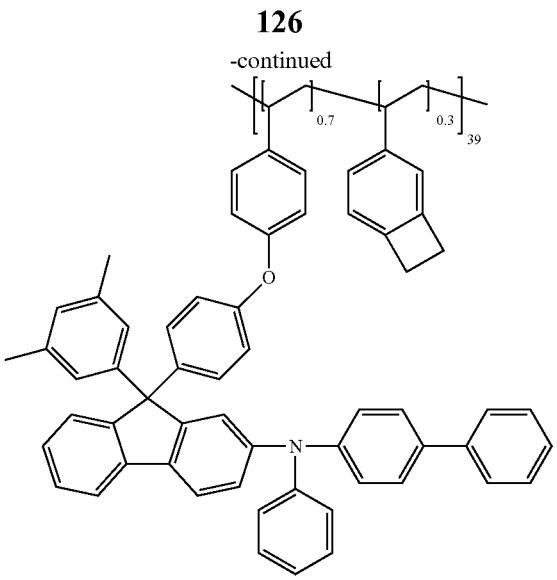
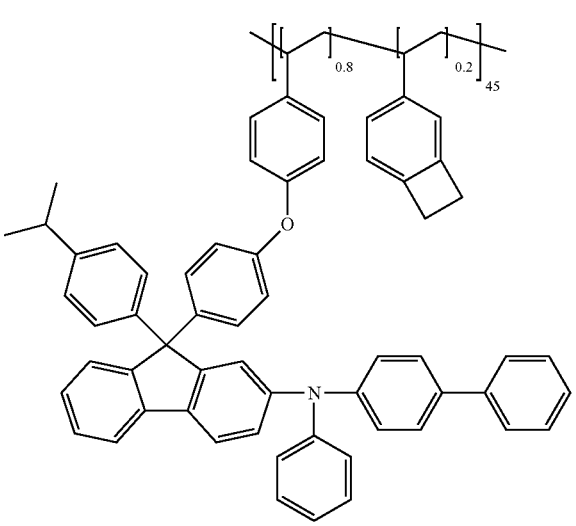
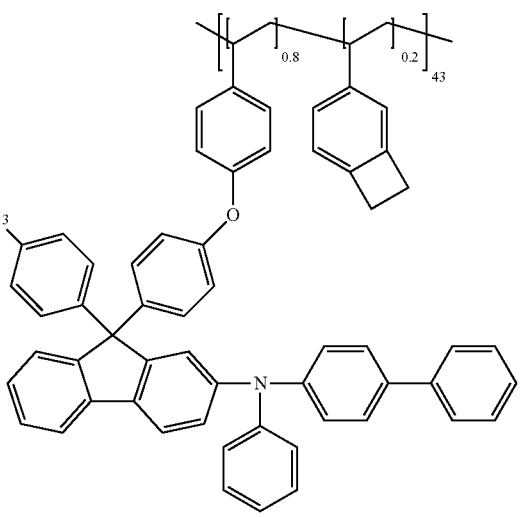

127
-continued
128
-continued
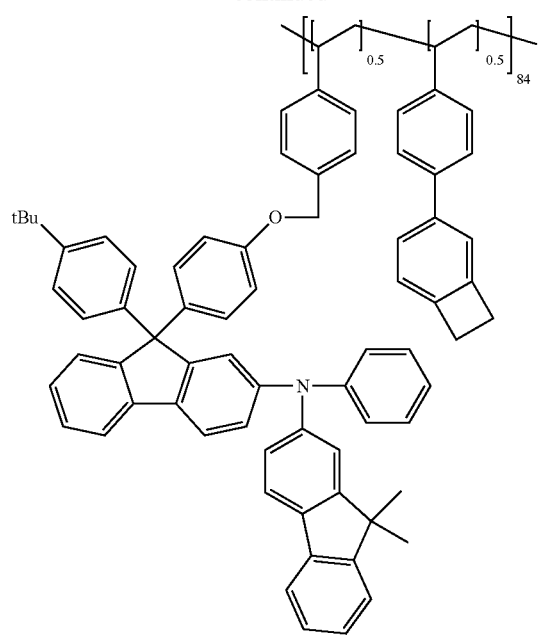
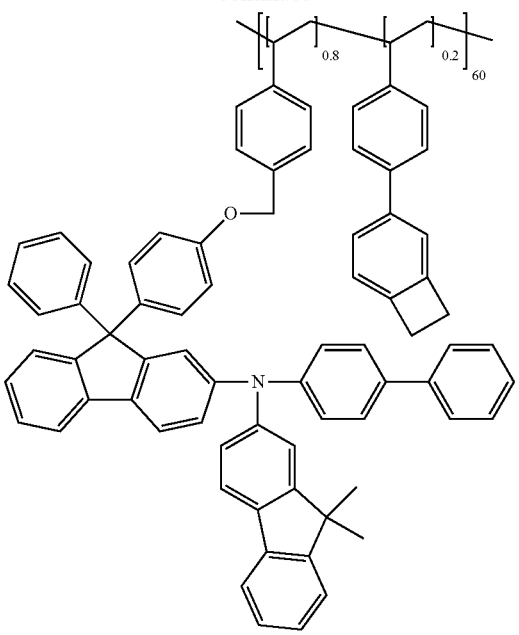
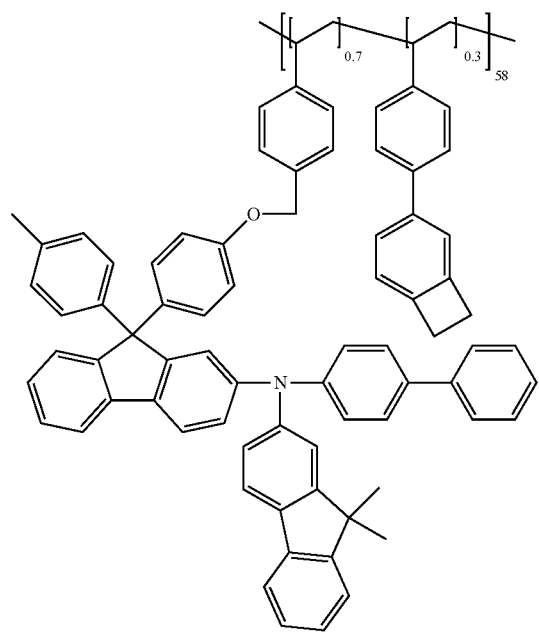
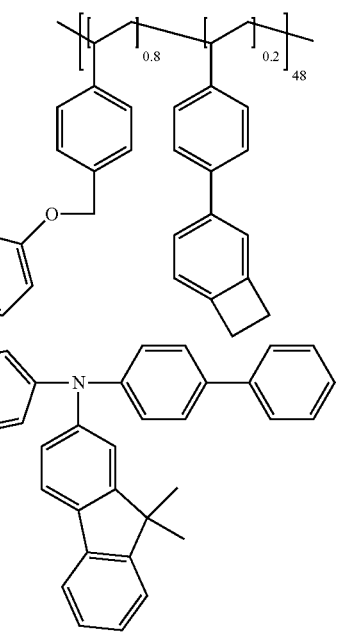

129
-continued
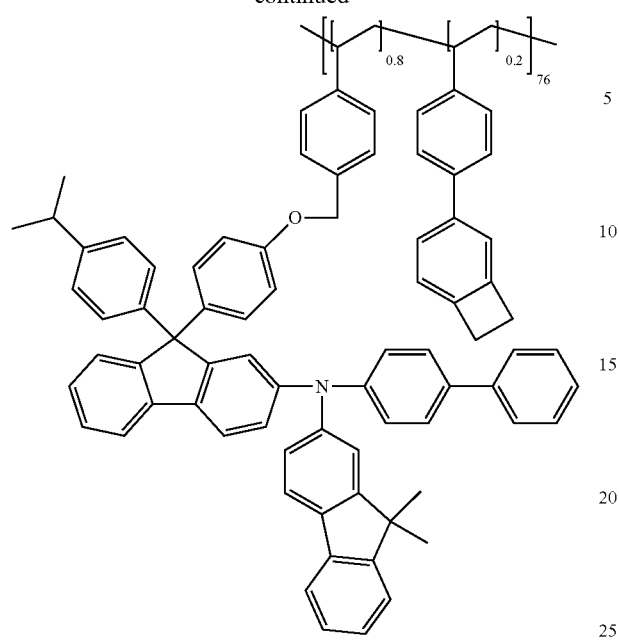
130
-continued
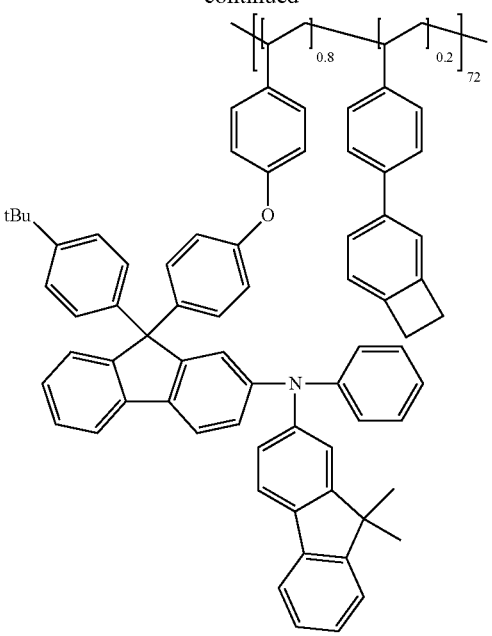
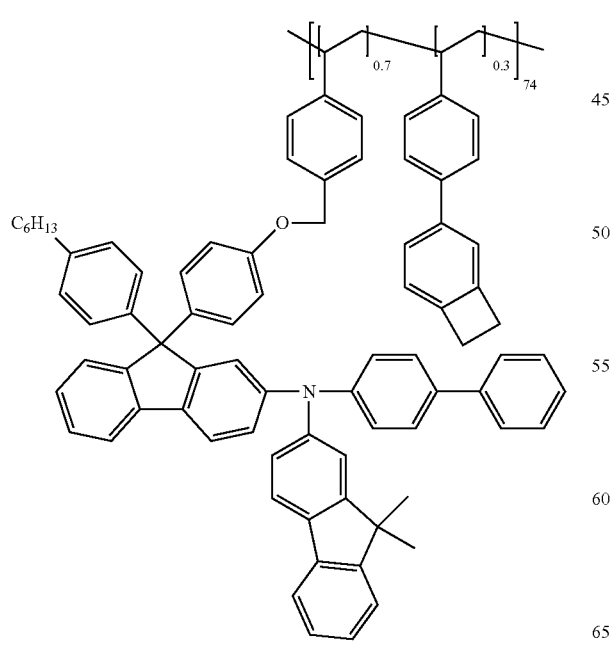
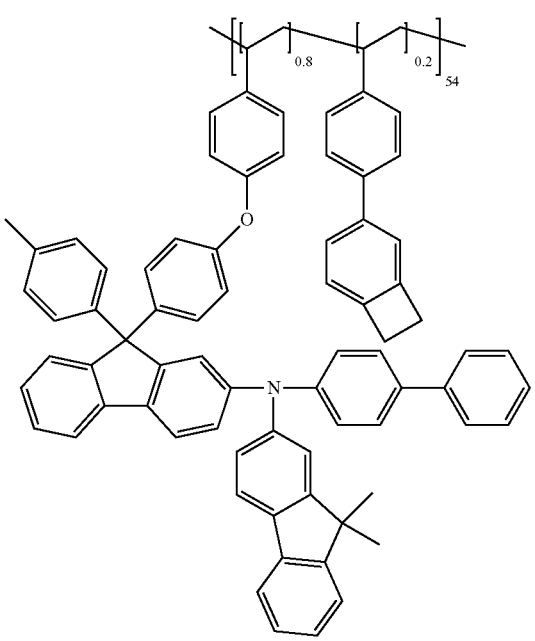

131
-continued
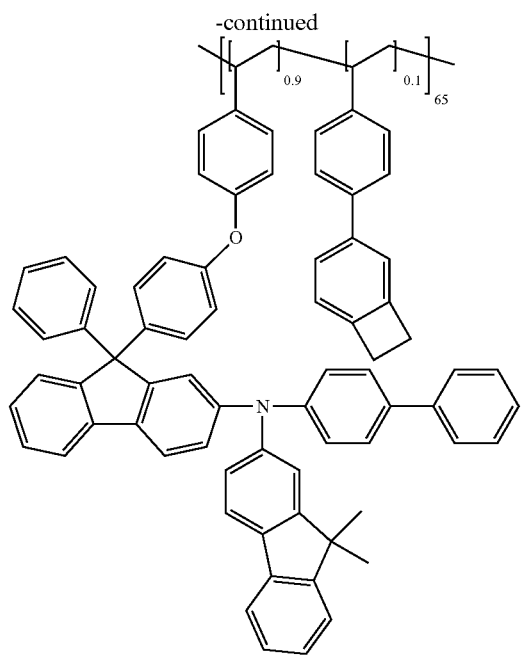
132
-continued
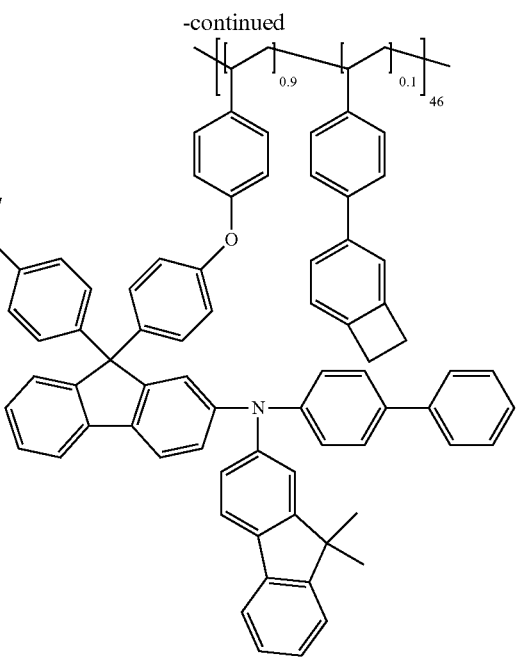
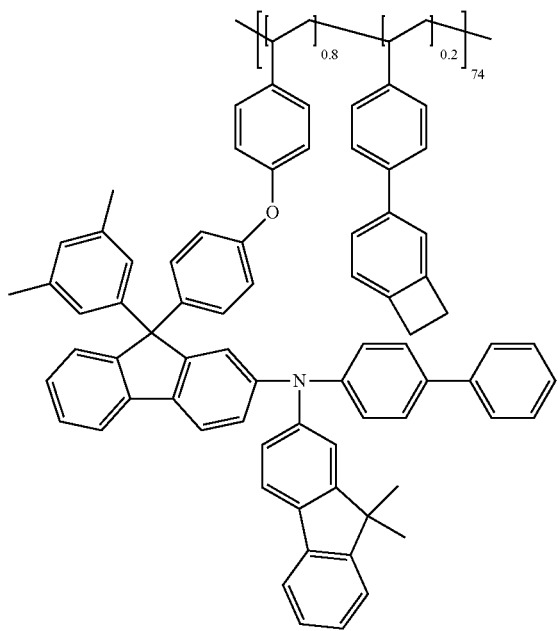
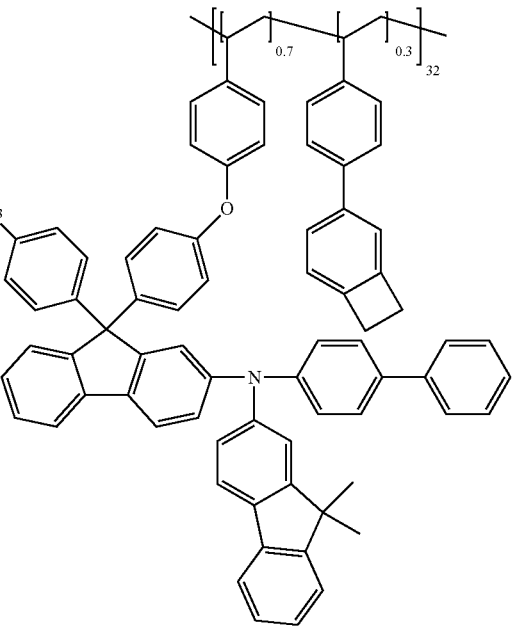

133
-continued
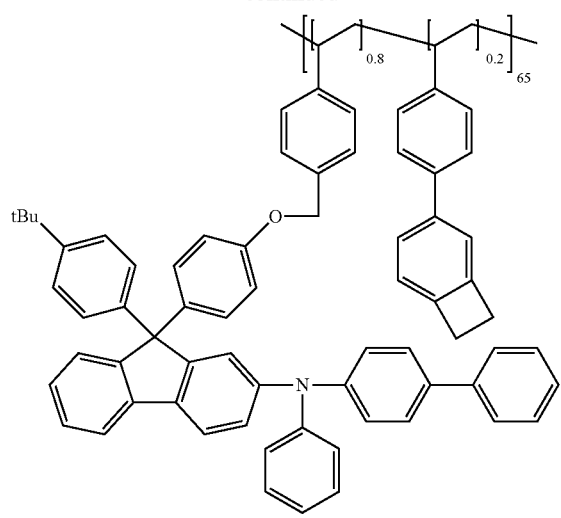
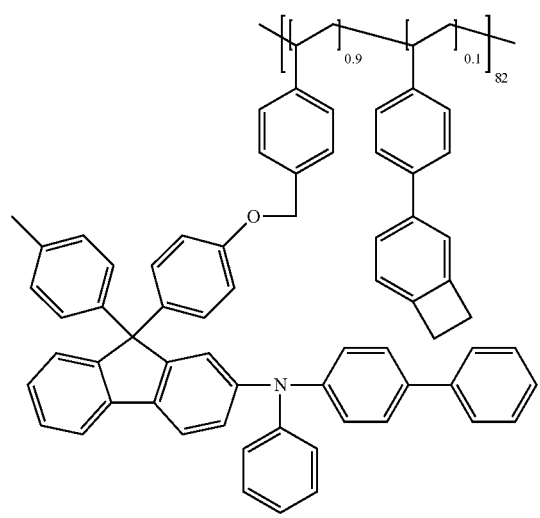
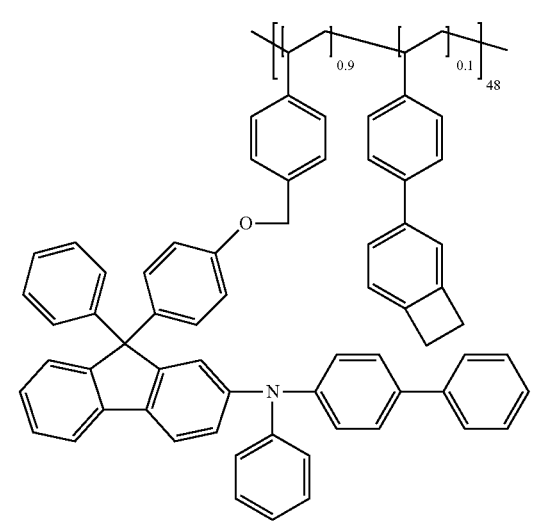
134
-continued
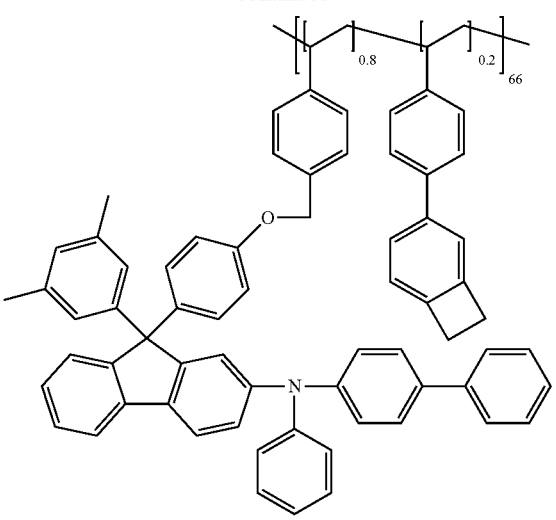
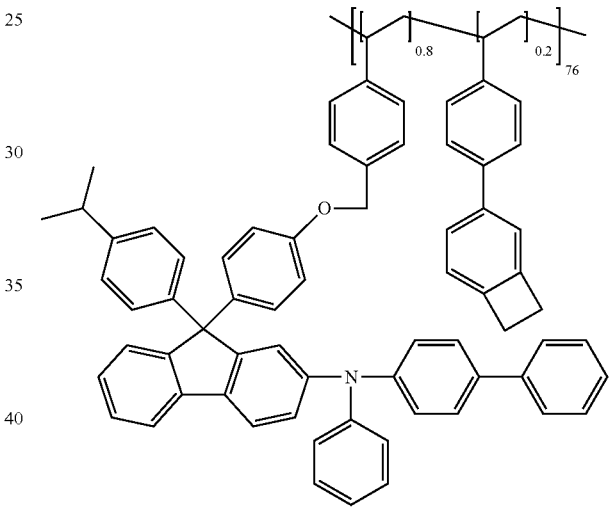
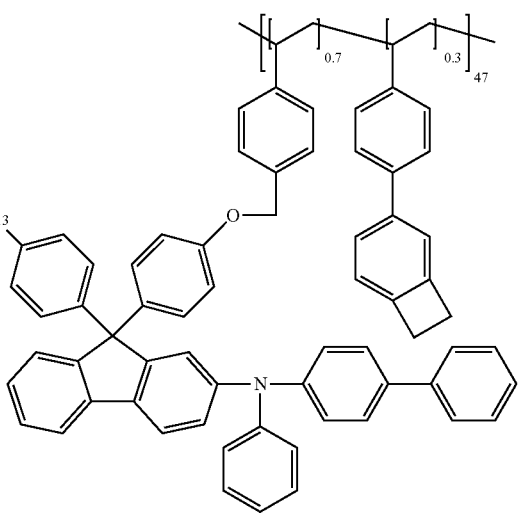

135
-continued
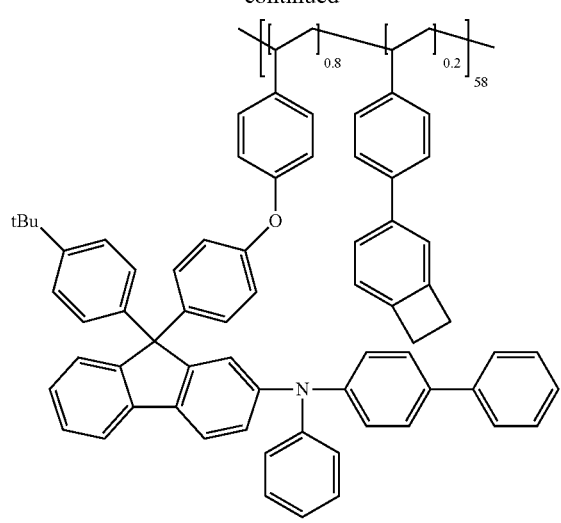
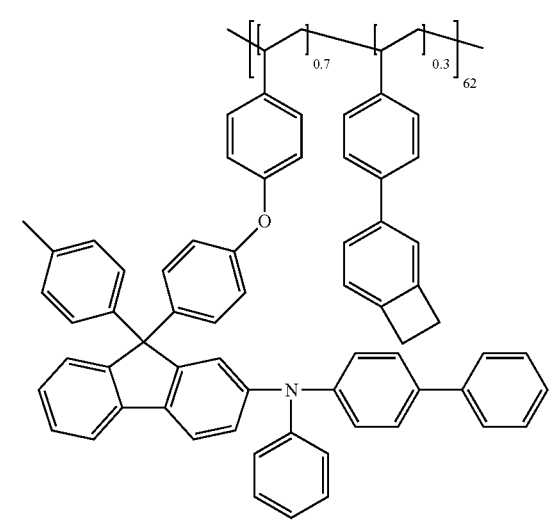
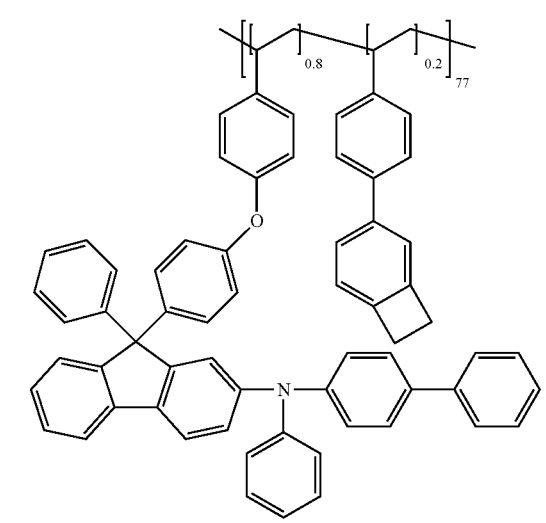
136
-continued
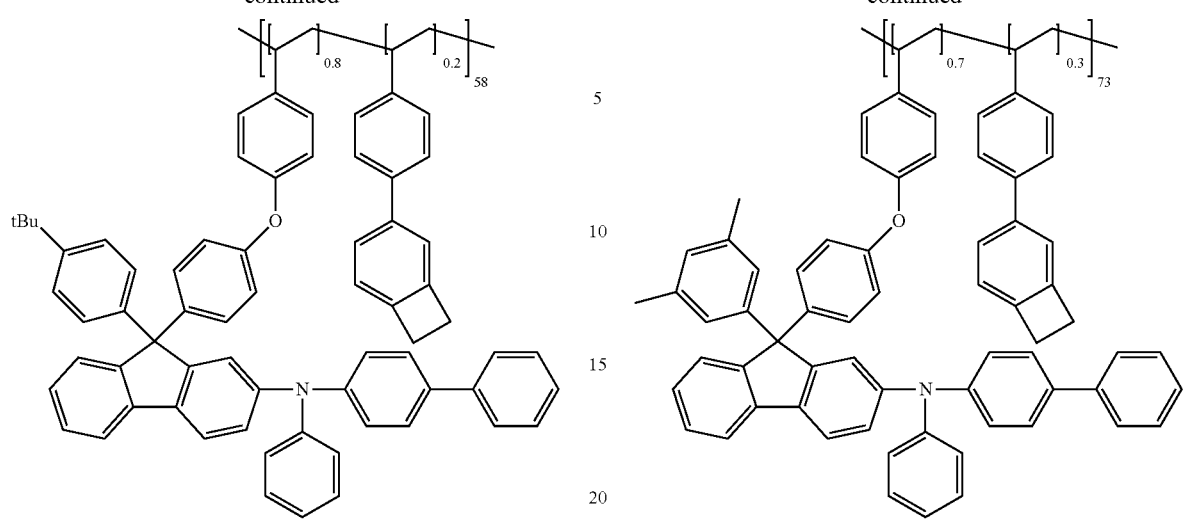
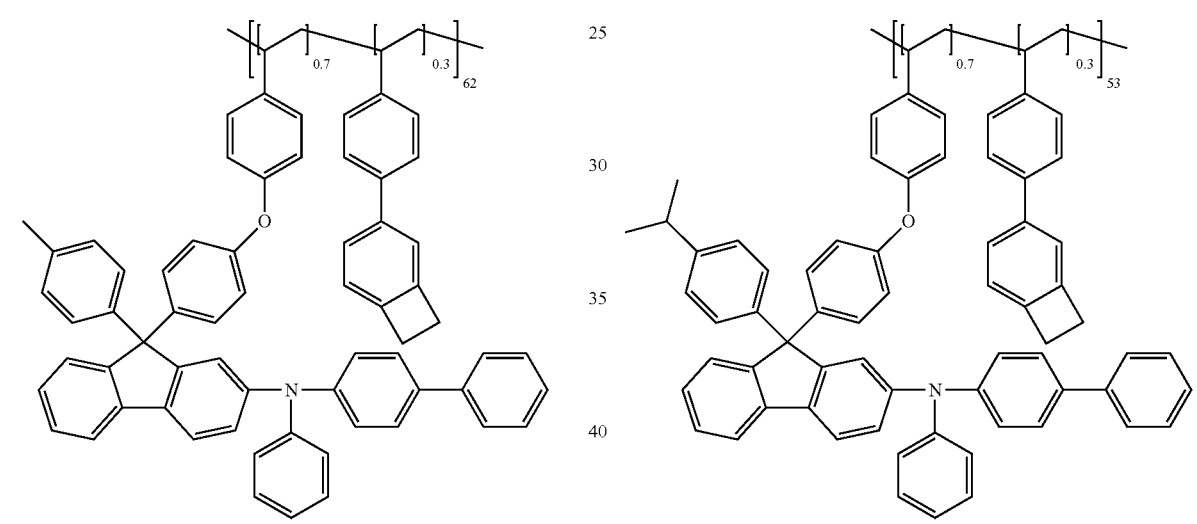
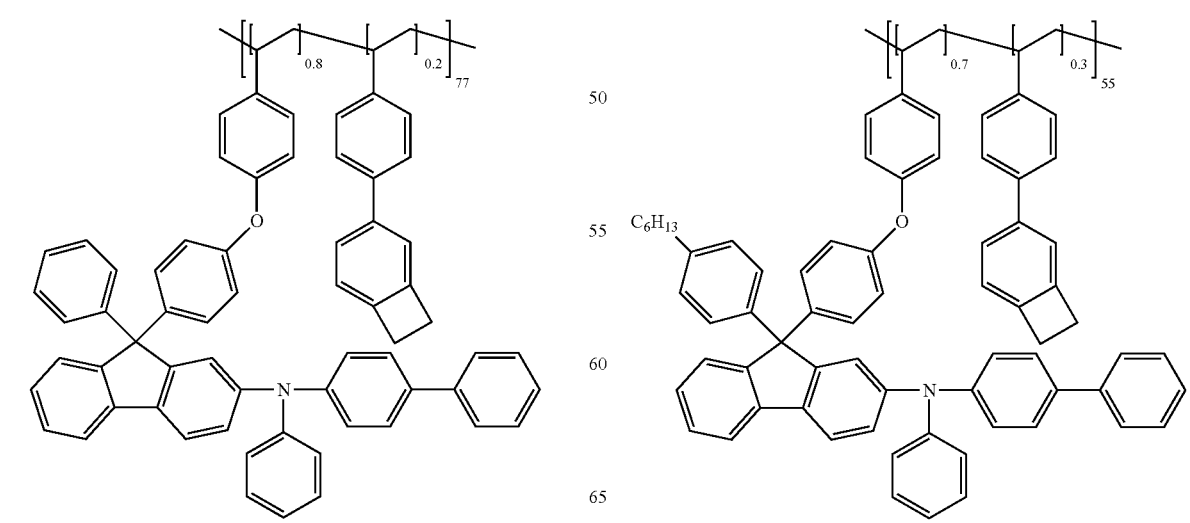

137
-continued
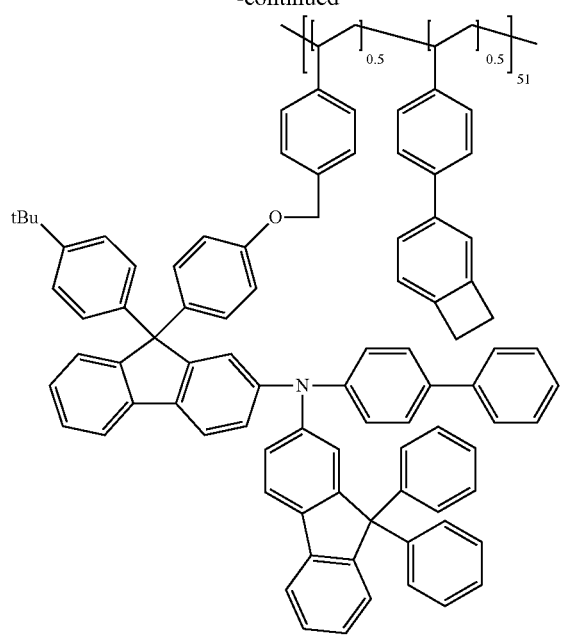
138
-continued
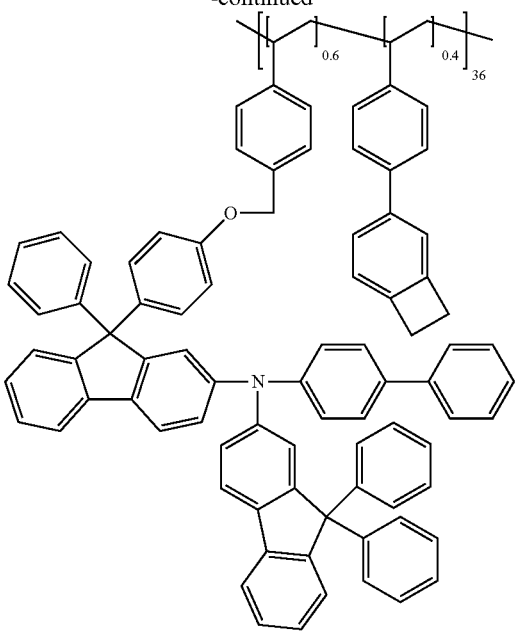
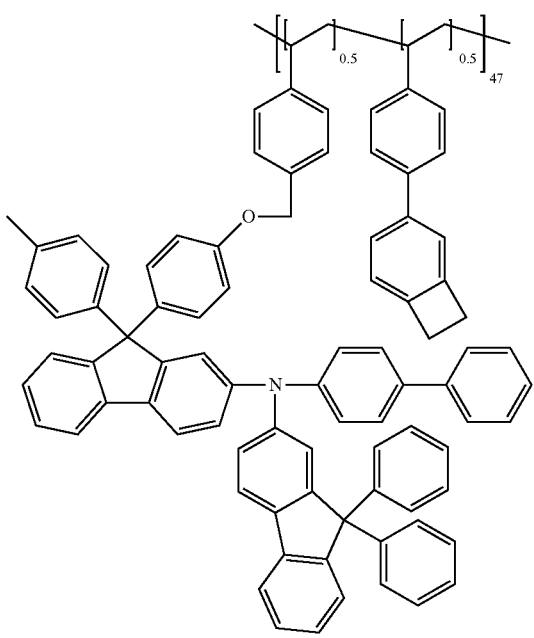
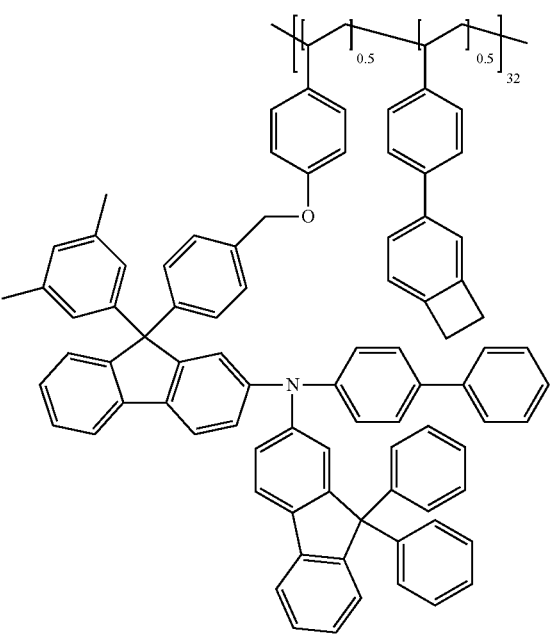

139
-continued
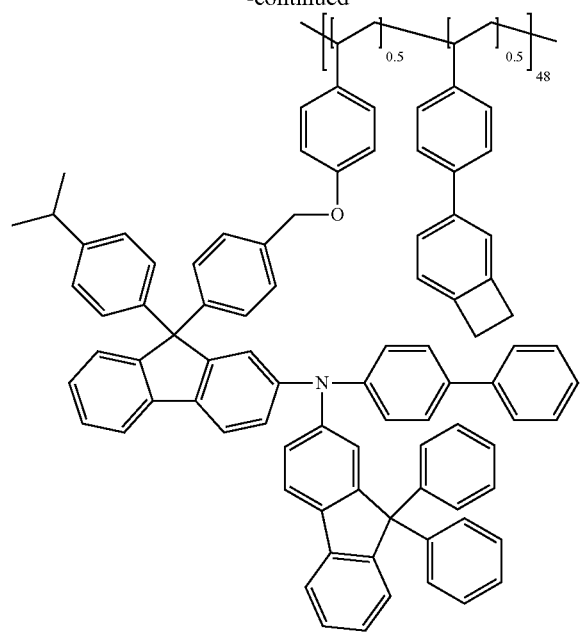
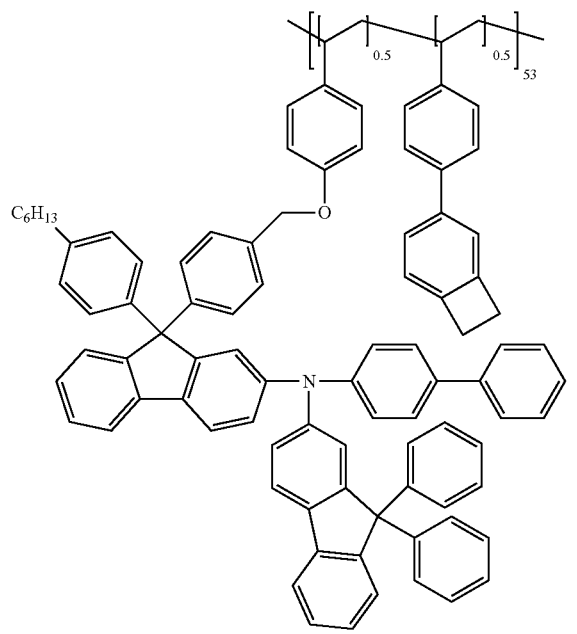
140
-continued
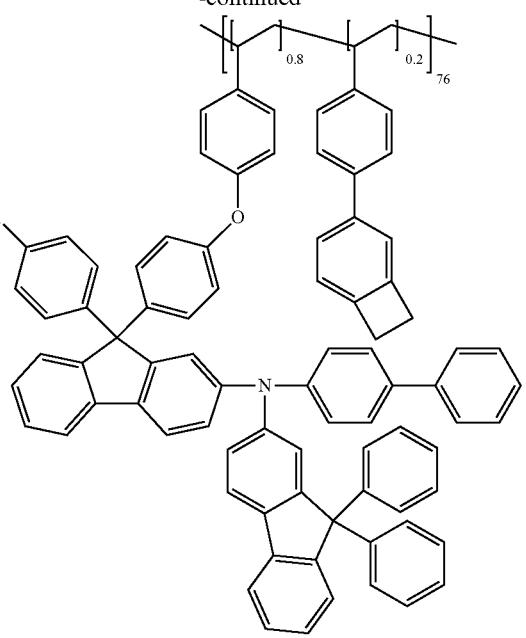
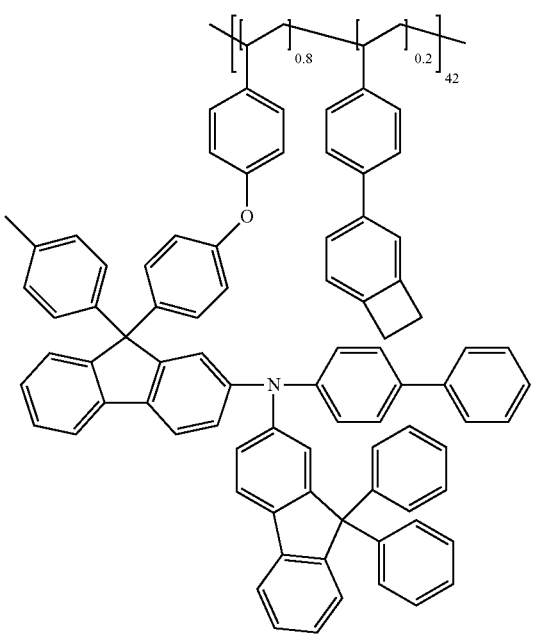

141
-continued
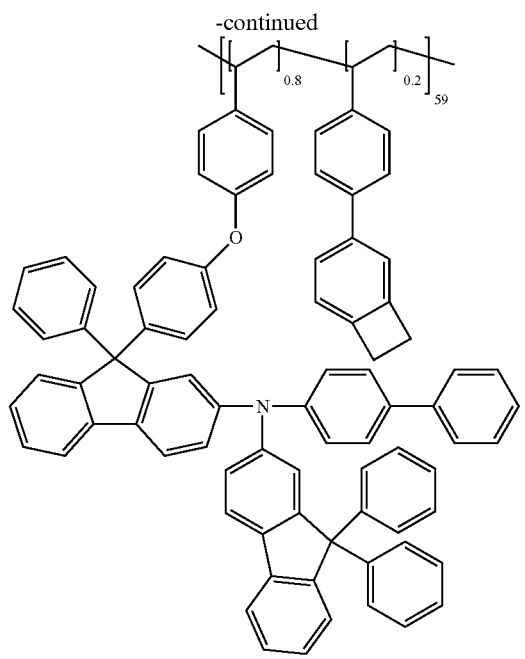
142
-continued
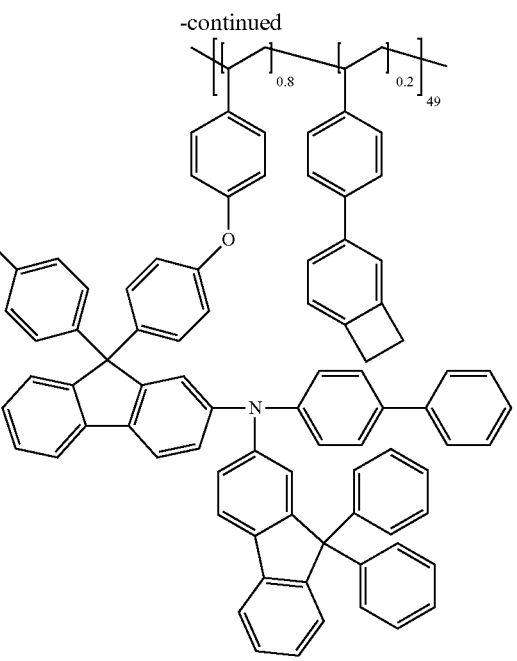
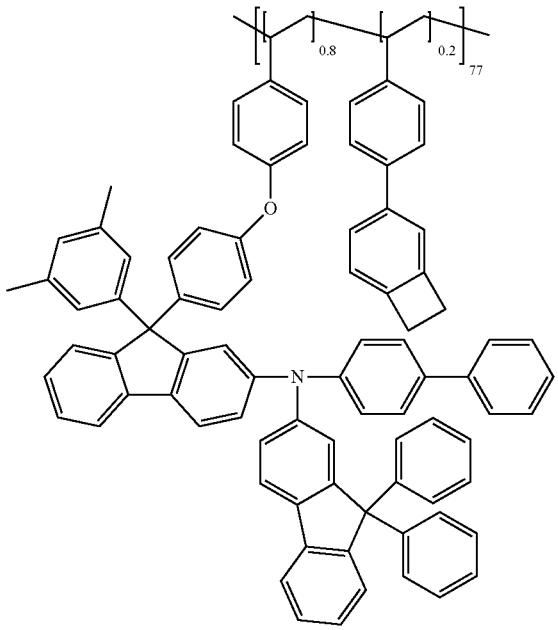
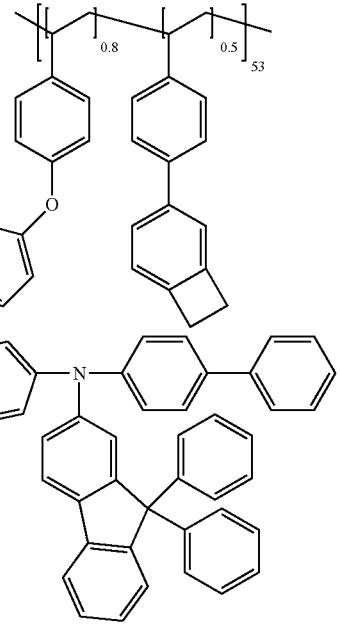

143
-continued
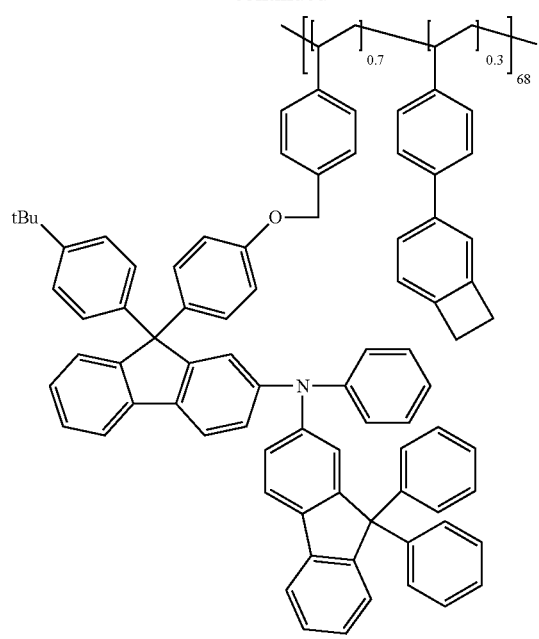
144
-continued
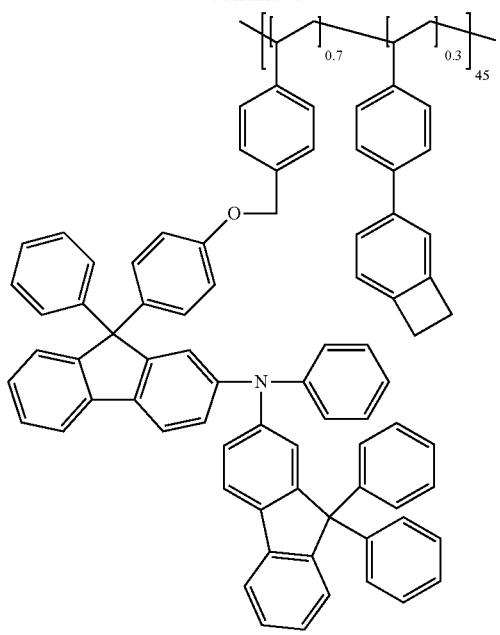
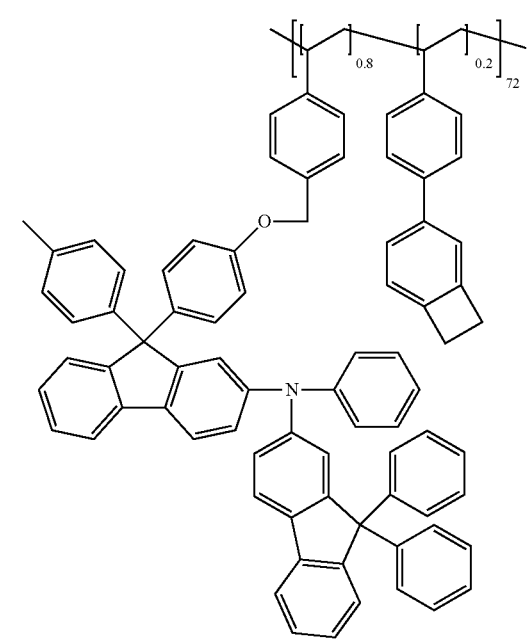
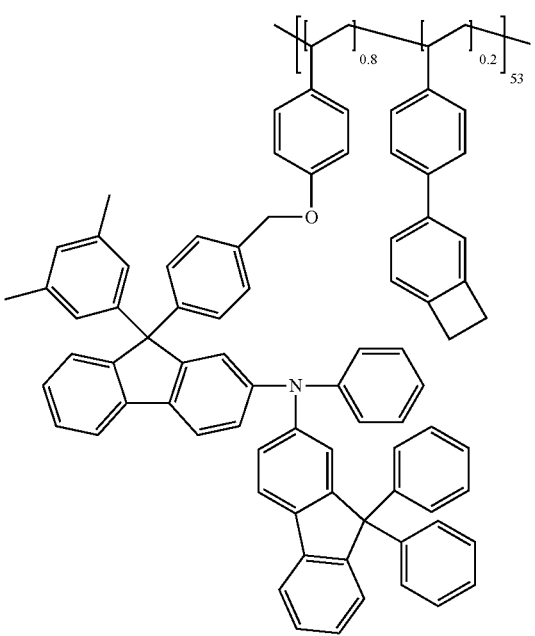

145
-continued
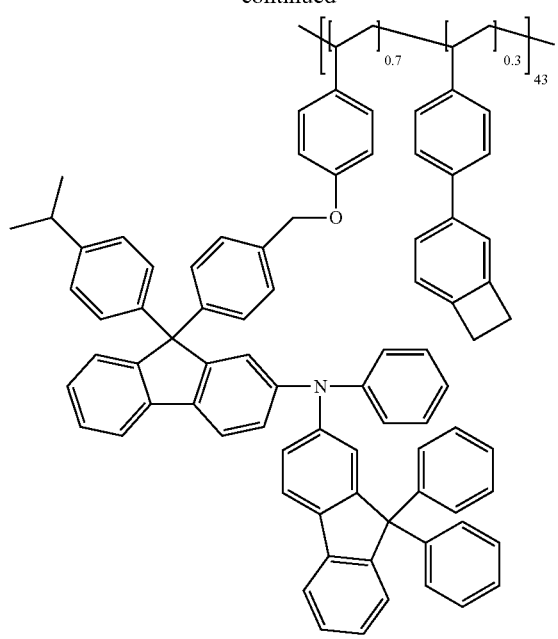
146
-continued
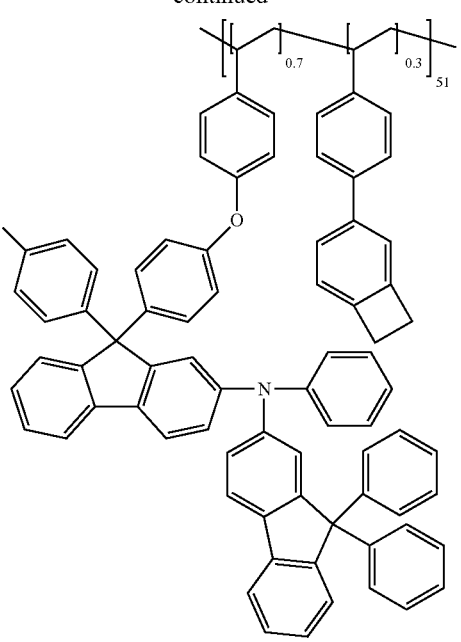
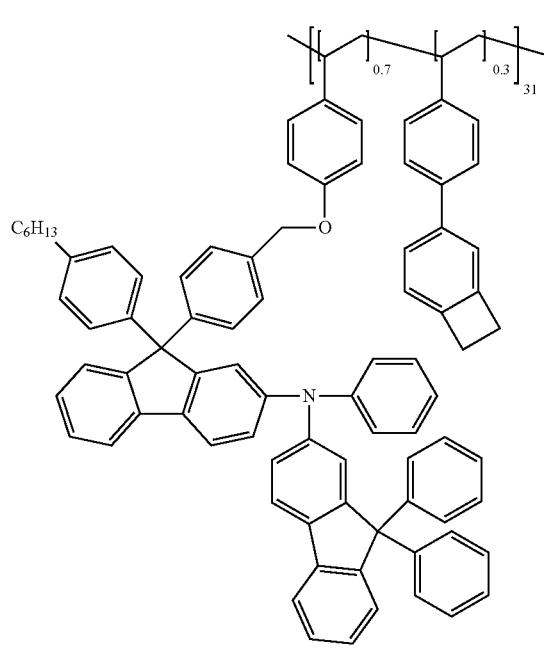
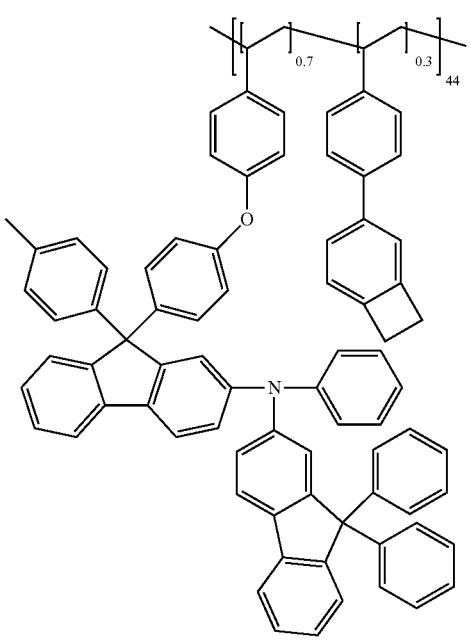

-continued

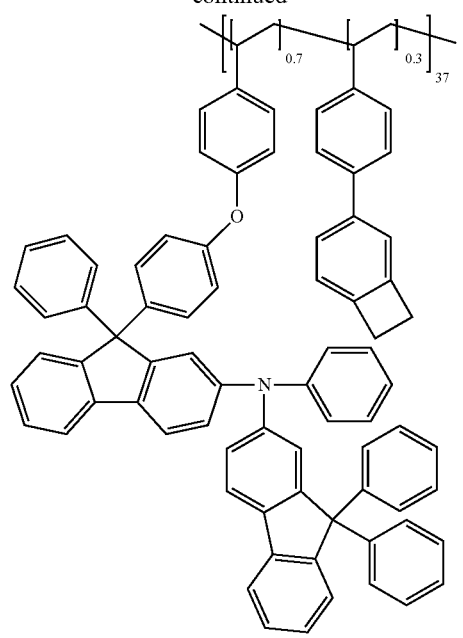

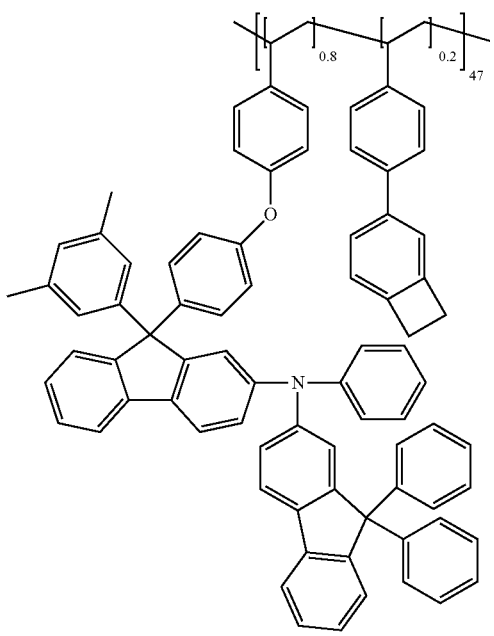

-continued

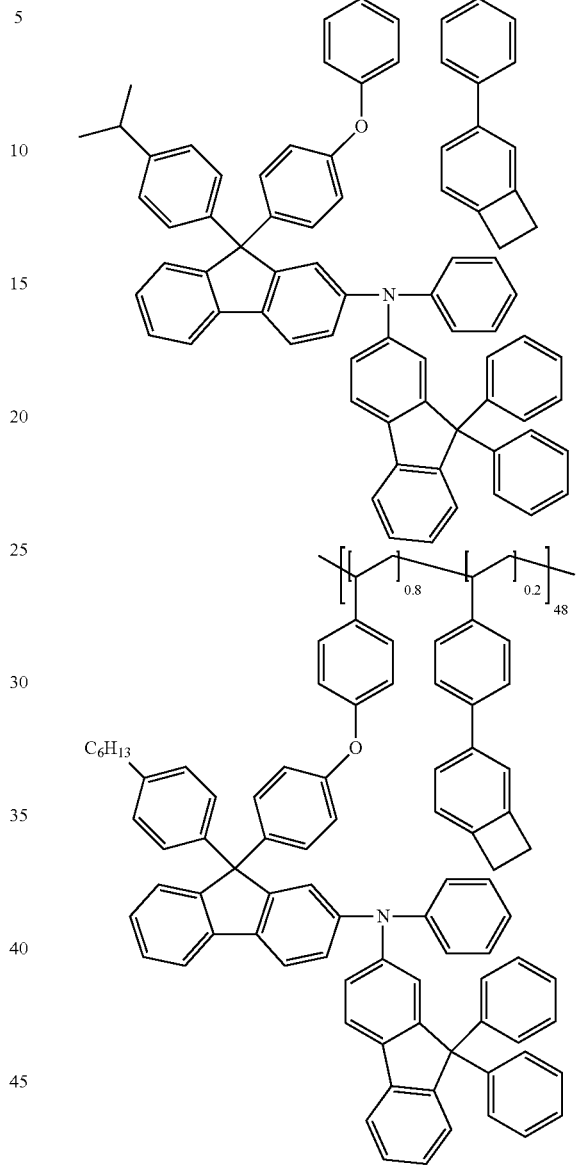

In an exemplary embodiment of the present specification, the polymer may have a number average molecular weight of 5,000 g/mol to 1,000,000 g/mol. Specifically, the polymer may have a number average molecular weight of 5,000 g/mol to 300,000 g/mol.

In the present specification, the molecular weight was analyzed by GPC equipment. PL mixed Bx2 was used as a column, and tetrahydrofuran (THF) (filtered with a 0.45 m filter and used) was used as a solvent. The molecular weight was measured at a flow rate of 1.0 mL/min and a sample concentration of 1 mg/mL. 100 L of the sample was injected, and the column temperature was set to 40° C. An Agilent RI detector was used as a detector, and a reference was set with polystyrene (PS). Data processing was performed by the ChemStation program.

The present specification provides a coating composition comprising the polymer.

According to an exemplary embodiment of the present specification, the coating composition may further comprise a solvent.

According to an exemplary embodiment of the present specification, azobisisobutyronitrile (AIBN) is used during the preparation of the coating composition.

In an exemplary embodiment of the present specification, the coating composition may be in a liquid phase. The "liquid phase" means that the composition is in a liquid state at room temperature under atmospheric pressure.

In an exemplary embodiment of the present specification, examples of the solvent include: a chlorine-based solvent such as chloroform, methylene chloride, 1,2-dichloroethane, 1,1,2-trichloroethane, chlorobenzene, and o-dichlorobenzene; an ether-based solvent such as tetrahydrofuran and dioxane; an aromatic hydrocarbon-based solvent such as toluene, xylene, trimethylbenzene, and mesitylene; an aliphatic hydrocarbon-based solvent such as cyclohexane, methylcyclohexane, n-pentane, n-hexane, n-heptane, n-octane, n-nonane, and n-decane; a ketone-based solvent such as acetone, methyl ethyl ketone, and cyclohexanone; an ester-based solvent such as ethyl acetate, butyl acetate, and ethyl cellosolve acetate; a polyhydric alcohol such as ethylene glycol, ethylene glycol monobutyl ether, ethylene glycol monoethyl ether, ethylene glycol monomethyl ether, dimethoxy ethane, propylene glycol, diethoxymethane, triethylene glycol monoethyl ether, glycerin, and 1,2-hexanediol and a derivative thereof; an alcohol-based solvent such as methanol, ethanol, propanol, isopropanol, and cyclohexanol; a sulfoxide-based solvent such as dimethyl sulfoxide; an amide-based solvent such as N-methyl-2-pyrrolidone and N,N-dimethylformamide; a benzoate-based solvent such as methyl benzoate, butyl benzoate, and 3-phenoxybenzoate; and a solvent such as tetralin, but the solvent is can be used as long as the solvent may dissolve or disperse the compound according to an exemplary embodiment of the present specification, and is not limited thereto.

In an exemplary embodiment of the present specification, the coating composition comprises a toluene solvent.

In another exemplary embodiment, the solvents may be used either alone or in a mixture of two or more solvents.

In still another exemplary embodiment, a boiling point of the solvent is preferably 40° C. to 250° C., and more preferably 60° C. to 230° C., but is not limited thereto.

In yet another exemplary embodiment, a viscosity of the single solvent or the mixed solvent is preferably 1 CP to 10 CP, and more preferably 3 CP to 8 CP, but is not limited thereto.

In still yet another exemplary embodiment, a concentration of the coating composition is preferably 0.1 wt/v % to 20 wt/v %, and more preferably 0.5 wt/v % to 5 wt/v %, but is not limited thereto.

In an exemplary embodiment of the present specification, the coating composition may further include one or two or more additives selected from the group consisting of a thermal polymerization initiator and a photopolymerization initiator.

Examples of the thermal polymerization initiator include peroxides such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5,5-trimethylhexanoyl peroxide, lauroyl peroxide, benzoyl peroxide, p-chlorobenzoyl peroxide, dicumyl peroxide, 2,5-dimethyl-2,5-(t-butyl oxy)-hexane, 1,3-bis(t-butyl peroxy-isopropyl) benzene, t-butyl cumyl peroxide, di-t-butyl peroxide, 2,5-dimethyl-2,5-(di-t-butyl peroxy) hexane-3, tris-(t-butyl peroxy) triazine, 1,1-di-t-butyl peroxy-3,3,5-trimethyl cyclohexane, 1,1-di-t-butylperoxy cyclohexane, 2,2-di(t-butyl peroxy) butane, 4,4-di-t-butylperoxyvaleric acid n-butyl ester, 2,2-bis(4,4-t-butyl peroxy cyclohexyl) propane, t-butyl peroxy isobutyrate, di-t-butyl peroxy hexahydro terephthalate, t-butyl peroxy-3,5,5-trimethylhexnonate, t-butyl peroxybenzoate, and di-t-butyl peroxy trimethyl adipate, or an azo-based thermal polymerization initiator such as azobisisobutyronitrile, azobisdimethylvaleronitrile, and azobiscyclohexyl nitrile, but the examples are not limited thereto.

Examples of the photopolymerization initiator include acetophenone-based or ketal-based photopolymerization initiators such as diethoxyacetophenone, 2,2-dimethoxy-1,2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl) butanon-1,2-hydroxy-2-methyl-1-phenylpropan-1-one, 2-methyl-2-morpholino(4-methylthiophenyl)propan-1-one, and 1-phenyl-1,2-propanedion-2-(o-ethoxycarbonyl)oxime, benzoin ether-based photopolymerization initiators such as benzoin, benzoin methyl ether, benzoin ethyl ether, benzoin isobutyl ether, and benzoin isopropyl ether, benzophenone-based photopolymerization initiators such as benzophenone, 4-hydroxybenzophenone, 2-benzoylnaphthalene, 4-benzoylbiphenyl, 4-benzoyl phenyl ether, acrylated benzophenone, and 1,4-benzoylbenzene, thioxanthone-based photopolymerization initiators such as 2-isopropylthioxanthone, 2-chlorothioxanthone, 2,4-dimethylthioxanthone, 2,4-diethylthioxanthone, and 2,4-dichlorothioxanthone, and examples of other photopolymerization initiators include ethylanthraquinone, 2,4,6-trimethylbenzoyldiphenylphosphine oxide, 2,4,6-trimethylbenzoylphenylethoxyphosphine oxide, bis(2,4,6-trimethylbenzoyl)phenylphosphine oxide, bis(2,4-dimethoxybenzoyl)-2,4,4-trimethylpentylphosphine oxide, methyl phenyl glyoxy ester, 9,10-phenanthrene, acridine-based compounds, triazine-based compounds, and imidazole-based compounds, but are not limited thereto.

Further, compounds having photopolymerization promoting effects may be used either alone or in combination with the photopolymerization initiators. Examples thereof include triethanolamine, methyldiethanolamine, ethyl 4-dimethylaminobenzoate, isoamyl 4-dimethylaminobenzoate, (2-dimethylamino)ethyl benzoate, 4,4'-dimethylamino benzophenone, and the like, but are not limited thereto.

According to an exemplary embodiment of the present specification, the coating composition is cured by a free-radical polymerization reaction such as nitroxide-mediated polymerization (NMP), atom transfer radical polymerization (ATRP), and reversible addition fragmentation chain transfer (RAFT) polymerization.

The present specification also provides an organic light emitting device formed by using the coating composition.

In an exemplary embodiment of the present specification, the organic light emitting device includes: a first electrode; a second electrode provided to face the first electrode; and an organic material layer having one or more layers provided between the first electrode and the second electrode, in which one or more layers of the organic material layer include a cured product of the coating composition.

In an exemplary embodiment of the present specification, the first electrode is a cathode, and the second electrode is an anode.

In another exemplary embodiment, the first electrode is an anode, and the second electrode is a cathode.

In an exemplary embodiment of the present specification, the cured product of the coating composition is in a state in which the coating composition is cured by a heat treatment or a light treatment.

In an exemplary embodiment of the present specification, the organic material layer including the cured product of the coating composition is a hole transport layer, a hole injection layer, or a layer which simultaneously transports and injects holes.

In an exemplary embodiment of the present specification, the organic material layer including the cured product of the coating composition includes a light emitting layer, and the light emitting layer includes the cured product of the coating composition.

In an exemplary embodiment of the present specification, the coating composition may further include a p-doping material (p-dopant).

In an exemplary embodiment of the present specification, the p-doping material includes $F_4TCNQ$; or a boron anion.

In an exemplary embodiment of the present specification, the p-doping material includes $F_4TCNQ$; or a boron anion, and the boron anion includes a halogen group.

In an exemplary embodiment of the present specification, the p-doping material includes $F_4TCNQ$; or a boron anion, and the boron anion includes F.

In an exemplary embodiment of the present specification, the p-doping material is selected from the following structural formulae.

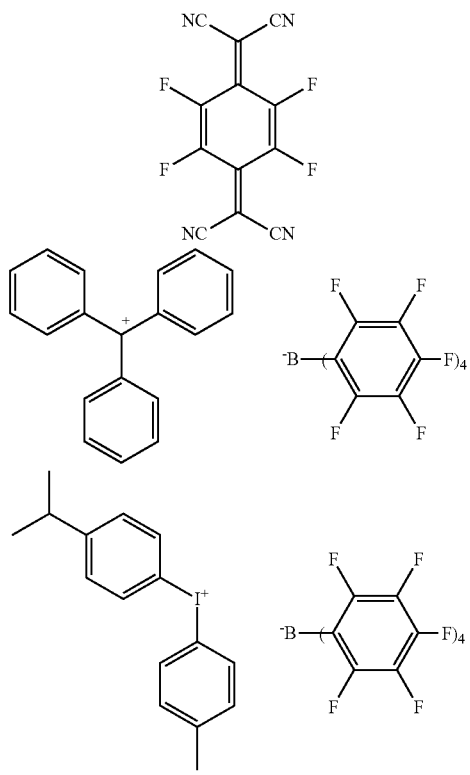

In an exemplary embodiment of the present specification, a content of the p-doping material is 0.001 wt % to 50 wt %; 0.01 wt % to 30 wt %; or 1 wt % to 25 wt %, based on the total weight 100% of the coating composition.

In an exemplary embodiment of the present specification, the organic light emitting device may further include one or two or more layers selected from the group consisting of a hole injection layer, a hole transport layer, an electron transport layer, an electron injection layer, an electron blocking layer, and a hole blocking layer.

In another exemplary embodiment, the organic light emitting device may be an organic light emitting device having a normal type structure in which an anode, an organic material layer having one or more layers, and a cathode are sequentially stacked on a substrate.

In still another exemplary embodiment, the organic light emitting device may be an organic light emitting device having an inverted type structure in which a cathode, an organic material layer having one or more layer, and an anode are sequentially stacked on a substrate.

The organic material layer of the organic light emitting device of the present specification may also be composed of a single-layered structure, but may be composed of a multi-layered structure in which an organic material layer having two or more layers is stacked. For example, the organic light emitting device of the present specification may have a structure including a hole injection layer, a hole transport layer, a light emitting layer, an electron transport layer, an electron injection layer, and the like as organic material layers. However, the structure of the organic light emitting device is not limited thereto, and may include a fewer number of organic layers.

For example, the structure of the organic light emitting device according to an exemplary embodiment of the present specification is exemplified in the FIGURE.

The FIGURE exemplifies a structure of an organic light emitting device in which an anode 201, a hole injection layer 301, a hole transport layer 401, a light emitting layer 501, a layer 601 which simultaneously injects and transports electrons, and a cathode 701 are sequentially stacked on a substrate 101.

In an exemplary embodiment of the present specification, the hole injection layer 301, the hole transport layer 401, or the light emitting layer 501 in the FIGURE may be formed by using a coating composition including a polymer including: the first unit represented by Formula 1; and the second unit represented by Formula 2.

In an exemplary embodiment of the present specification, the hole injection layer 301 in the FIGURE may be formed by using a coating composition including a polymer including: the first unit represented by Formula 1; and the second unit represented by Formula 2.

In an exemplary embodiment of the present specification, the hole transport layer 401 in the FIGURE may be formed by using a coating composition including a polymer including: the first unit represented by Formula 1; and the second unit represented by Formula 2.

The FIGURE exemplifies an organic light emitting device, and the organic light emitting device is not limited thereto.

When the organic light emitting device includes a plurality of organic material layers, the organic material layers may be formed of the same material or different materials.

The organic light emitting device of the present specification may be manufactured by the materials and methods known in the art, except that one or more layers of the organic material layer are formed by using a coating composition.

For example, the organic light emitting device of the present specification may be manufactured by sequentially stacking an anode, an organic material layer, and a cathode on a substrate. In this case, the organic light emitting device may be manufactured by depositing a metal or a metal oxide having conductivity, or an alloy thereof on a substrate to form an anode, forming an organic material layer including a hole injection layer, a hole transport layer, a light emitting layer, and an electron transport layer thereon, and then depositing a material, which may be used as a cathode, thereon, by using a physical vapor deposition (PVD) method such as sputtering or e-beam evaporation. In addition to the method described above, an organic light emitting device may be manufactured by sequentially depositing a cathode material, an organic material layer, and an anode material on a substrate.

The present specification also provides a method for manufacturing an organic light emitting device formed by using the coating composition.

Specifically, an exemplary embodiment of the present specification provides a method for manufacturing an organic light emitting device, the method including: preparing a substrate; forming a cathode or an anode on the substrate; forming an organic material layer having one or more layers on the cathode or the anode; and forming an anode or a cathode on the organic material layer, in which the forming of the organic material layer includes forming an organic material layer having one or more layers by using the coating composition.

In an exemplary embodiment of the present specification, the organic material layer formed by using the coating composition is formed by using spin coating or ink-jetting.

In another exemplary embodiment, the organic material layer formed by using the coating composition is formed by a printing method.

In still another exemplary embodiment of the present specification, examples of the printing method include inkjet printing, nozzle printing, offset printing, transfer printing or screen printing, and the like, but are not limited thereto.

The coating composition according to an exemplary embodiment of the present specification is suitable for a solution process due to the structural characteristics thereof, so that the organic material layer may be formed by a printing method, and as a result, there is an economic effect in terms of time and costs when a device is manufactured.

In an exemplary embodiment of the present specification, the forming of the organic material layer formed by using the coating composition includes: coating the cathode or the anode with the coating composition; and subjecting the coating composition to a heat treatment or a light treatment.

In an exemplary embodiment of the present specification, the time for subjecting the organic material layer formed by using the coating composition to a heat treatment is preferably within 1 hour, and more preferably within 30 minutes.

In an exemplary embodiment of the present specification, an atmosphere under which the organic material layer formed by using the coating composition is subjected to a heat treatment is preferably an inert gas such as argon and nitrogen.

When the forming of the organic material layer formed by using the coating composition includes the subjecting of the coating composition to the heat treatment or the light treatment, a plurality of fluorene groups included in the coating composition may form a cross-linkage, thereby providing an organic material layer including a thin-filmed structure. In this case, it is possible to prevent the organic material layer from being dissolved or morphologically affected or decomposed by a solvent deposited on the surface of the organic material layer formed by using the coating composition.

Therefore, when the organic material layer formed by using the coating composition is formed by a method including the subjecting of the coating composition to the heat treatment or the light treatment, resistance to a solvent is increased, so that a plurality of layers may be formed by repeatedly carrying out solution deposition and cross-linking methods, and stability is increased, so that service life characteristics of the device may be increased.

In an exemplary embodiment of the present specification, the coating composition including the polymer may use a coating composition dispersed by being mixed with a polymer binding agent.

In an exemplary embodiment of the present specification, as the polymer binding agent, those which do not extremely suppress charge transport are preferred, and those which are not strong in absorption to visible light are preferably used. As the polymeric binding agent, poly(N-vinylcarbazole), polyaniline, and derivatives thereof, polythiophene and derivatives thereof, poly(p-phenylene vinylene) and derivatives thereof, poly(2,5-thienylene vinylene) and derivatives thereof, polycarbonate, polyacrylate, polymethyl acrylate, polymethyl methacrylate, polystyrene, polyvinyl chloride, polysiloxane, and the like are exemplified.

Further, the polymer according to an exemplary embodiment of the present specification may also be included as a compound alone, and may be included as a copolymer by using a coating composition mixed with another monomer, in an organic material layer. In addition, the polymer may be included as a copolymer or a mixture by using a coating composition mixed with another polymer.

As the anode material, materials having a high work function are usually preferred so as to facilitate the injection of holes into an organic material layer. Specific examples of the anode material which may be used in the present specification include: a metal, such as vanadium, chromium, copper, zinc, and gold, or an alloy thereof; a metal oxide, such as zinc oxide, indium oxide, indium tin oxide (ITO), and indium zinc oxide (IZO); a combination of metal and oxide, such as $ZnO:Al$ or $SnO_2:Sb$; a conductive polymer, such as poly(3-methylthiophene), poly[3,4-(ethylene-1,2-dioxy)thiophene] (PEDOT), polypyrrole, and polyaniline; and the like, but are not limited thereto.

As the cathode material, materials having a low work function are usually preferred so as to facilitate the injection of electrons into an organic material layer. Specific examples of the cathode material include: a metal, such as magnesium, calcium, sodium, potassium, titanium, indium, yttrium, lithium, gadolinium, aluminum, silver, tin, and lead, or an alloy thereof; a multi-layered structural material, such as LiF/Al or $LiO_2$/Al; and the like, but are not limited thereto.

The hole injection layer is a layer which injects holes from an electrode, and a hole injection material is preferably a compound which has a capability of transporting holes and thus has an effect of injecting holes at an anode and an excellent effect of injecting holes into a light emitting layer or a light emitting material, prevents excitons produced from the light emitting layer from moving to an electron injection layer or an electron injection material, and is also excellent in the ability to form a thin film. The highest occupied molecular orbital (HOMO) of the hole injection material is preferably a value between the work function of the anode material and the HOMO of the neighboring organic material layer. Specific examples of the hole injection material include metal porphyrin, oligothiophene, an arylamine-based organic material, a hexanitrile hexaazatriphenylene-based organic material, a quinacridone-based organic material, a perylene-based organic material, anthraquinone, polyaniline-based and polythiophene-based conductive polymers, and the like, but are not limited thereto.

The hole transport layer is a layer which accepts holes from a hole injection layer and transports the holes to a light emitting layer, and the hole transport material is suitably a material having high hole mobility which may accept holes from an anode or a hole injection layer to transfer the holes to a light emitting layer. Specific examples thereof include an arylamine-based organic material, a conductive polymer, a block copolymer having both conjugated portions and non-conjugated portions, and the like, but are not limited thereto.

The light emitting material is a material which may emit light in a visible light region by accepting and combining holes and electrons from a hole transport layer and an electron transport layer, respectively, and preferably a material having high quantum efficiency for fluorescence or phosphorescence. Specific examples thereof include: an 8-hydroxy-quinoline aluminum complex ($Alq_3$); a carbazole-based compound; a dimerized styryl compound; BAlq; a 10-hydroxybenzoquinoline-metal compound; benzoxazole-based, benzothiazole-based and benzimidazole-based compounds; a poly(p-phenylenevinylene) (PPV)-based polymer; a spiro compound; polyfluorene; lubrene, and the like, but are not limited thereto.

The light emitting layer may include a host material and a dopant material. Examples of the host material include fused aromatic ring derivatives, or hetero ring-containing compounds, and the like. Specifically, examples of the fused aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto.

Examples of the dopant material include an aromatic amine derivative, a styrylamine compound, a boron complex, a fluoranthene compound, a metal complex, and the like. Specifically, the aromatic amine derivative is a fused aromatic ring derivative having a substituted or unsubstituted arylamine group, and examples thereof include a pyrene, an anthracene, a chrysene, a periflanthene, and the like, which have an arylamine group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamine group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

The electron transport layer is a layer which accepts electrons from an electron injection layer and transports the electrons to a light emitting layer, and an electron transport material is suitably a material having high electron mobility which may proficiently accept electrons from a cathode and transfer the electrons to a light emitting layer. Specific examples thereof include: an Al complex of 8-hydroxyquinoline; a complex including $Alq_3$; an organic radical compound; a hydroxyflavone-metal complex; and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo[h] quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a cathode, and may be generally formed under the same conditions as those of the hole injection layer. Specific examples thereof include an oxadiazole derivative or a triazole derivative, a phenanthroline derivative, an aluminum complex, and the like, but are not limited thereto.

The organic light emitting device according to the present specification may be a top emission type, a bottom emission type, or a dual emission type according to the materials to be used.

In an exemplary embodiment of the present application, the compound may be included in an organic solar cell or an organic transistor in addition to the organic light emitting device.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below. The Examples of the present specification are provided to more completely explain the present specification to a person with ordinary skill in the art.

PREPARATION EXAMPLES

Preparation Example 1. Synthesis of Intermediate (1) Synthesis of Intermediate 3

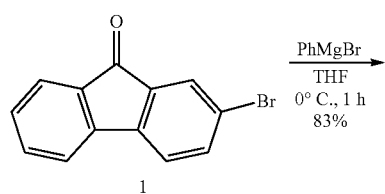

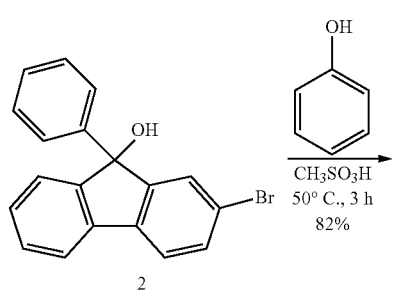

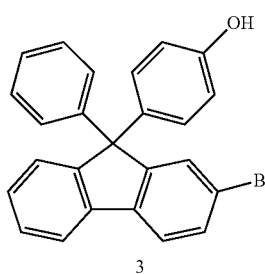

2-bromo-9-fluorenone (1) (20.2 g, 60 mmol) was put into a flask and dissolved in anhydrous tetrahydrofuran (200 mL), and then the flask was put into an ice-water bath. Phenylmagnesium bromide (3 M in ether, 30 mL, 90 mmol) was slowly put thereinto, and the resulting solution was stirred at 0° C. for 1 hour. The reaction was stopped with NH₄Cl (aq), and the product was extracted with diethyl ether and water. After the organic layer was collected, the organic layer was dried using MgSO₄ and filtered. The filtrate was dried by a vacuum rotary concentrator to remove the organic solvent, and the residue was column purified to obtain 21.8 g (yield of 83%) of Intermediate 2.

After Intermediate 2 (16.6 g, 40 mmol), phenol (18.8 g, 200 mmol), and methanesulfonic acid (57 mL) were put into a round-bottom flask, the resulting mixture was stirred at 50° C. for 3 hours. Distilled water (57 mL) was put into the mixture after the reaction was completed, and then the resulting mixture was stirred for 30 minutes. After a solid filtered with a filter was sufficiently washed with distilled water, the solid was dried in a vacuum oven at 50° C. to obtain 16.6 g (yield of 82%) of Intermediate 3.

(2) Synthesis of Intermediate 4

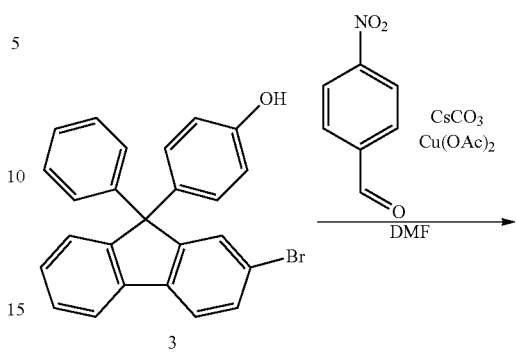

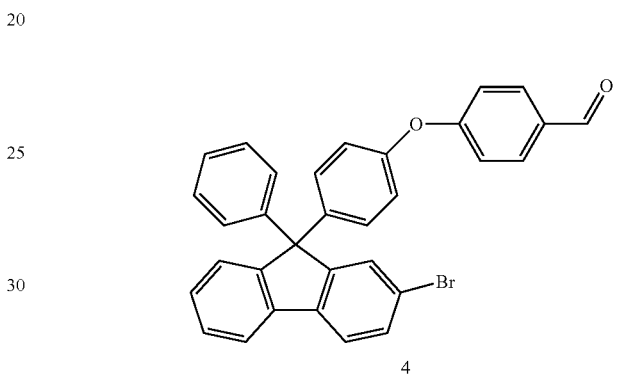

Intermediate 3 (10 g, 24.19 mmol), 4-nitrobenzaldehyde (4.38 g, 29.03 mmol), cesium carbonate (15.76 g, 48.36 mmol), and copper acetate (II) (441 mg, 2.42 mmol) were dissolved in dimethylformamide (80 ml), and then the resulting solution was stirred at a temperature of 100° C. for 15 hours. After the solution was cooled to room temperature, the reaction was terminated by using ammonium chloride, dimethylformamide was evaporated, and then the residue was extracted with methylene chloride and water. After the organic layer was collected, the organic layer was dried using MgSO₄ and filtered. After the filtrate was dried by a vacuum rotary concentrator to evaporate the organic solvent, the residue was column purified to obtain 10.5 g (yield of 84%) of Intermediate 4.

(3) Synthesis of Intermediate 5

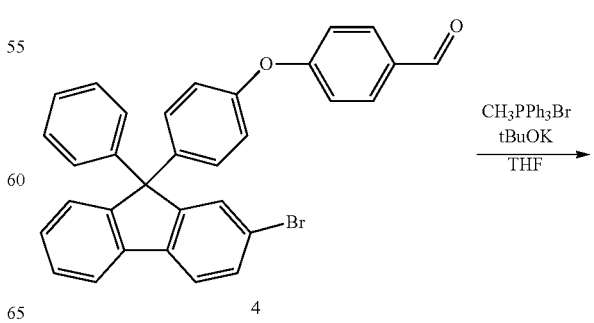

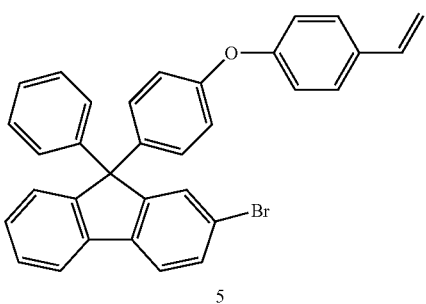

5

After tBuOK (1.37 g, 12.23 mmol) and anhydrous tetrahydrofuran (20 mL) were put into methyltriphenylphosphonium bromide (4.37 g, 12.23 mmol) and then the resulting mixture was stirred at room temperature for 10 minutes, Intermediate 4 (3.16 g, 6.11 mmol) was slowly added dropwise to a 0.5 M state of tetrahydrofuran, and then the resulting mixture was stirred for 4 hours. After the reaction was terminated by adding dropwise sodium bicarbonate in a supersaturated aqueous solution state, the product was extracted with ethyl acetate and water. After the organic layer was collected, the organic layer was dried using MgSO₄ and filtered. After the filtrate was dried by a vacuum rotary concentrator to evaporate the organic solvent, the residue was column purified to obtain 4 g (yield of 92%) of Intermediate 5.

(4) Synthesis of Intermediate 6

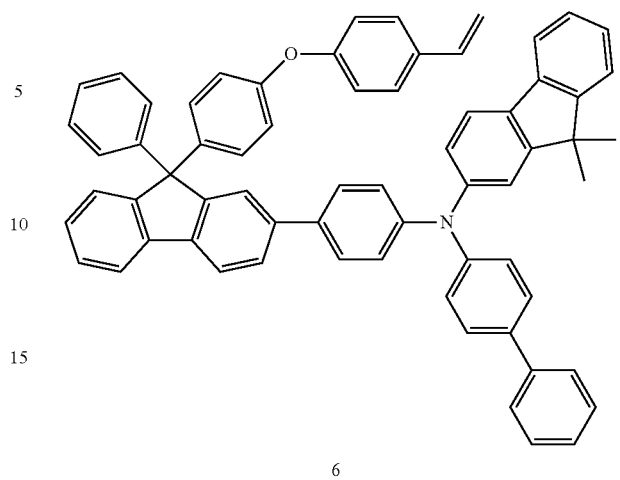

6

After Intermediate 5 (1.29 g, 2.5 mmol), boronic acid (3 g, 6.25 mmol), Pd(PPh₃)₄ (144 mg, 0.125 mmol), and K₂CO₃ (1.73 g, 12.5 mmol) were put into a round-bottom flask, the atmosphere of the flask was substituted with nitrogen. After tetrahydrofuran (9.4 mL) and H₂O (3.1 mL) were put thereinto, the resulting mixture was stirred at 90° C. for 4 hours. After the reaction was terminated, the product was extracted with ethyl acetate and water. After the organic layer was collected, the organic layer was dried using MgSO₄ and filtered. After the filtrate was dried by a vacuum rotary concentrator to evaporate the organic solvent, the residue was column purified to obtain 2.0 g (yield of 90%) of Intermediate 6.

(5) Synthesis of Intermediate 7

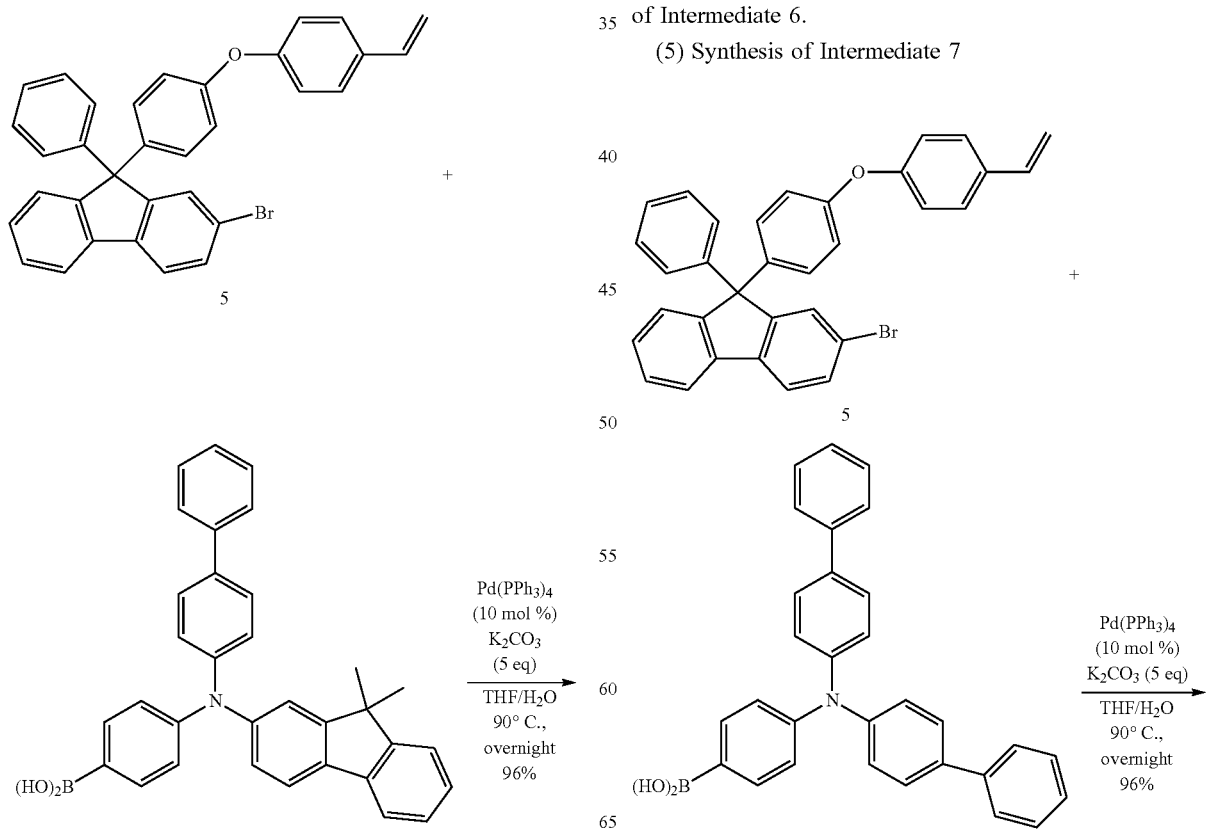

-continued

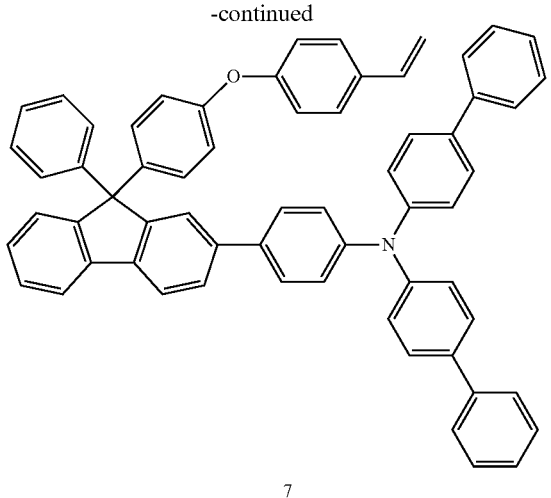

7

4.1 g of Intermediate 7 was obtained by performing the same Buchwald-Hartwig amination as in the method of synthesizing Intermediate 6.

(6) Synthesis of Intermediate 8

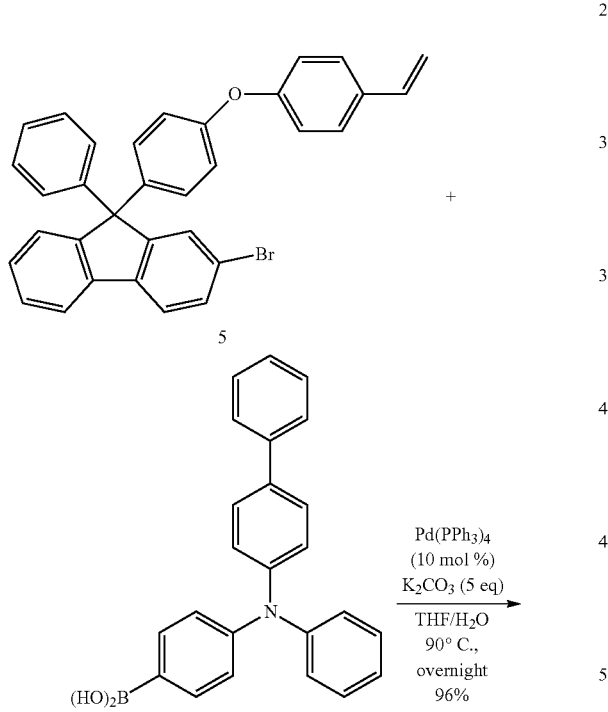

2.7 g of Intermediate 8 was obtained by performing the same Buchwald-Hartwig amination as in the method of synthesizing Intermediate 6.

(7) Synthesis of Intermediate 9

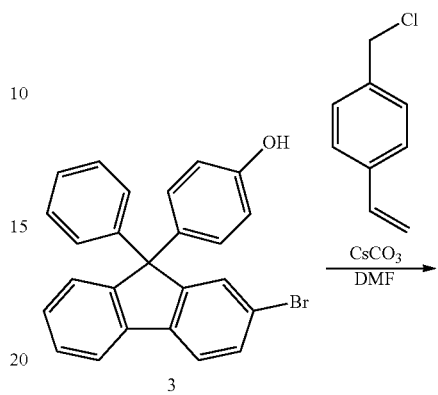

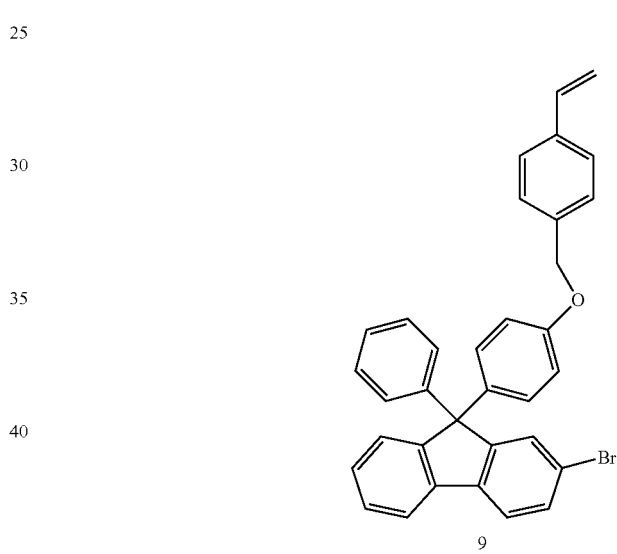

Intermediate 3 (10 g, 24.19 mmol), 1-(chloromethyl)-4-vinylbenzene (4.43 g, 29.03 mmol), cesium carbonate (15.76 g, 48.36 mmol), and copper acetate (II) (441 mg, 2.42 mmol) were dissolved in dimethylformamide (80 ml), and then the resulting solution was stirred at a temperature of 100° C. for 8 hours. After the solution was cooled to room temperature, the reaction was terminated by using sodium bicarbonate in a saturated aqueous solution state, dimethylformamide was evaporated, and then the residue was extracted with ethyl acetate and water. After the organic layer was collected, the organic layer was dried using MgSO₄ and filtered. After the filtrate was dried by a vacuum rotary concentrator to evaporate the organic solvent, the residue was column purified to obtain 11.8 g (yield of 92%) of Intermediate 9.

(8) Synthesis of Intermediate 10

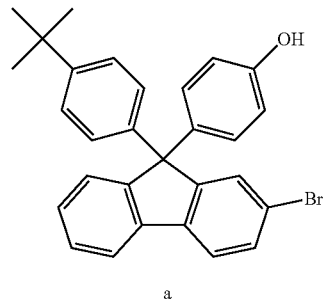
a

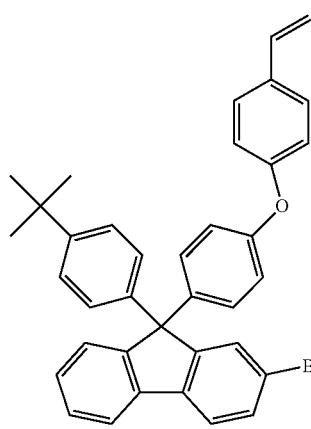
10

Intermediate 10 (4.3 g) was obtained by performing the experiment in the same manner as in the methods of synthesizing Intermediates 4 and 5, except that Intermediate a was used instead of Intermediate 3.

(9) Synthesis of Intermediate 11

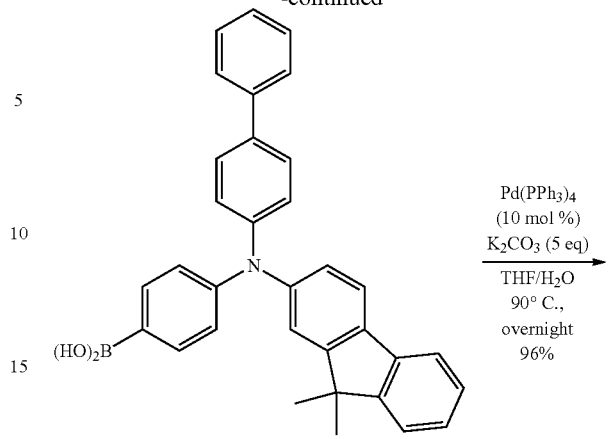

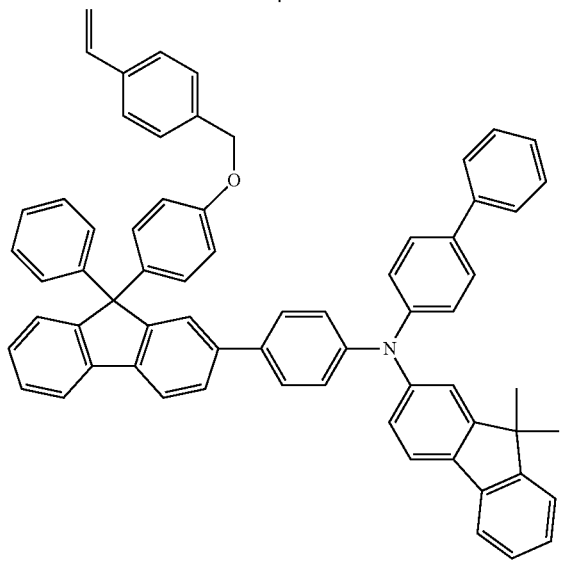
11

Intermediate 11 (2.8 g) was obtained by performing the experiment in the same manner as in the method of synthesizing Intermediate 6, except that Intermediate 9 was used instead of Intermediate 5.

(10) Synthesis of Intermediate 12

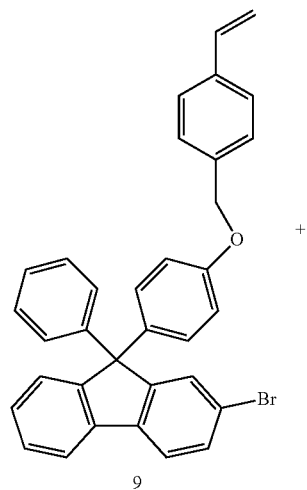
9

+

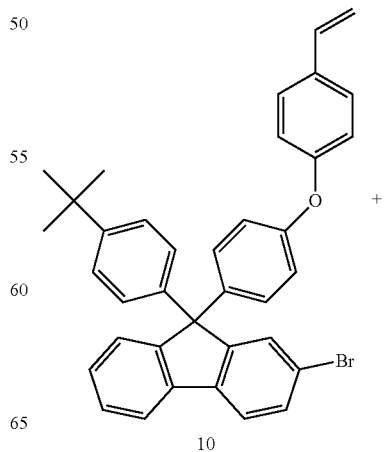
10

+

-continued

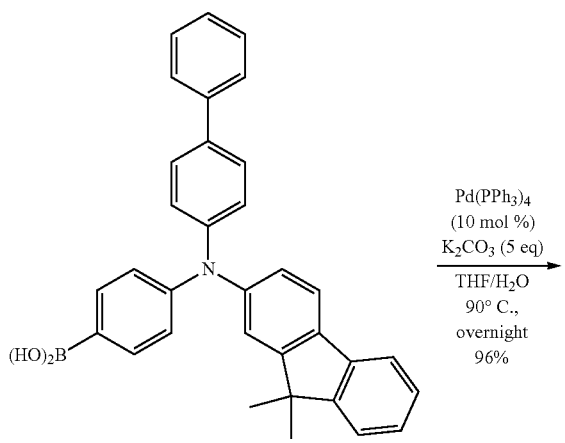

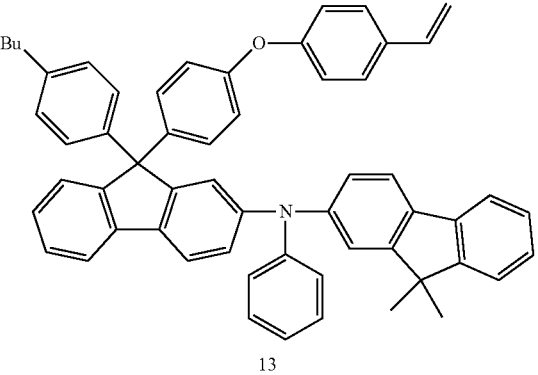

13

Intermediate 10 (3 g), 9,9-dimethyl-N-phenyl-9H-fluoren-2-amine (1.8 g), Pd(tBu$_3$P$_2$) (134 mg), and NatBuO (1.5 g) were put into toluene (10 ml), and the resulting solution was stirred at 100° C. for 10 hours. After the solution was cooled to room temperature, the organic layer was collected by using distilled water and methylene chloride, and then the organic layer was dried using MgSO$_4$ and filtered. After the filtrate was dried by a vacuum rotary concentrator to evaporate the organic solvent, the residue was column purified to obtain 2.8 g (yield of 70%) of Intermediate 13.

(12) Synthesis of Intermediate 14

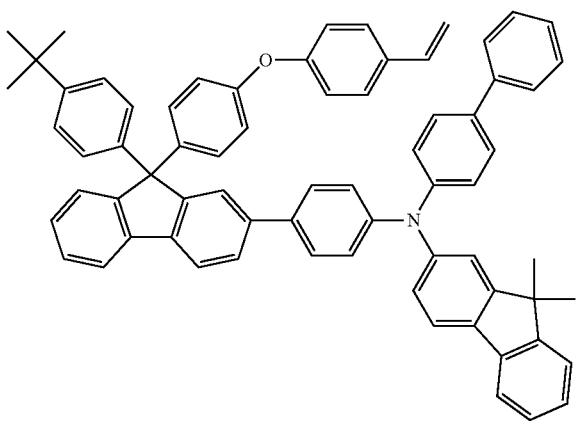

12

Intermediate 12 (1.8 g) was obtained by performing the experiment in the same manner as in the method of synthesizing Intermediate 6, except that Intermediate 10 was used instead of Intermediate 5.

(11) Synthesis of Intermediate 13

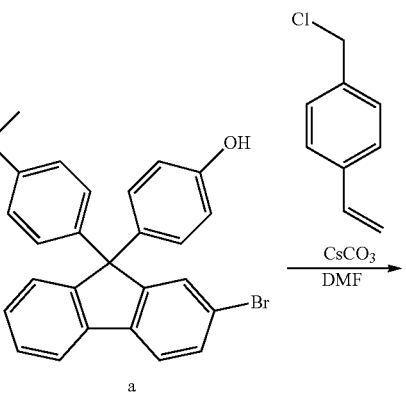

a

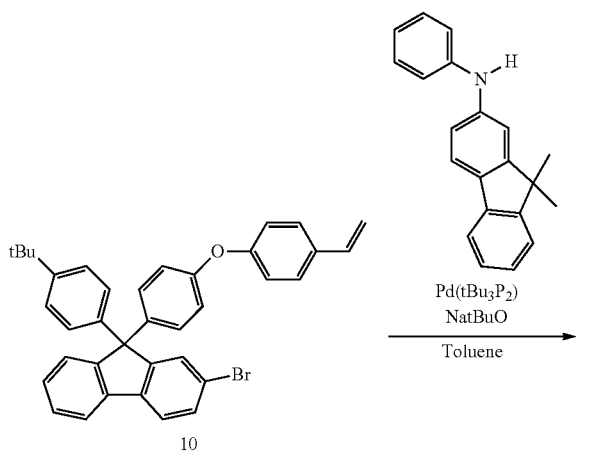

10

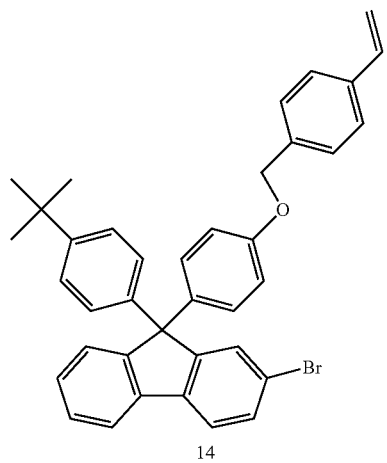

14

Intermediate 14 (1.1 g) was obtained by performing the synthesis in the same manner as in the method of synthesizing Intermediate 9, except that Intermediate a was used instead of Intermediate 3.

167
(13) Synthesis of Intermediate 15
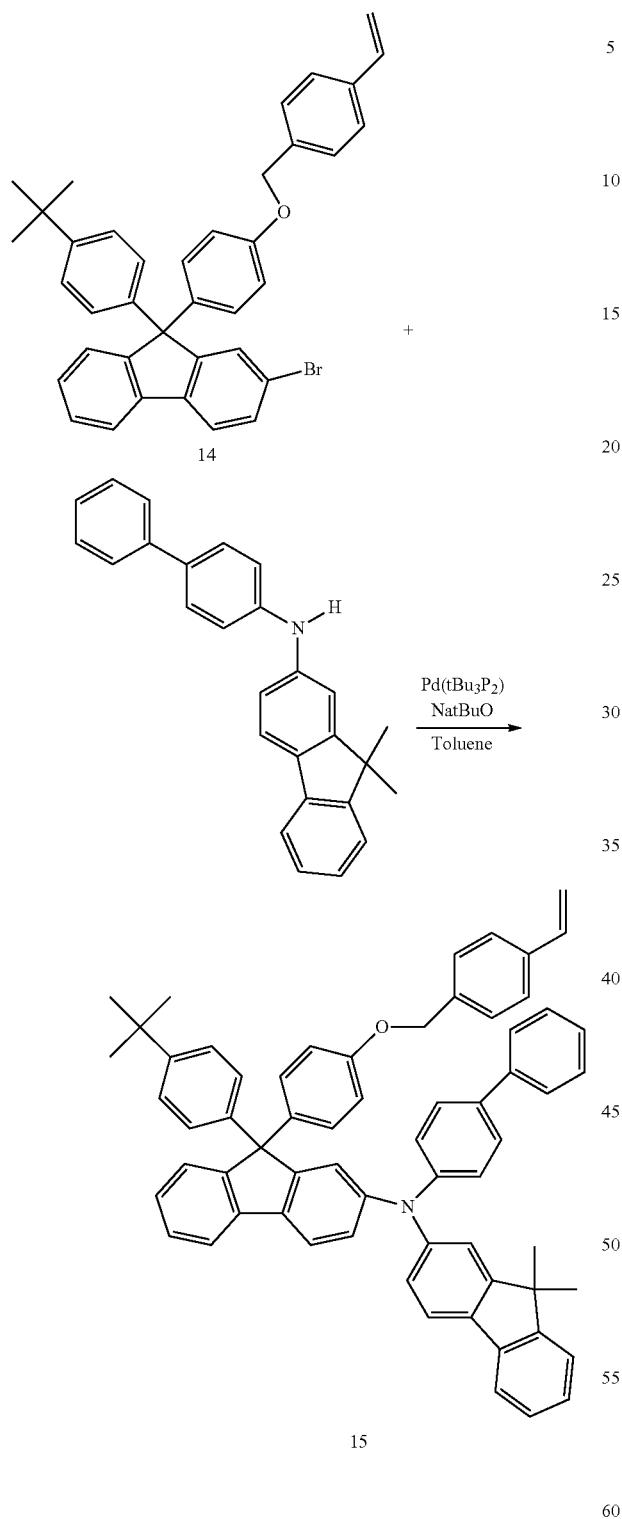
Intermediate 15 (0.7 g) was obtained by performing the synthesis in the same manner as in the method of synthesizing Intermediate 13, except that Intermediate 14 and 9,9-dimethyl-N-biphenyl-9H-fluoren-2-amine were used instead of Intermediate 10 and 9,9-dimethyl-N-phenyl-9H-fluoren-2-amine, respectively.
168
(14) Synthesis of Comparative Compound Z
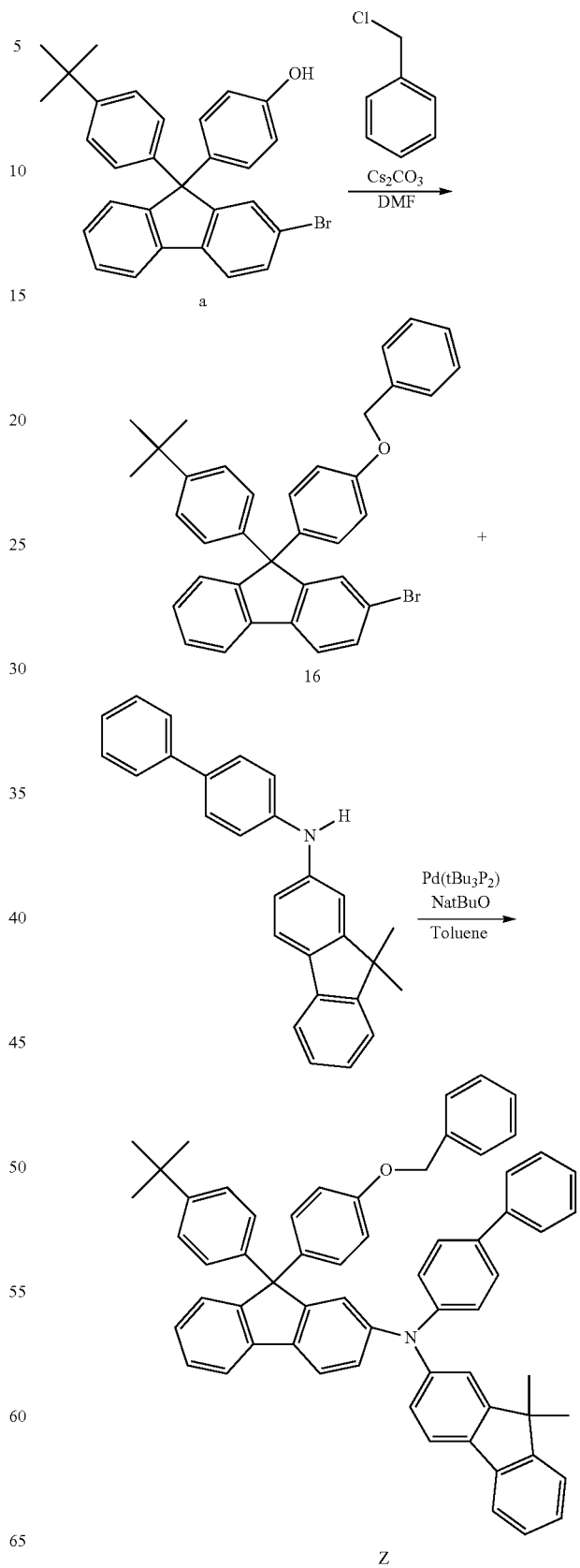

Intermediate 16 (2.6 g) was obtained by performing the synthesis in the same manner as in the method of synthesizing Intermediate 14, except that (chloromethyl)benzene was used instead of 1-(chloromethyl)-4-vinylbenzene. Comparative Compound Z (1.7 g) was obtained by performing the synthesis in the same manner as in the method of synthesizing Intermediate 15, except that Intermediate 16 was used instead of Intermediate 14.

Synthesis Example 2. Synthesis of Polymer A

Preparation Example 3. Synthesis of Polymer B

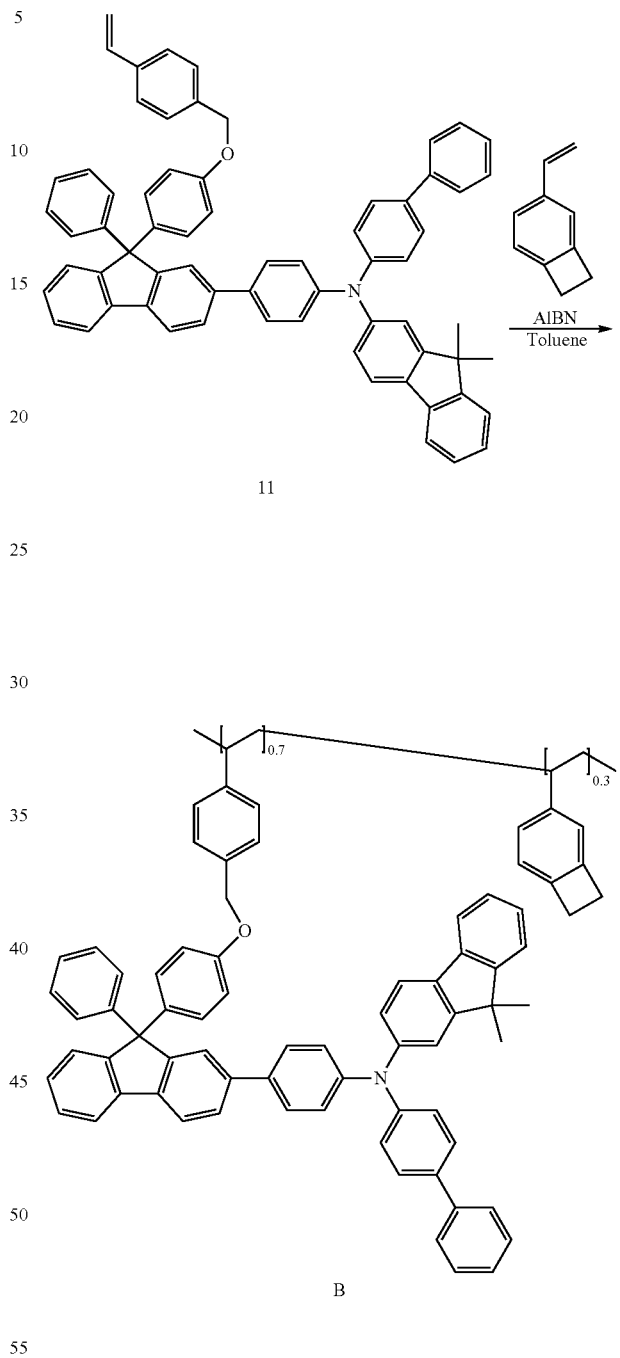

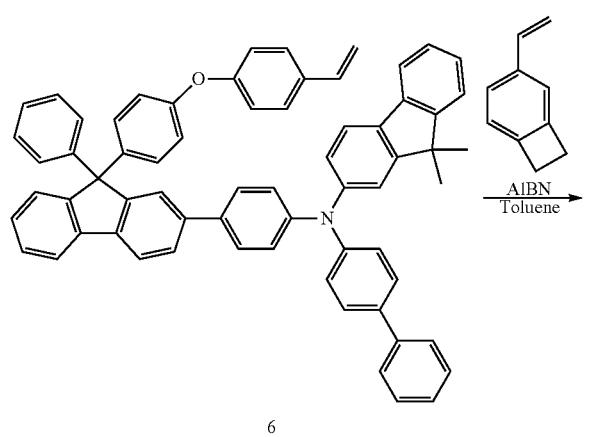

After Intermediate 6 (1 g) and 3-vinylbicyclo[4.2.0]octa-1,3,5-triene (34 mg) (manufactured by Aldrich Chemical Co., Ltd.), and azobisisobutyronitrile (6.5 mg) were put into a round-bottom flask and then the resulting mixture was put into anhydrous toluene (8 mL) under nitrogen atmosphere, the resulting mixture was stirred at 60° C. for 2 hours. After the reaction was terminated, a precipitate precipitated in ethanol was filtered and washed with ethyl acetate, and then the obtained solid was dried to obtain 740 mg (yield of 74%) of Polymer A. Mn=35,492, Mw=92,016

620 mg (yield of 62%) of Polymer B was obtained by performing the experiment in the same manner as in the method of synthesizing Polymer A, except that Intermediate 11 was used instead of Intermediate 6. Mn=26,248, Mw=49,381

Preparation Example 4. Synthesis of Polymer C

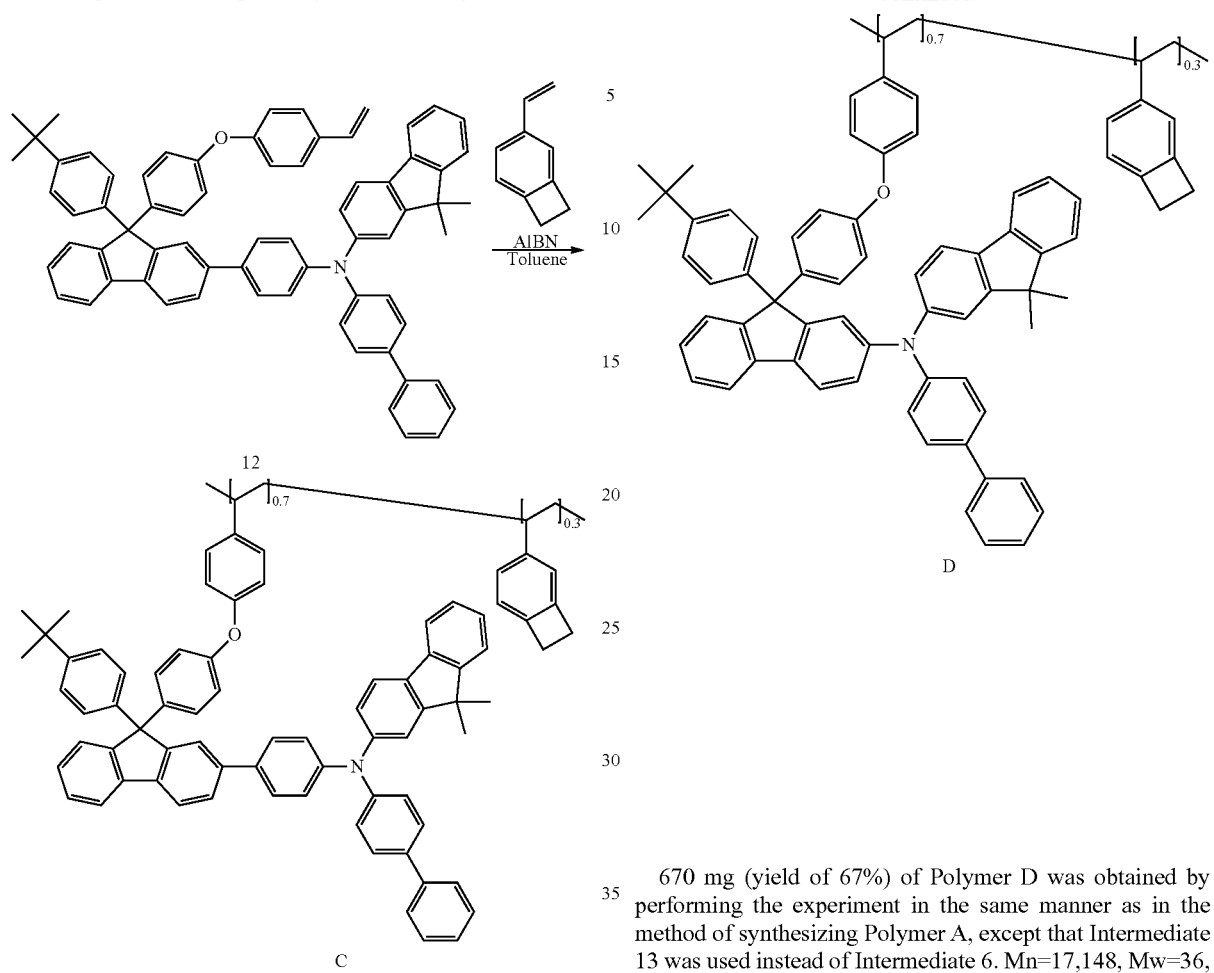

620 mg (yield of 62%) of Polymer C was obtained by performing the experiment in the same manner as in the method of synthesizing Polymer A, except that Intermediate 12 was used instead of Intermediate 6. Mn=20,871, Mw=37,961

Preparation Example 5. Synthesis of Polymer D 670 mg (yield of 67%) of Polymer D was obtained by performing the experiment in the same manner as in the method of synthesizing Polymer A, except that Intermediate 13 was used instead of Intermediate 6. Mn=17,148, Mw=36,791

Preparation Example 6. Synthesis of Polymer E

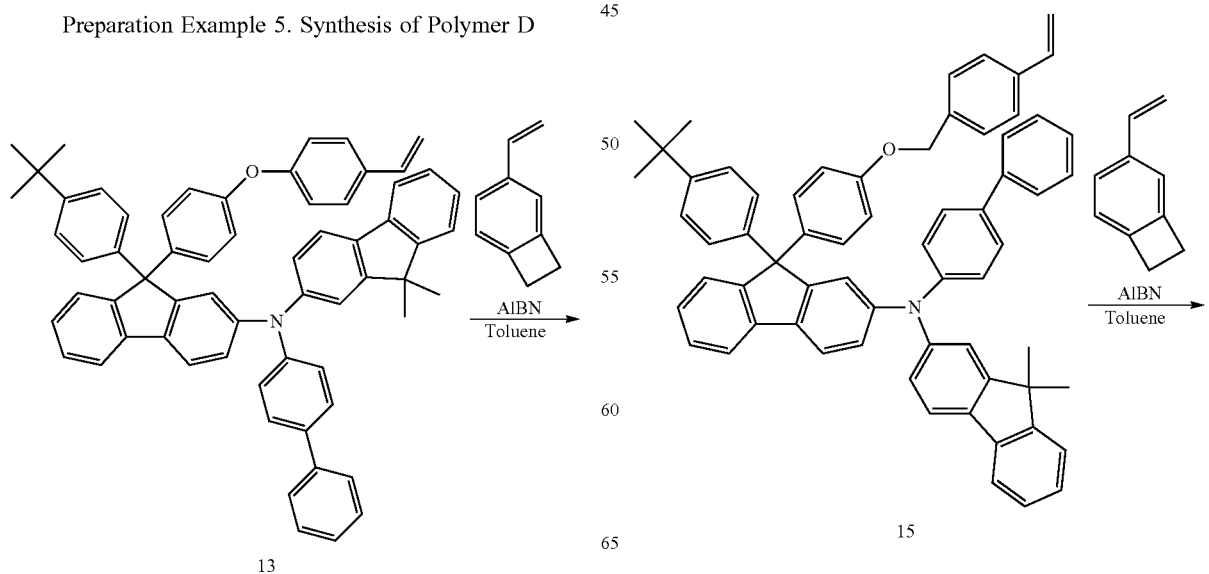

-continued

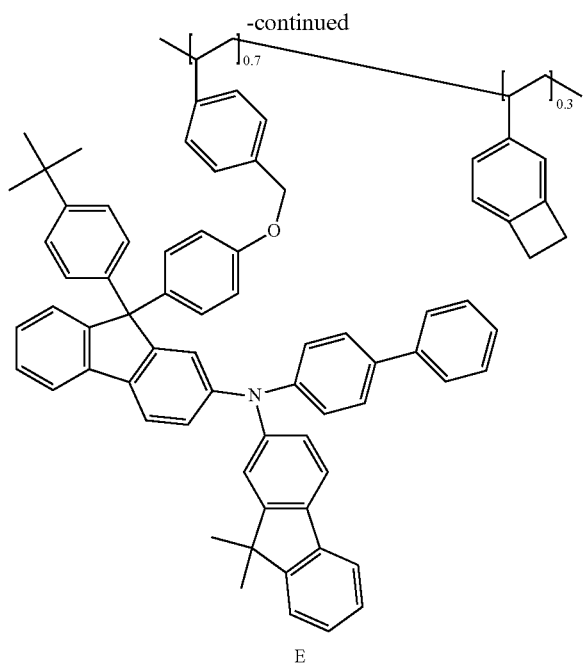

E 490 mg (yield of 49%) of Polymer E was obtained by performing the experiment in the same manner as in the method of synthesizing Polymer A, except that Intermediate 15 was used instead of Intermediate 6. Mn=19,540, Mw=27,439

EXAMPLES

[Preparation of ITO Substrate]

A glass substrate thinly coated with indium tin oxide (ITO) to have a thickness of 1,500 Å was put into distilled water in which a detergent was dissolved, and ultrasonically washed. In this case, a product manufactured by Fischer Co., was used as the detergent, and distilled water, which had been filtered twice with a filter manufactured by Millipore Co., was used as the distilled water. After the ITO was washed for 30 minutes, ultrasonic washing was conducted twice repeatedly using distilled water for 10 minutes.

After the washing with distilled water was completed, ultrasonic washing was conducted using isopropyl alcohol and acetone solvents, the substrate was dried, and then the substrate was cleaned for 5 minutes, and then transported to a glove box.

Device Example 1

The ITO surface of a transparent ITO electrode was spin-coated (4,000 rpm) with 2 wt % of a toluene ink of Polymer A: the following p-dopant (the following Formula M) (weight ratio of 8:2) and the transparent ITO electrode was heat-treated (cured) at 200° C. for 30 minutes, thereby forming a hole injection layer having a thickness of 40 nm. Thereafter, the transparent ITO electrode was transported to a vacuum deposition machine, and then a hole transport layer was formed to have a thickness of 20 nm by vacuum-depositing the following Compound G onto the hole injection layer.

Subsequently, the following Compound H and Compound I (weight ratio of 8:2) were vacuum-deposited to have a thickness of 20 nm on the hole transport layer, thereby forming a light emitting layer. Compound J was vacuum-deposited to have a thickness of 35 nm on the light emitting layer, thereby forming a layer which simultaneously injects and transports electrons. LiF and aluminum were sequentially deposited on the layer, which simultaneously injects and transports electrons, to have a thickness of 1 nm and 100 nm, respectively, thereby forming a cathode.

In the aforementioned procedure, the deposition rate of the organic material was maintained at 0.4 to 0.7 Å/sec, the deposition rates of lithium fluoride and aluminum of the cathode were maintained at 0.3 Å/sec and at 2 Å/sec, respectively, and the degree of vacuum during the deposition was maintained at $2 \times 10^{-7}$ to $5 \times 10^{-8}$ torr, thereby manufacturing an organic light emitting device.

[Compound G]

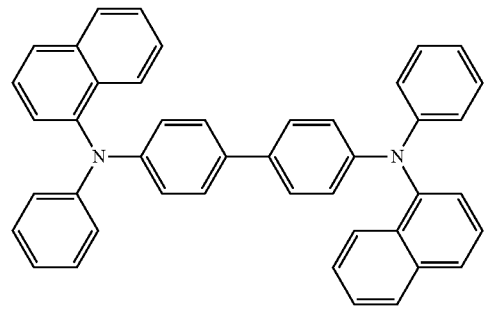

[Compound H]

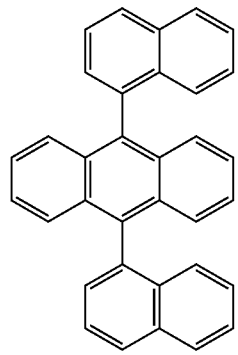

[Compound I]

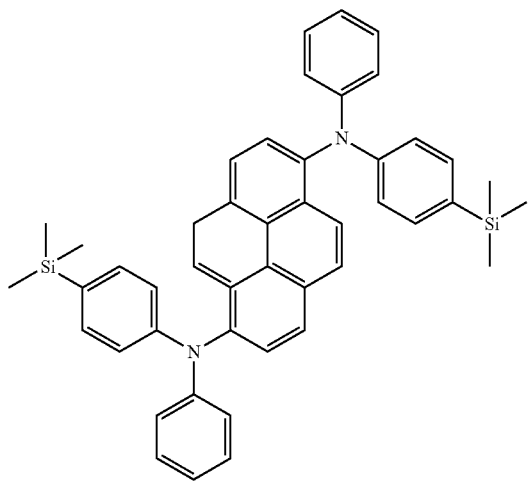

-continued

[Compound J]

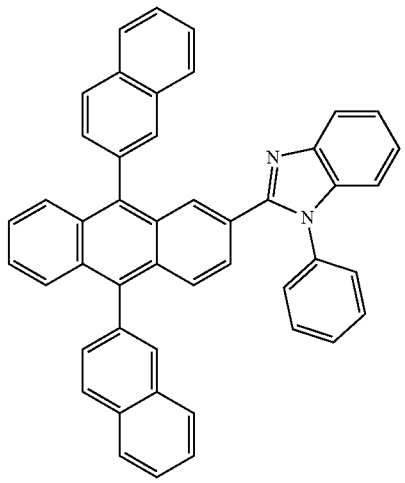

[Formula M]

Device Example 2

An organic light emitting device was manufactured in the same manner as in the procedure in Device Example 1, except that 2 wt % of a toluene ink of Polymer B: the p-dopant (weight ratio of 8:2) was used instead of 2 wt % of the toluene ink of Polymer A: the p-dopant (weight ratio of 8:2) during the film-formation of the hole injection layer in the manufacturing procedure in Device Example 1.

Device Example 3

An organic light emitting device was manufactured in the same manner as in the procedure in Device Example 1, except that 2 wt % of a toluene ink of Polymer C: the p-dopant (weight ratio of 8:2) was used instead of 2 wt % of the toluene ink of Polymer A: the p-dopant (weight ratio of 8:2) during the film-formation of the hole injection layer in the manufacturing procedure in Device Example 1.

Device Example 4

An organic light emitting device was manufactured in the same manner as in the procedure in Device Example 1, except that 2 wt % of a toluene ink of Polymer D: the p-dopant (weight ratio of 8:2) was used instead of 2 wt % of the toluene ink of Polymer A: the p-dopant (weight ratio of 8:2) during the film-formation of the hole injection layer in the manufacturing procedure in Device Example 1.

Device Example 5

An organic light emitting device was manufactured in the same manner as in the procedure in Device Example 1, except that 2 wt % of a toluene ink of Polymer E: the p-dopant (weight ratio of 8:2) was used instead of 2 wt % of the toluene ink of Polymer A: the p-dopant (weight ratio of 8:2) during the film-formation of the hole injection layer in the manufacturing procedure in Device Example 1.

Comparative Device Example 1

An organic light emitting device was manufactured in the same manner as in the procedure in Device Example 1, except that 2 wt % of a toluene ink of the following single molecular Z: the p-dopant (weight ratio of 8:2) was used instead of 2 wt % of the toluene ink of Polymer A: the p-dopant (weight ratio of 8:2) during the film-formation of the hole injection layer in the manufacturing procedure in Device Example 1.

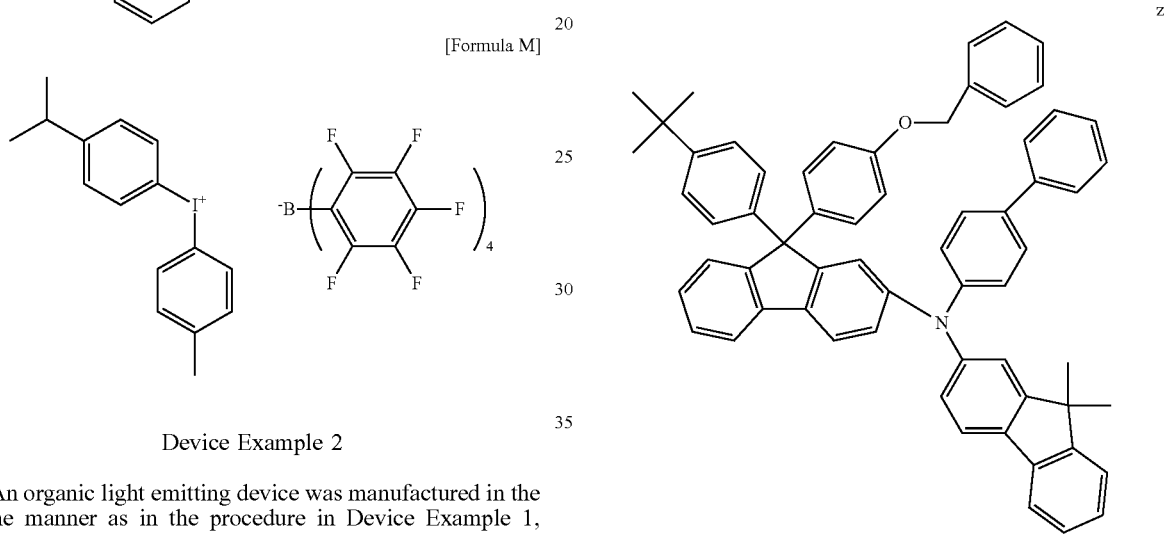

When an electric current was applied to the organic light emitting devices manufactured in Device Examples 1 to 5 and Comparative Device Example 1, the voltages, efficiencies, and service lives were measured, and the results are shown in the following [Table 1]. T95 means time taken for the luminance to decrease to 95% when the initial luminance at the light density of 20 mA/cm$^2$ is set to 100%. Further, EQE is a value obtained by measuring a spectral radiation luminance spectrum when a voltage is applied to the devices such that the current density becomes 10 mA/cm$^2$, by using spectroradiometer CS-1000 (manufactured by Konica Minolta Optics, Inc.), and the external quantum efficiency was calculated from the obtained spectral radiation luminance spectrum.

TABLE 1

| | Voltage (V) (@10 mA/cm$^2$) | Current density (mA/cm$^2$) | EQE (%) (@10 mA/cm$^2$) | Service life (T95, h) (@20 mA/cm$^2$) |
|---|---|---|---|---|
| Device Example 1 | 6.18 | 10 | 5.7 | 38 |
| Device Example 2 | 6.14 | 10 | 5.5 | 35 |
| Device Example 3 | 6.21 | 10 | 4.0 | 29 |

TABLE 1-continued

| | Voltage (V) (@10 mA/cm²) | Current density (mA/cm²) | EQE (%) (@10 mA/cm²) | Service life (T95, h) (@20 mA/cm²) |
|---|---|---|---|---|
| Device Example 4 | 6.24 | 10 | 4.4 | 22 |
| Device Example 5 | 6.95 | 10 | 3.7 | 19 |
| Comparative Device Example 1 | 6.57 | 10 | 3.7 | 7 |

As shown in Table 1, it can be seen that the case where the coating composition using the polymer including the first unit represented by Formula 1 and the second unit represented by Formula 2 according to the present specification was used as a material for a hole injection layer exhibits an excellent effect of high efficiency, particularly, a long service life, as compared to Comparative Device Example 1 in which the single molecular compound was used.

Accordingly, it can be seen that since the coating composition using the polymer including the first unit represented by Formula 1 and the second unit represented by Formula 2 according to the present specification is excellent in uniformity of the coating layer and stability of the film, it is possible to improve the performance of the organic light emitting device by using the coating composition.

Although the preferred exemplary embodiments of the present invention have been described above, the present invention is not limited thereto, and various modifications can be made and carried out within the scopes of the claims and the detailed description of the invention, and also fall within the scope of the invention.

The invention claimed is:

1. A polymer comprising:
a first unit represented by the following Formula 1; and
a second unit represented by the following Formula 2:

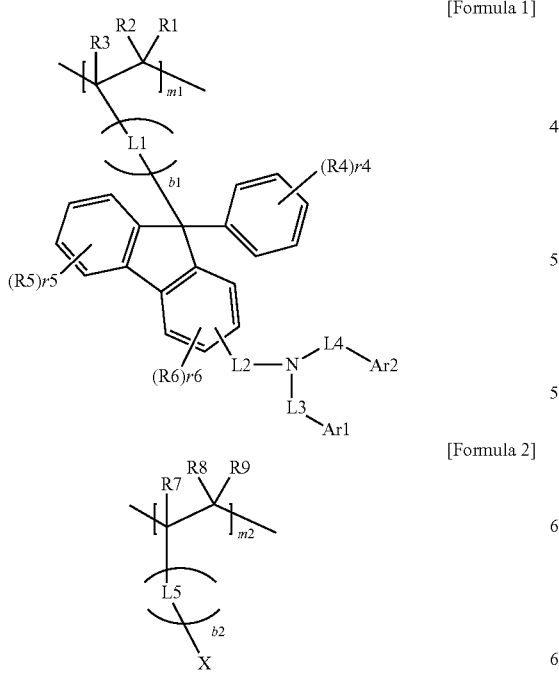

[Formula 1]

[Formula 2]

in Formulae 1 and 2,

X is a curing group,

L1 to L5 are the same as or different from each other, and are each independently a direct bond; —O—; a substituted or unsubstituted alkylene group; a substituted or unsubstituted arylene group; a substituted or unsubstituted divalent amine group; or a substituted or unsubstituted heteroarylene group, b1 and b2 are the same as or different from each other, and are each independently an integer from 1 to 10, when b1 and b2 are each 2 or more, two or more L1s and L5s are each the same as or different from each other, Ar1 and Ar2 are the same as or different from each other, and are each independently a substituted or unsubstituted aryl group, R1 to R9 are the same as or different from each other, and are each independently hydrogen; deuterium; a halogen group; a hydroxyl group; a nitrile group; a substituted or unsubstituted alkyl group; a substituted or unsubstituted cycloalkyl group; a substituted or unsubstituted aryl group; or a substituted or unsubstituted heterocyclic group, r4 is an integer from 1 to 5, r5 is an integer from 1 to 4, r6 is an integer from 1 to 3, when r4 to r6 are each 2 or more, two or more R4s to R6s are each the same as or different from each other, m1 is a mole fraction and $0<m1<1$, m2 is a mole fraction and $0<m2<1$, and $m1+m2 \leq 1$.

2. The polymer of claim 1, wherein X is any one selected from the following structures:

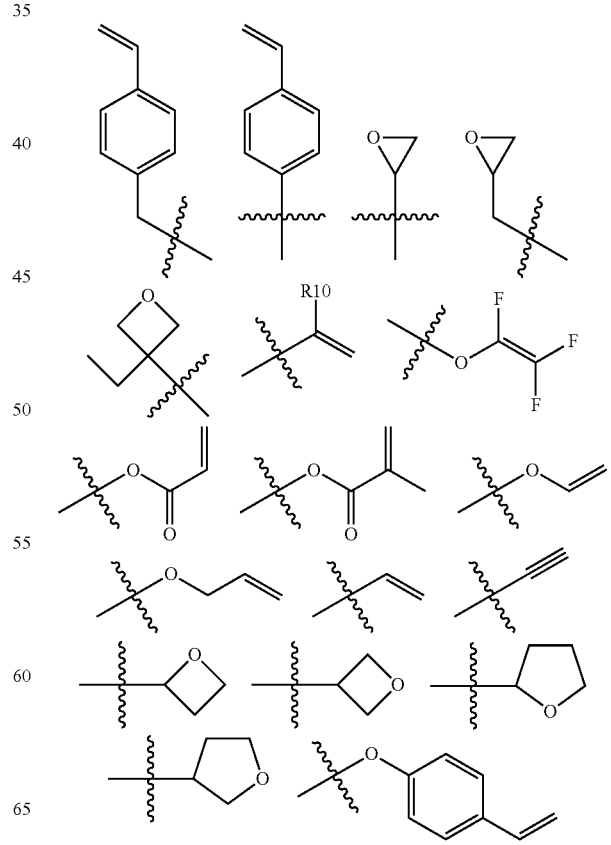

179

-continued

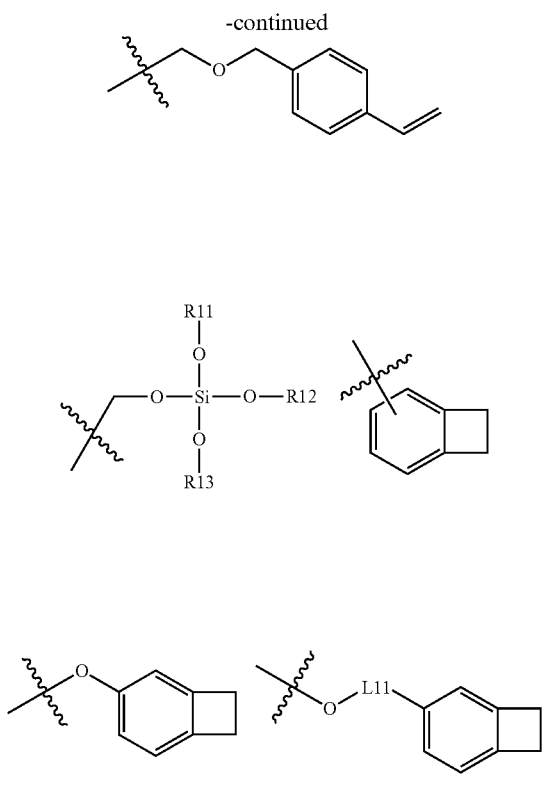

in the structures,

L11 is a substituted or unsubstituted alkylene group; or a substituted or unsubstituted arylene group, and R10 to R13 are the same as or different from each other, and are each independently hydrogen; or a substituted or unsubstituted alkyl group having 1 to 6 carbon atoms.

3. The polymer of claim 1, wherein the first unit represented by Formula 1 is represented by any one of the following structures:

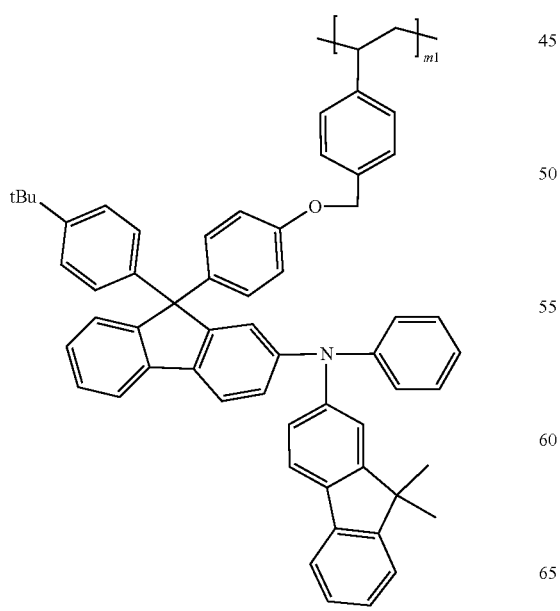

180

-continued

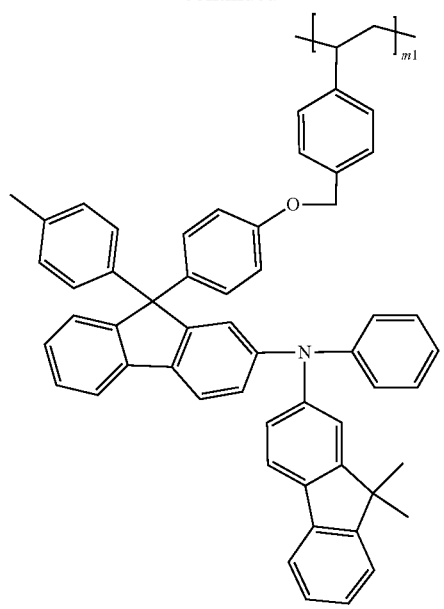

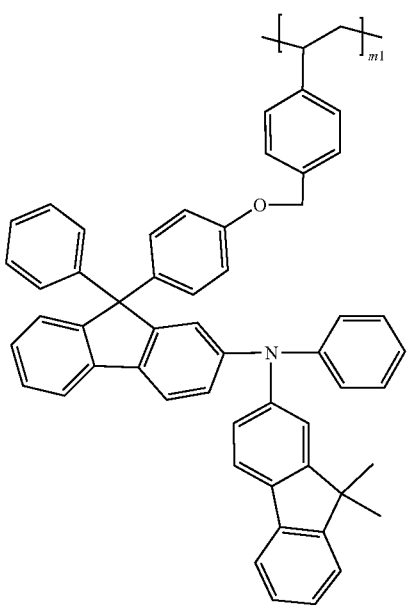

181
-continued
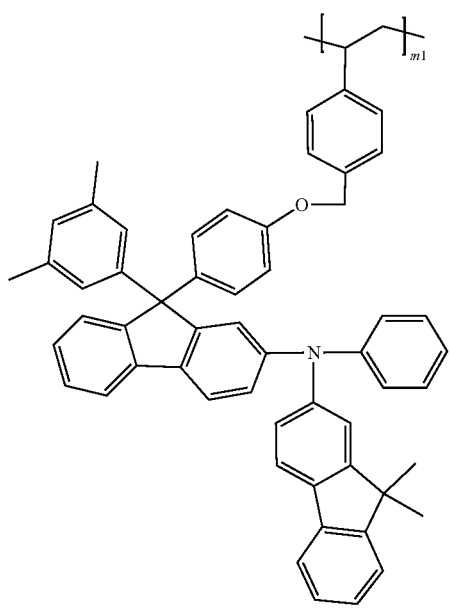
182
-continued
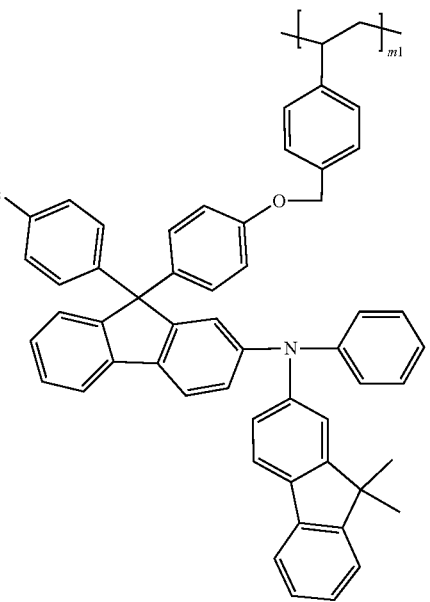
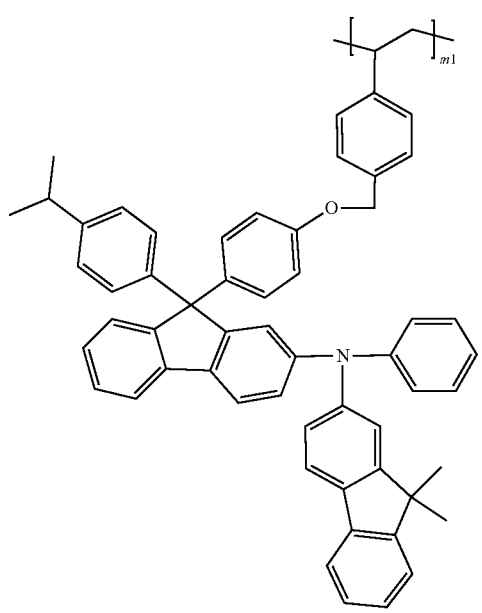
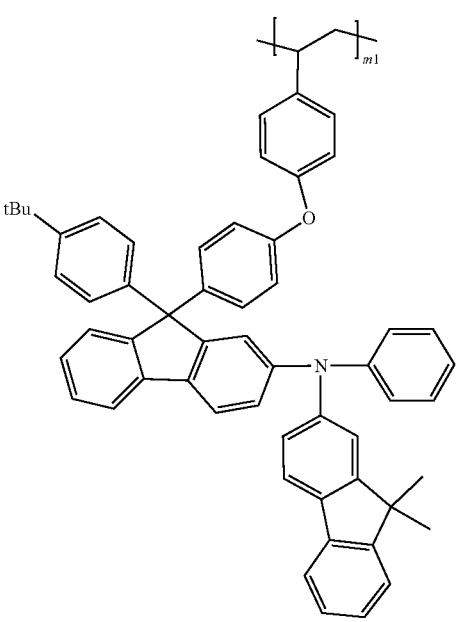

183
-continued
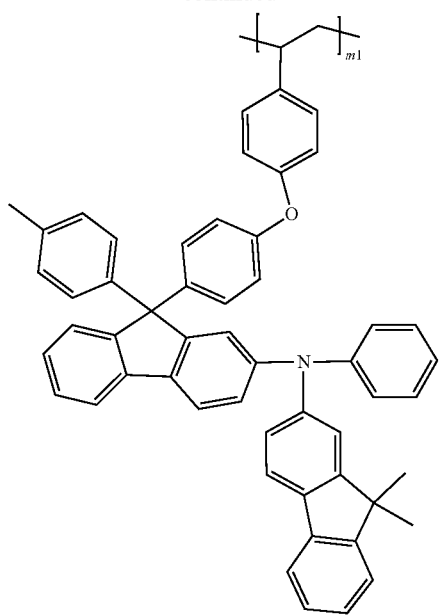
184
-continued
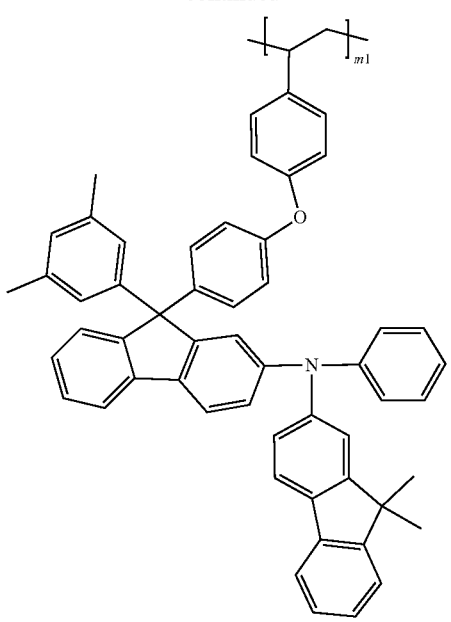
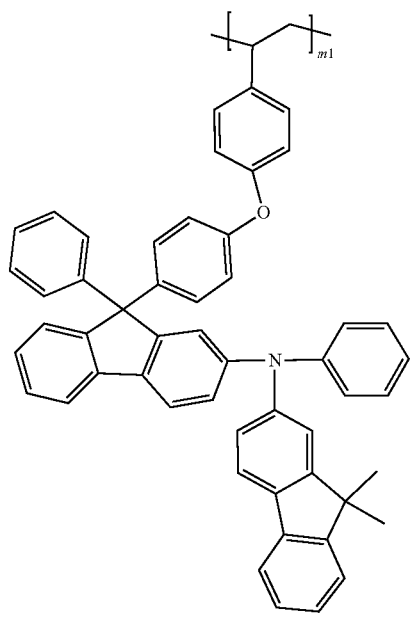
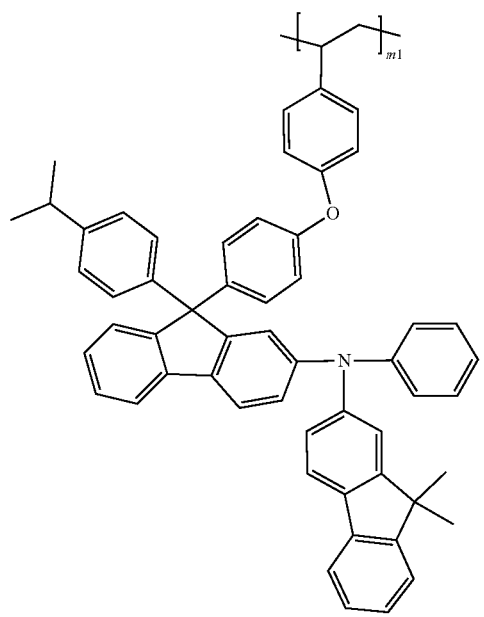

185
-continued
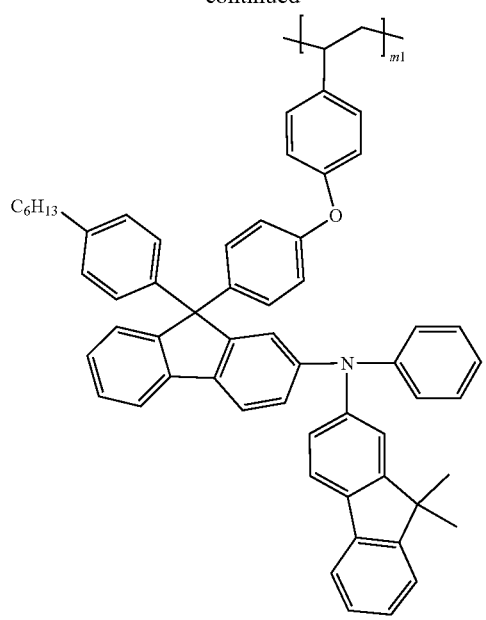
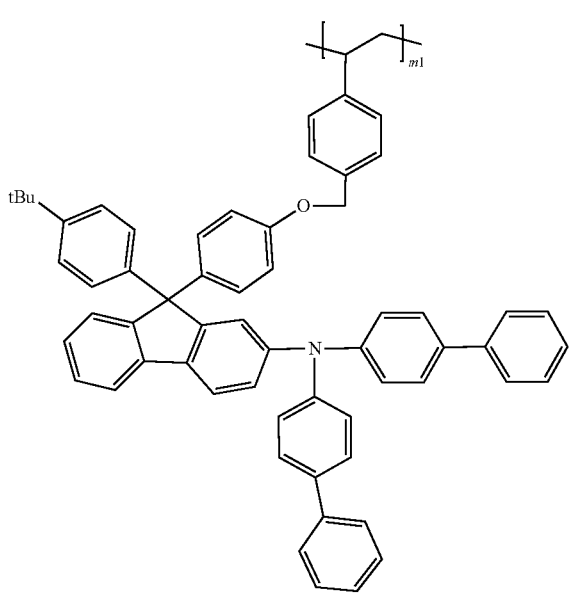
186
-continued
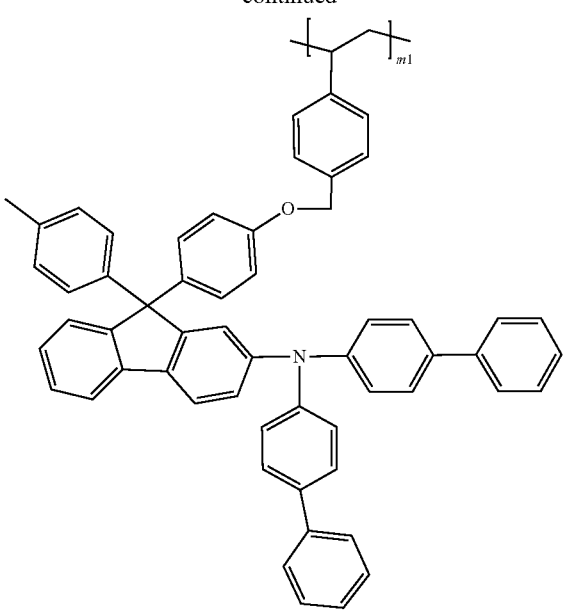
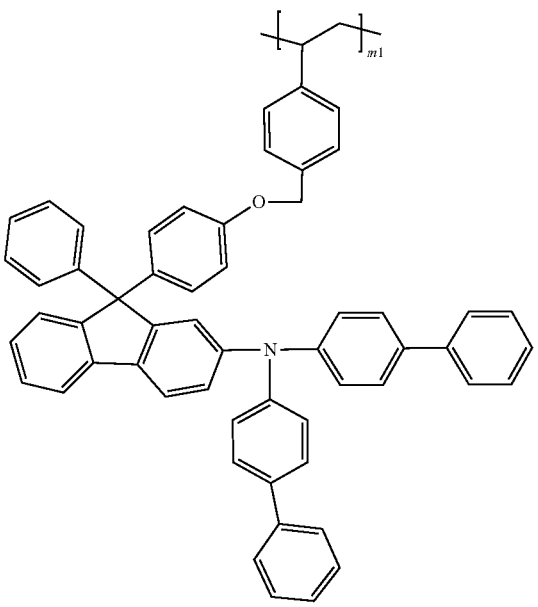

187
-continued
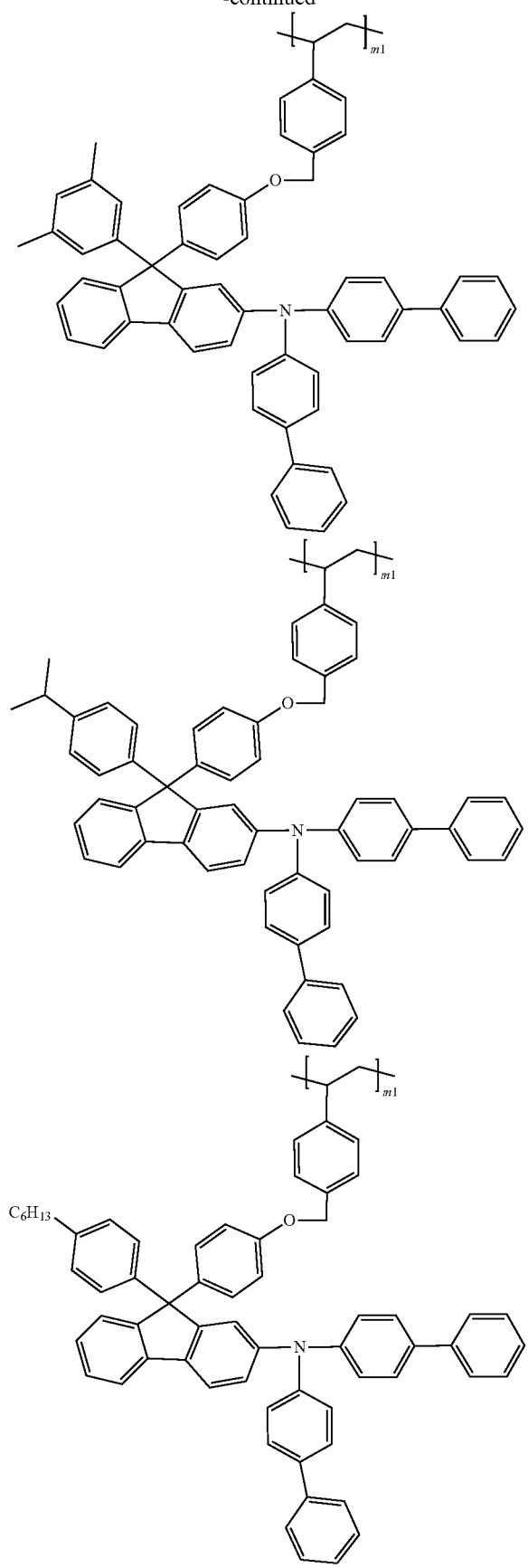
188
-continued
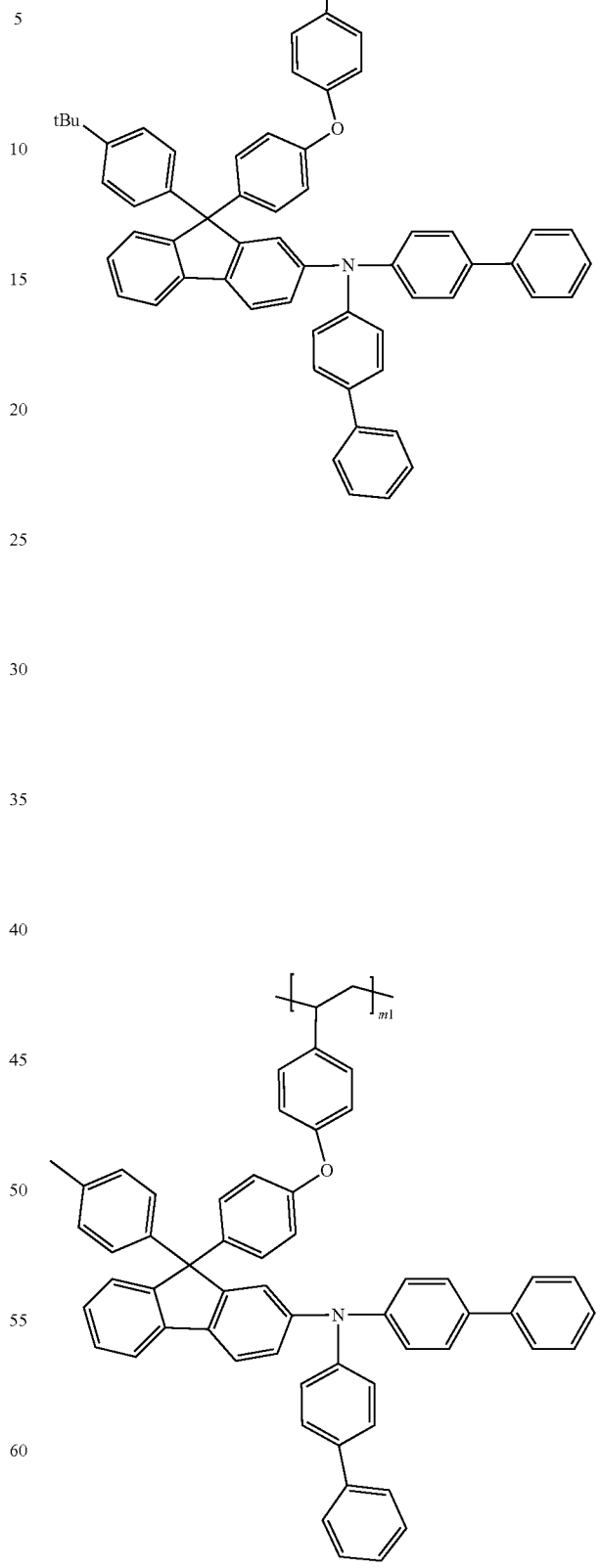

189
-continued
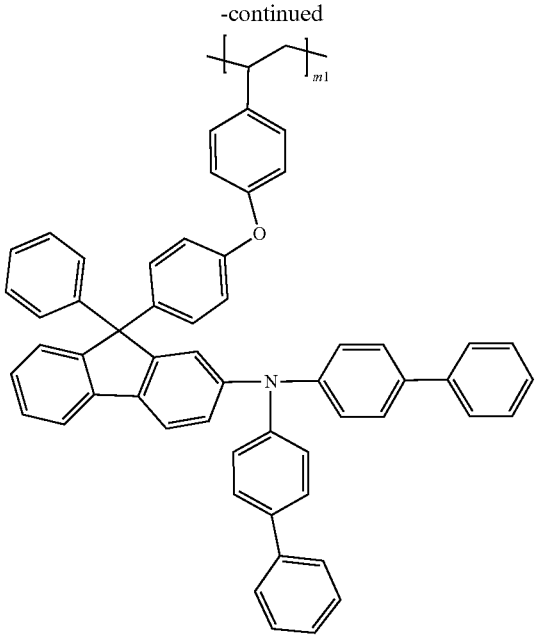
190
-continued
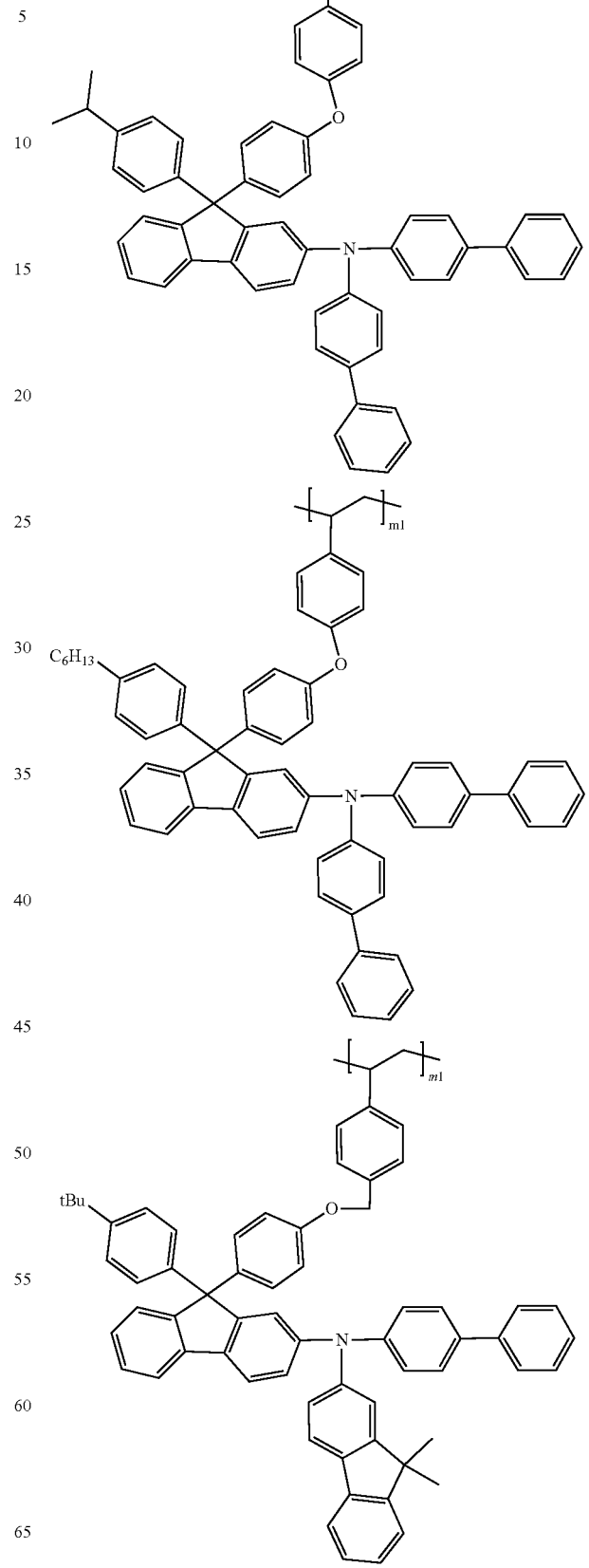
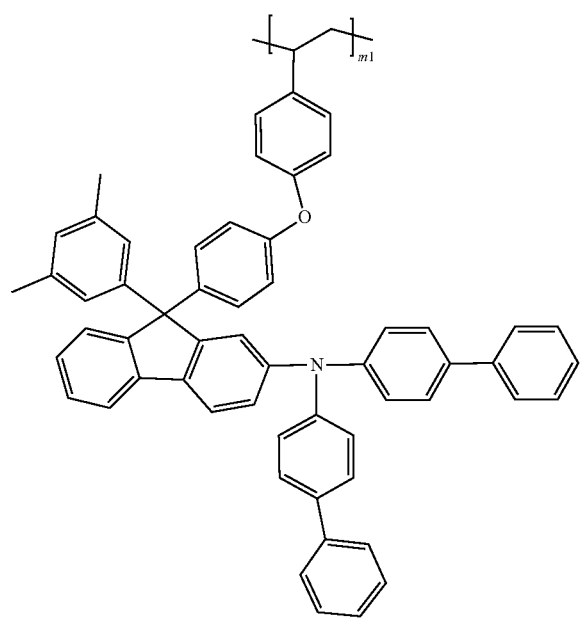

191
-continued
192
-continued
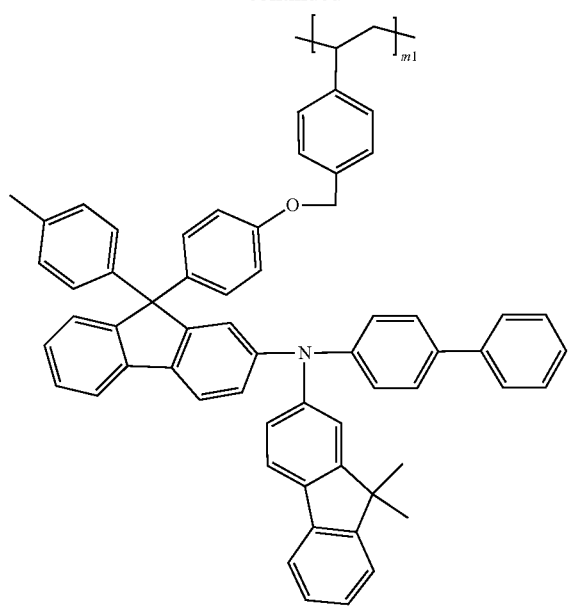
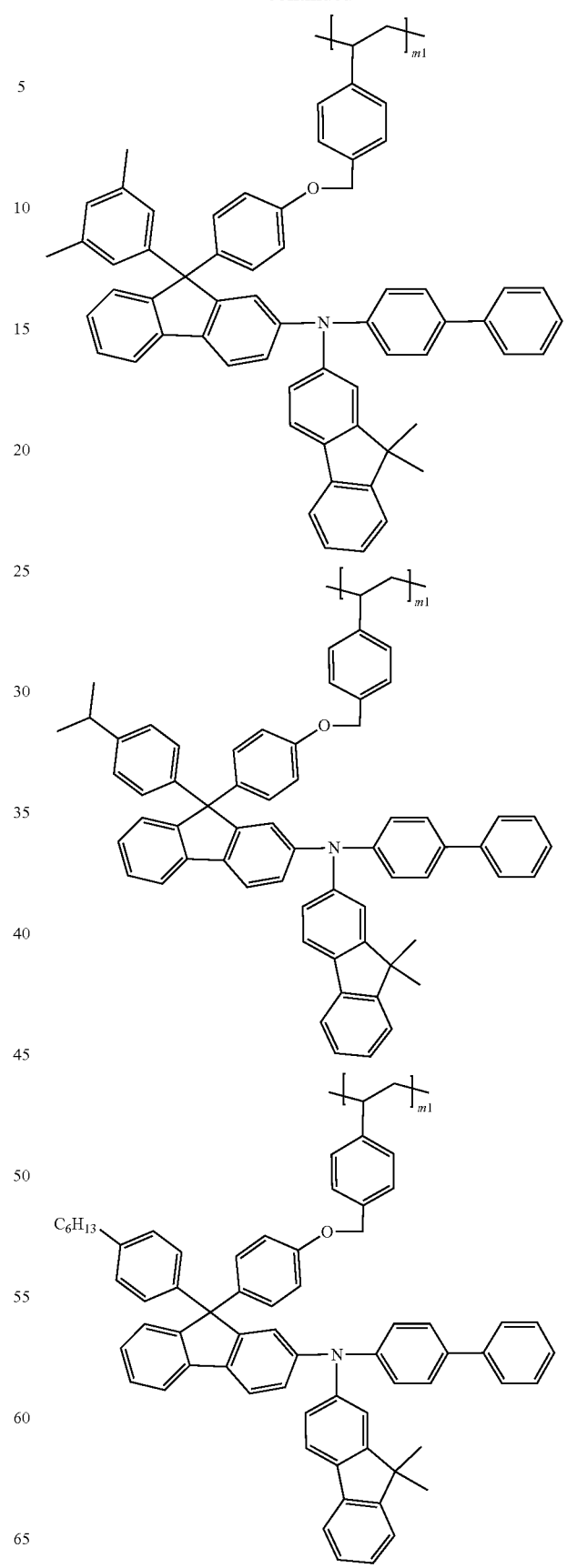

193
-continued
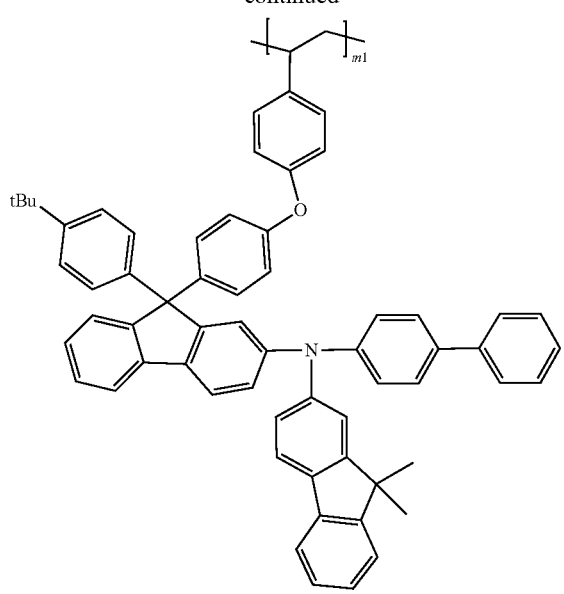
194
-continued
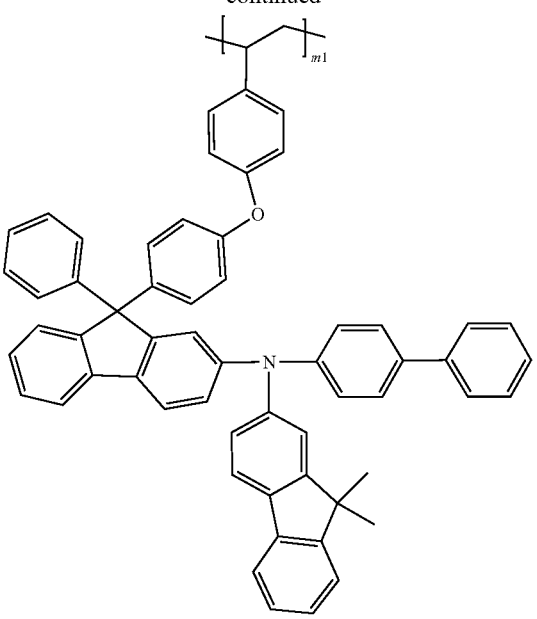
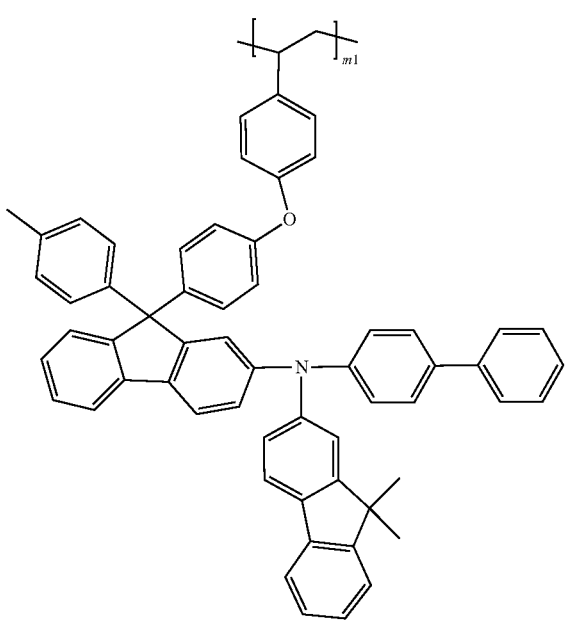
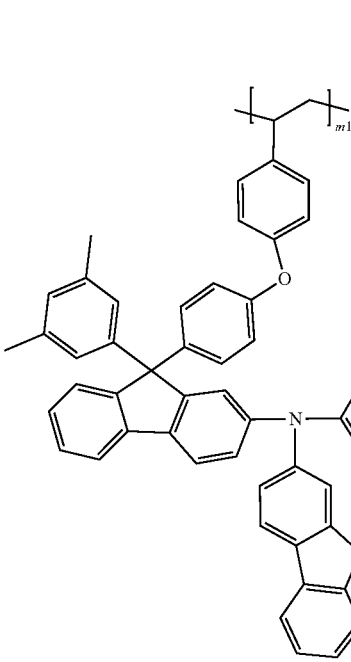

195
-continued
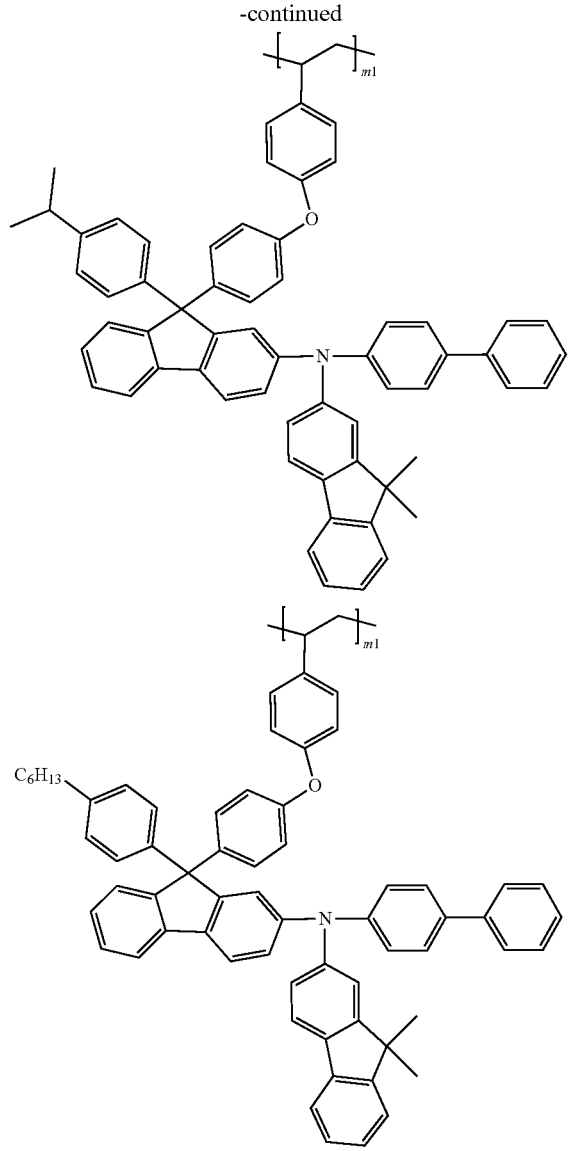
196
-continued
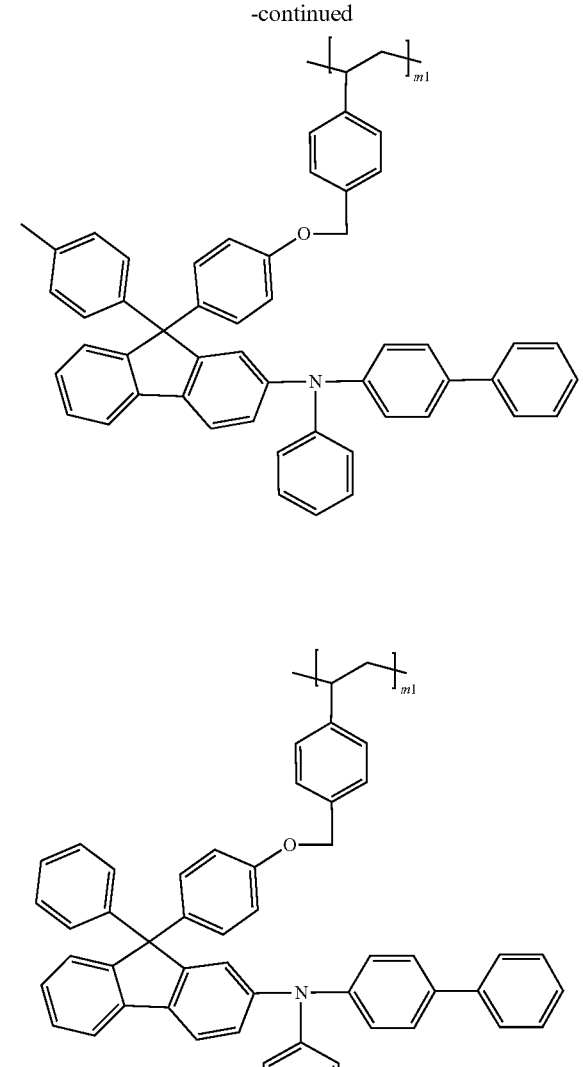
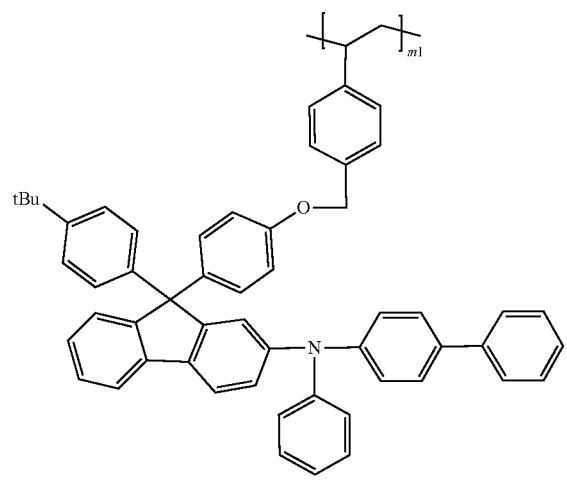
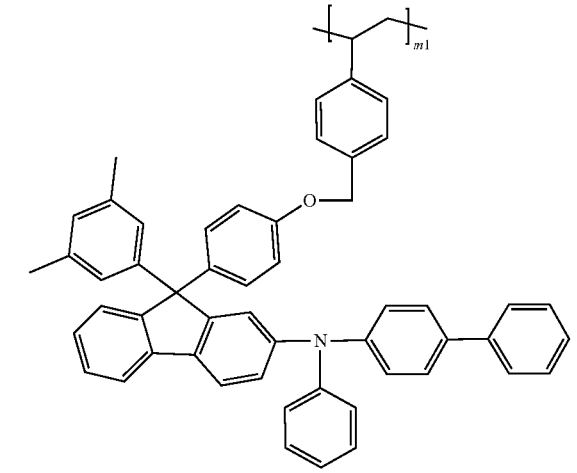

197
-continued
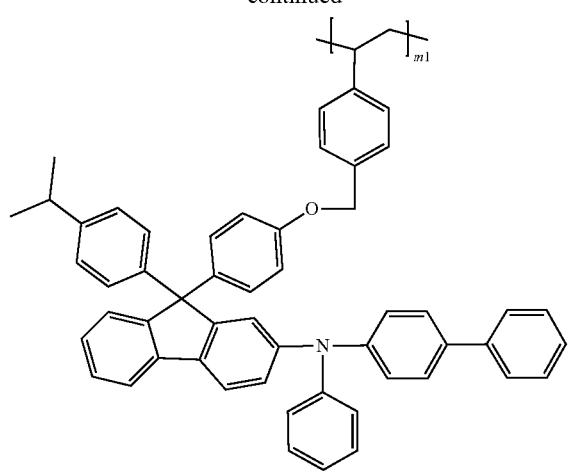
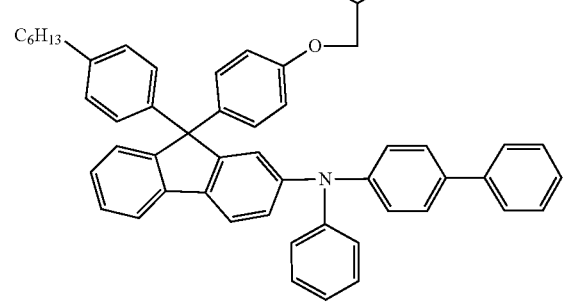
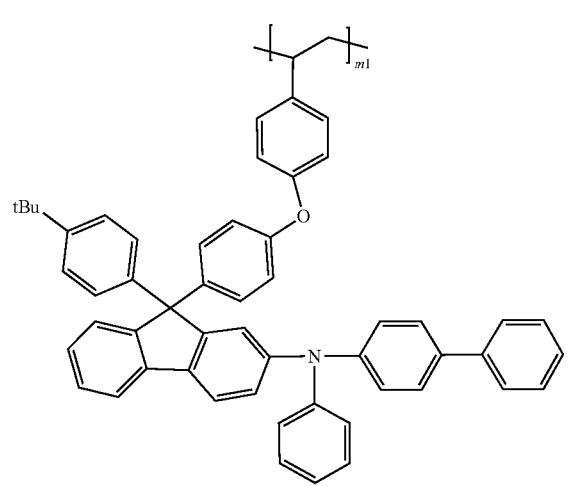
198
-continued
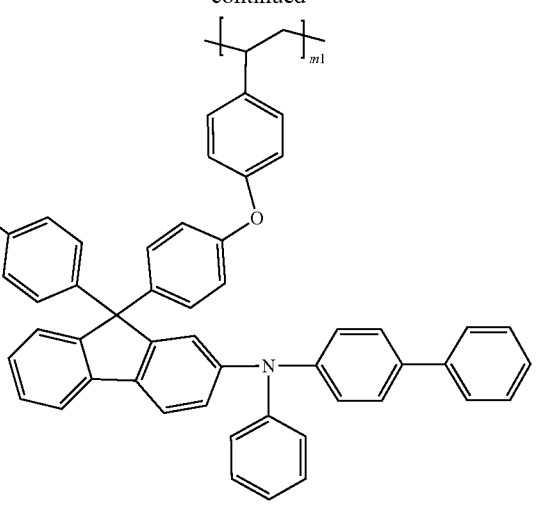
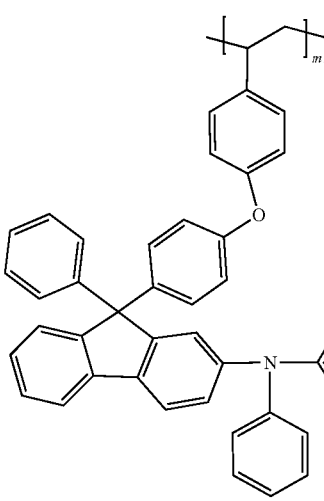
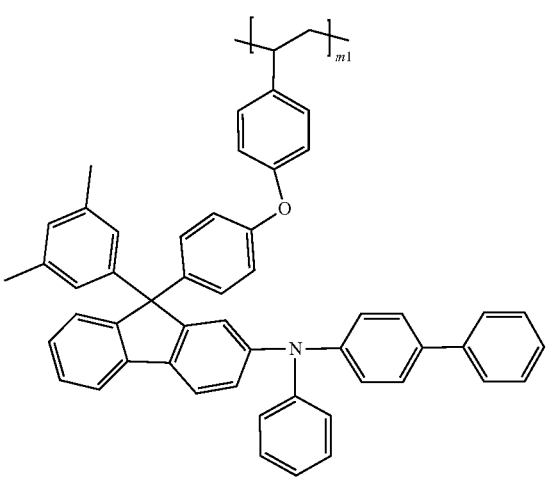

199
-continued
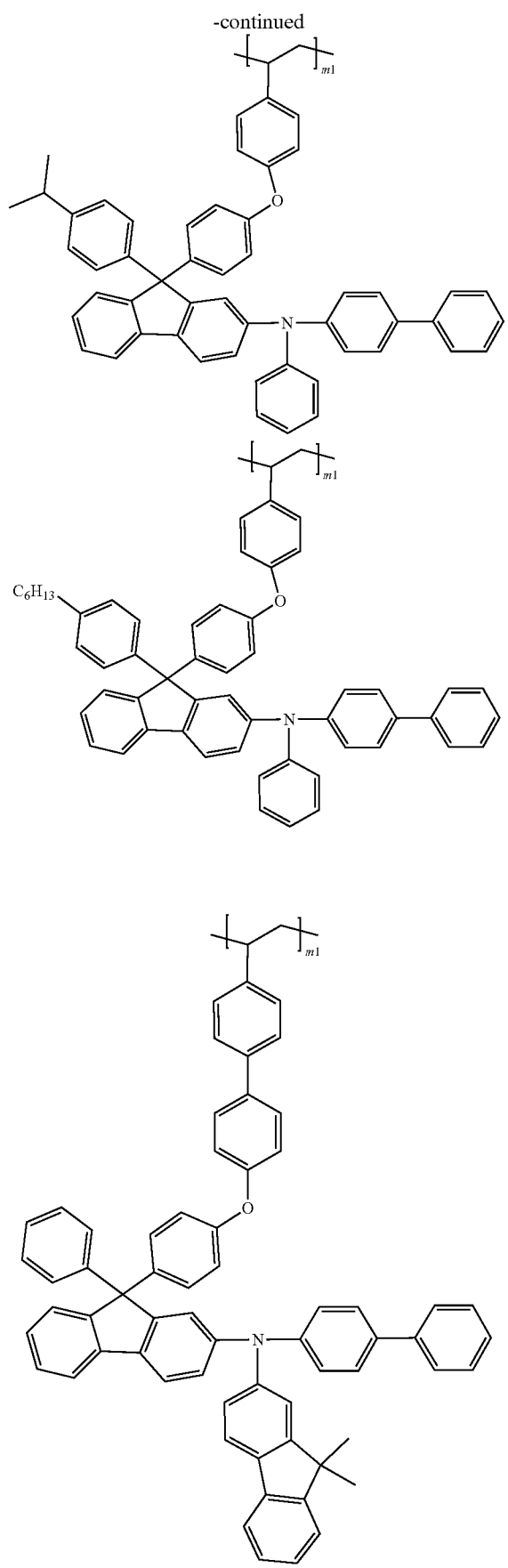
200
-continued
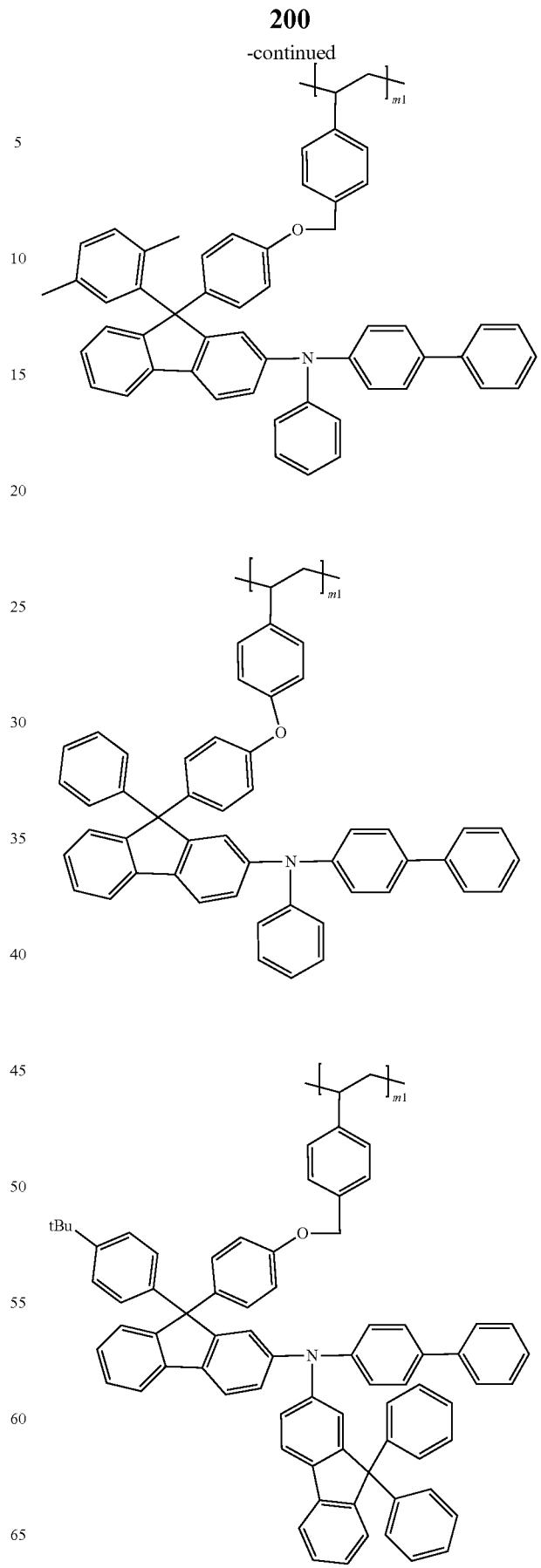

201
-continued
202
-continued
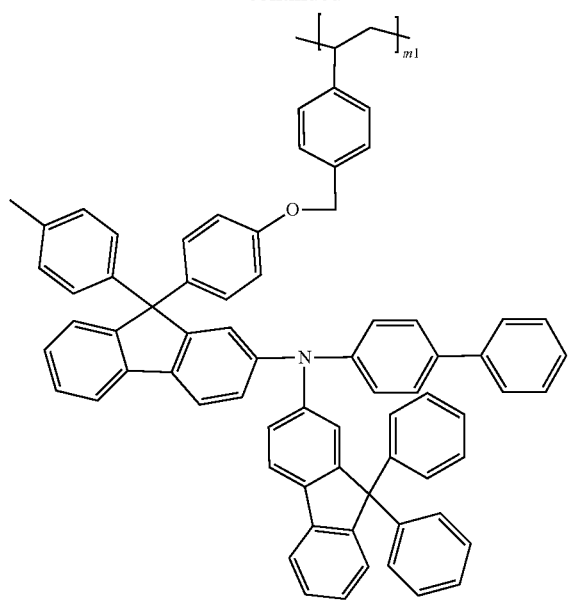
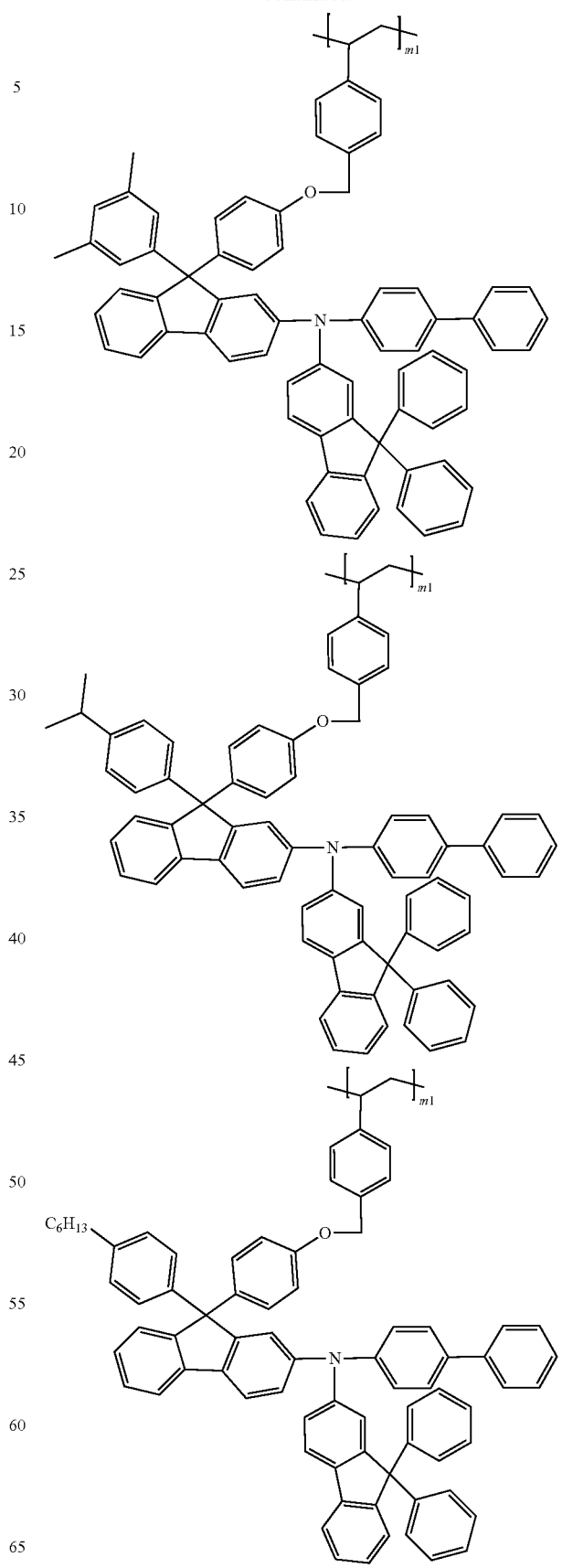

203
-continued
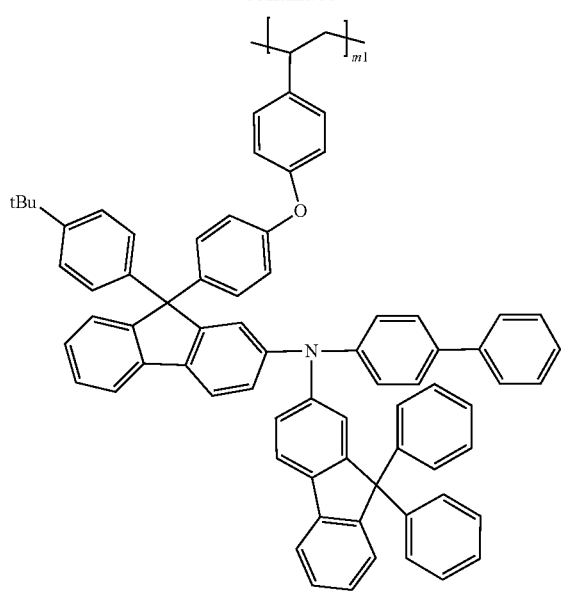
204
-continued
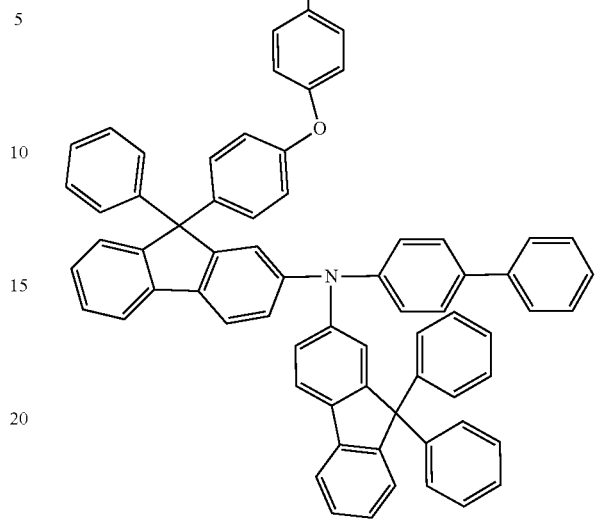
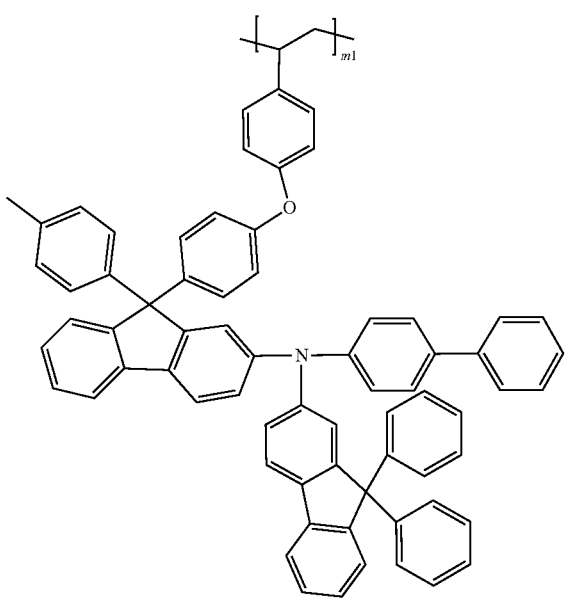
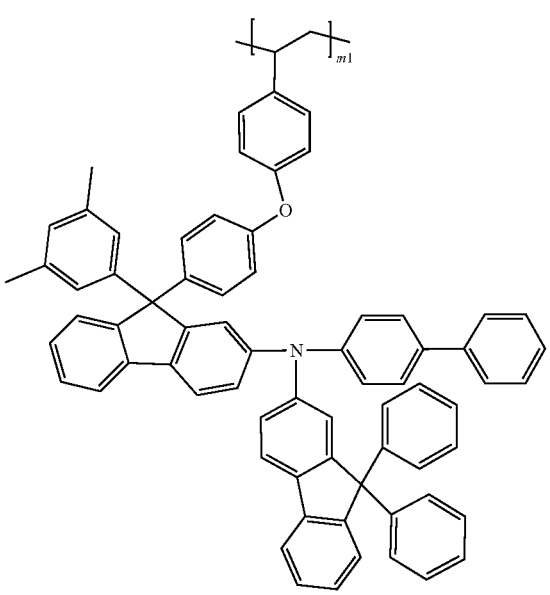

205
-continued
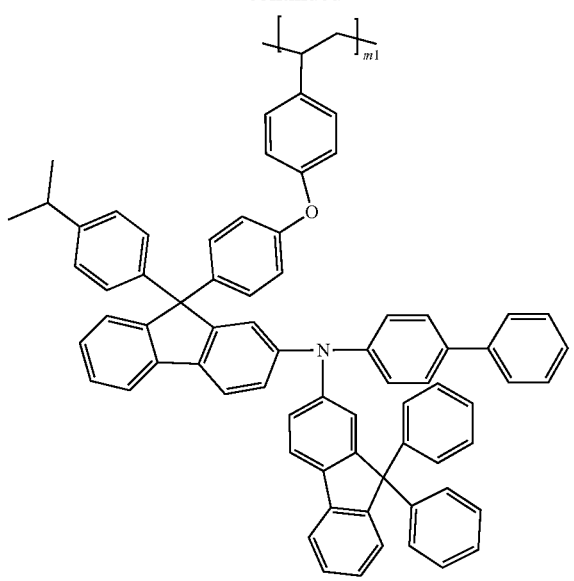
206
-continued
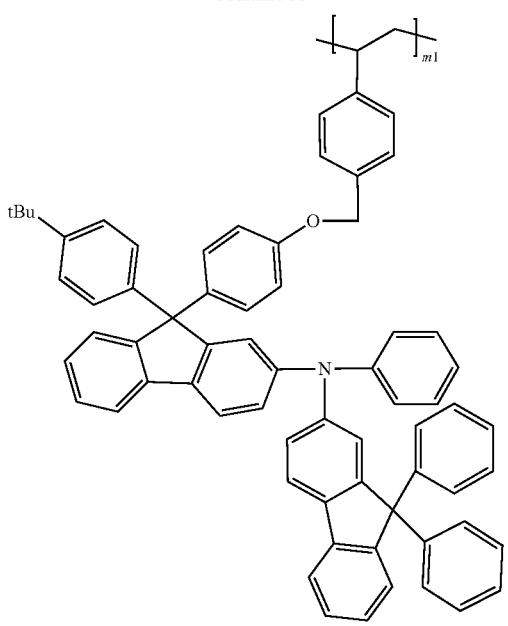
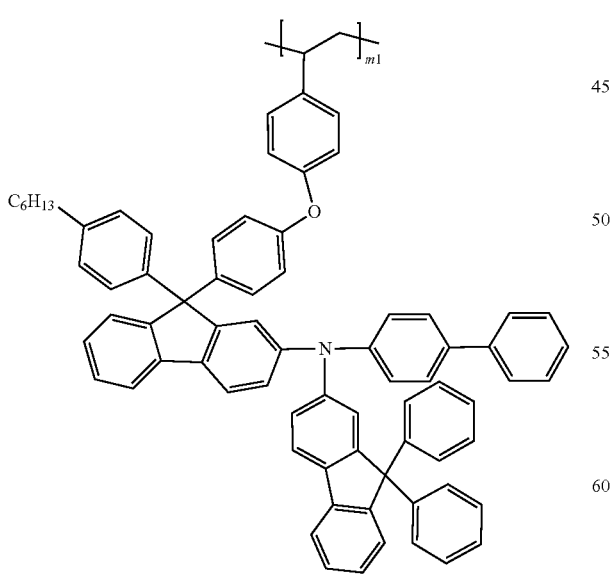
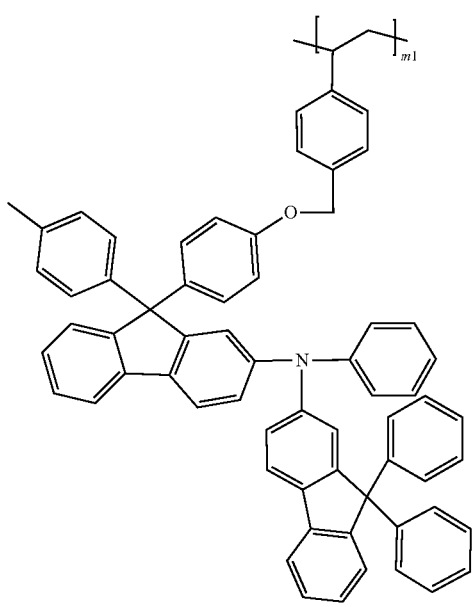

207
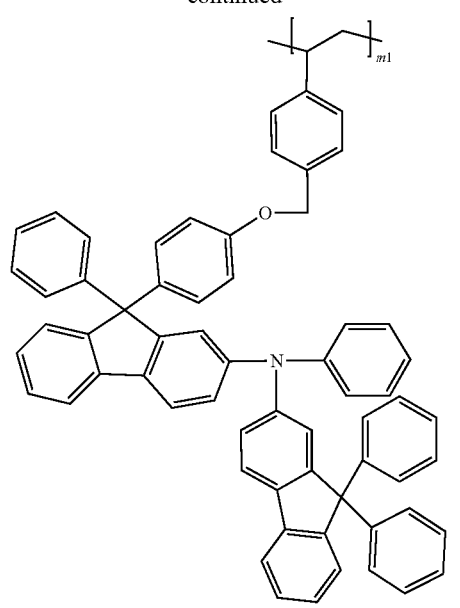
208
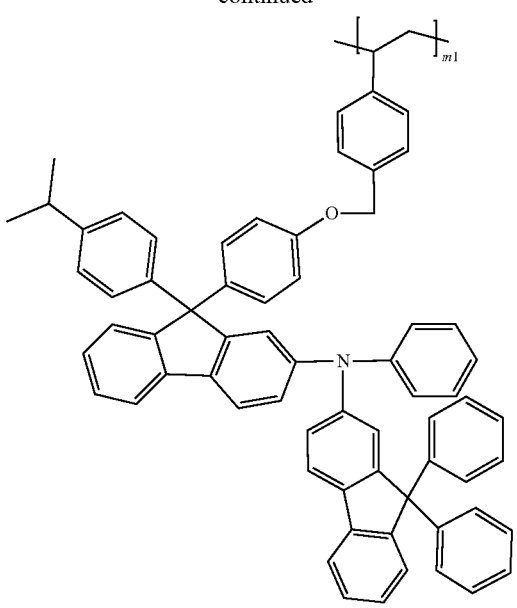
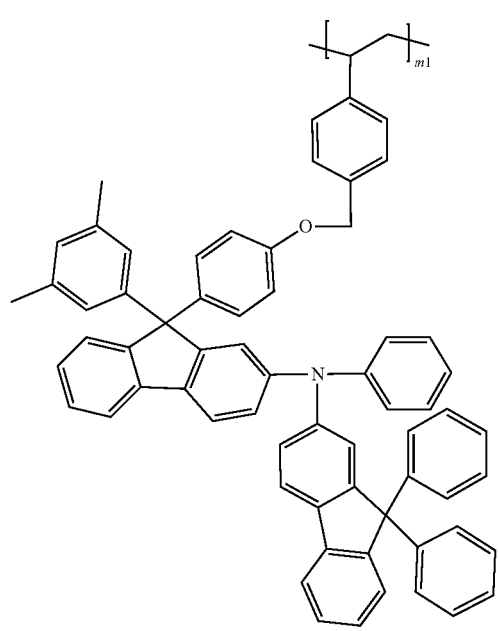
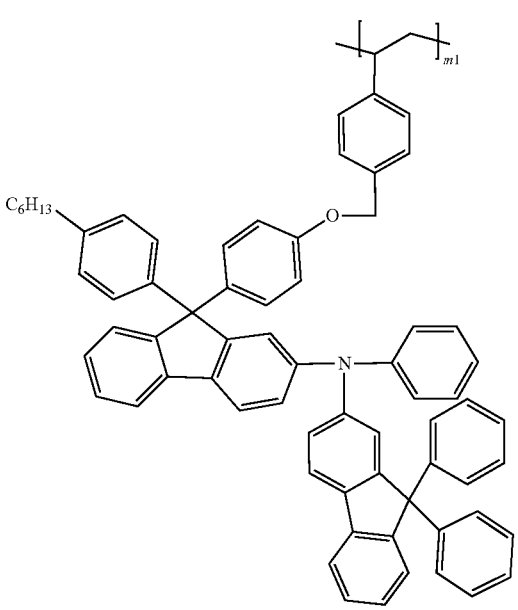

209
-continued
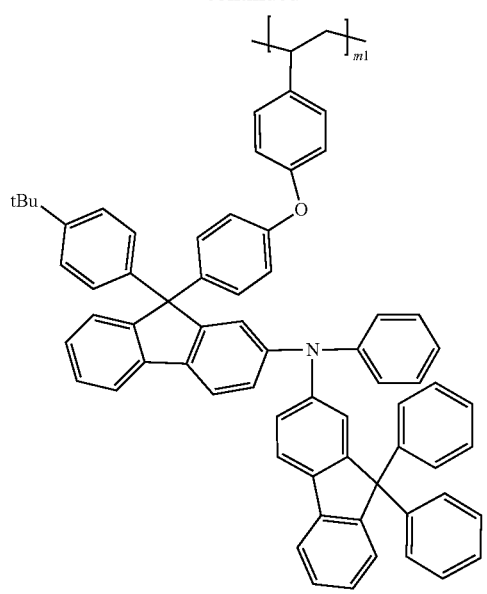
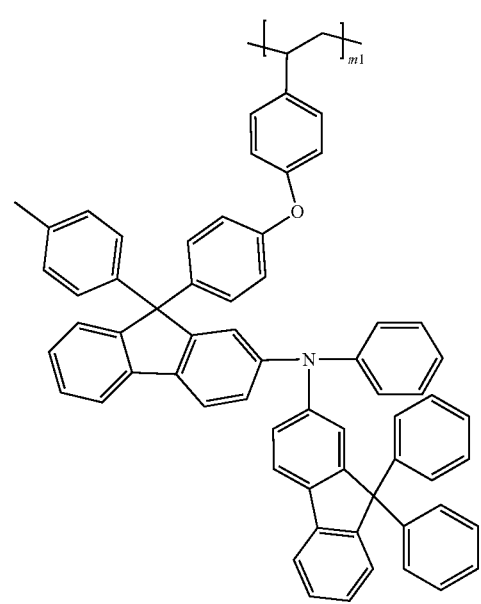
210
-continued
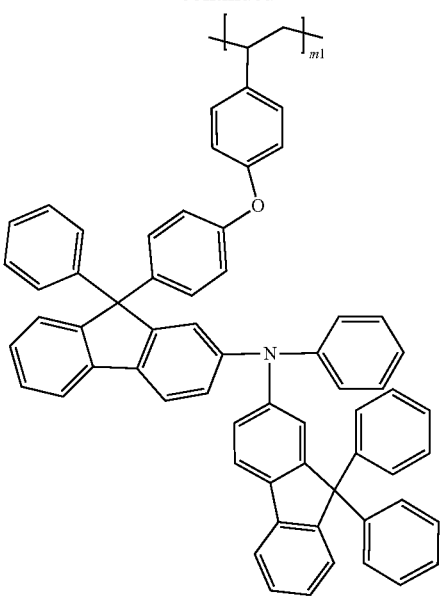
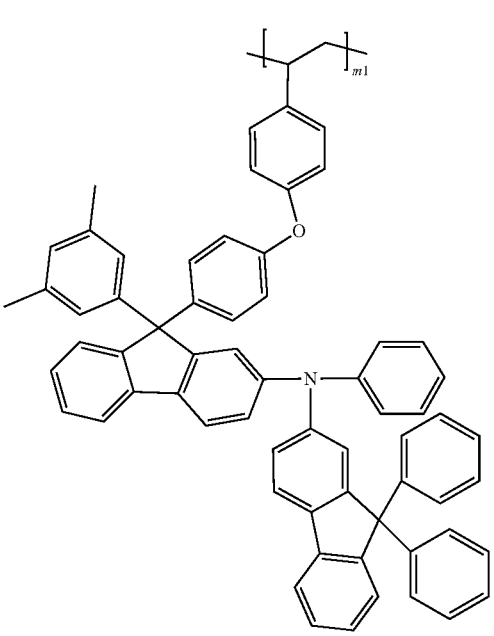

211
-continued
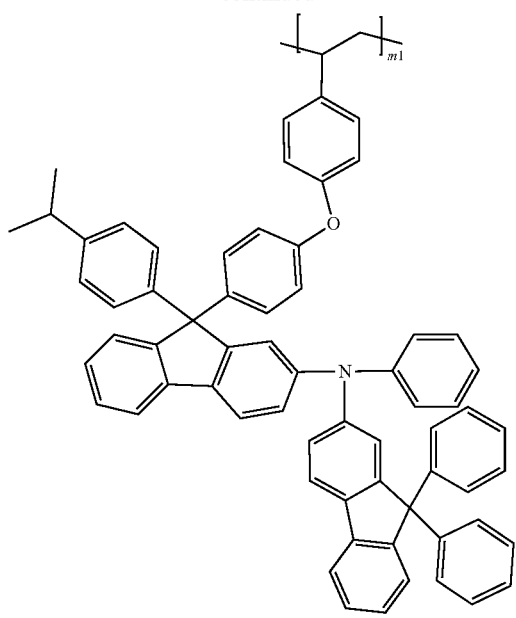
212
-continued
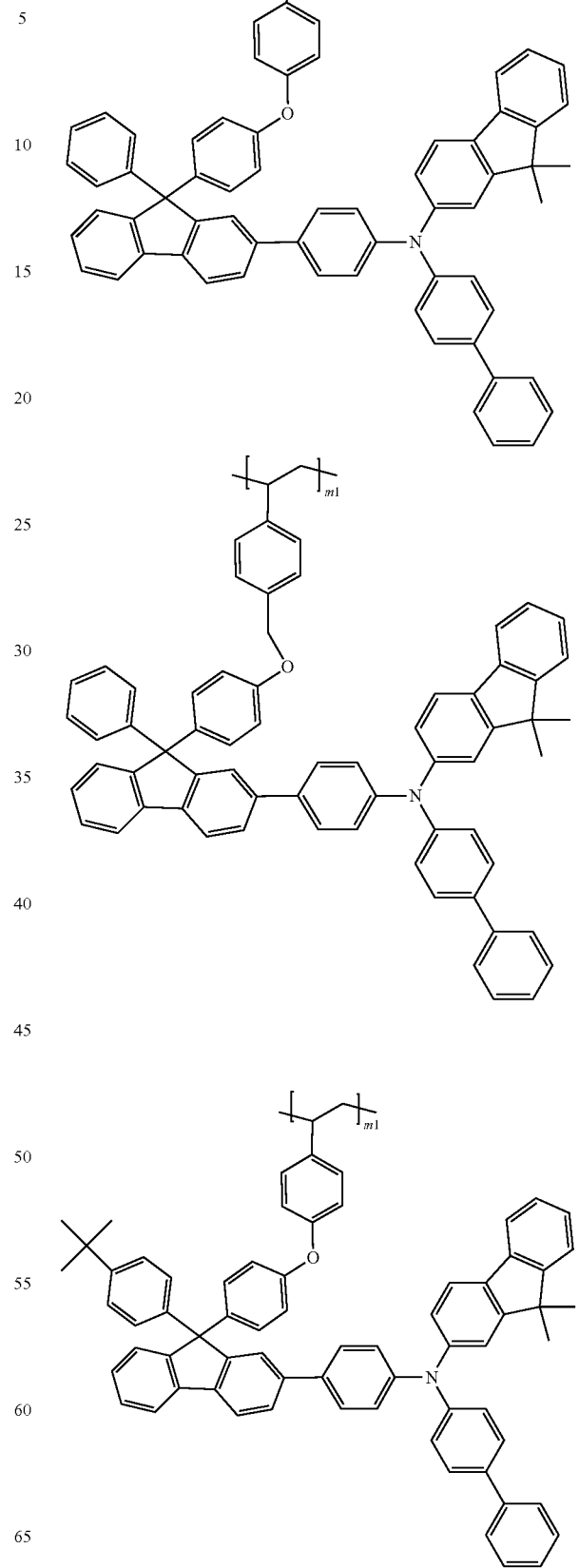
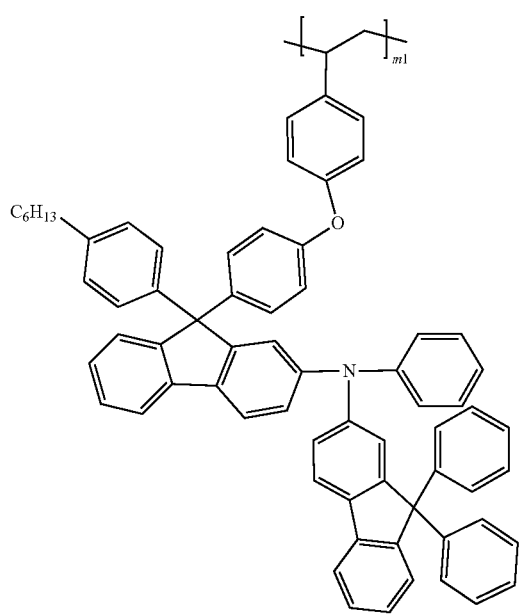

213
-continued
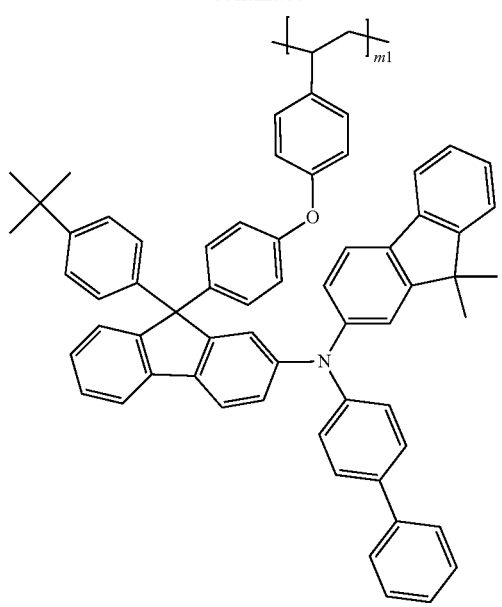
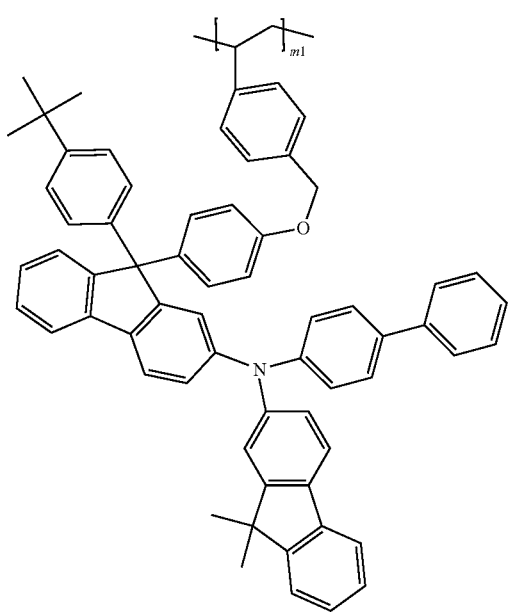
214
-continued
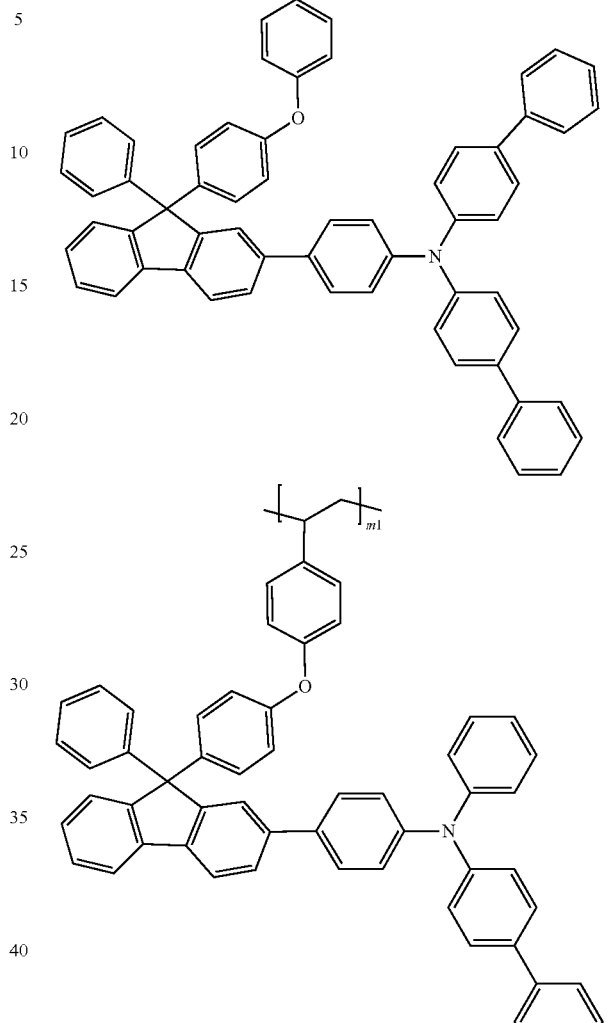
in the structures,
m1 is a mole fraction and 0<m1<1.
4. The polymer of claim 1, wherein the second unit represented by Formula 2 is represented by any one of the following structures:
Q1
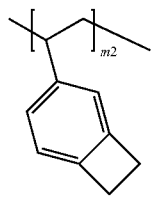

215
-continued
Q2
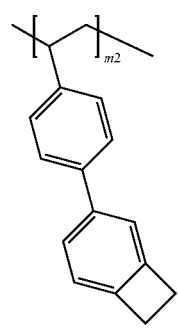
Q3
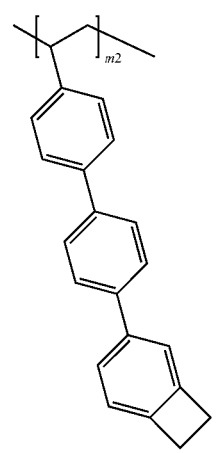
Q4
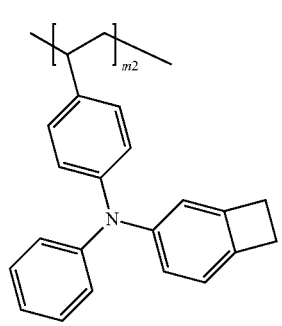
Q5
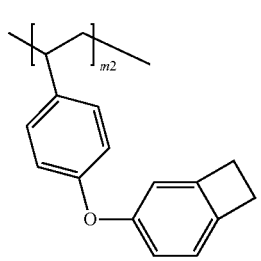
216
-continued
Q6
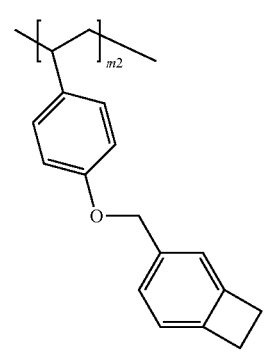
Q7
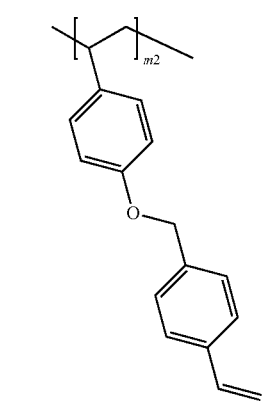
Q8
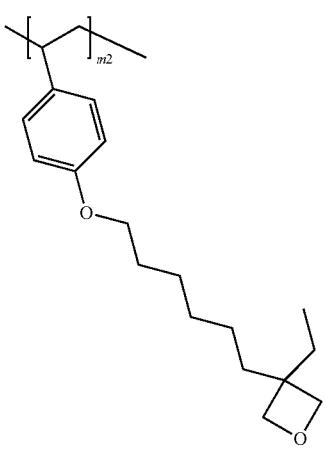
in the structures,
m2 is a mole fraction and 0<m2<1.
5. The polymer of claim 1, wherein the polymer comprising the first unit represented by Formula 1 and the second unit represented by Formula 2 is any one selected from the following structures:

217
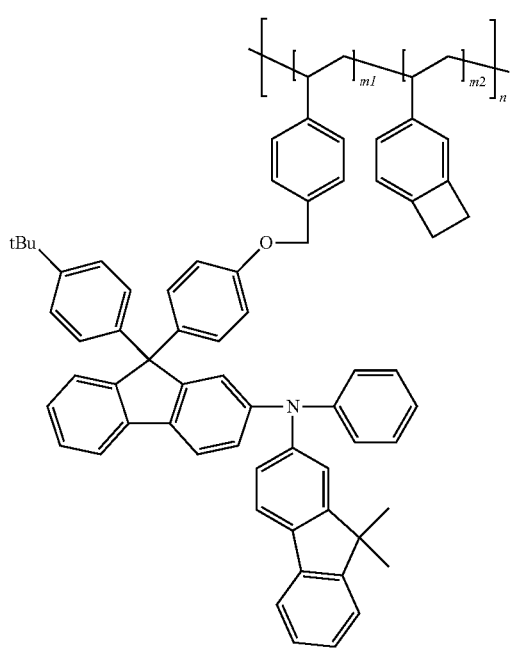
218
-continued
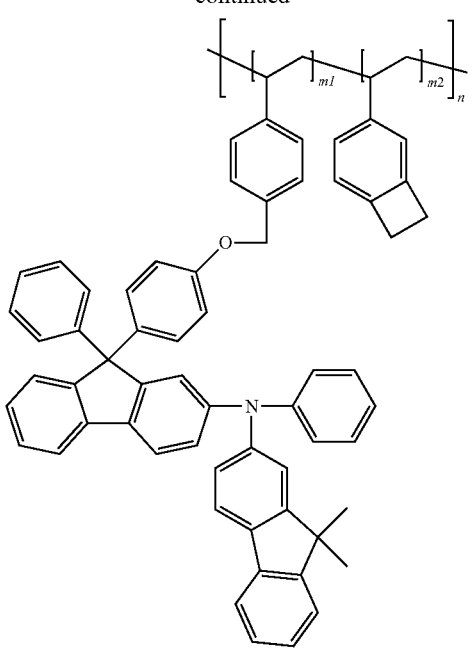
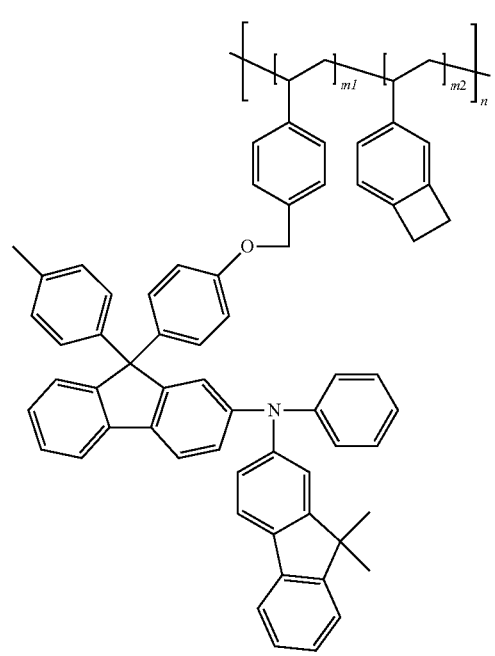
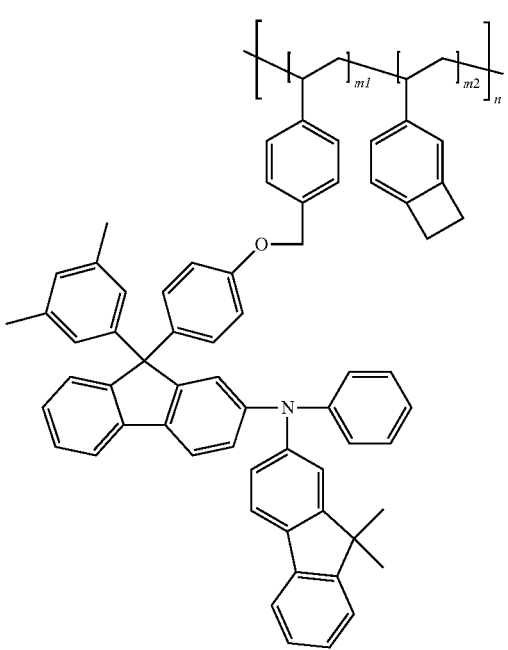

219
-continued
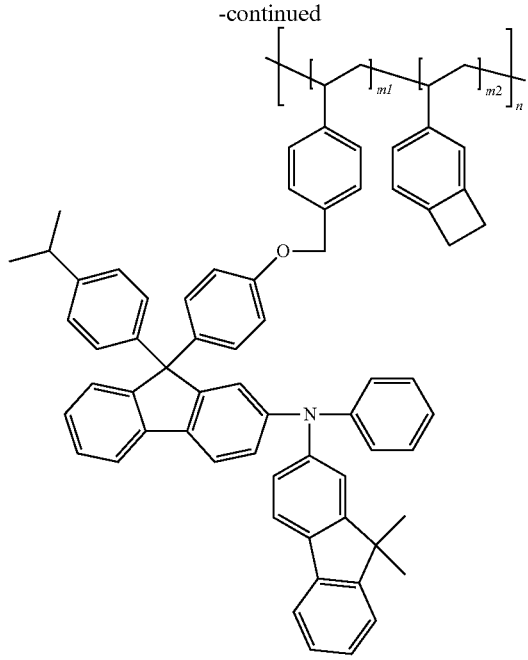
220
-continued
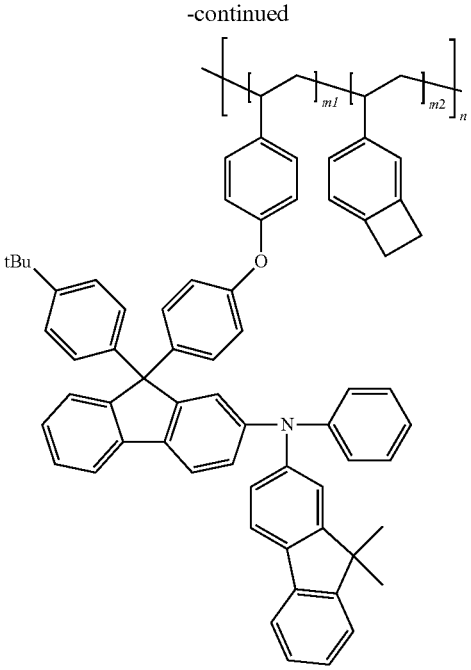
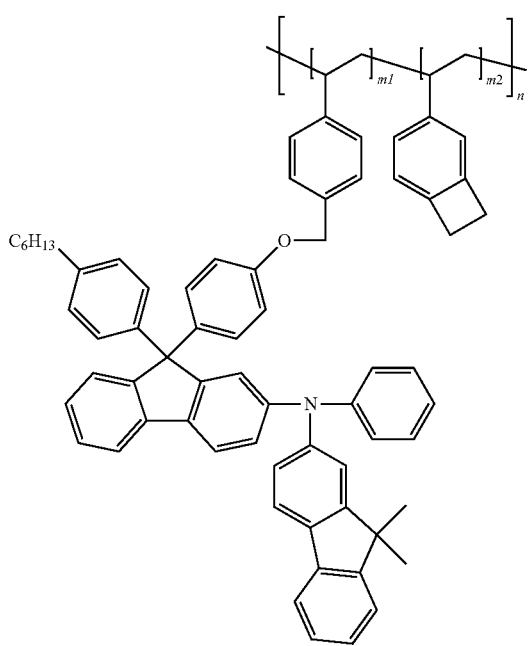
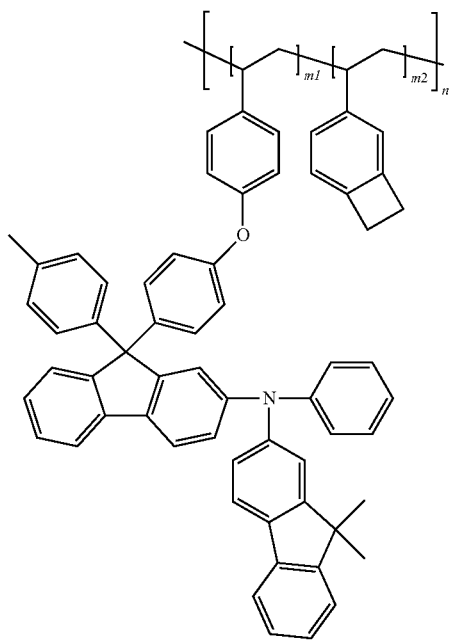

-continued
221
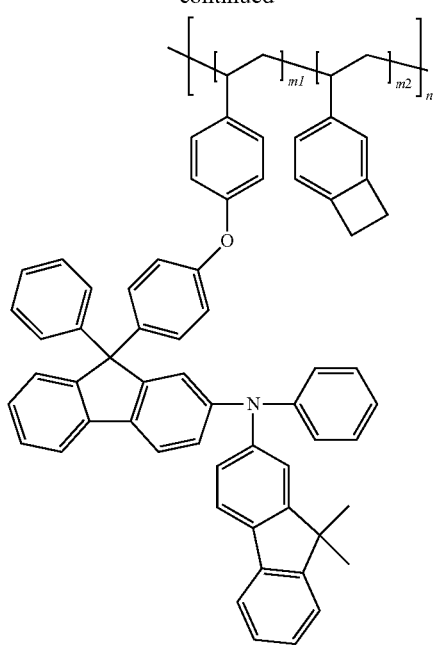
222
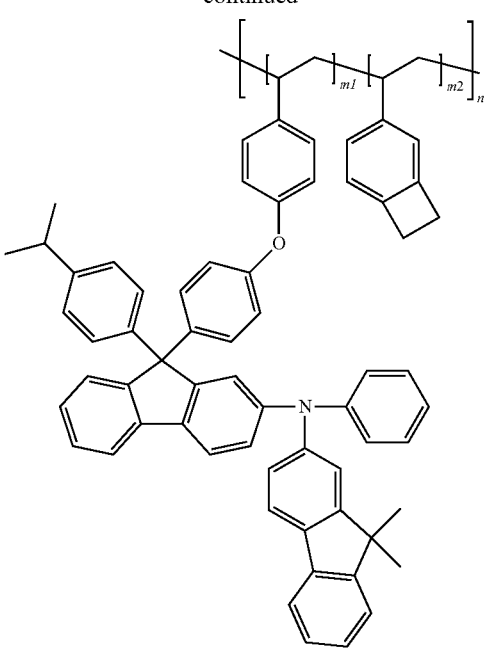
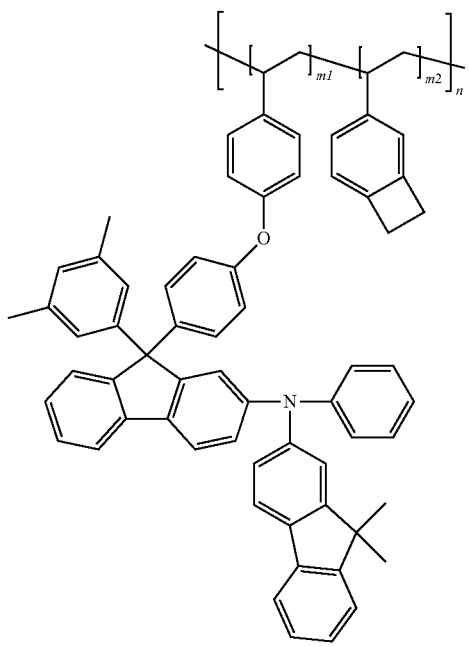
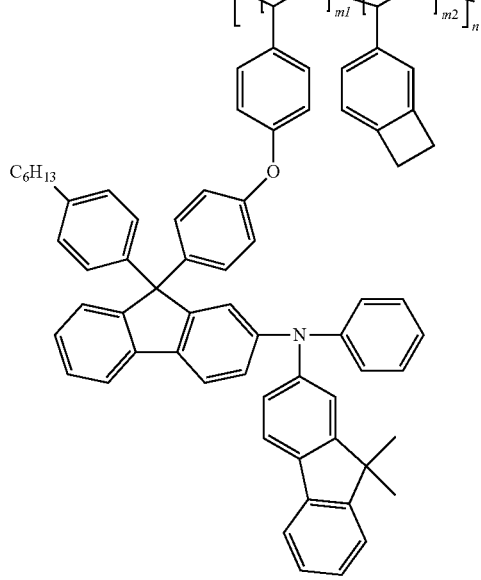

223
-continued
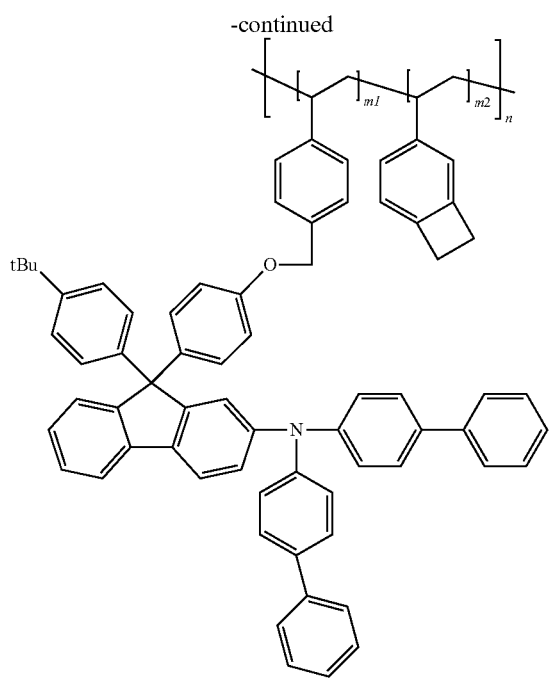
224
-continued
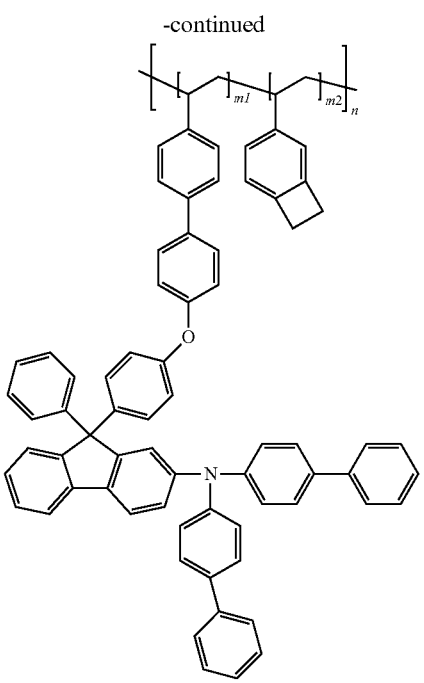
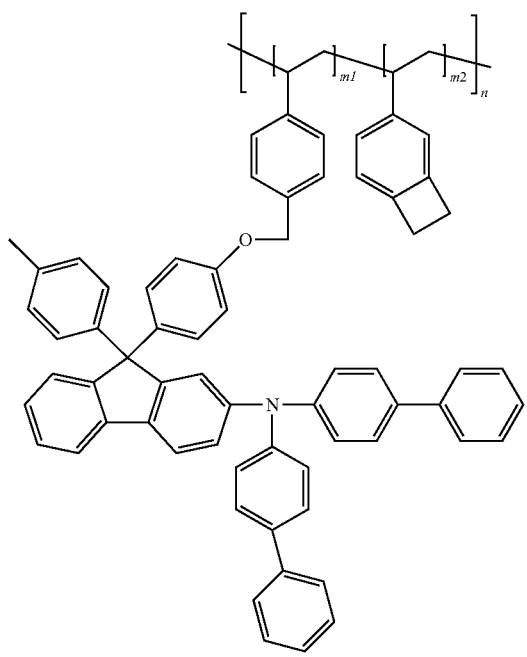
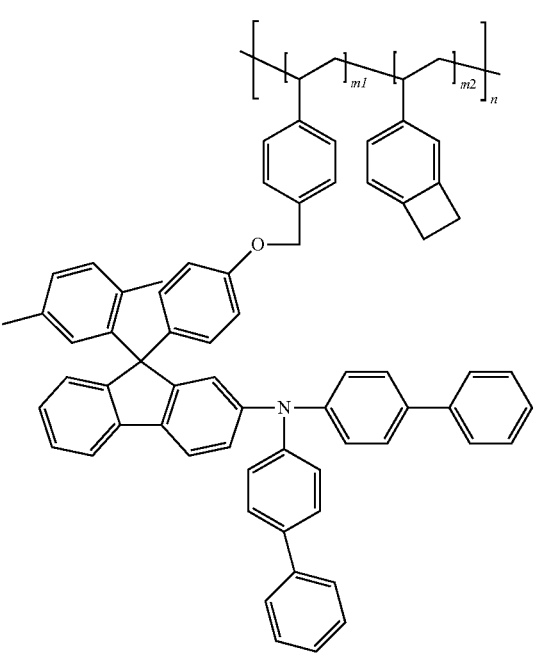

225
-continued
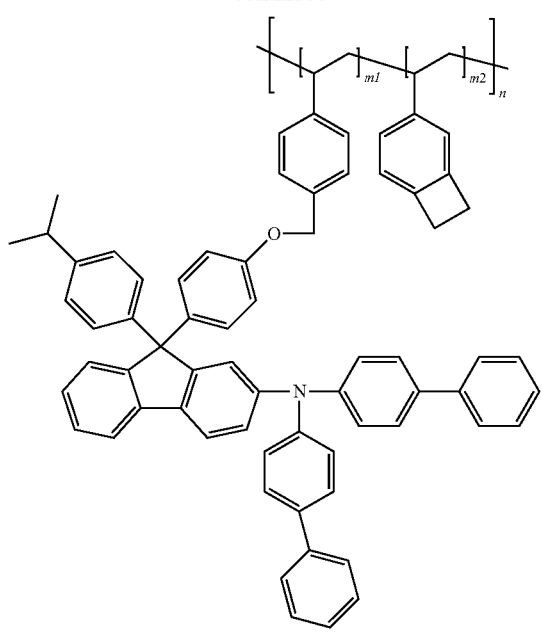
226
-continued
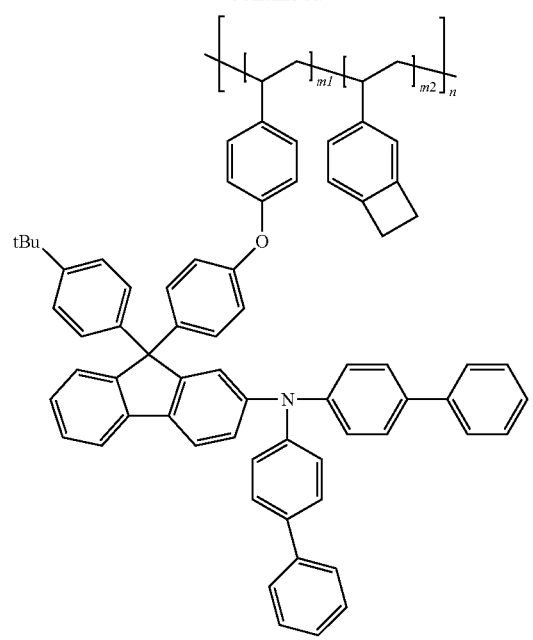
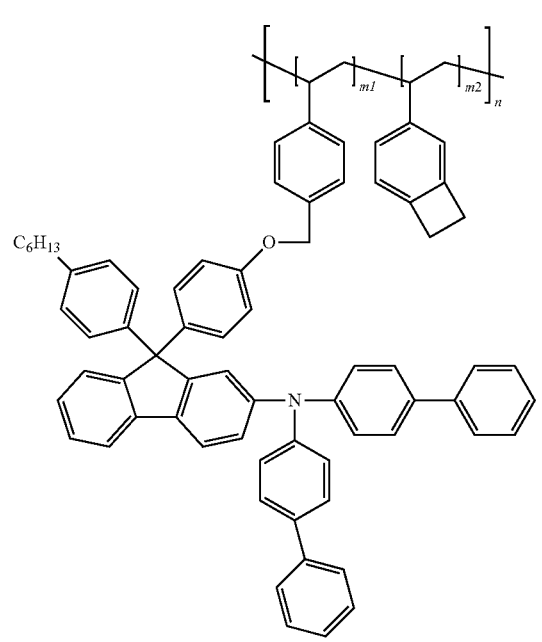
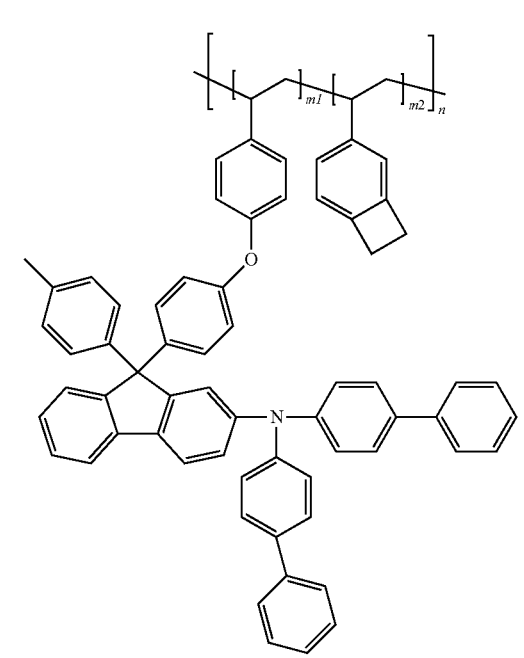

227
-continued
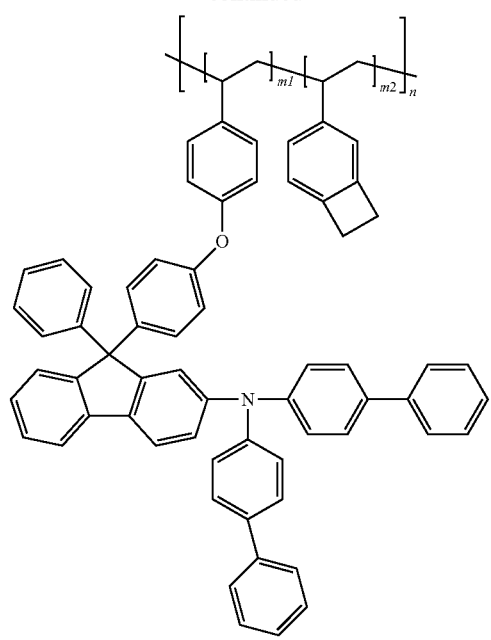
228
-continued
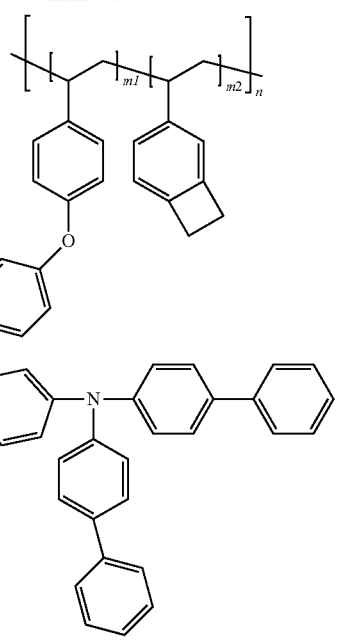
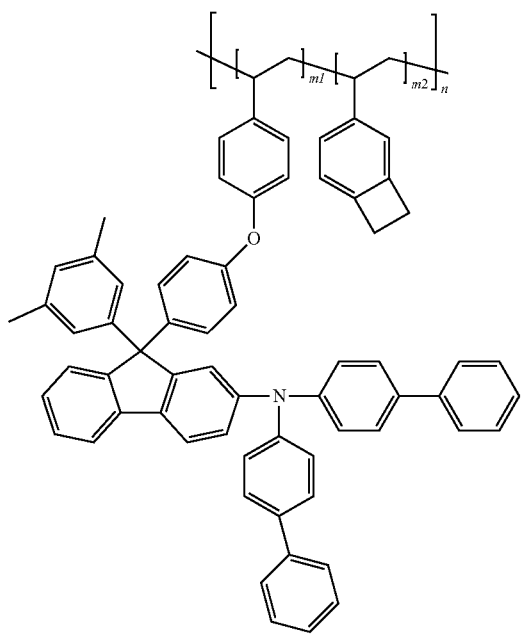
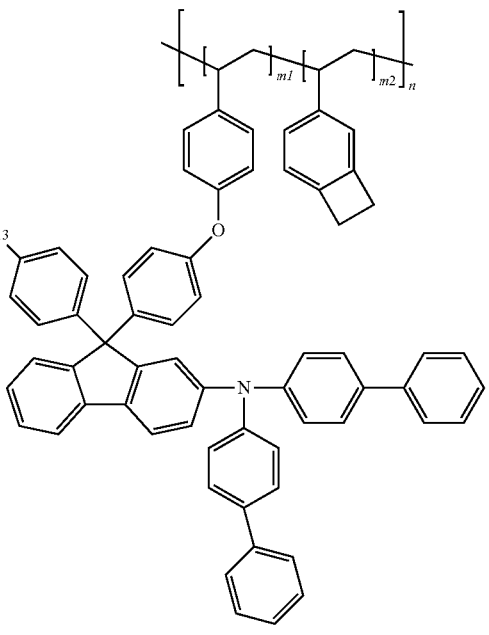

229
-continued
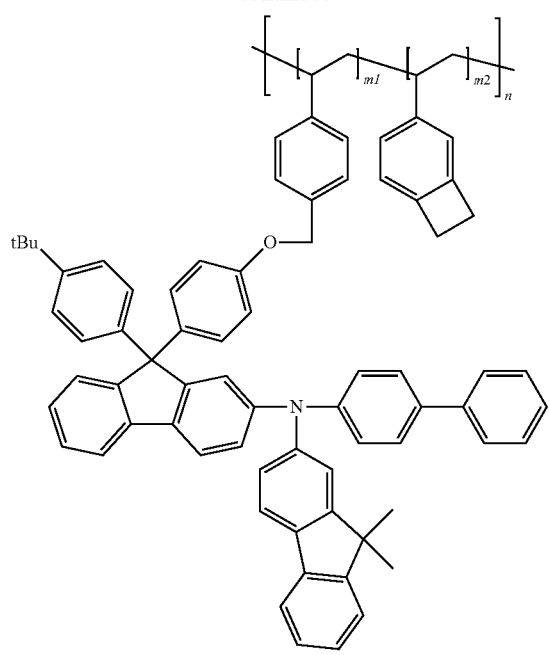
230
-continued
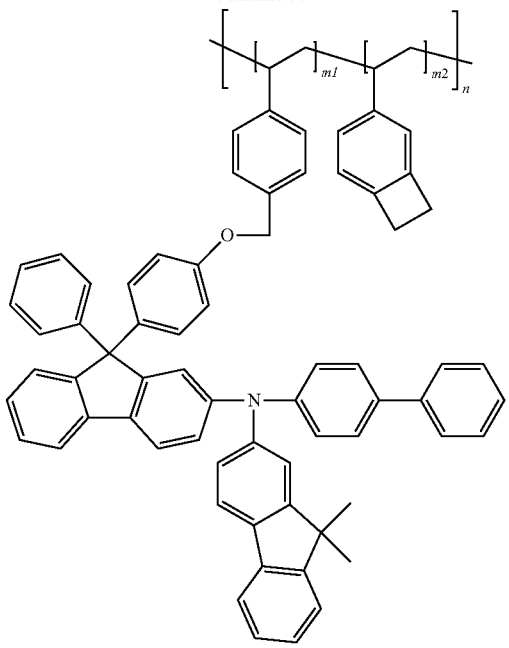
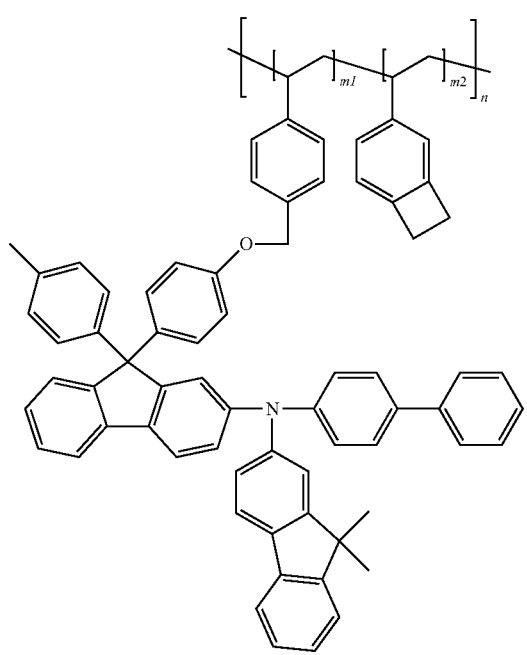
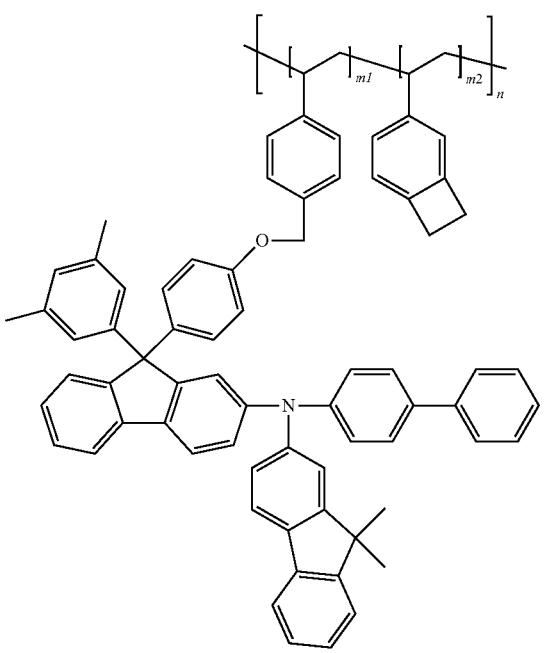

231
-continued
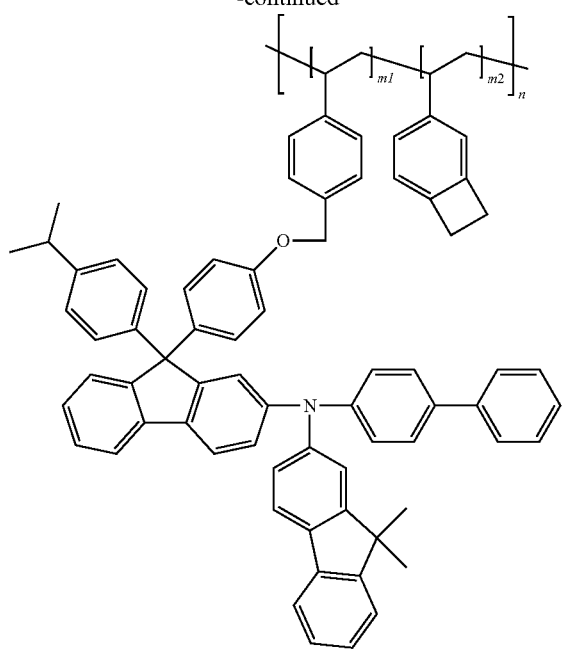
232
-continued
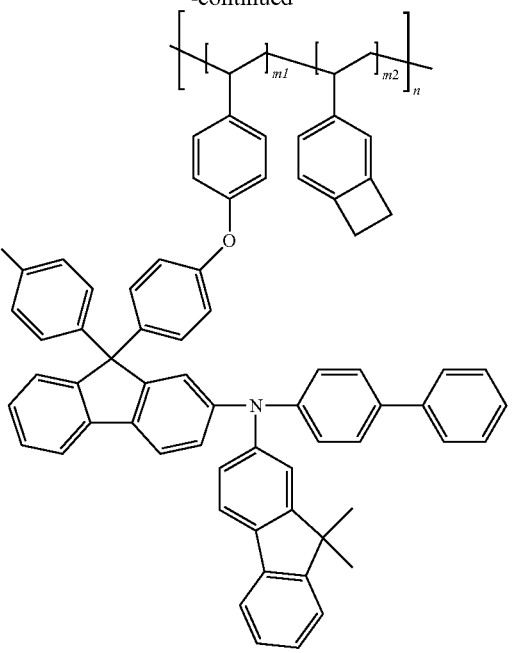
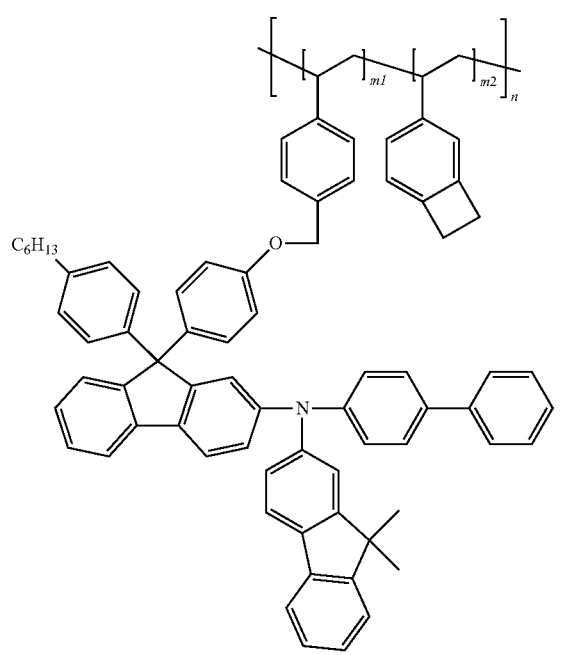
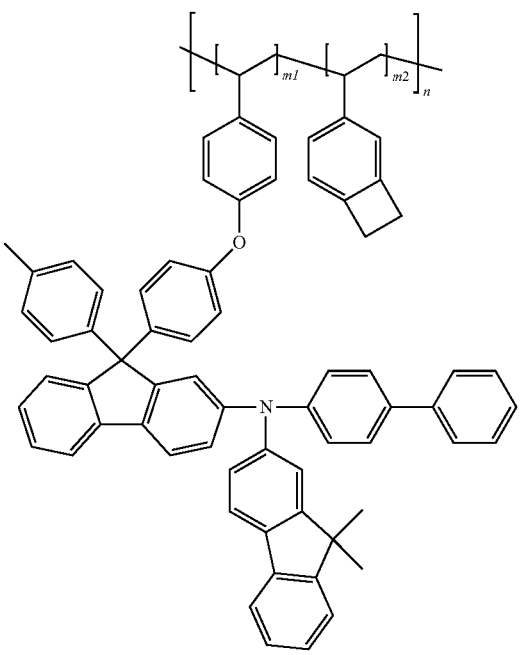

233
-continued
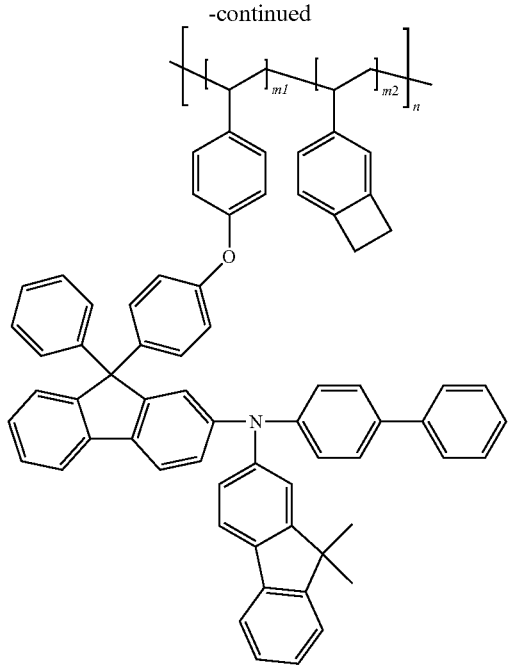
234
-continued
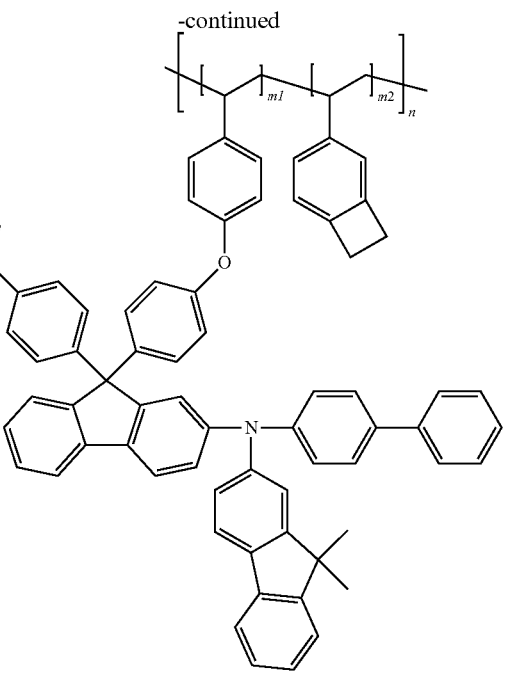
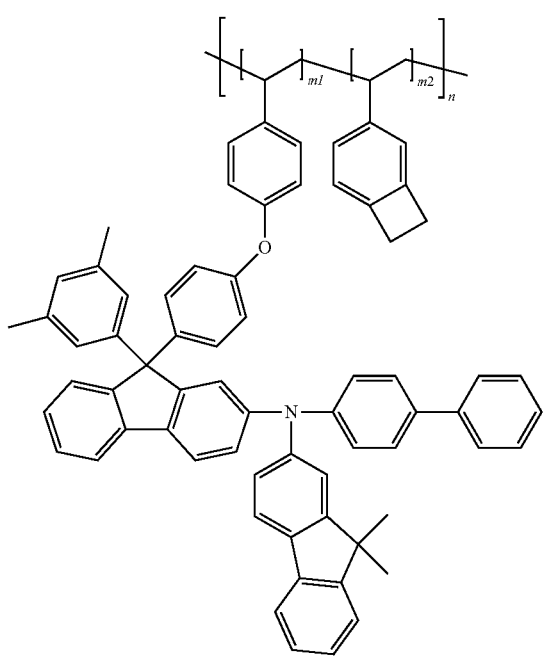
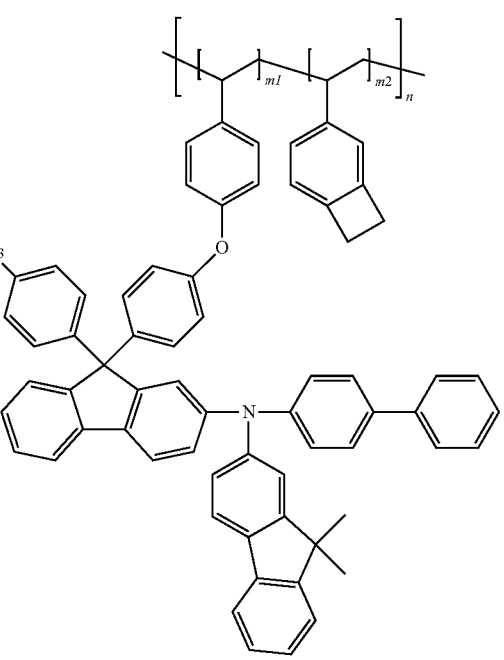

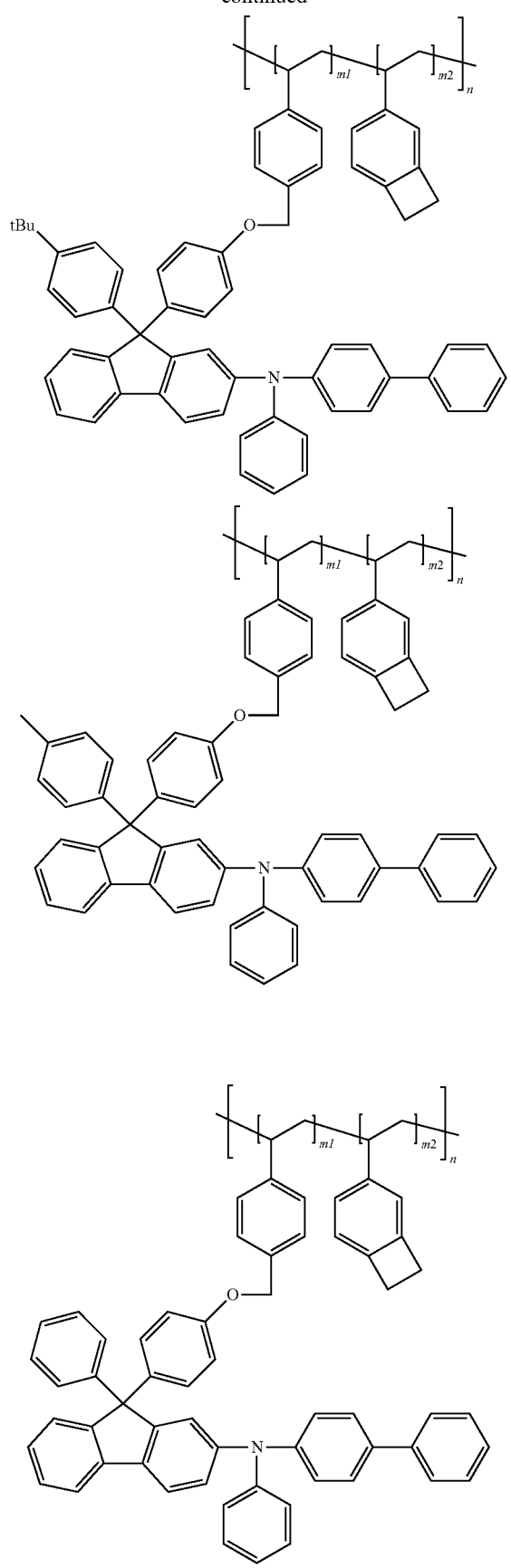
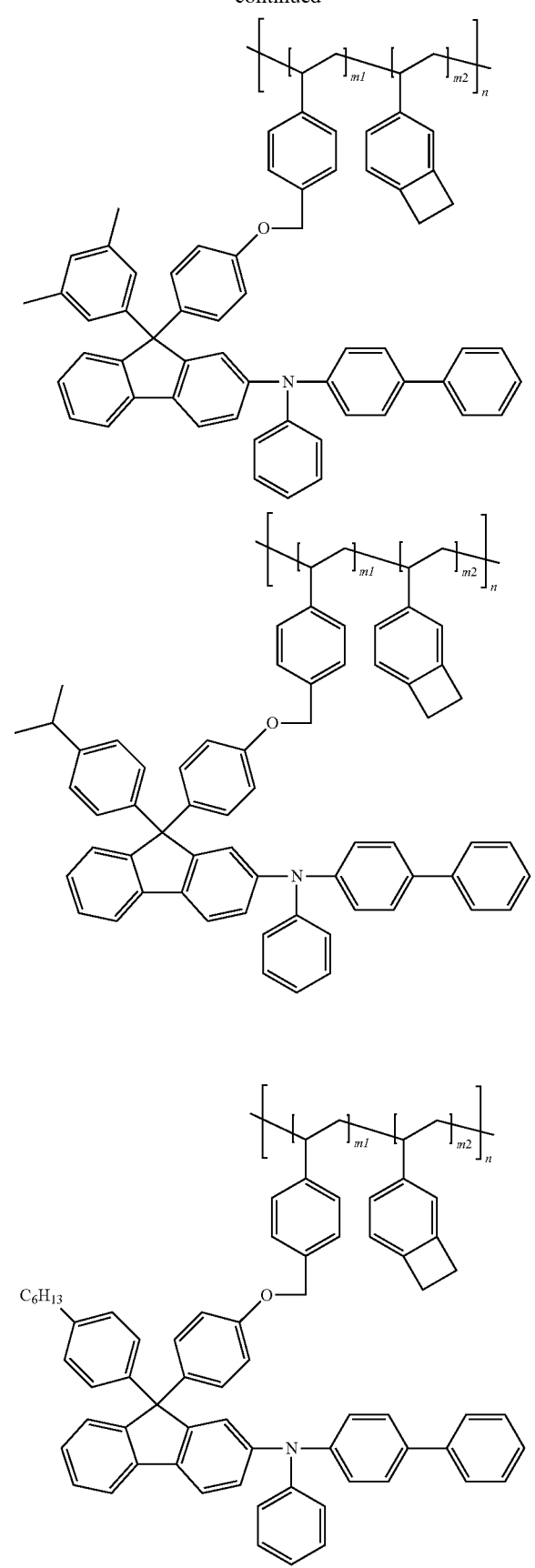

237
-continued
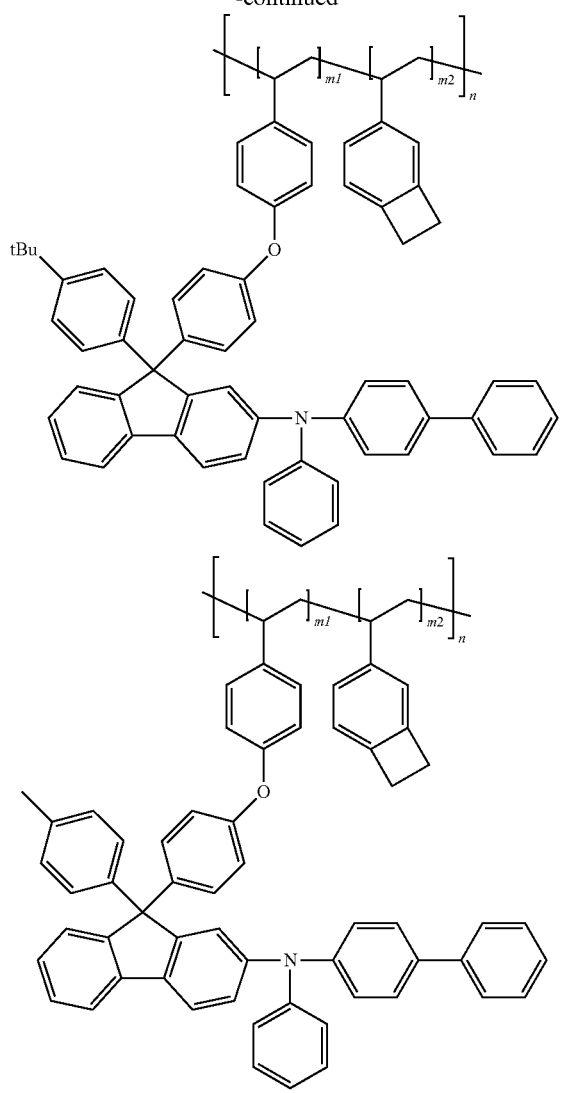
238
-continued
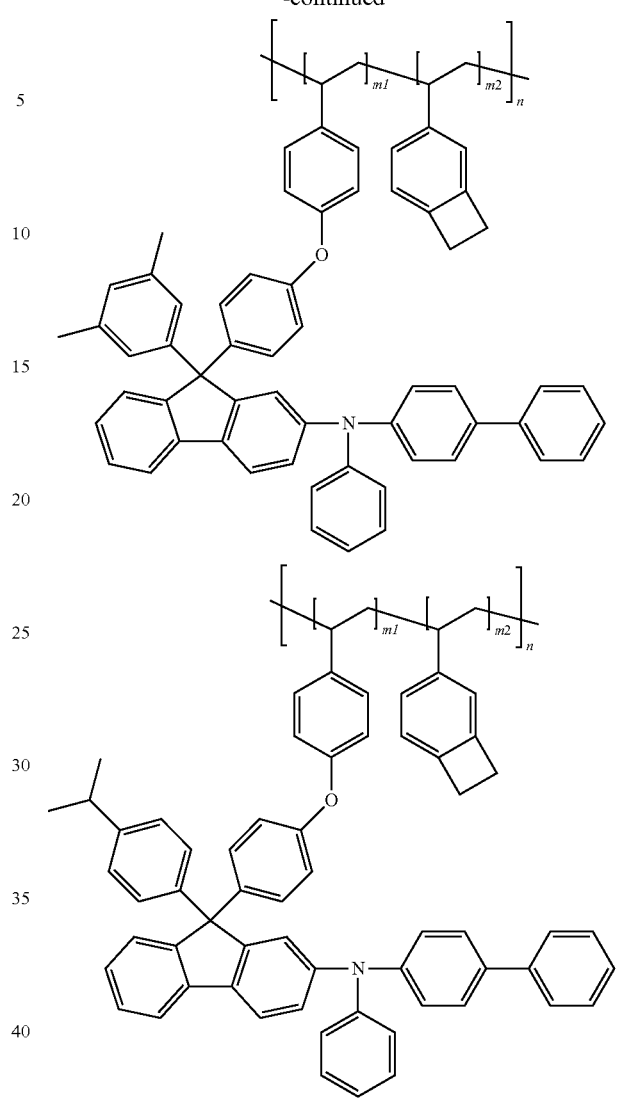
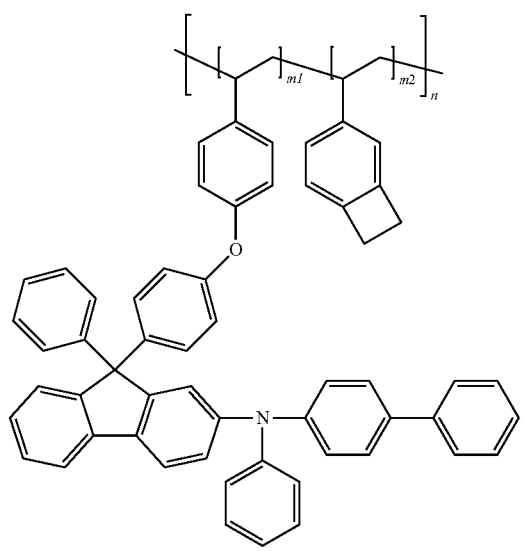
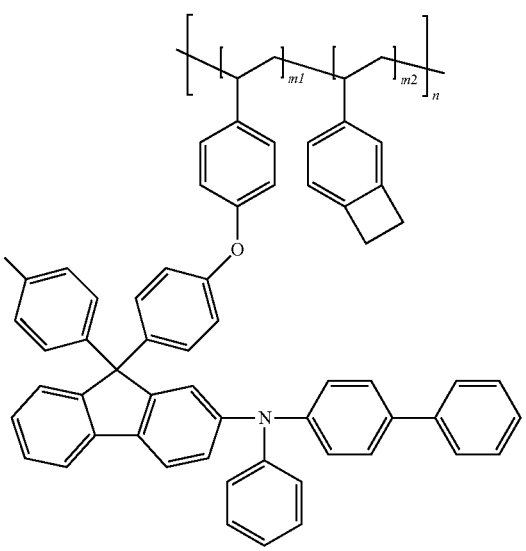

239
-continued
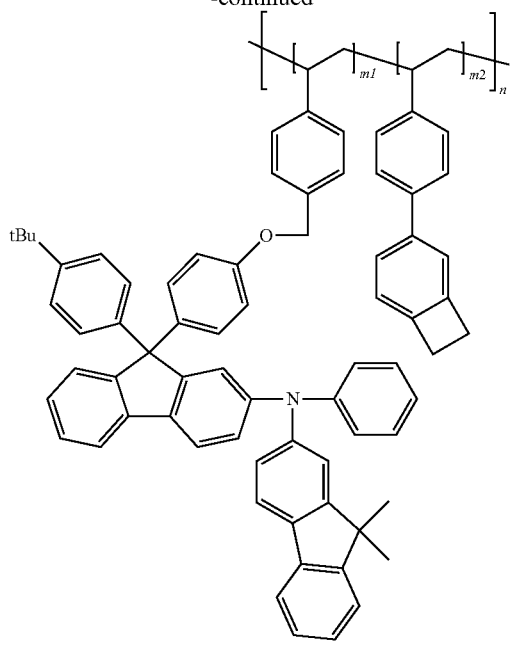
240
-continued
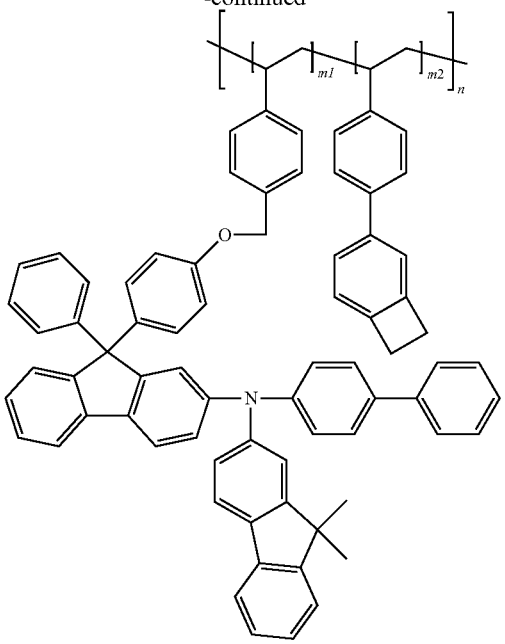
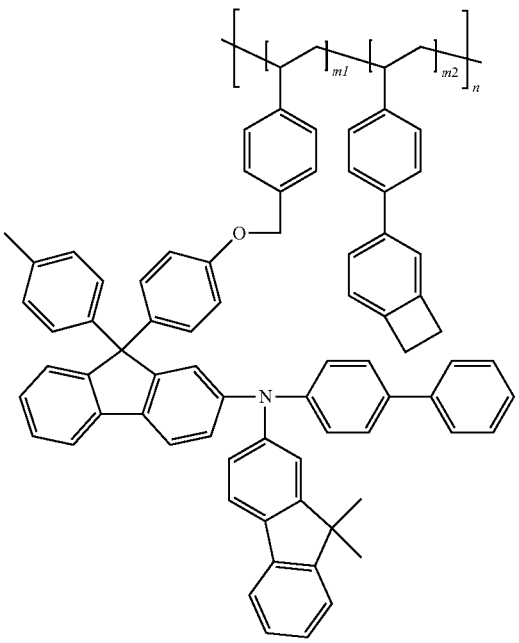

241
-continued
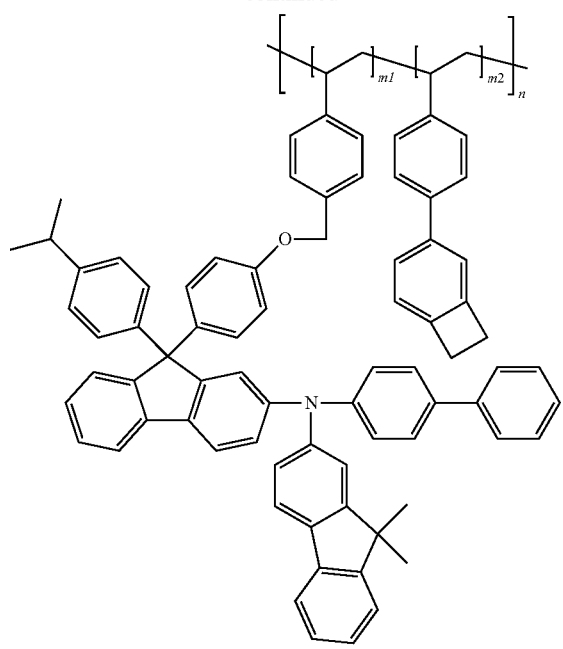
242
-continued
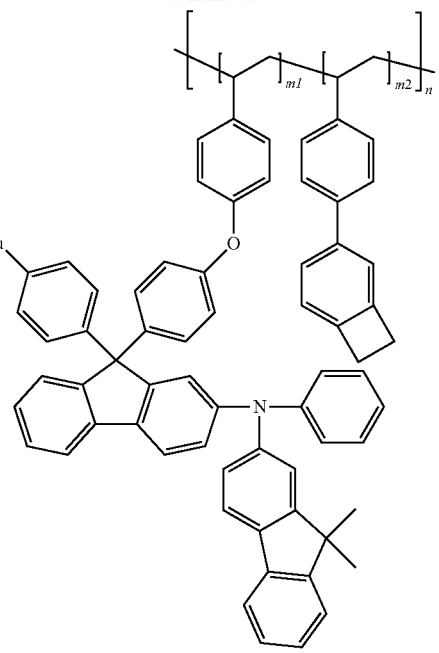
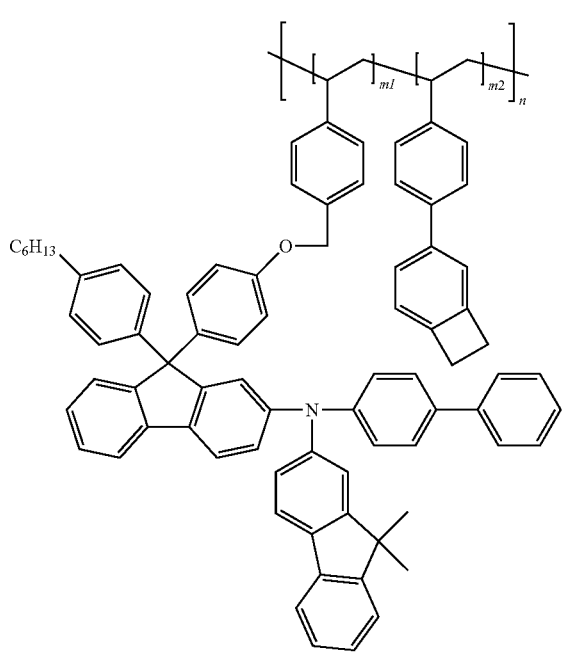
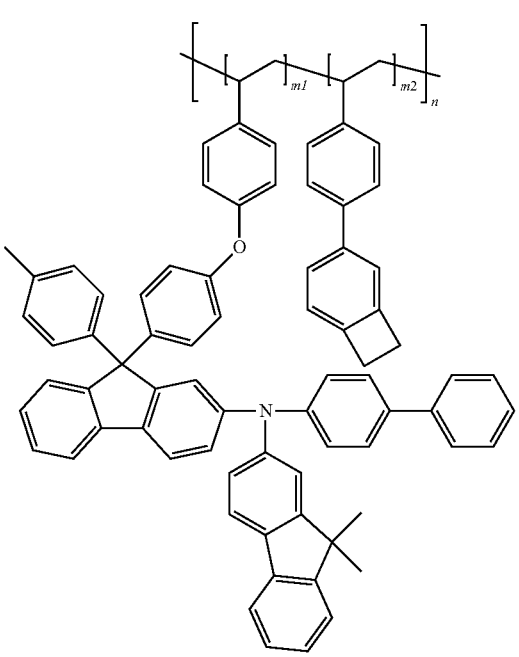

243
-continued
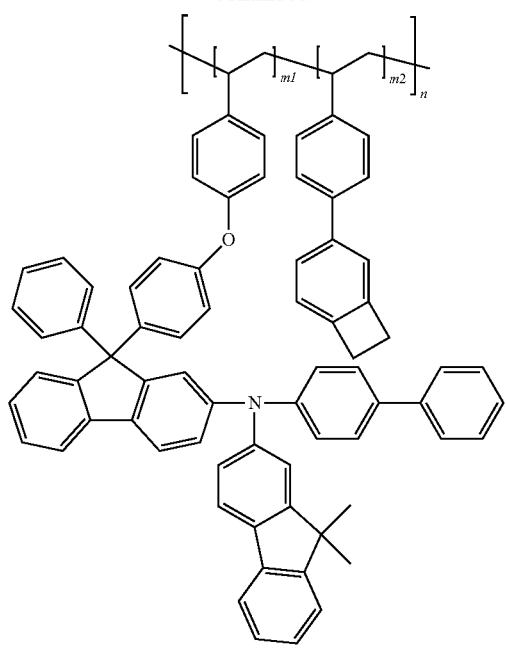
244
-continued
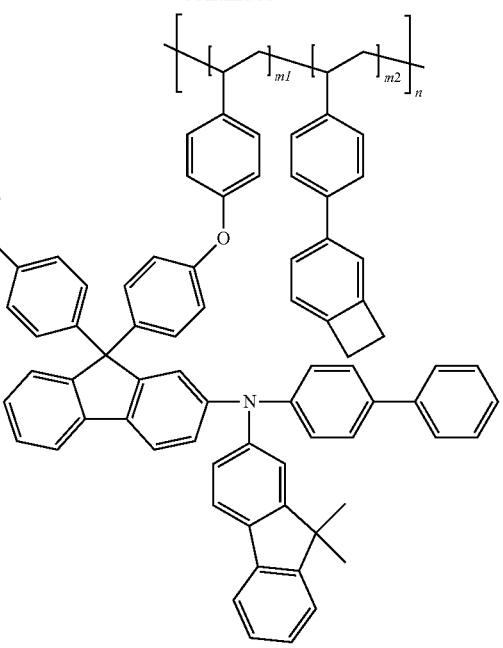
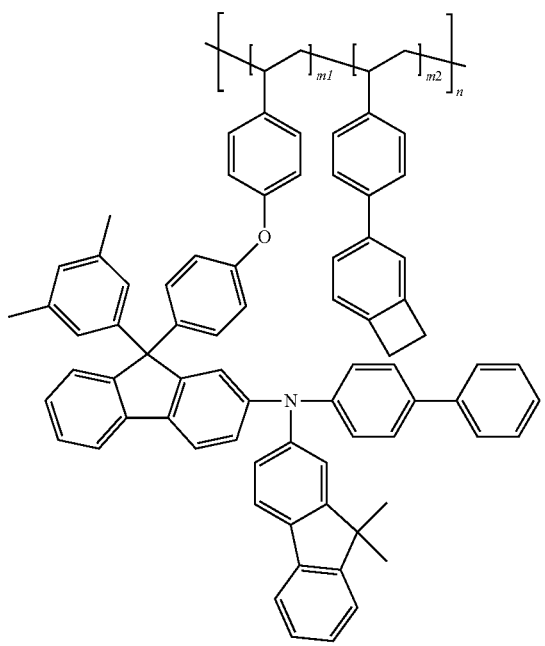
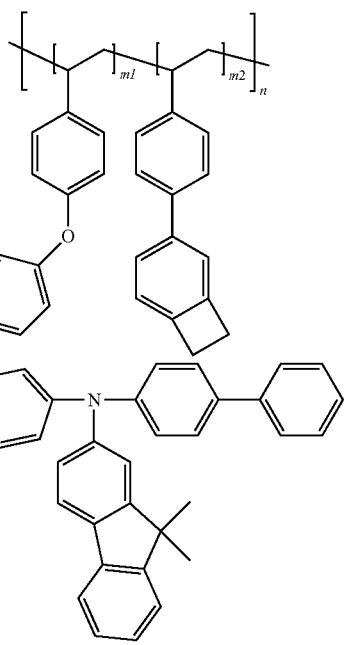

245
-continued
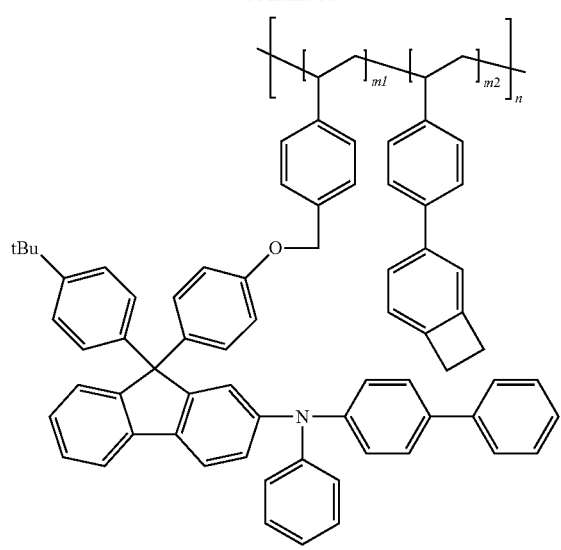
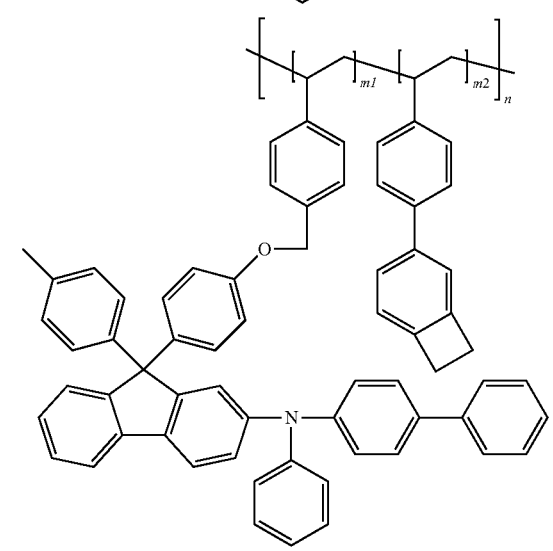
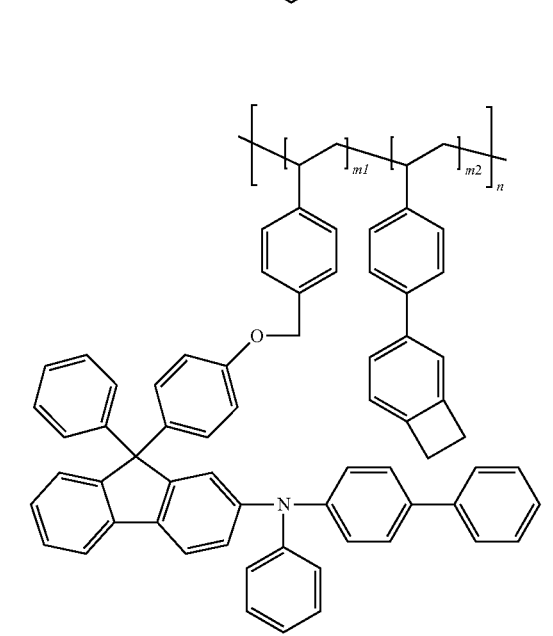
246
-continued
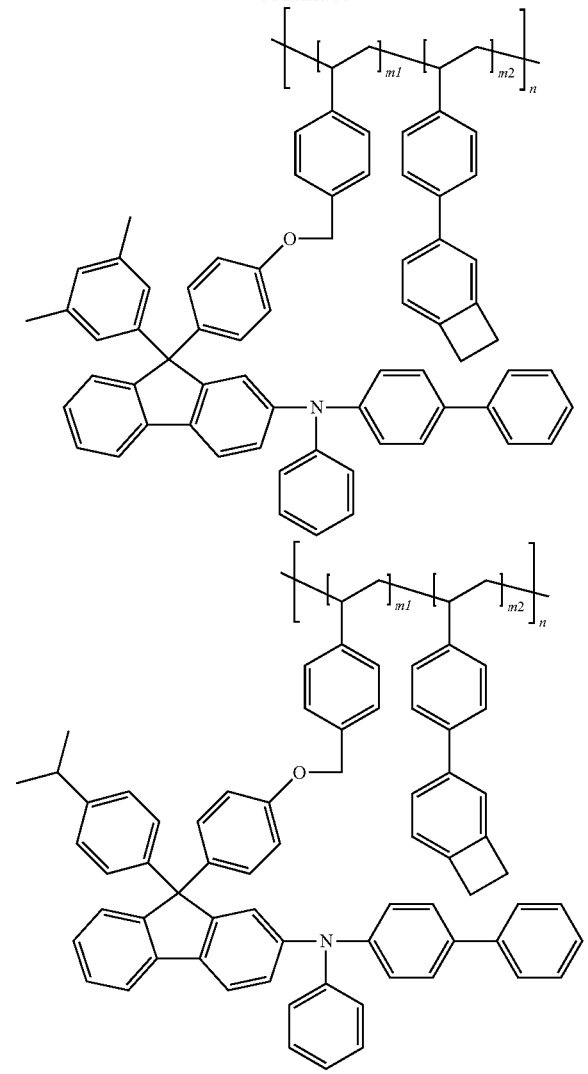
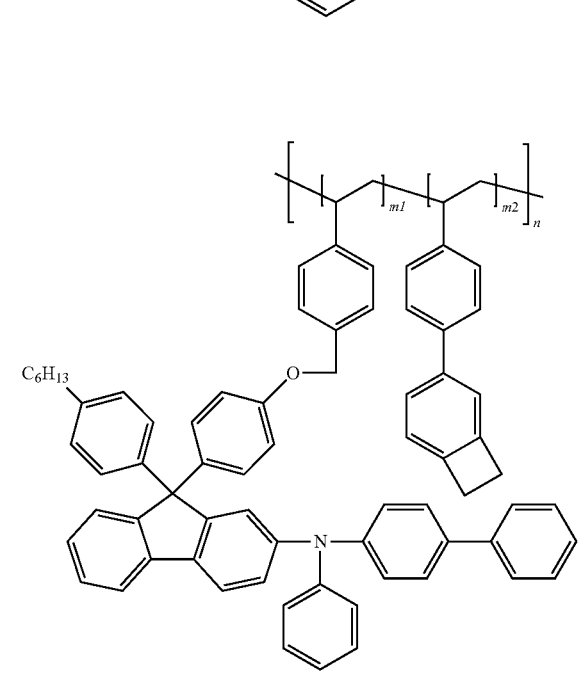

247
-continued
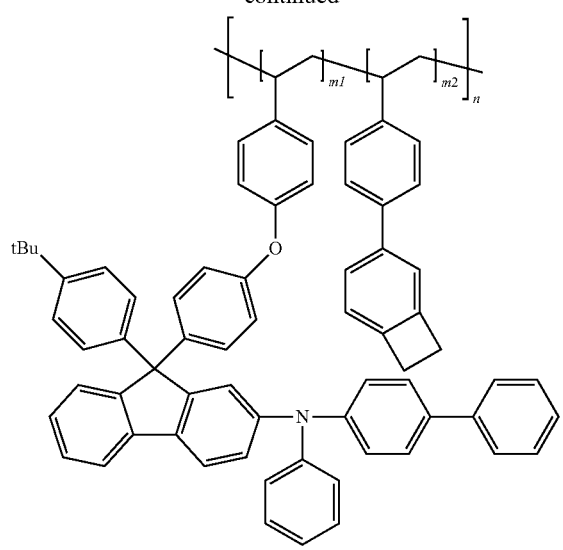
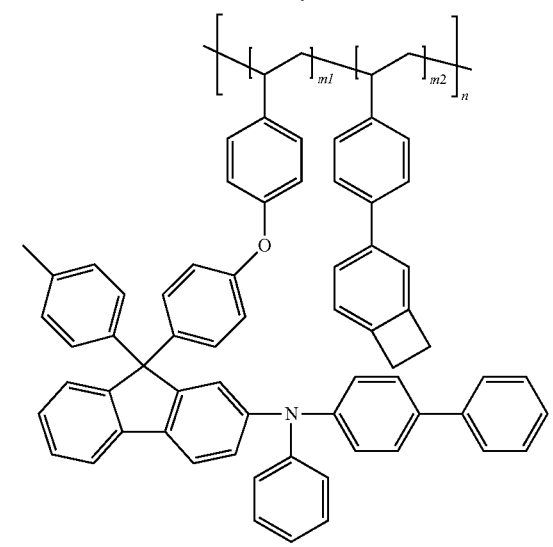
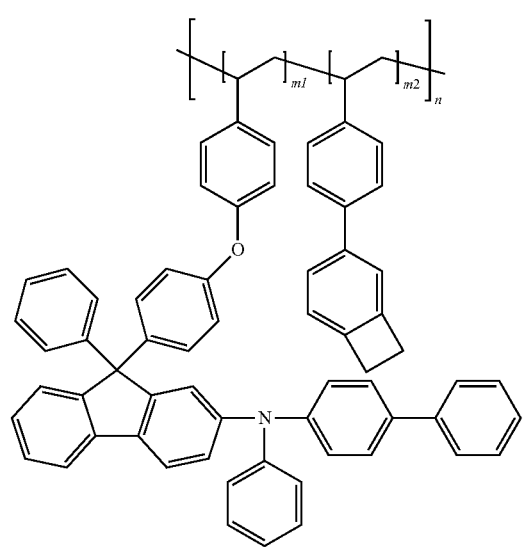
248
-continued
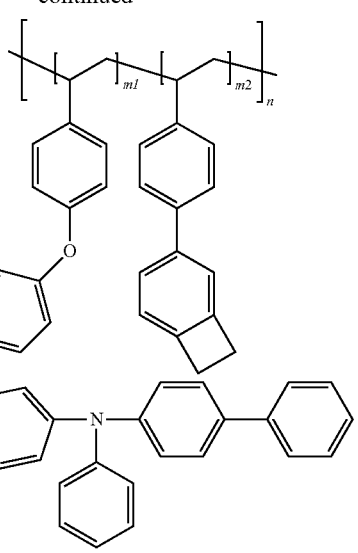
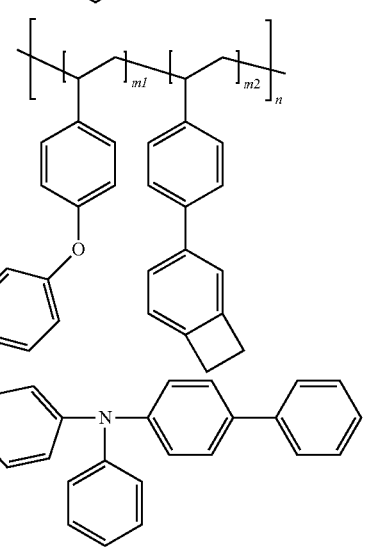
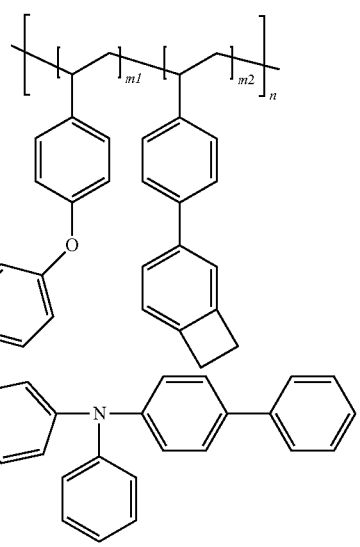

-continued
249
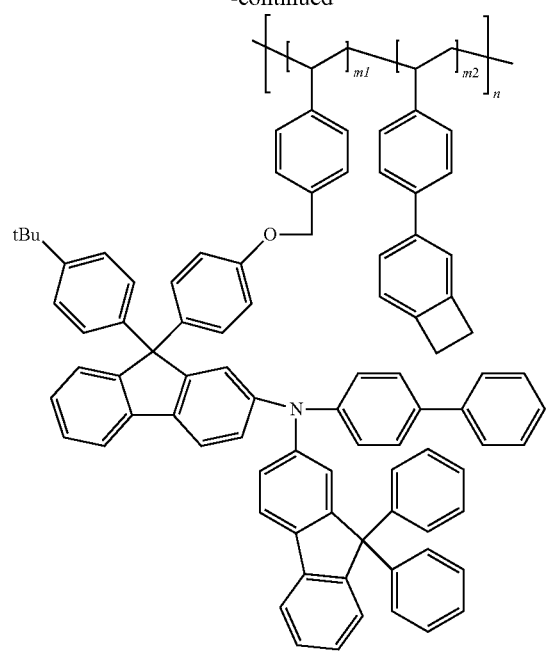
250
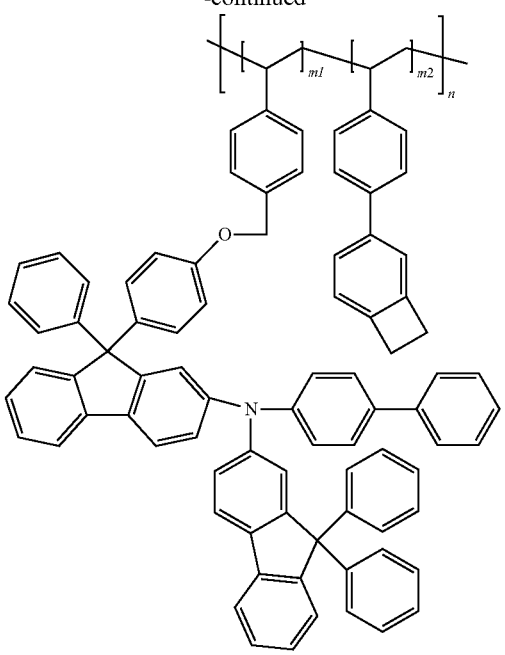
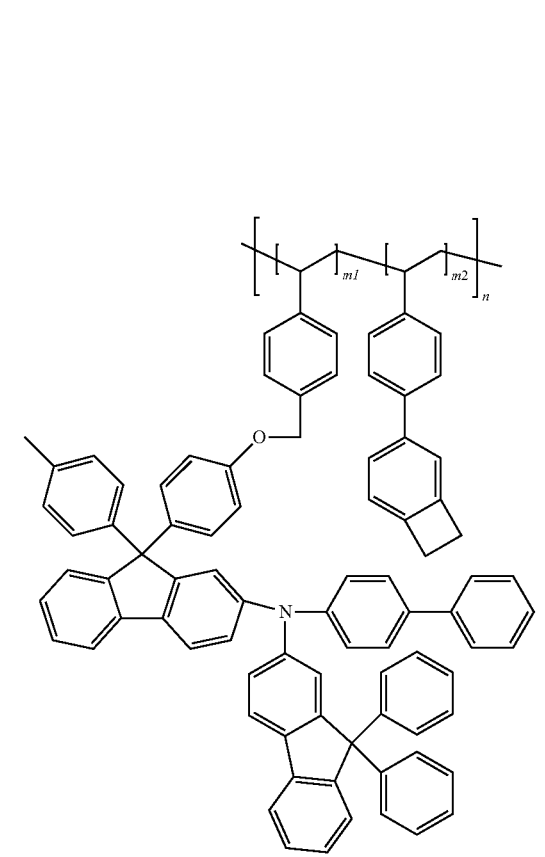
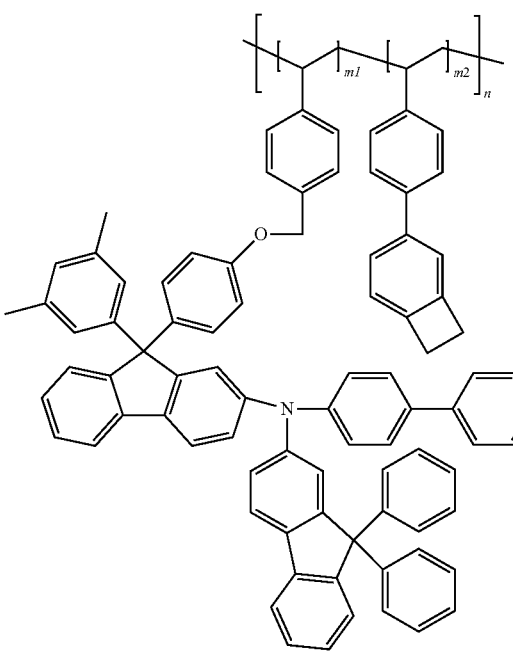

251
-continued
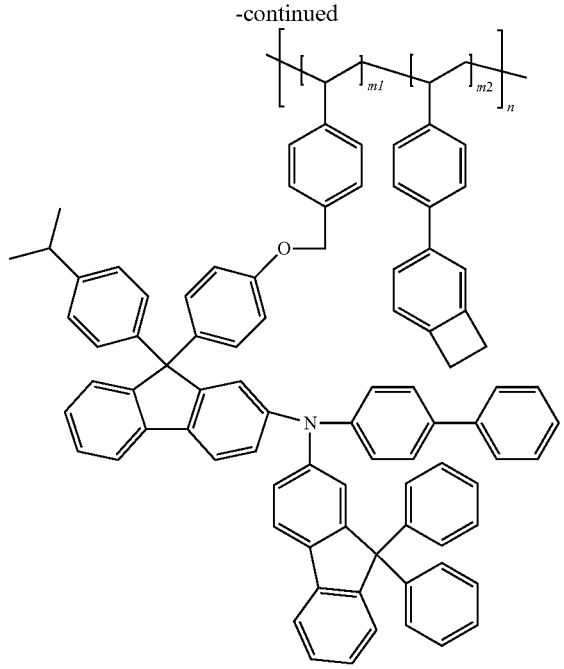
252
-continued
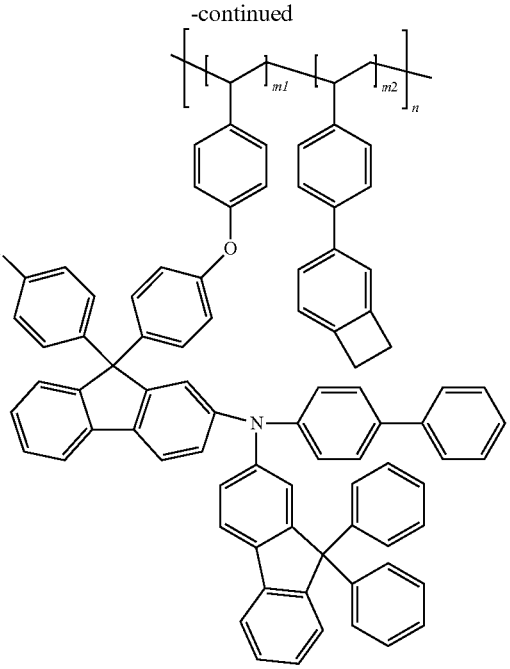
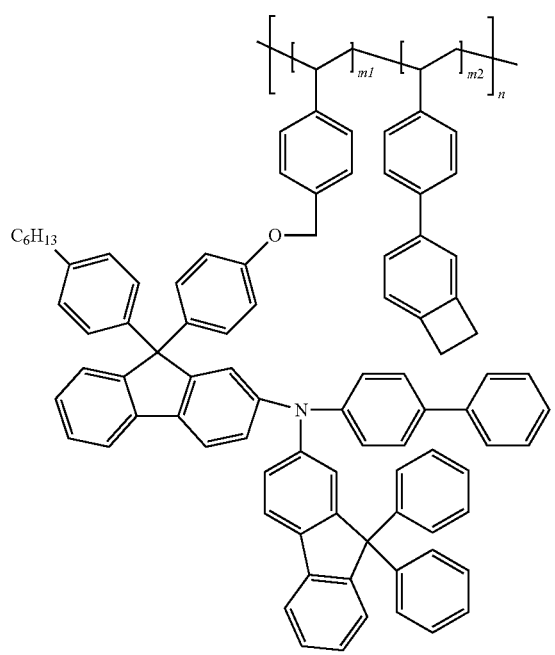
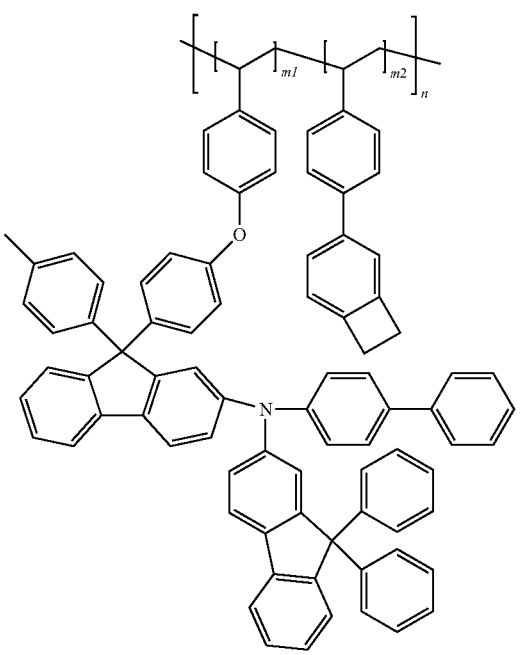

253
-continued
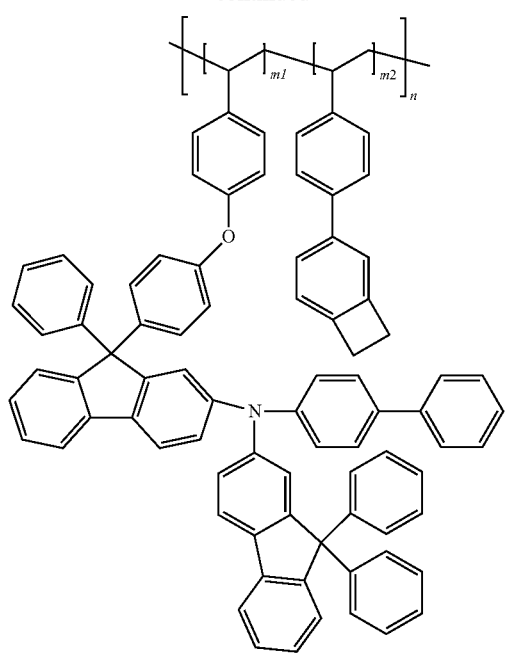
254
-continued
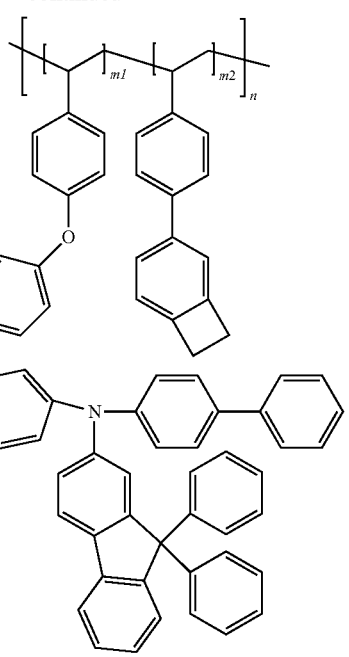
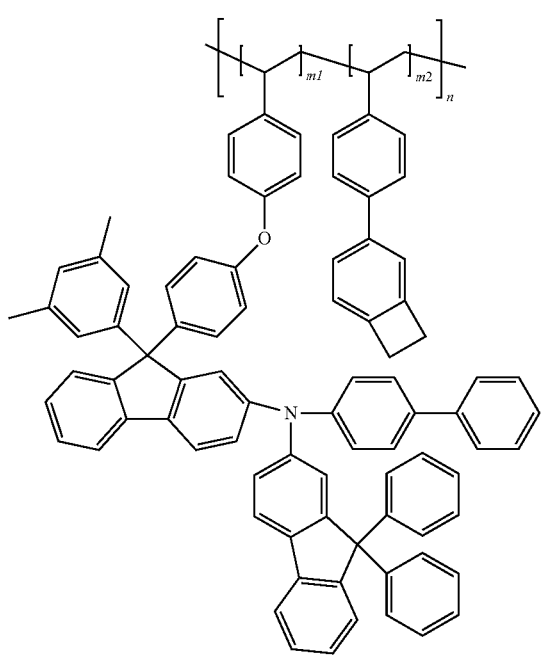
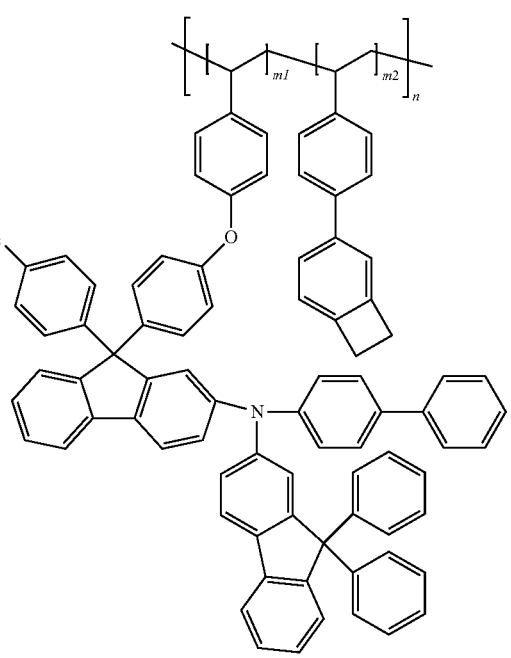

255
-continued
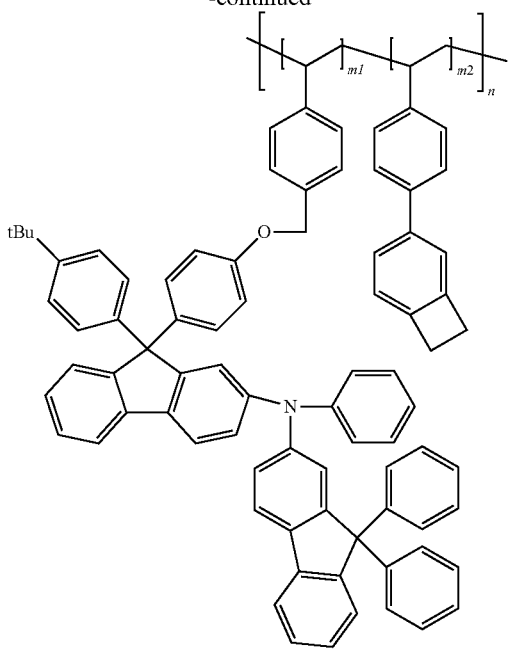
256
-continued
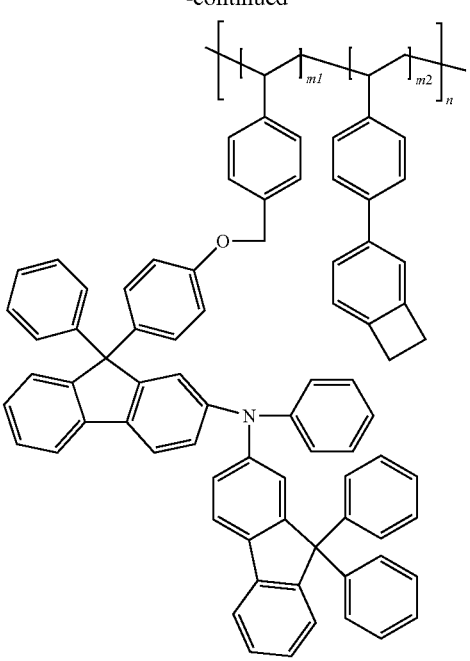
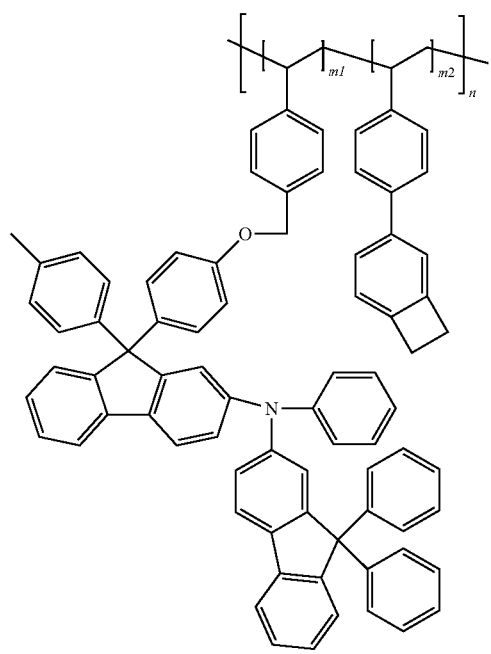
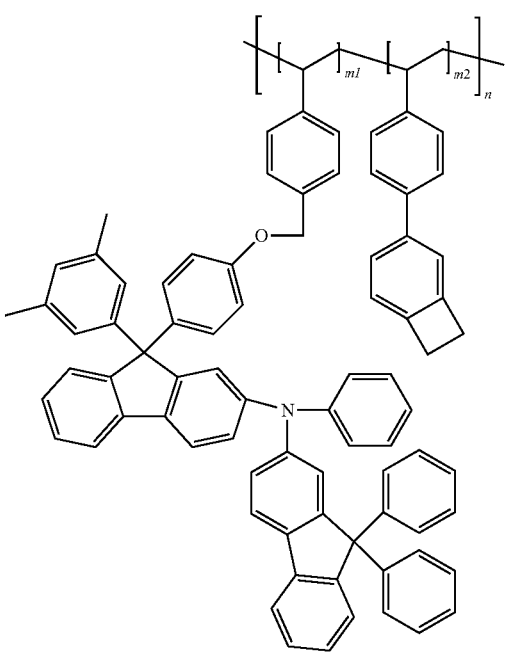

257
-continued
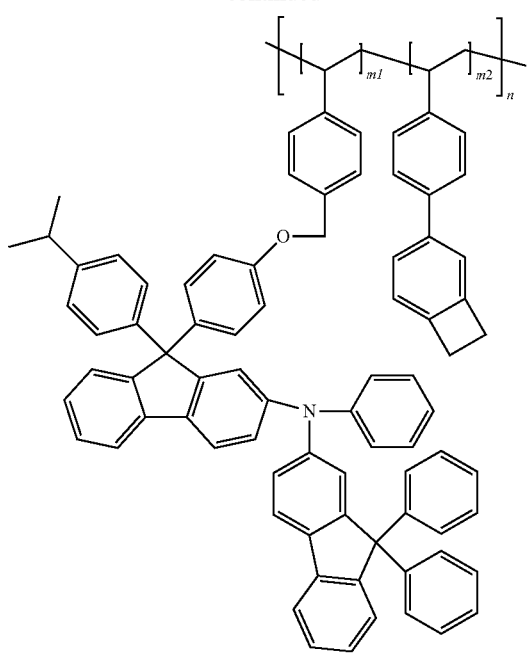
258
-continued
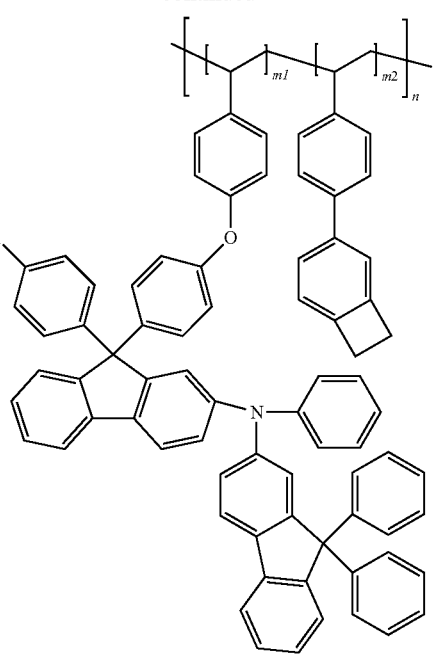
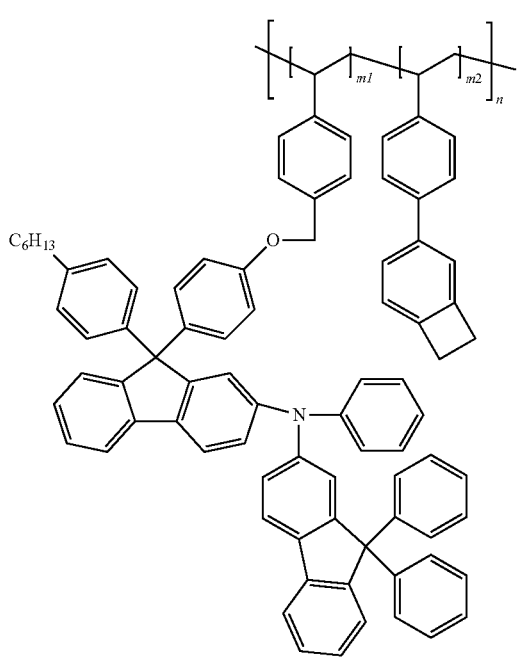
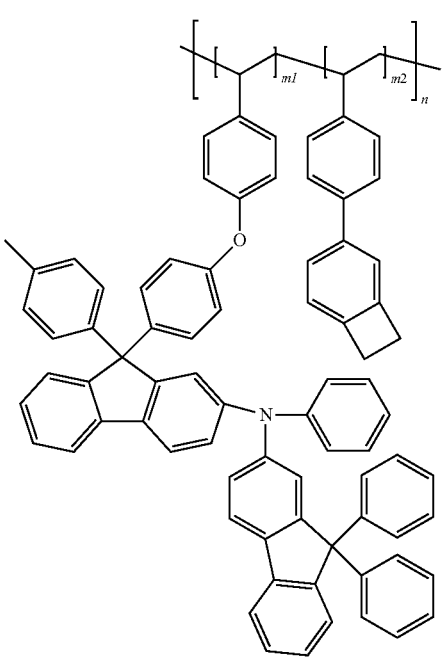

259
-continued
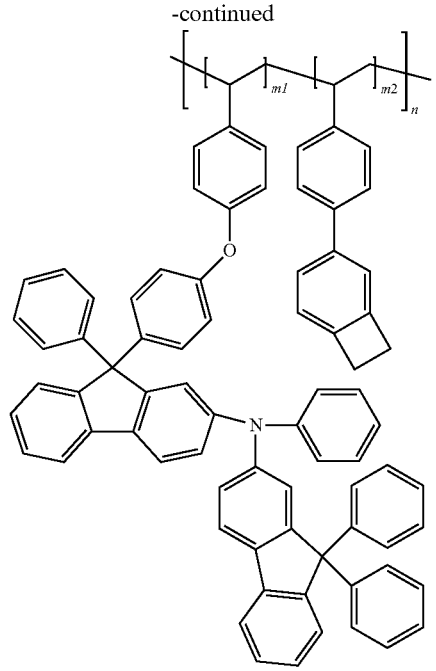
260
-continued
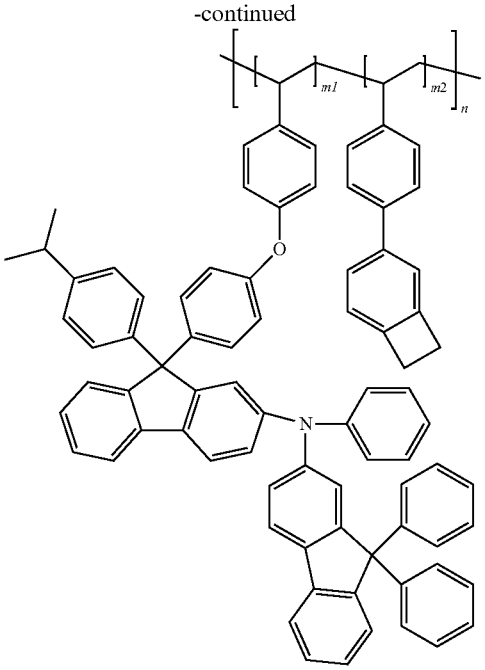
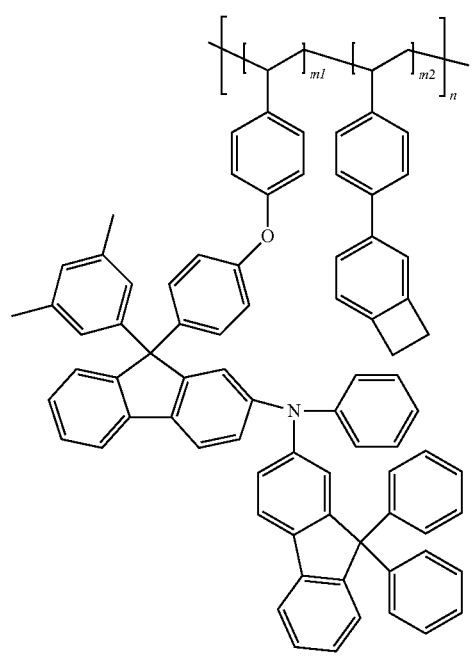
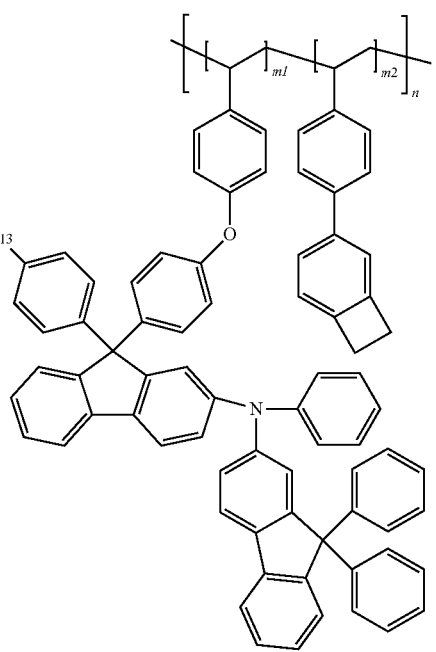

261
-continued
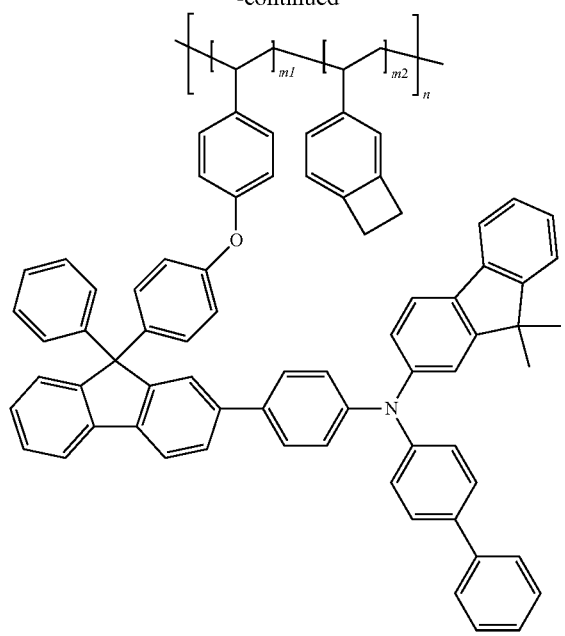
262
-continued
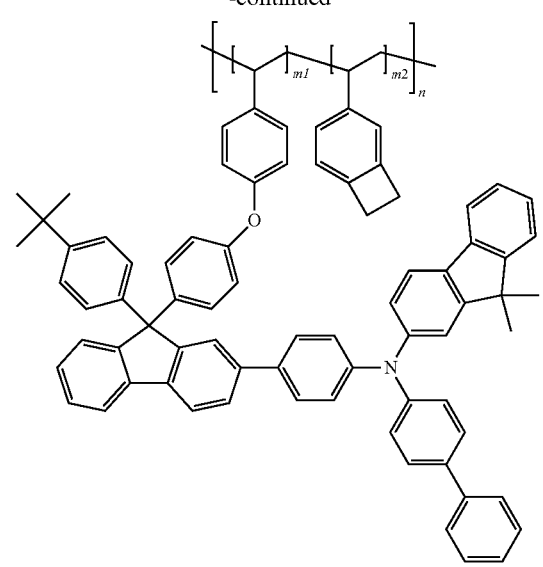
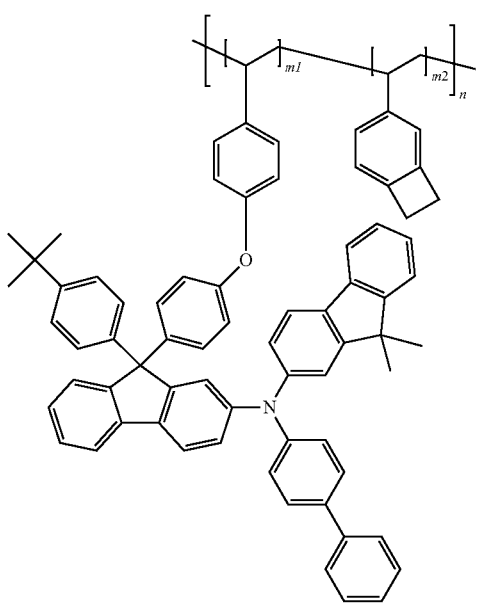

-continued

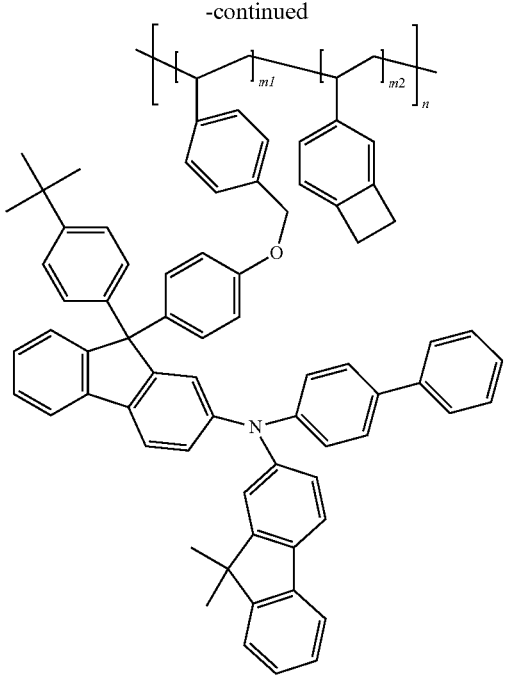

in the structures,
m1 is a mole fraction and 0<m1<1,
m2 is a mole fraction and 0<m2<1,
m1+m2≤1, and
n is a repeating number of the unit, and an integer from 1 to 10,000.

6. The polymer of claim 1, wherein the polymer has a number average molecular weight of 5,000 g/mol to 1,000,000 g/mol.

7. A coating composition comprising the polymer according to claim 1.

8. The coating composition of claim 7, further comprising:
a p-doping material.

9. An organic light emitting device comprising:
a first electrode;
a second electrode provided to face the first electrode; and
an organic material layer having at least one layer provided between the first electrode and the second electrode,
wherein the at least one layer comprises a cured product of the coating composition of claim 7.

10. The organic light emitting device of claim 9, wherein the cured product of the coating composition is in a state in which the coating composition is cured by a heat treatment or a light treatment.

11. The organic light emitting device of claim 9, wherein the at least one layer comprising the cured product of the coating composition is a hole transport layer, a hole injection layer, or a layer which simultaneously transports and injects holes.

12. The organic light emitting device of claim 9, wherein the at least one layer comprising the cured product of the coating composition comprises a light emitting layer, and the light emitting layer comprises the cured product of the coating composition.

13. The polymer of claim 1, wherein in Formulae 1 and 2, m1>m2.

14. The polymer of claim 1, wherein in Formula 2, X is cyclobutabenzene or oxetane.

15. The coating composition of claim 7, further comprising a solvent having a boiling point of 40° C. to 250° C.

16. A method for manufacturing an organic light emitting device, the method comprising:
preparing a substrate;
forming a cathode or an anode on the substrate;
forming an organic material layer having at least one layer on the cathode or the anode; and
forming an anode or a cathode on the organic material layer,
wherein the at least one layer is formed by using the coating composition of claim 7.

17. The method of claim 16, wherein the at least one layer is formed by a printing method.

18. The method of claim 16, wherein the forming the organic material layer on the cathode or the anode comprises:
coating the cathode or the anode with the coating composition; and
subjecting the coating composition to a heat treatment or a light treatment.

* * * * *